(12) United States Patent
Or-Bach et al.

(10) Patent No.: US 11,956,952 B2
(45) Date of Patent: Apr. 9, 2024

(54) SEMICONDUCTOR MEMORY DEVICE AND STRUCTURE

(71) Applicant: Monolithic 3D Inc., San Jose, CA (US)

(72) Inventors: Zvi Or-Bach, San Jose, CA (US); Jin-Woo Han, San Jose, CA (US)

(73) Assignee: Monolithic 3D Inc., Klamath Falls, OR (US)

(*) Notice: Subject to any disclaimer, the term of this patent is extended or adjusted under 35 U.S.C. 154(b) by 0 days.

(21) Appl. No.: 15/243,941

(22) Filed: Aug. 22, 2016

(65) Prior Publication Data
US 2017/0053906 A1 Feb. 23, 2017

Related U.S. Application Data

(60) Provisional application No. 62/221,618, filed on Sep. 21, 2015, provisional application No. 62/215,112, (Continued)

(51) Int. Cl.
 H10B 43/20 (2023.01)
 H01L 27/102 (2023.01)
 (Continued)

(52) U.S. Cl.
 CPC ......... H10B 43/20 (2023.02); H01L 27/1027 (2013.01); H10B 12/20 (2023.02);
 (Continued)

(58) Field of Classification Search
 CPC ......... H01L 27/11578; H01L 27/11575; H01L 27/11548; H01L 27/1027; H01L 27/10802;
 (Continued)

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
WO PCT/US2008/063483 5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.
(Continued)

*Primary Examiner* — Moin M Rahman
(74) *Attorney, Agent, or Firm* — PatentPC; Bao Tran

(57) ABSTRACT

A device, including: a first structure including first memory cells, the first memory cells including first transistors; and a second structure including second memory cells, the second memory cells including second transistors, where the second transistors overlay the first transistors, and a plurality of memory cells control lines, where the first transistors are self-aligned to the second transistors, where a second transistor channel of the second transistors is aligned to a first transistor channel of the first transistors, the aligned is at an atomic level as would have been resulted from an epitaxial growth process.

7 Claims, 100 Drawing Sheets

Tunneling oxide layer, charge trap layer, control oxide layer stack deposition
Gate such as W or polysilicon deposition
Gate patterning 2122 Gate
2102 Tunneling oxide layer, charge trap layer control oxide layer stack
Word Line Comb 2122

Isotopic etching P layer with gate as mask, which results in separation between N+ regions.

Channel 2114
2110
2112
2122 Gate
Word Line Comb 2122

Related U.S. Application Data filed on Sep. 7, 2015, provisional application No. 62/208,812, filed on Aug. 23, 2015.

(51) Int. Cl.
  *H10B 12/00* (2023.01)
  *H10B 41/20* (2023.01)
  *H10B 41/50* (2023.01)
  *H10B 43/50* (2023.01)

(52) U.S. Cl.
  CPC ............. *H10B 41/20* (2023.02); *H10B 41/50* (2023.02); *H10B 43/50* (2023.02)

(58) Field of Classification Search
  CPC ........... H01L 21/823857; H01L 23/576; H01L 21/563; H01L 23/528; H01L 24/09; H01L 24/32; H01L 24/48; H01L 25/0657; H01L 2224/32145; H01L 2224/48091; H01L 2224/4824; H01L 2224/49112; H01L 2225/06555; H01L 2924/14; H01L 2224/2919; H01L 2224/73265; H01L 2224/73253; H01L 2224/83365; H01L 2224/16238; H01L 2224/48229; H01L 23/57; H01L 2924/10158; H01L 2225/0651; H01L 2225/06517; H01L 2225/06558; H01L 25/18; H01L 24/01; H01L 24/15; H01L 24/16; H01L 24/17; H01L 24/76; H01L 24/82; H01L 2224/76; H01L 2224/82; H01L 2224/82007; H01L 2224/821; H01L 2225/06513; H01L 2924/014; H01L 23/488; H01L 33/62; H01L 27/2481–249; H01L 27/112–11597; H01L 2924/145–1453; H01L 27/11517–1156; H01L 2924/1438; H01L 29/42324–42336; H01L 29/788–7889; H01L 27/11524; H01L 27/11529; H01L 27/11551–11556; H01L 27/108–10897; H01L 2924/1436–14369; H01L 27/1023; H01L 28/40–92; H01L 23/5226; H01L 29/41775; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H04L 9/002; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H10B 12/0383; H10B 12/395; H10B 20/30; H10B 41/49; H10B 61/22; H10B 12/053; H10B 12/056; H10B 12/05; H10B 12/36; H10B 10/12
  USPC ....... 257/316, 319, 325, 321, 314, 758, 510, 257/390; 438/593, 594, 527, 437, 264, 438/261, 201, 692, 238, 259, 267, 258, 438/211

See application file for complete search history.

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |

(56) References Cited

U.S. PATENT DOCUMENTS

| | | |
|---|---|---|
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Lyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,204,529 B1 | 3/2001 | Lung et al. |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B2 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,720,613 B1 | 4/2004 | Chang |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |

(56) References Cited

U.S. PATENT DOCUMENTS

| | | |
|---|---|---|
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,091,551 B1 | 8/2006 | Anderson et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,339,821 B2 | 3/2008 | Walker |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,536 B2 | 2/2009 | Jin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,629,640 B2 | 12/2009 | She et al. |
| 7,632,738 B2 | 12/2009 | Lee |
| 7,633,162 B2 | 12/2009 | Lee |
| 7,638,836 B2 | 12/2009 | Walker |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,269 B2 | 8/2010 | Walker |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,851,844 B2 | 12/2010 | Van der Zanden et al. |
| 7,863,095 B2 | 1/2011 | Sasaki et al. |

(56) References Cited

U.S. PATENT DOCUMENTS

| | | |
|---|---|---|
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,266,560 B2 | 8/2012 | McIlrath |
| 8,264,065 B2 | 9/2012 | Su et al. |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,566,762 B2 | 8/2013 | Morimoto et al. |
| 8,525,342 B2 | 10/2013 | Chandrasekaran |
| 8,546,956 B2 | 10/2013 | Nguyen |
| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,796,777 B2 | 8/2014 | Song et al. |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |

(56) References Cited

U.S. PATENT DOCUMENTS

| | | |
|---|---|---|
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0008013 A1 | 1/2007 | Fijany et al. |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |

(56) References Cited

U.S. PATENT DOCUMENTS

| | | |
|---|---|---|
| 2008/0272492 A1 | 11/2008 | Tsang |
| 2008/0277778 A1 | 11/2008 | Furman et al. |
| 2008/0283873 A1* | 11/2008 | Yang .................. H01L 27/0688 |
| | | 257/E27.081 |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0080258 A1 | 3/2009 | Walker |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1* | 12/2010 | Kidoh .................. H10B 43/27 |
| | | 257/E21.409 |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |

(56) References Cited

U.S. PATENT DOCUMENTS

| | | |
|---|---|---|
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187118 A1* | 7/2013 | Murooka ............... H01L 45/16 257/4 |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0200375 A1* | 8/2013 | Yamazaki ............... H01L 29/04 438/479 |
| 2013/0203248 A1 | 8/2013 | Ernst et al. |
| 2013/0207243 A1 | 8/2013 | Fuergut |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2015/0364360 A1* | 12/2015 | Chen ............... H01L 21/31116 438/424 |
| 2016/0049201 A1 | 2/2016 | Lue |
| 2016/0064507 A1* | 3/2016 | Amo ............... H01L 29/66545 257/314 |
| 2016/0086970 A1 | 3/2016 | Peng |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker |
| 2018/0090219 A1 | 3/2018 | Harari |
| 2018/0090368 A1 | 3/2018 | Eun-Jeong et al. |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner |
| 2019/0157296 A1 | 5/2019 | Harari et al. |
| 2020/0020408 A1 | 1/2020 | Norman |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

BAKIR and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 Imoin Rahman Symposium on , vol. no., pp. 14-15, Jun. 12-14, 2007.

Lue, H.- T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", Imoin Rahman Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate- All-Around or Inde-

(56) References Cited

OTHER PUBLICATIONS pendent Gates (ΦFlash), Suitable for Full 3D Integration", International Electron Devices Meeting, 2009, pp. 637-640.
Celler, G.K. et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D Ic Fabrication: Challenges and Prospects", Proceedings of VLSI Multi Level Interconnect Conference 2006, pp. 57-64.
Jung, S.-M., et al., "The revolutionary and truly 3-dimensional 25F2 Sram technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Flamand, G. et al., "Towards Highly Efficient 4-Terminal Mechanical Photovoltaic Stacks," III-Vs Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IMOIN RAHMAN, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 Imoin Rahman International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IMOIN RAHMAN International Conference on 3D System Integration (3DIC), Sep. 28-30, 2009, pp. 1-5.
Franzon, P.D. et al., "Design and CAD for 3D Integrated Circuits," 45th ACM/IMOIN RAHMAN Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IMOIN RAHMAN International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T Sram Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IMOIN RAHMAN International Conference on 3D System Integration, 3DIC 2009.
Marchal, P., et al., "3-D technology assessment: Path-finding the technology/design sweet-spot", (2009) Proceedings of the Imoin Rahman, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "*CELONCEL: Effective Design Technique for 3-D Monolithic Integration targeting High Performance Integrated Circuits*", Asia pacific DAC 2011, paper 4A-4.
Choudhury, D., "3D Integration Technologies for Emerging Microsystems", IMOIN RAHMAN Proceedings of the IMS 2010, pp. 1-4.
Lee, Y.-J., et al., "3D 65nm CMOS with 320°C Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-58.
Park, J.-H., et al., "N-Channel Germanium MOSFET Fabricated Below 360 °C by Cobalt-Induced Dopant Activation for Monolithic Three-Dimensional-ICs", Imoin Rahman Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu-Cu non-thermo compression bonding for wafer-to-wafer 3D stacking", Imoin Rahman 3D Systems Integration Conference (3DIC), Nov. 16-18, 2010.

(56) References Cited

OTHER PUBLICATIONS

Gaudin, G., et al., "Low temperature direct wafer to wafer bonding for 3D integration", 3D Systems Integration Conference (3DIC), IMOIN RAHMAN, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.
Souri, S. J., "Interconnect Performance in 3-Dimensional Integrated Circuits", PHD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IMOIN RAHMAN Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (Mcfet) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From The Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J. et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IMOIN RAHMAN Design and Test of Computers, Nov.-Dec. 2005, pp. 498-510.

Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IMOIN RAHMAN Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IMOIN RAHMAN International 3D Systems Integration Conference (3DIC), Nov. 16-18, 2010, pp. 1- 4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration", www.electroiq.com, Aug. 18, 2010, last accessed Aug. 18, 2010.
Madan, N., et al., "Leveraging 3D Technology for Improved Reliability," Proceedings of the 40th Annual IMOIN RAHMAN/ACM International Symposium on Microarchitecture (MICRO 2007), IMOIN RAHMAN Computer Society.
Hayashi, Y., et al., "Fabrication of Three Dimensional IC Using "Cumulatively Bonded IC" (Cubic) Technology", 1990 Symposium on VLSI Technology, pp. 95-96.
Akasaka, Y., "Three Dimensional IC Trends," Proceedings of the IMOIN RAHMAN, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures? ," DAC 2011, paper 58, pp. 282-283.
Yun, J-G., et al., "Single-Crystalline Si Stacked Array (STAR) NAND Flash Memory," IMOIN RAHMAN Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IMOIN RAHMAN Transactions on Electron Devices, vol. 59, No. 1, Jan. 2012, pp. 35-45.
Goplen, B., et al., "Thermal via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IMOIN RAHMAN International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D Cmos Sequential Integration," 2011 Imoin Rahman International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IMOIN RAHMAN International Memory Workshop, May 20, 2012, Monterey, CA.
Lee, S. Y., et al., "3D IC Architecture for High Density Memories," IMOIN RAHMAN International Memory Workshop, p. 1-6, May 2010.
Rajendran, B., et al., "CMOS transistor processing compatible with monolithic 3-D Integration," Proceedings MIC 2005.

(56) References Cited

OTHER PUBLICATIONS

Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IMOIN RAHMAN Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IMOIN RAHMAN, vol. No., pp. 562-567, Jun. 4-8, 2007.
Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IMOIN RAHMAN Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IMOIN RAHMAN, 97.1 (2009) pp. 18-30.
Lee, B.H., et al., "A Novel Pattern Transfer Process for Bonded SOI Giga-bit DRAMs," Proceedings 1996 IMOIN RAHMAN International SOI Conference, Oct. 1996, pp. 114-115.
Wu, B., et al., "Extreme ultraviolet lithography and three dimensional circuits," Applied Physics Reviews, 1, 011104 (2014).
Delhougne, R., et al., "First Demonstration of Monocrystalline Silicon Macaroni Channel for 3-D Nand Memory Devices" IMOIN RAHMAN VLSI Tech Digest, 2018, pp. 203-204.
Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.
Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IMOIN RAHMAN VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T. et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IMOIN RAHMAN International, pp. 297-300, Dec. 7-9, 2009.
Burr, G. W., et al., "Overview of candidate device technologies for storage-class memory," IBM Journal of Research and Development , vol. 52, No. 4.5, pp. 449-464, Jul. 2008.
Bez, R., et al., "Introduction to Flash memory," Proceedings IMOIN RAHMAN, 91(4), 489-502 (2003).
Auth, C., et al., "45nm High-k + Metal Gate Strain-Enchanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," Imoin Rahman International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IMOIN RAHMAN International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp157-169.
Froment, B., et.al., "Nickel vs. Cobalt Silicide integration for sub-50nm Cmos", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IMOIN RAHMAN, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IMOIN RAHMAN International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to -2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, 13-15, Dec. 2004.

(56) References Cited

OTHER PUBLICATIONS

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IMOIN RAHMAN Transactions on Electron Devices, vol. 54, No. 12, pp. 3325-3335, Dec. 2007.
Henttinen, K et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IMOIN RAHMAN International Electron Devices Meeting (IEDM), Dec. 7-9, 2009, pp. 1-4.
Wierer, J.J. et al., "High-power AlGaInN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IMOIN RAHMAN Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IMOIN RAHMAN Electron Device Letters, vol. 27, No. 11, Nov. 2006, pp. 911-913.
Zhang, S., et al., "Stacked CMOS Technology on SOI Substrate," IMOIN RAHMAN Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IMOIN RAHMAN International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IMOIN RAHMAN Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IMOIN RAHMAN Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," Imoin Rahman Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IMOIN RAHMAN Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IMOIN RAHMAN Electron Device Letters, vol. 31, No. 4, Apr. 2010, pp. 275-277.
Abramovici, M., "In-system silicon validation and debug", (2008) IMOIN RAHMAN Design and Test of Computers, 25 (3), pp. 216-223.
Saxena, P., et al., "Repeater Scaling and Its Impact on CAD", IMOIN RAHMAN Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IMOIN RAHMAN/ACM Design, pp. 225-230.
Anis, E., et al., "On using lossless compression of debug data in embedded logic analysis", (2007) Proceedings of the IMOIN RAHMAN International Test Conference, paper 18.3, pp. 1-10.
Boule, M., et al., "Adding debug enhancements to assertion checkers for hardware emulation and silicon debug", (2006) Proceedings of the IMOIN RAHMAN International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IMOIN RAHMAN Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IMOIN RAHMAN Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.

(56) References Cited

OTHER PUBLICATIONS

Josephson, D.D., "The manic depression of microprocessor debug", (2002) IMOIN RAHMAN International Test Conference (TC), paper 23.4, pp. 657-663.
Ko, H.F., et al., "Algorithms for state restoration and trace-signal selection for data acquisition in silicon debug", (2009) IMOIN RAHMAN Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IMOIN RAHMAN International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IMOIN RAHMAN European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.
McLaughlin, R., et al., "Automated debug of speed path failures using functional tests", (2009) Proceedings of the IMOIN RAHMAN VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IMOIN RAHMAN International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IMOIN RAHMAN Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IMOIN RAHMAN Design and Test of Computers, 24 (5), pp. 486-493.
Vermeulen, B., "Functional debug techniques for embedded systems", (2008) IMOIN RAHMAN Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IMOIN RAHMAN Design and Test of Computers, 19 (3), pp. 37-45.
Vermeulen, B., et al., "Core-based scan architecture for silicon debug", (2002) IMOIN RAHMAN International Test Conference (TC), pp. 638-647.
Vanrootselaar, G. J., et al., "Silicon debug: scan chains alone are not enough", (1999) IMOIN RAHMAN International Test Conference (TC), pp. 892-902.
Kim, G.-S., et al., "A 25-mV-sensitivity 2-GB/s optimum-logic-threshold capacitive-coupling receiver for wireless wafer probing systems", (2009) IMOIN RAHMAN Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.

Brillouet, M., "Emerging Technologies on Silicon", IEDM 2004, pp. 17-24.
Meindl, J. D., "Beyond Moore's Law: the Interconnect Era", IMOIN RAHMAN Computing in Science & Engineering, Jan./Feb. 2003, pp. 20-24.
Lin, X., et al., "Local Clustering 3-D Stacked CMOS Technology for Interconnect Loading Reduction", IMOIN RAHMAN Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IMOIN RAHMAN Design & Test of Computers, Jul./Aug. 2008, vol. 25, issue 4, pp. 322-332.
Borkar, S., "Designing Reliable Systems from Unreliable Components: The Challenges of Transistor Variability and Degradation", IMOIN RAHMAN Micro, IMOIN RAHMAN Computer Society, November-Dec. 2005, pp. 10-16.
Zhu, S., et al., "N-Type Schottky Barrier Source/Drain MOSFET Using Ytterbium Silicide", IMOIN RAHMAN Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IMOIN RAHMAN Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IMOIN RAHMAN Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.

(56) References Cited

OTHER PUBLICATIONS

Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IMOIN RAHMAN, vol. 97, No. 3, Mar. 2009, pp. 481-510.
Crawford, M.H., "LEDs for Solid-State Lighting: Performance Challenges and Recent Advances", IMOIN RAHMAN Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IMOIN RAHMAN International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IMOIN RAHMAN Transactions on Image Processing, vol. 4, No. 12, Dec. 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IMOIN RAHMAN International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Kim, S.D., et al., "Advanced source/drain engineering for box-shaped ultra shallow junction formation using laser annealing and pre-amorphization implantation in sub-100-nm SOI CMOS," IMOIN RAHMAN Trans. Electron Devices, vol. 49, No. 10, pp. 1748-1754, Oct. 2002.
Ahn, J., et al., "High-quality MOSFET's with ultrathin LPCVD gate SiO2," IMOIN RAHMAN Electron Device Lett., vol. 13, No. 4, pp. 186-188, Apr. 1992.
Yang, M., et al., "High Performance CMOS Fabricated on Hybrid Substrate with Different Crystal Orientation," Proceedings IEDM 2003.
Yin, H., et al., "Scalable 3-D finlike poly-Si TFT and its nonvolatile memory application," IMOIN RAHMAN Trans. Electron Devices, vol. 55, No. 2, pp. 578-584, Feb. 2008.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.
Faynot, O. et al., "Planar Fully depleted SOI technology: A Powerful architecture for the 20nm node and beyond," Electron Devices Meeting (IEDM), 2010 IMOIN RAHMAN International, vol. No., pp. 3.2.1, 3.2.4, Dec. 6-8, 2010.
Khakifirooz, A., "ETSOI Technology for 20nm and Beyond", SOI Consortium Workshop: Fully Depleted SOI, Apr. 28, 2011, Hsinchu Taiwan.
Kim, I.-K., et al., "Advanced Integration Technology for a Highly Scalable SOI DRAM with SOC (Silicon-On-Capacitors)", IEDM 1996, pp. 96-605-608, 22.5.4.
Lee, B.H., et al., "A Novel CMP Method for cost-effective Bonded SOI Wafer Fabrication," Proceedings 1995 IMOIN RAHMAN International SOI Conference, Oct. 1995, pp. 60-61.
Kim, J., et al.; "A stacked memory device on logic 3D technology for ultra-high-density data storage"; Nanotechnology 22 (2011) 254006 (7pp).
Hsieh, P-Y, et al., "Monolithic 3D BEOL FinFET switch arrays using location-controlled-grain technique in voltage regulator with better FOM than 2D regulators", IEDM paper 3.1, pp. IEDM19-46 to -49.
Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to 405.
Rachmady, W., et al., "300mm Heterogeneous 3D Integration of Record Performance Layer Transfer Germanium PMOS with Sili-

(56) References Cited

OTHER PUBLICATIONS con NMOS for Low Power High Performance Logic Applications", IEDM 2019, paper 29.7, pp. IEDM19-697 to 700.
Uchida, K., et al., "Enhancement of hot-electron generation rate in Schottky source metal-oxide-semiconductor filed-effect transistors," Appl. Phys. Lett., 76, 3992 (2000). 10.1063/1.126845.
Okuyama, K., et al., "Characterization of Newly Developed 3-D Parallel Triple Gate MOS Transistor," 4$^{th}$ COE Workshop Sep. 16, 2005. Hiroshima University.
Okuyama, K., et al., "Control of Subthreshold Characteristics of Narrow-Channel Silicon-on-Insulator n-Type Metal-Oxide-Semiconductor Transistor with Additional Side Gate Electrodes", Jap. J. of Appl. Phys., vol. 46, No. 4B, 2007, pp.
Okuyama, K., et al., "Proposal of 3-Dimensional Independent Triple-Gate MOS Transistor with Dynamic Current Control," IEDM 2007. IEEE 1-4244-0585-8/07/.
Hokazono, A., et al., "Steep Channel & Halo Profiles utilizing Boron-Diffusion-Barrier Layers (Si:C) for 32 nm Node and Beyond," VLSI Technology, 2008 IEEE Symposium on, vol. No., pp. 112-113, IEEE 978-1-4244-1805-3/08/.
Astrova, E.V., et al., "Anisotropic Shaping of Macroporous Silicon," ISSN 1063-7826, Semiconductors, 2015, vol. 49, No. 4, pp. 551-558.
Huang, Z., et al., "Extended Arrays of Vertically Aligned Sub-10 nm Diameter [100] Si Nanowires by Metal Assisted Chemical Etching", NanoLetters 2008, vol. 8, No. 9, pp. 3046-3051.
Schmidt, T., et al., "Fabrication of Ultra-high aspect ratio silicon nanopores by electrochemical etching", App. Phys. Lett., 105, 123111 (2014) 10.1063/1.4896524.
Lin, J., et al., "Investigation of the Formation of Undercut during the Fabrication of Silicon Microchannels by Electrochemical Etching," Proc. 3$^{rd}$ IEEE Intl. Conf. on Nano/Micro Engineered and Molecular Systems, Jan. 6-9, 2008. Sanya, China.
Tsai, Wen-Jer, "A Novel Trapping-Nitride-Storage Non-Volatile Memory Cell Using a Gated-Diode Structure With an Ultra-Thin Dielectric Dopant Diffusion Barrier", IEEE Trans. Elect. Dev., vol. 55, No. 8, pp. 2202-2211, Aug. 2008.

\* cited by examiner

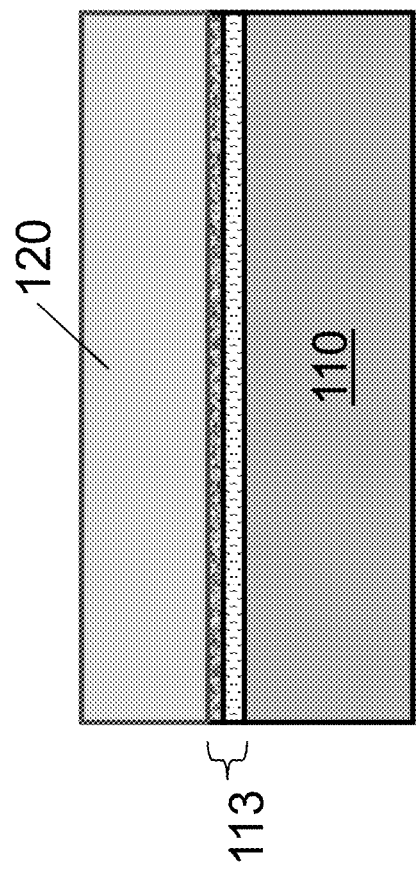
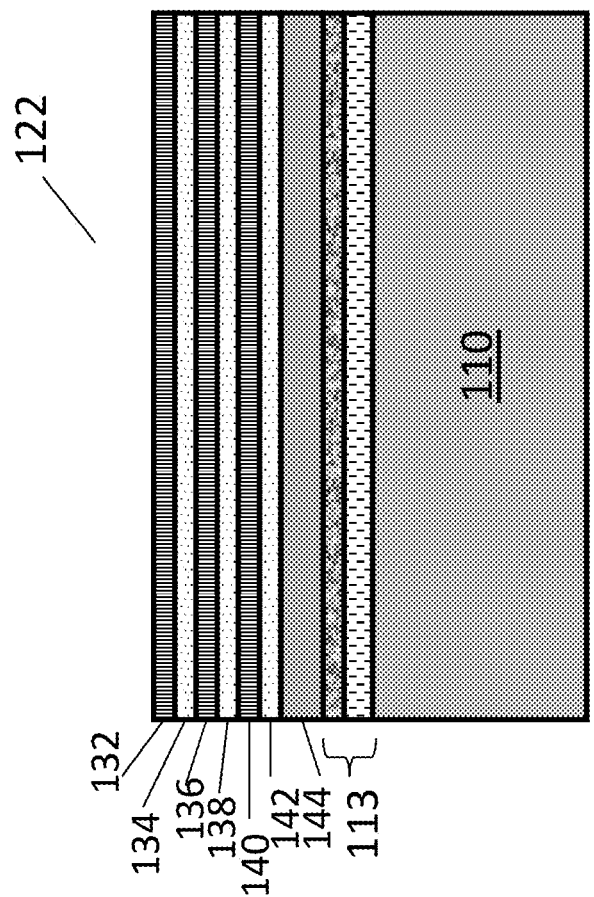

370 Re-grown epitaxial regions

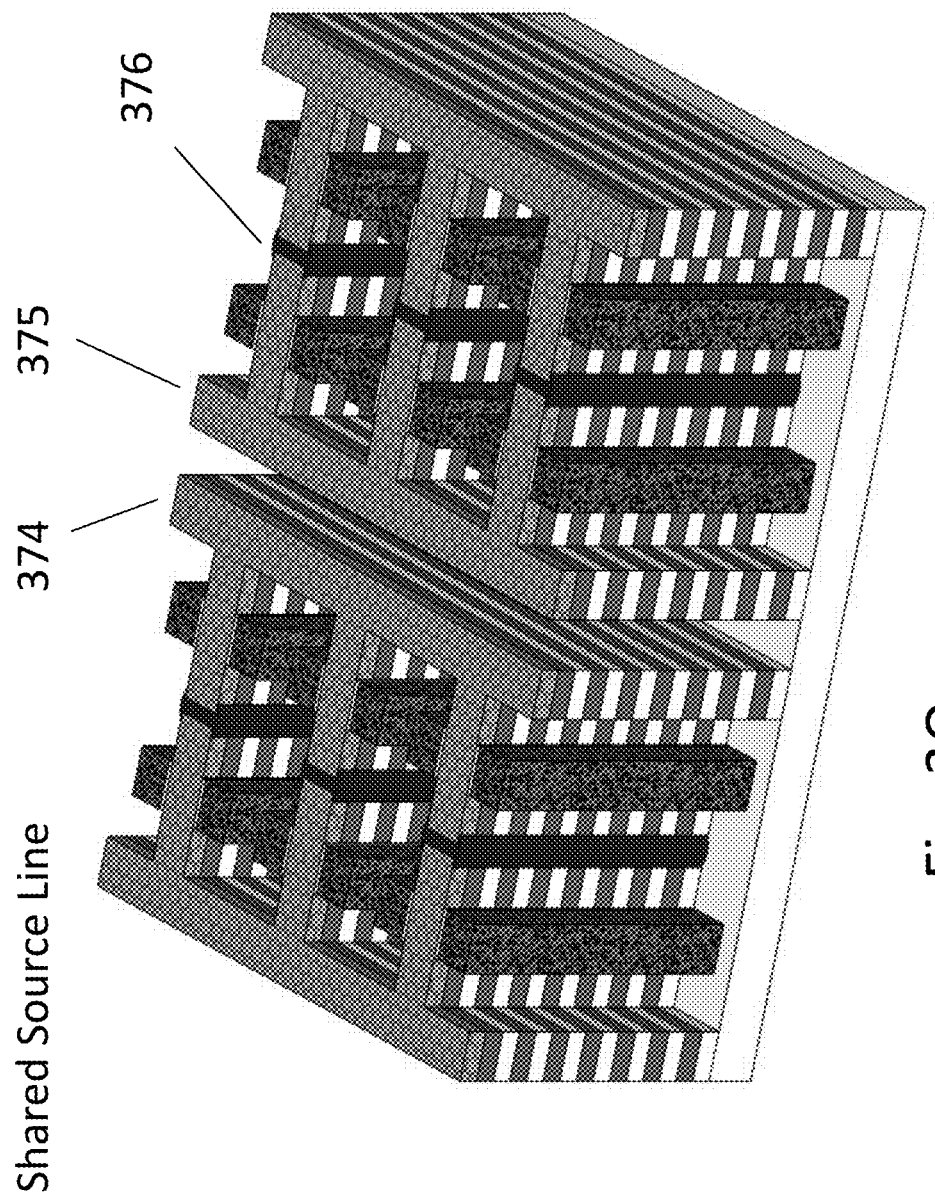

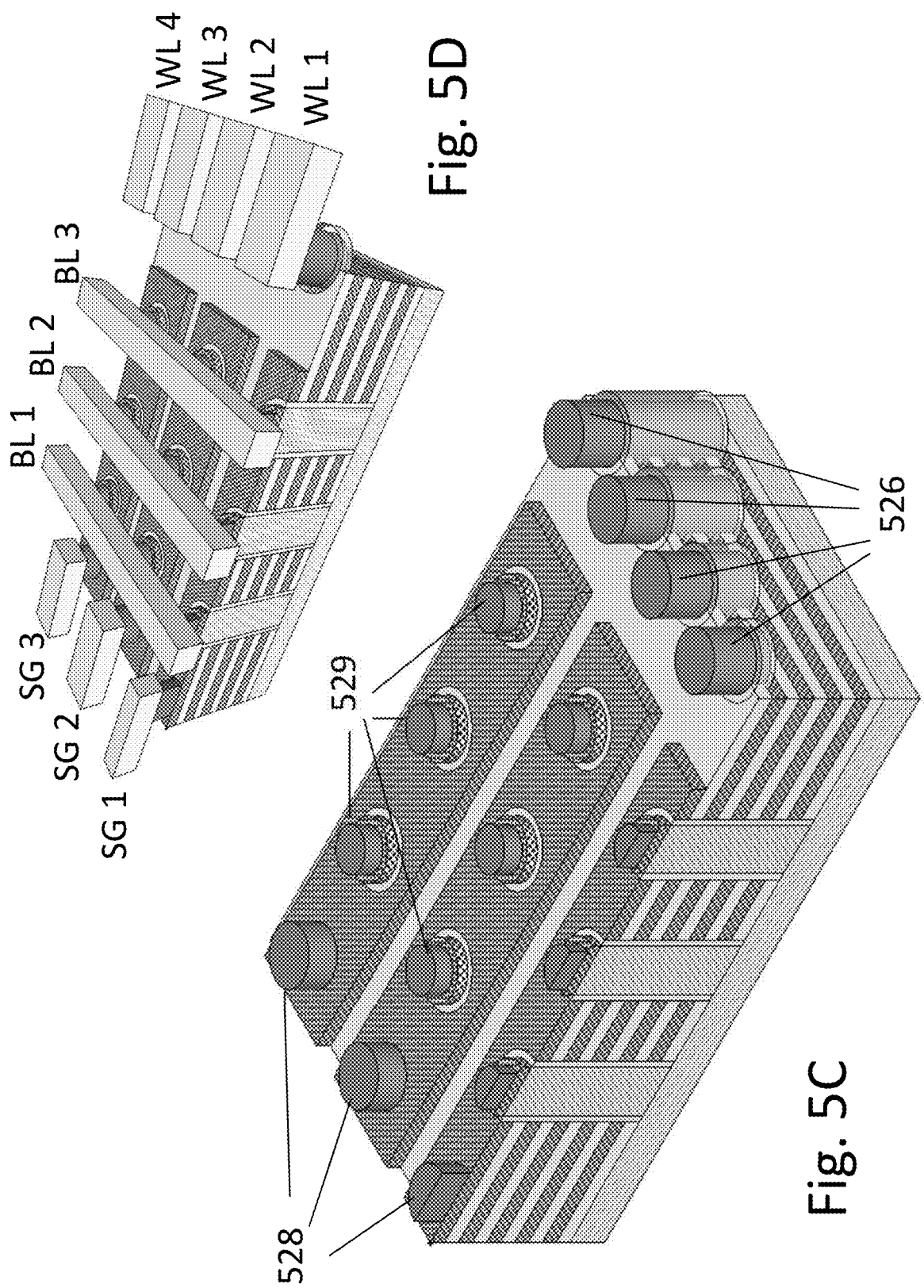

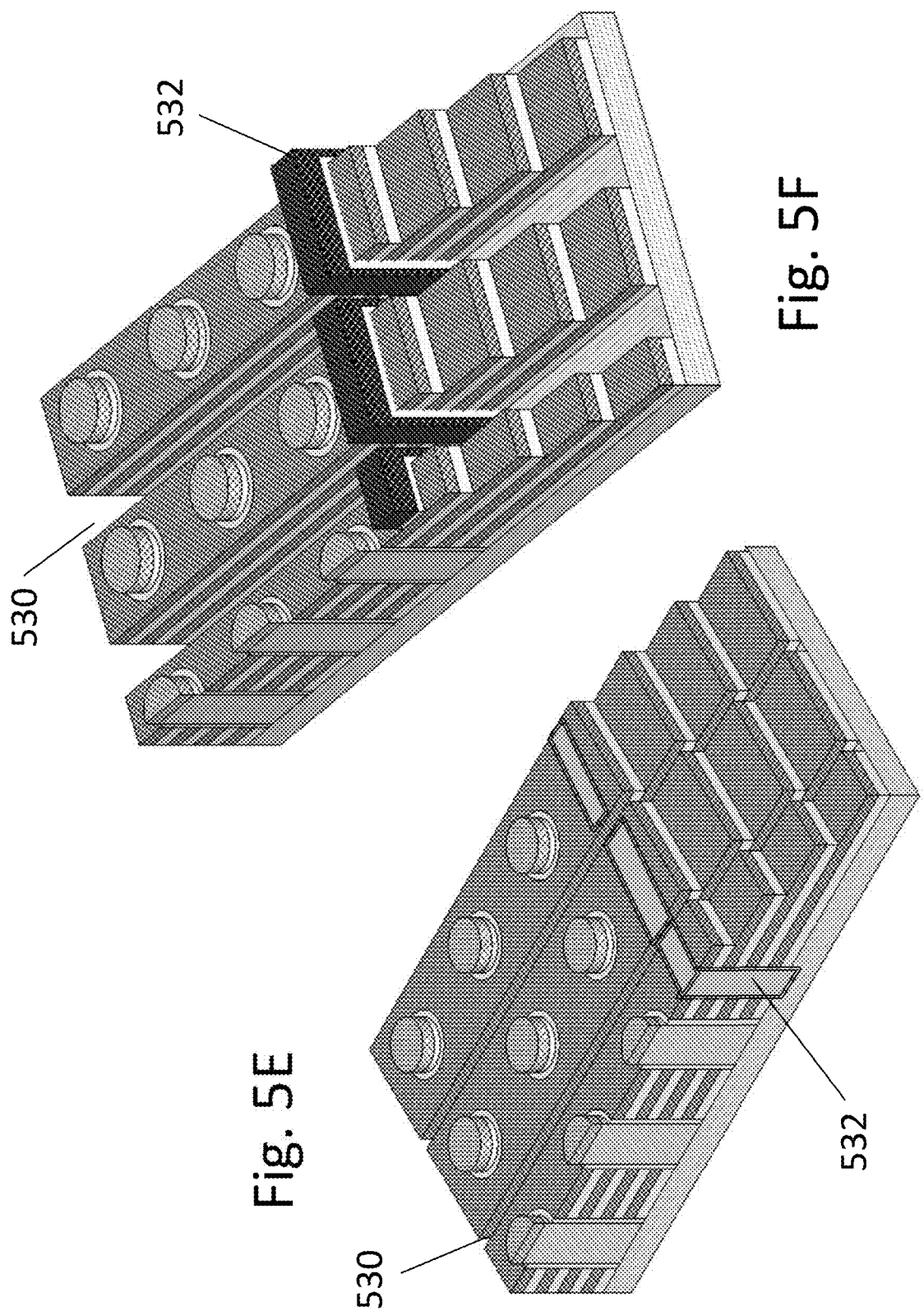

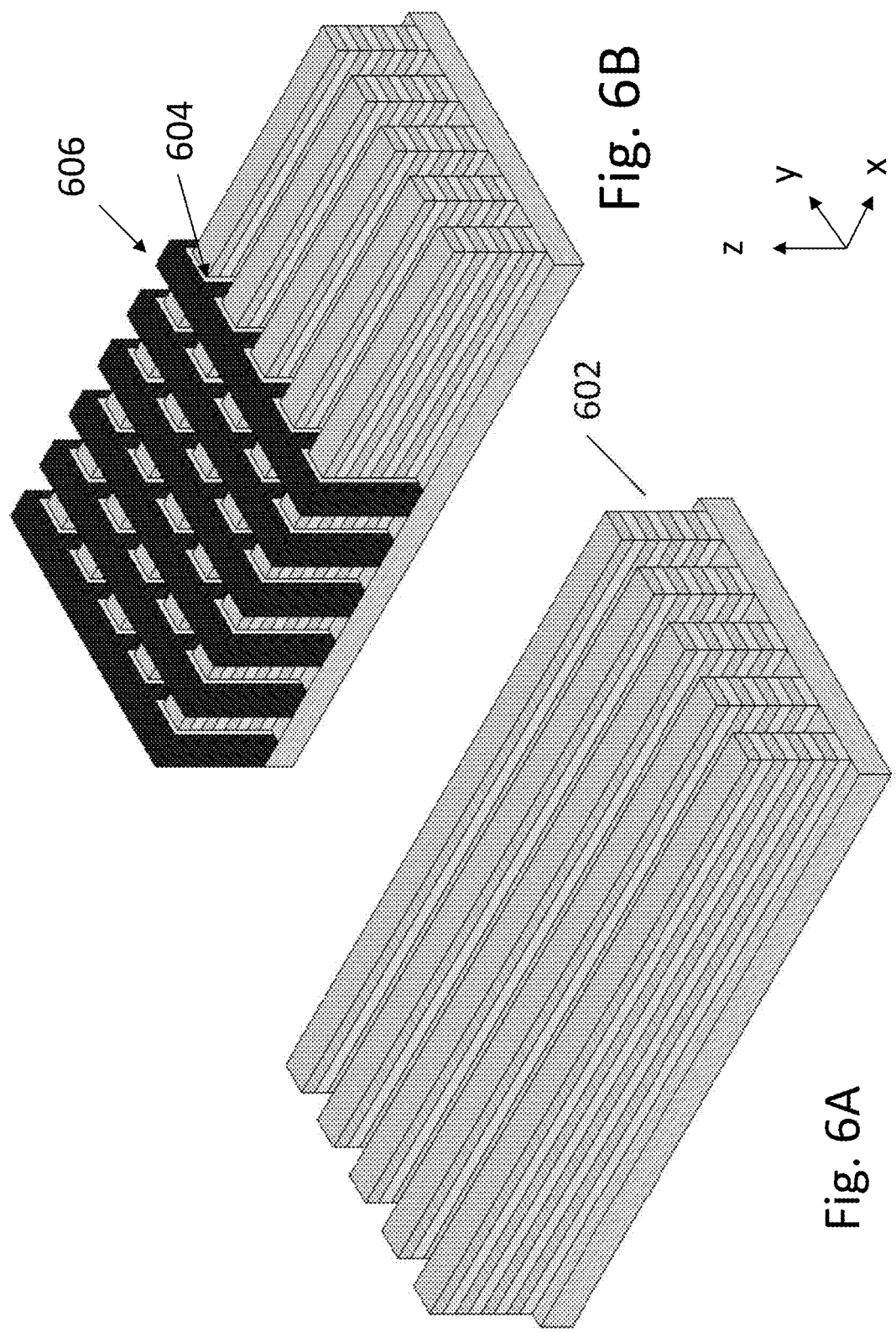

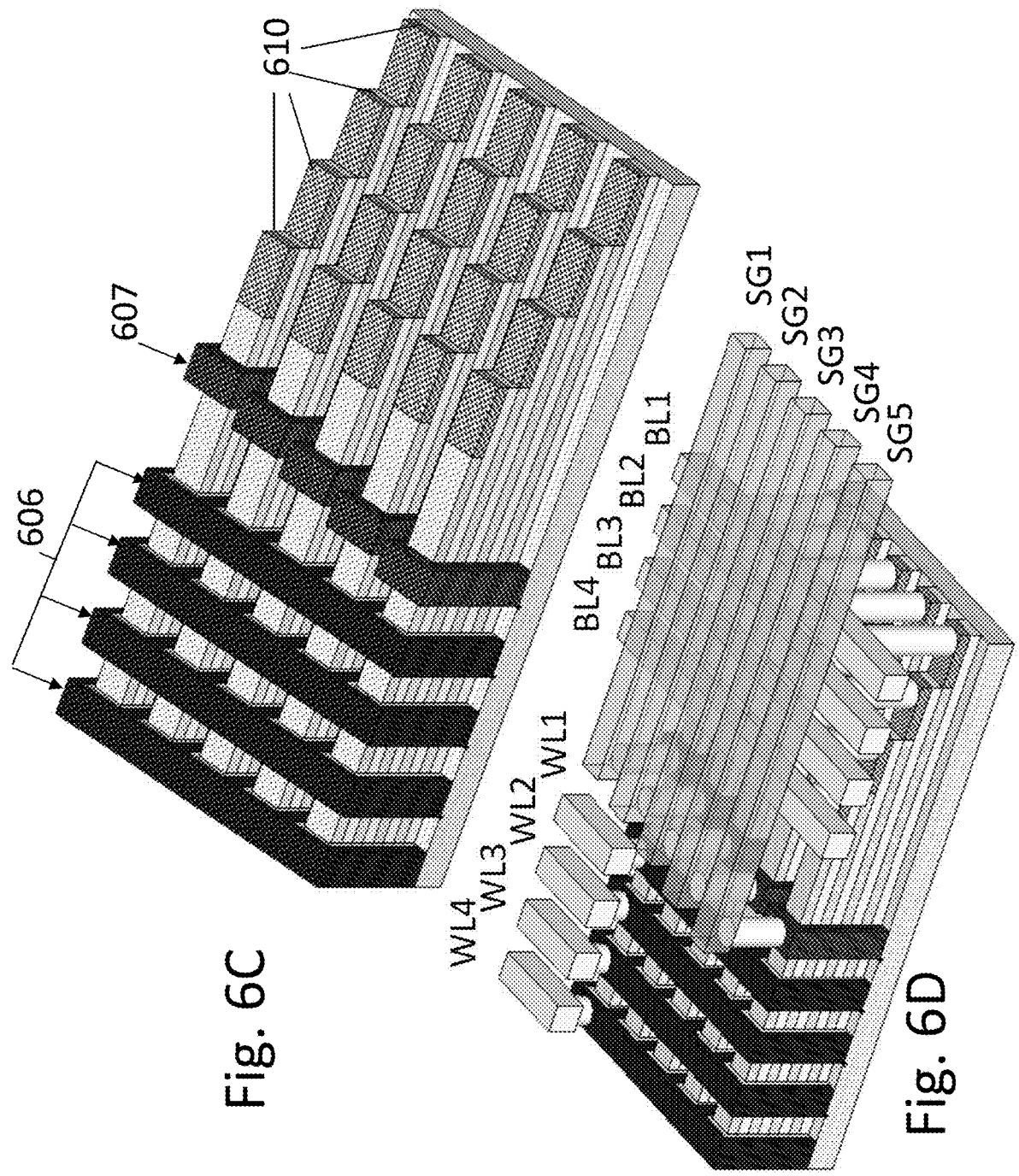

NPNP (PNPN) array

NPNP (PNPN) unit

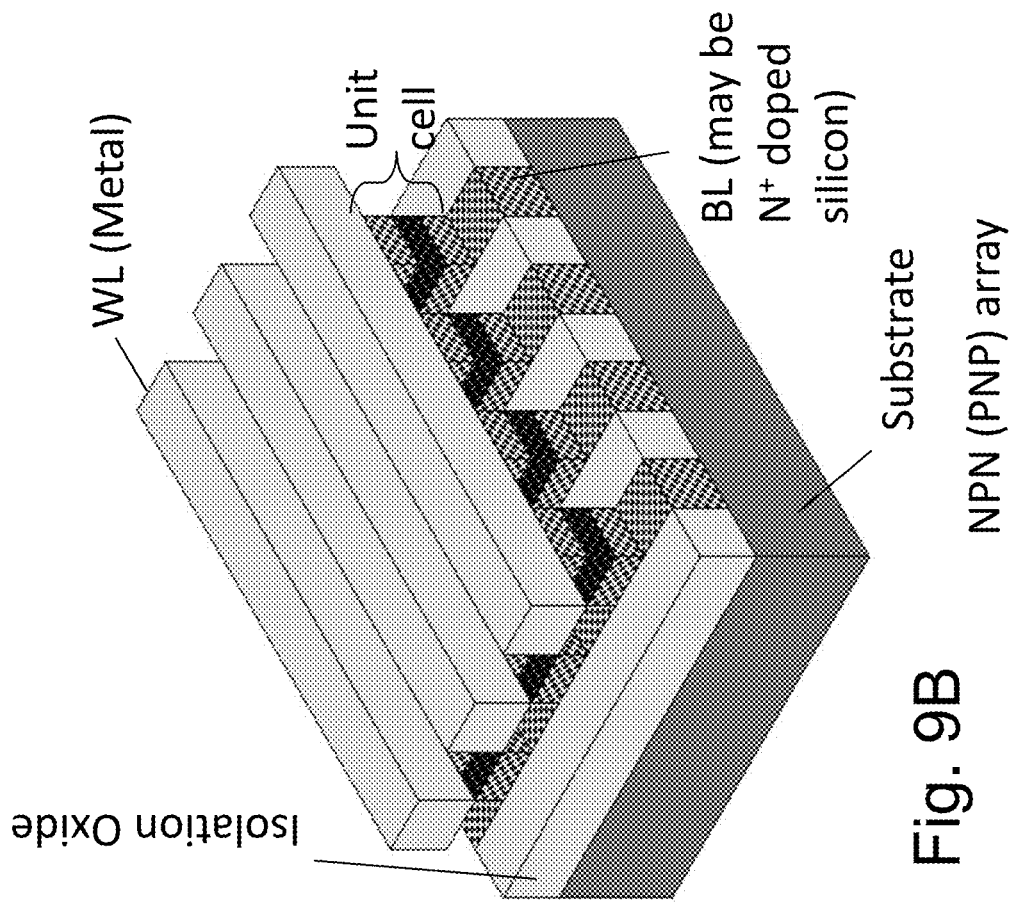
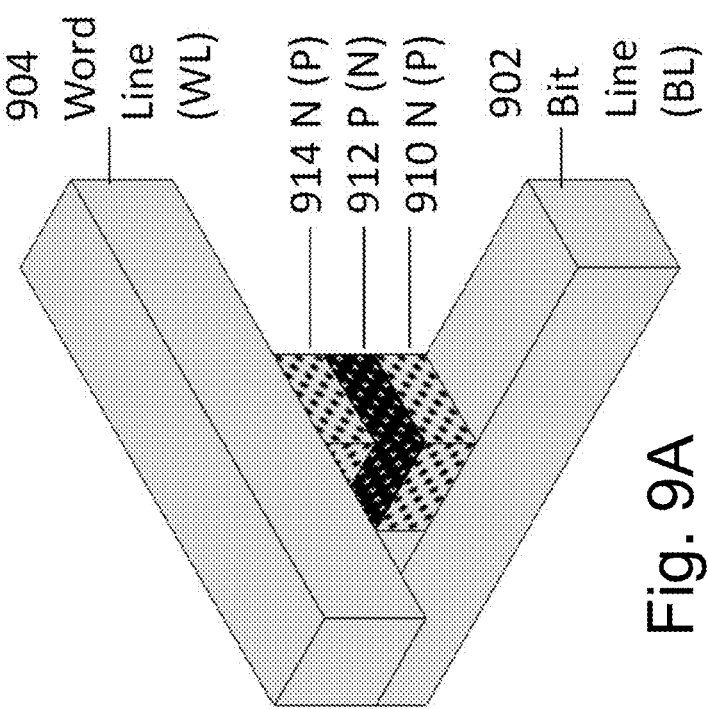
Fig. 9B
Fig. 9A

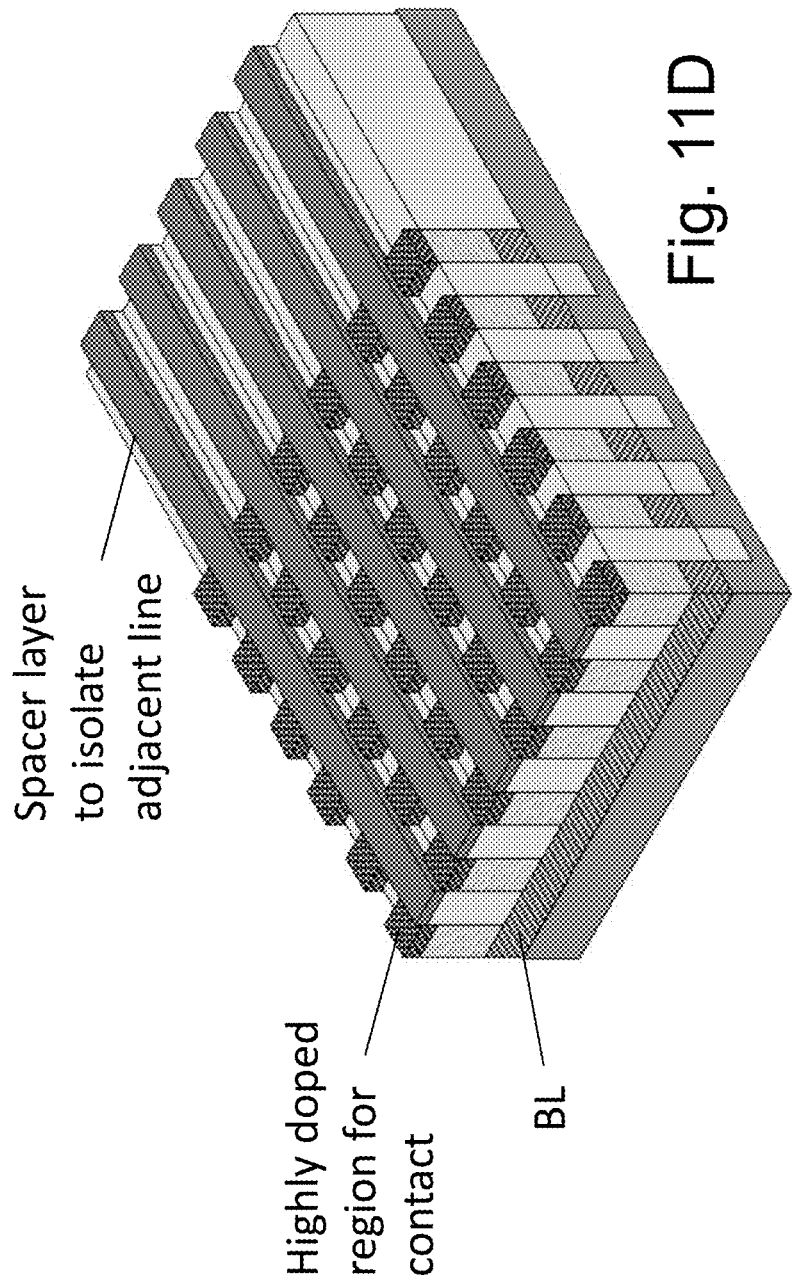

1) Fill the metal line, the metal will be chosen by considering the subsequent silicon epi process constraint.

WL is electrically continuous by chain of doped polysilicon contacted to the sidewall of the doped silicon . Yet, the doped silicon surface is exposed for serving as seed layer of subsequent epitaxial growth.
Word line is perpendicular to bit line Selective epitaxial growth of NPNP silicon pillar, followed by the similar process of the first layer Spacer layer to isolate adjacent line Word line and Bit Line can be interchangeable depending on the periphery design. The line in between is "shared line".

Electrically continuous via chain of contacts

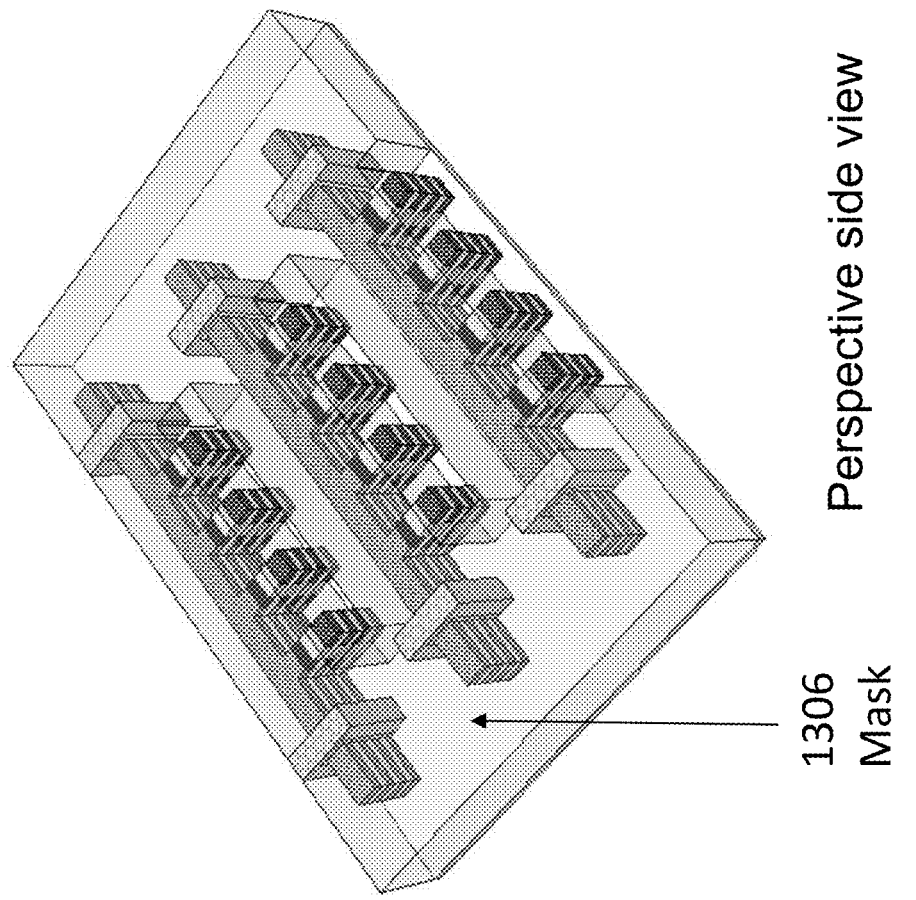
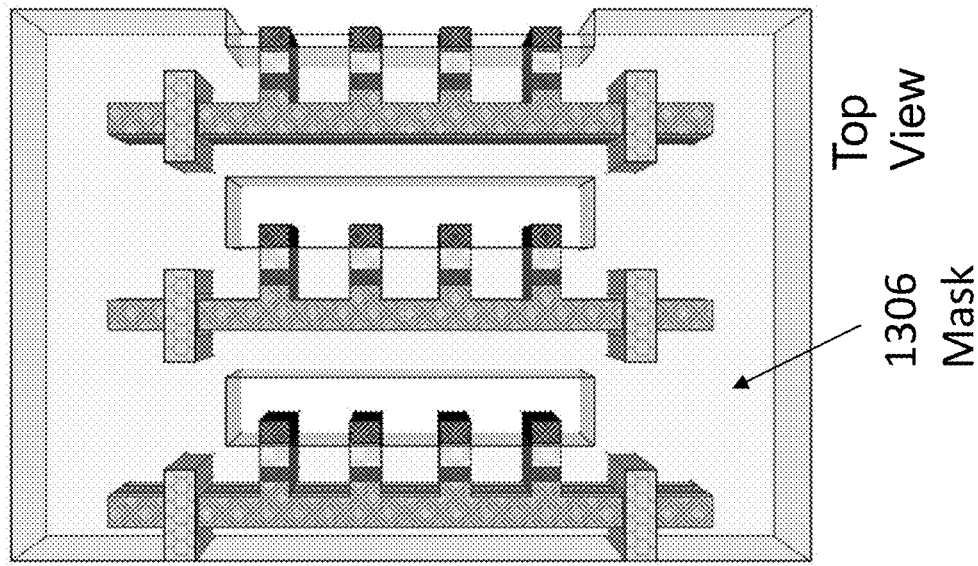
Fig. 13C
Perspective side view
1306 Mask
Top View
1306 Mask
- Masking and open for the region of outer P region (cathode).
- Diffusion doping
- Silicide the cathode region

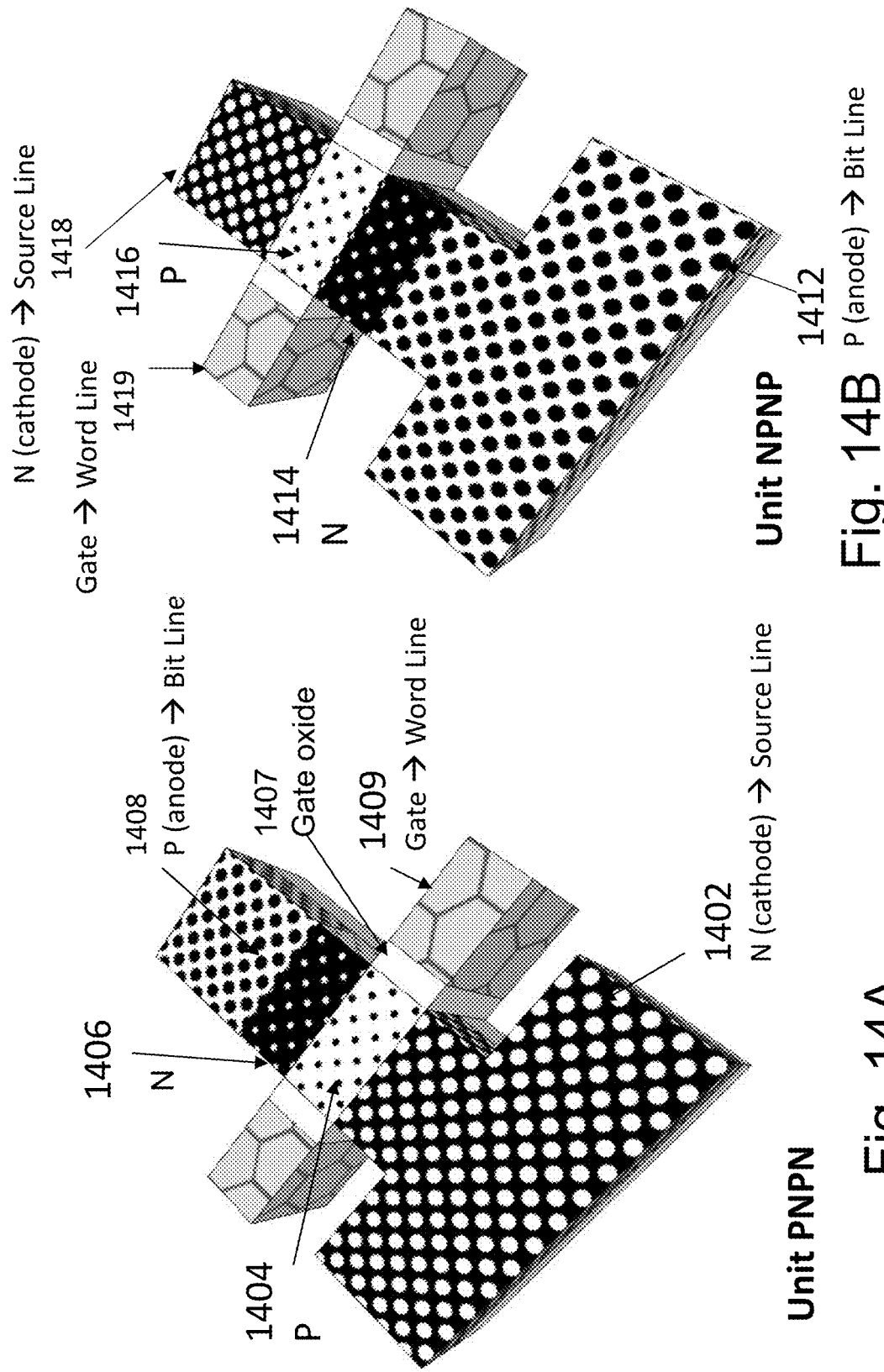

Optional Holding BL Staircase Terminal

Source line (anode line) is not drawn for simplicity.

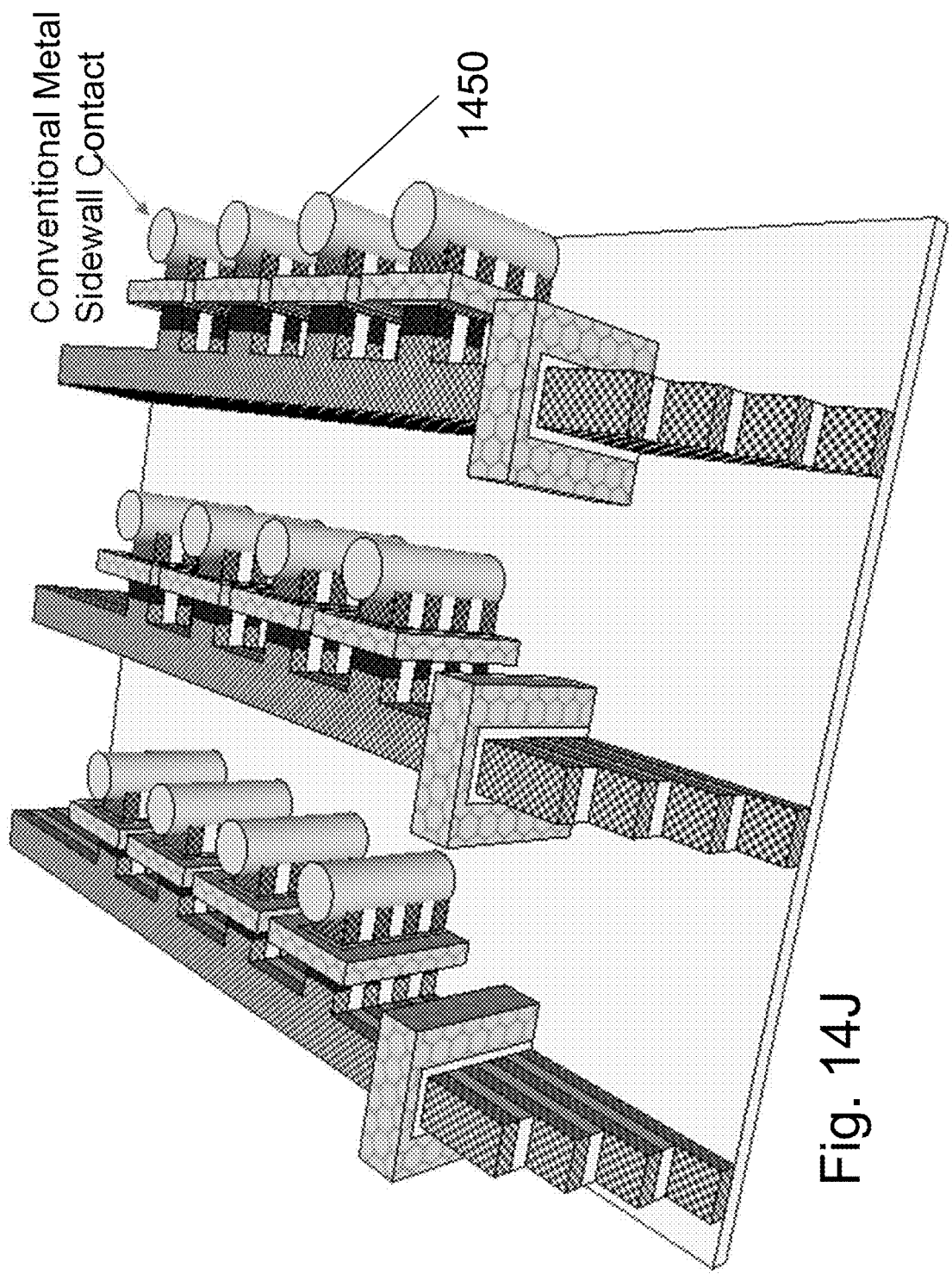

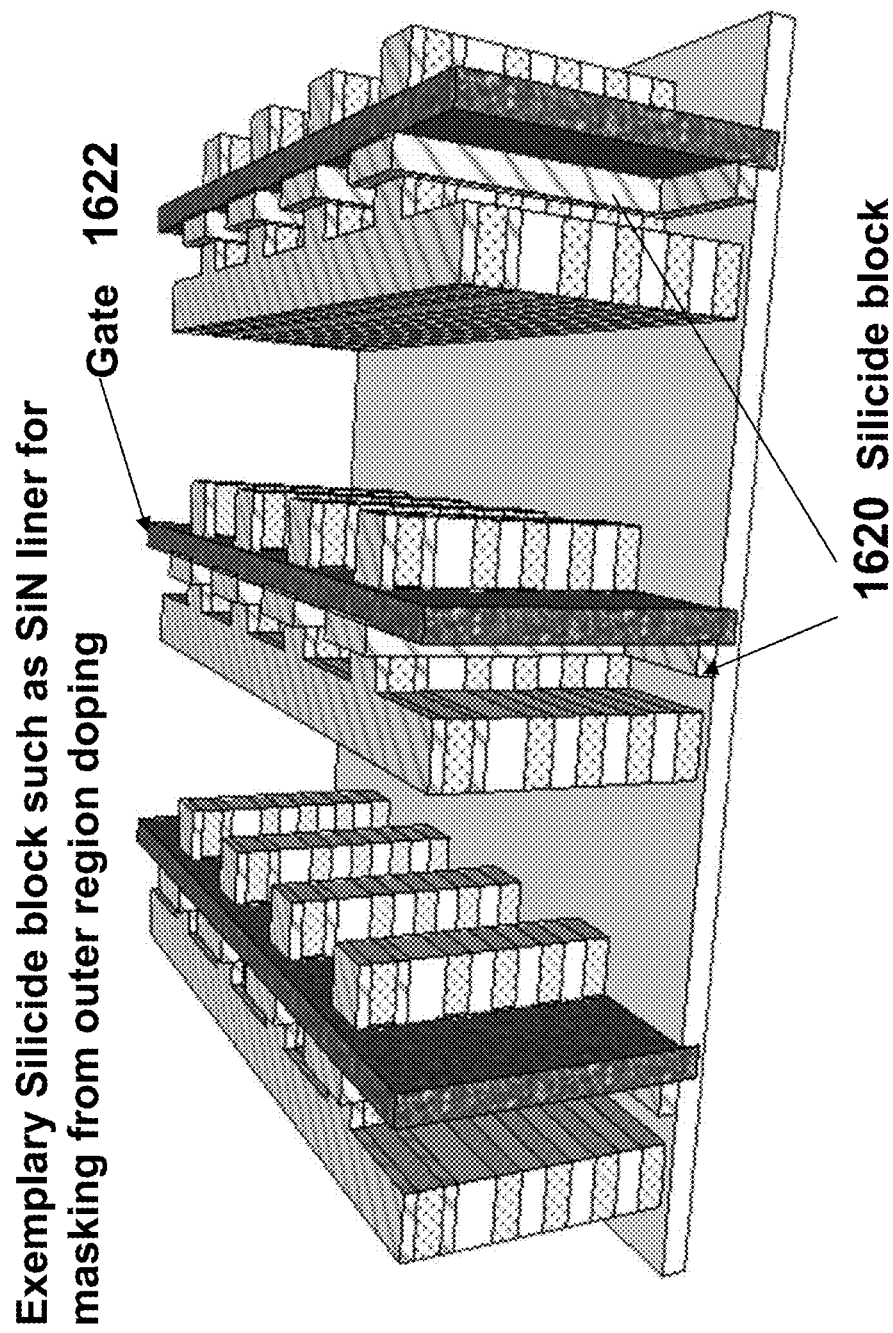

Exemplary Select Transistor Layer Process (case A, column select)
1. Etch the column region backbone to separate each select transistor
2. Form isolation layer.
3. column select transistor gate stack
4. column select transistor S/D Side View after exemplary pin select transistor process
(case B, pin select gate)
→ Separated Select gate

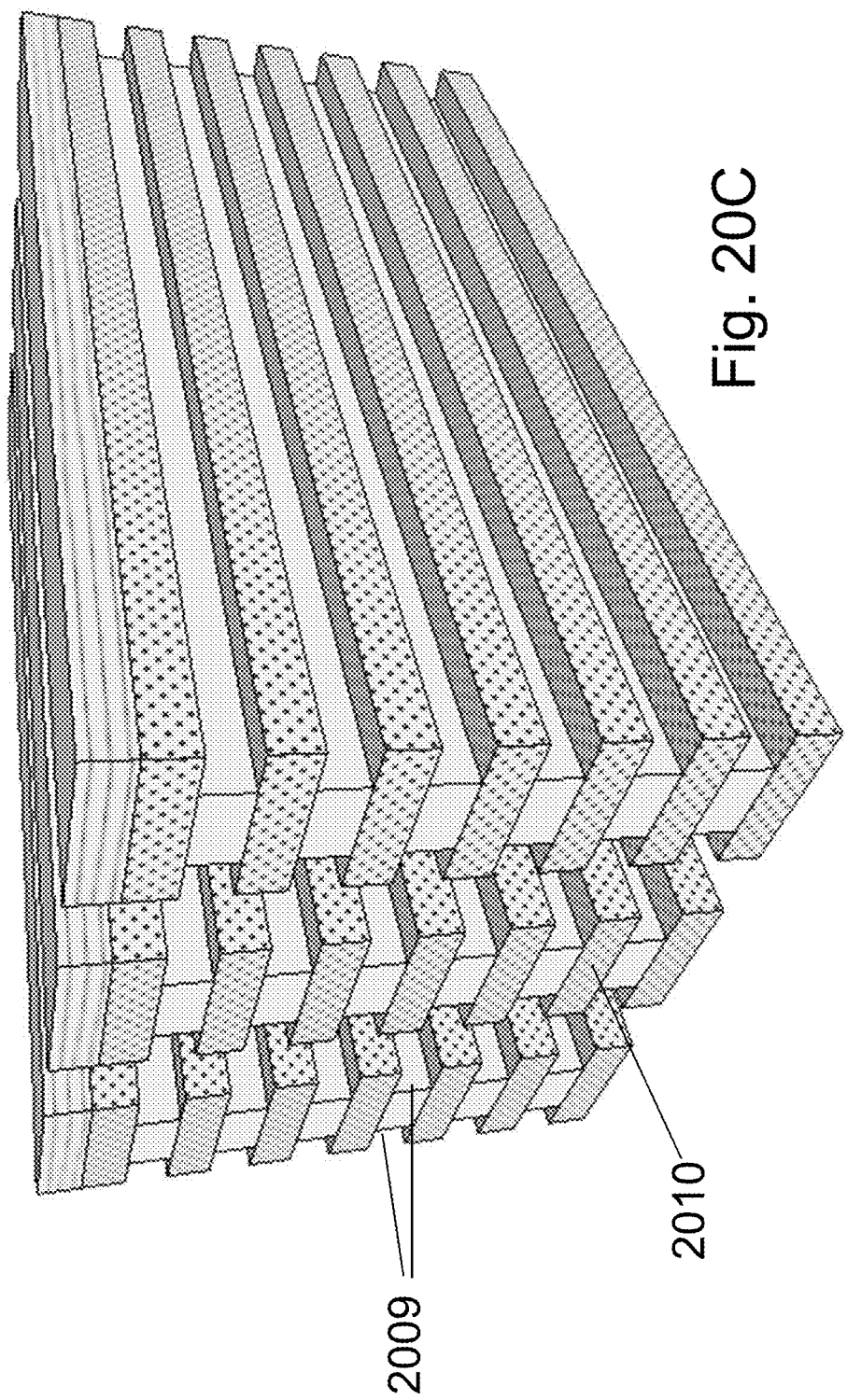

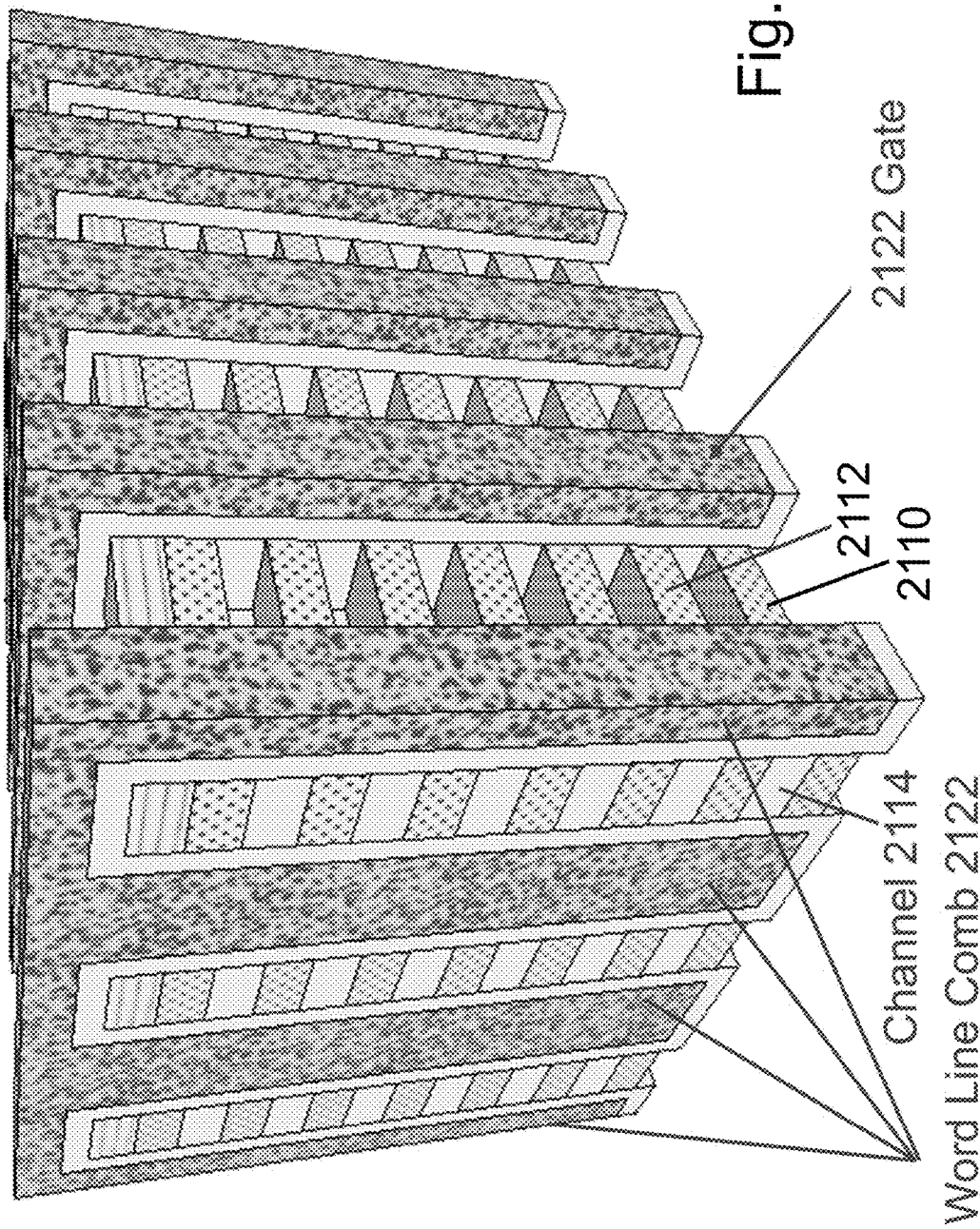

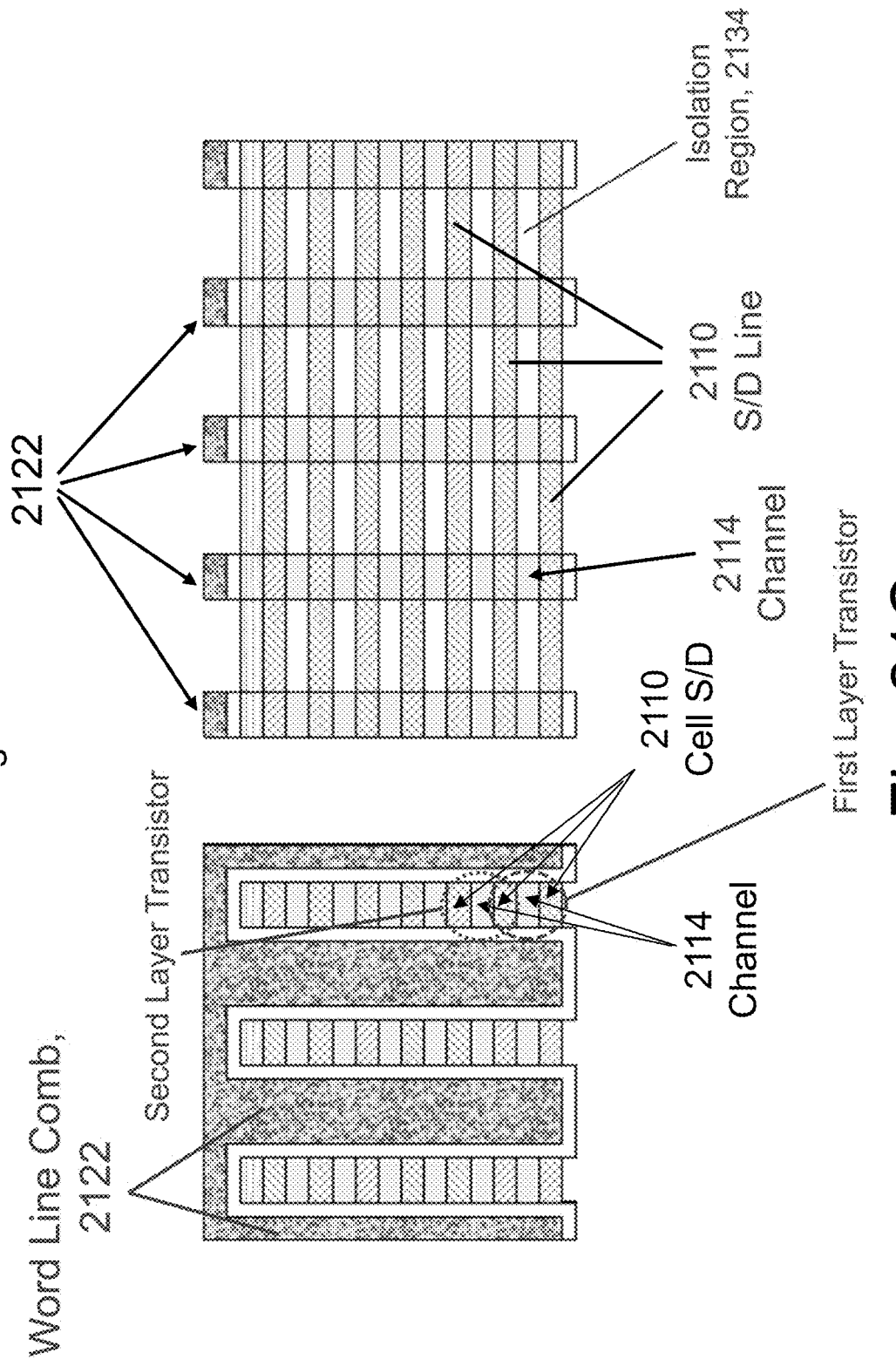

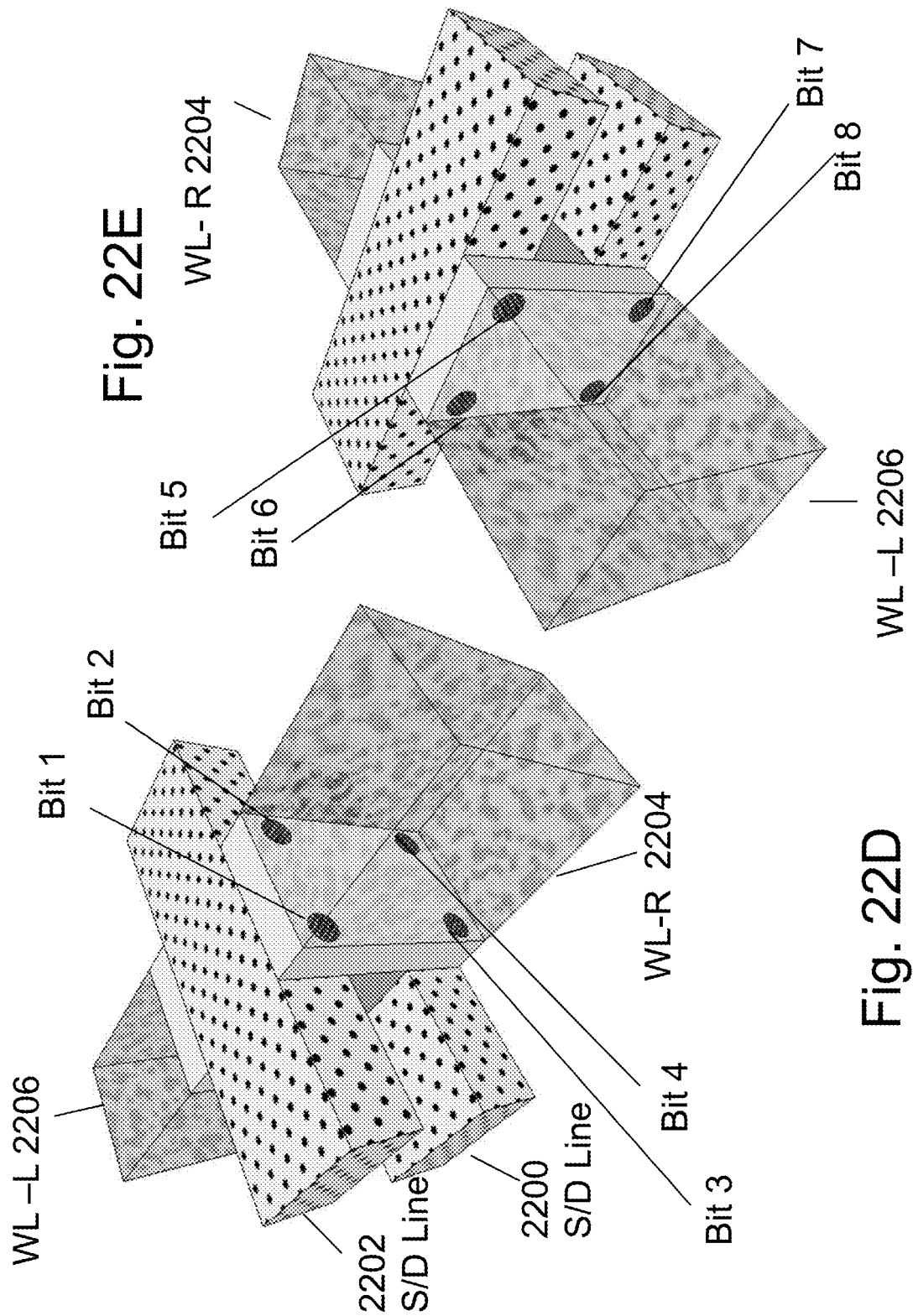

SEMICONDUCTOR MEMORY DEVICE AND STRUCTURE

This application claims benefit of provisional U.S. Patent Application No. 62/221,618, filed on Sep. 21, 2015; provisional U.S. Patent Application No. 62/215,112, filed on Sep. 7, 2015; and provisional U.S. Patent Application No. 62/208,812, filed on Aug. 23, 2015. This application claims priority to the foregoing applications. The contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,557,632, 8,298,875, 8,642,416, 8,362,482, 8,378,715, 8,379,458, 8,395,191, 8,450,804, 8,574,929, 8,581,349, 8,642,416, 8,687,399, 8,742,476, 8,674,470, 8,803,206, 8,902,663, 8,994,404, 9,021,414, 9,023,688, 9,030,858, 9,117,749, 9,219,005; U.S. patent publication 2011/0092030; and pending U.S. Patent Applications, 62/077,280, 62/042,229, Ser. No. 13/803,437, 61/932,617, Ser. Nos. 14/607,077, 14/642,724, 62/139,636, 62/149,651, 62/198,126, and 62/239,931. The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804; and U.S. patent application Ser. No. 14/461,539. The entire contents of the foregoing patents, publications, and applications are incorporated herein by reference.

An early work on monolithic 3D was presented in U.S. Pat. No. 7,052,941 and follow-on work in related patents includes U.S. Pat. No. 7,470,598. A technique which has been used over the last 20 years to build SOI wafers, called "Smart-Cut" or "Ion-Cut", was presented in U.S. Pat. No. 7,470,598 as one of the options to perform layer transfer for the formation of a monolithic 3D device. Yet in a related patent disclosure, by the same inventor of U.S. Pat. No. 7,470,598, U.S. application Ser. No. 12/618,542 it states: "In one embodiment of the previous art, exfoliating implant method in which ion-implanting Hydrogen into the wafer surface is known. But this exfoliating implant method can destroy lattice structure of the doped layer 400 by heavy ion-implanting. In this case, to recover the destroyed lattice structure, a long time thermal treatment in very high temperature is required. This long time/high temperature thermal treatment can severely deform the cell devices of the lower region." Moreover, in U.S. application Ser. No. 12/635,496 by the same inventor is stated: [0034]Among the technologies to form the detaching layer, one of the well-known technologies is Hydrogen Exfoliating Implant.' This method has some disadvantages such processing costs and lattice defects because it uses high amount of ion implantation.

In a land mark papers at VLSI 2007 and IEDM 2007, Toshiba presented techniques to construct 3D memories which they called—BiCS. Many of the memory vendors followed that work by variation and alternatives mostly for non-volatile memory applications, such as now being referred to as 3D-NAND. They provide an important manufacturing advantage of being able to utilize one, usually 'critical', lithography step for the patterning of multiple layers. The vast majority of these 3D Memory schemes use poly-silicon for the active memory cell channel which suffers from higher cell to cell performance variations and lower drive than a cell with a monocrystalline channel. In at least our U.S. Pat. Nos. 8,026,521, 8,114,757, 8,687,399, 8,379,458, and 8,902,663, these are incorporated herein by reference, we presented multiple 3D memory structures generally constructed by successive layer transfers using ion cut techniques. In this work we are presenting multiple methods and structures to construct 3D memory with monocrystalline channels constructed by alternative methods to ion cut and successive layer transfers. This structure provides the benefit of multiple layers being processed after one lithography step with many of the benefits of a monocrystalline channel, and provides overall lower construction costs.

SUMMARY

The invention may be directed to multilayer or Three Dimensional Integrated Circuit (3D IC) devices and fabrication methods.

In one aspect, a device, comprising: a first structure comprising first memory cells, said first memory cells comprising first transistors; and a second structure comprising second memory cells, said second memory cells comprising second transistors, wherein said second transistors overlay said first transistors, and a plurality of memory cells control lines, wherein said first transistors are self-aligned to said second transistors, wherein a second transistor channel of said second transistors is aligned to a first transistor channel of said first transistors, said aligned is at an atomic level as would have been resulted from an epitaxial growth process, wherein said second structure comprises a vertically oriented transistor, and wherein a second memory control line for said second memory cells is isolated from a first memory control line for said first memory cells.

In another aspect, a device, comprising: a first structure comprising first memory cells, said first memory cells comprising first transistors; and a second structure comprising second memory cells, said second memory cells comprising second transistors, wherein said second transistors overlay said first transistors, and wherein said first transistors are self-aligned to said second transistors, wherein a second transistor channel of said second transistors is aligned to a first transistor channel of said first transistors, said aligned is at an atomic level as would have been resulted from an epitaxial growth process, wherein said first transistors and said second transistors each comprise a drain and a source, and wherein at least one of said first transistor drains is directly connected to at least one of said second transistor sources.

In another aspect, a device, comprising: a first structure comprising first memory cells, said first memory cells comprising first transistors; and a second structure comprising second memory cells, said second memory cells comprising second transistors, wherein said second transistors overlay said first transistors, and wherein said first transistors are self-aligned to said second transistors, wherein a second transistor channel of said second transistors is aligned to a first transistor channel of said first transistors, said aligned is at an atomic level as would have been resulted from an epitaxial growth process, wherein said second structure comprises vertical oriented transistors, wherein said device comprises a plurality of memory control lines, wherein said second transistors comprise a drain and a source, and wherein said drain and said source each have an ohmic connection to at least one of a plurality of memory control lines.

BRIEF DESCRIPTION OF THE DRAWINGS

Various embodiments of the invention will be understood and appreciated more fully from the following detailed description, taken in conjunction with the drawings in which:

FIGS. 1A and 1B are example illustrations of forming multilayer porous structures;

FIGS. 5A-5F are example illustrations of the formation and structure of a 3D ReRAM memory;

FIGS. 6A-6D are example illustrations of the formation and structure of an alternative 3D ReRAM memory;

FIGS. 9A-9B are example illustrations of the formation and structure of vertical memory cell of a two terminal memory using bi-ristor technology for a 3D memory;

FIGS. 11A-11H are example illustrations of the formation and structure of another horizontal bi-ristor and SCR technology 3D memory;

FIGS. 13A-13C are example illustrations of the formation and structure of 3D memory utilizing at least diffusion doping;

FIGS. 14A-14M are example illustrations of the formation and structure of 3D TRAM memory;

FIGS. 16A-16L are example illustrations of the formation and structure of 3D TRAM memory with select transistors;

FIGS. 20A-20H are example illustrations of the formation and structure of vertically oriented 3D memories;

FIGS. 21A-21E are example illustrations of the formation and structure of a NOR type 3D memory; and FIGS. 22A-22F are example illustrations of the formation and structure of a NOR type 3D universal memory.

DETAILED DESCRIPTION

Figure 2:
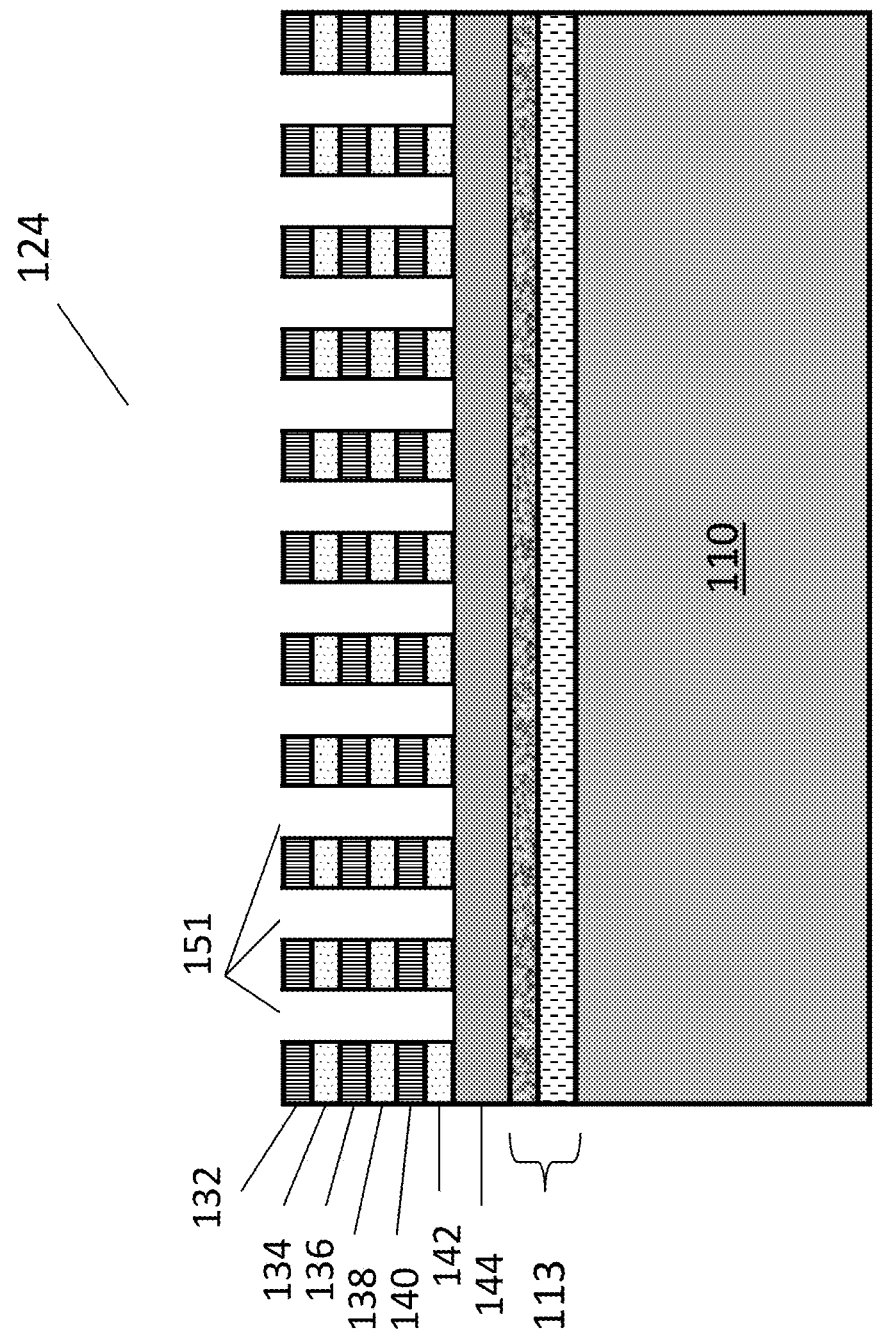
FIG. 2 is an example illustration of multilayer porous structures.

An embodiment or embodiments of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

Memory architectures include at least two important types—NAND and NOR. The NAND architecture provides higher densities as the transistors forming the memory cells are serially connected with only an external connection at the beginning and end as is illustrated in at least U.S. Pat. No. 8,114,757, FIGS. 37A-37G. NOR architectures are less dense but provides faster access and could work sometimes when the NAND architecture cannot as transistors in the memory cell are directly accessible and in many cases both its source and drain are accessible, such as being illustrated in at least U.S. Pat. No. 8,114,757, FIGS. 30A-30M.

The memory cell could be constructed with conventional N type or P type transistors where the channel doping may be of opposite type with respect to the source drain doping or the memory cell could utilize a junction-less transistor construction where the gate could fully deplete the channel when in the off-state. For some architectures, the junction-less transistor is attractive as it may take less processing steps (or provide other device advantages such a low leakage off-state) to form the memory array without the need to form a change in doping along the transistor.

Some 3D Memory architectures are utilizing a horizontal memory transistor, for example, such as illustrated in at least U.S. Pat. No. 8,114,757, at least FIGS. 37A-37G and FIGS. 30A-30M. Others may use vertical memory transistors, for example, such as in the Toshiba BiCS architecture such as illustrated in at least U.S. Pat. No. 7,852,675.

Multiple methods to construct 3D memory structures using horizontal junction-less transistors for a NAND architecture, and for horizontal NAND and NOR architectures in general may be found in, for example, such as U.S. Pat. No. 8,114,757 in at least FIG. 33 and FIG. 37. The following would present multiple techniques to form a multilayer silicon over oxide start structure equivalent to, for example, such as at least FIGS. 33D and 37D, without the use of ion-cut layer transfer.

The starting structure could be similar to FIG. 41A of U.S. application Ser. No. 14/642,724, incorporated herein by reference, as illustrated in FIG. 1A. A base donor substrate 110 may be used to form a dual porous layer for future cut layer 113 on which an epitaxial process may be used to form relatively thick crystalline layer 120. Future cut layer 113 may include two porous layers; an upper layer of porous silicon, which may contain microscopic pores of diameter of a few nm, and below this is formed a lower layer of porous silicon for which the pore diameter may be a few (or more) times greater (similar to FIG. 23 of U.S. application Ser. No. 14/642,724), for the future 'cut' or cleave. The epitaxial formation of relatively thick crystalline layer 120 could include successively altering the addition of dopants to further support the following steps.

Then, by utilizing anodizing processes, thick crystalline layer 120 may be converted to a multilayer of low porosity over high porosity as illustrated in as illustrated in FIG. 1B, which is similar to FIG. 41B of Ser. No. 14/642,724. FIG. 1B illustrates relatively thick crystalline layer 120 after going through a porous formation process which forms multilayer structure 122. Multilayer structure 122 may include layer 144, layer 142, layer 140, layer 138, layer 136, layer 134 and layer 132. Multilayer structure 122 may include base donor wafer substrate 110 with porous cut layer 113 for the planed transfer of the fabricated multilayer structure over the target wafer, which could include the memory peripherals circuits prefabricated on the target wafer. Alternatively, multilayer structure 122 may not include porous cut layer 113 when the transfer to a target wafer is not intended. Layer 144 could be the portion of layer 120 which remains after the multi-layer processing. The alternating layers could have alternating porosities of r levels such as layers 132, 136, 140 with porosity of less than 30% or less than 40% while layers 134, 138, 142 with porosity over 50% or over 60%, or layers 132, 136, 140 with a porosity of less than 55% while layers 134, 138, 142 with porosity over 65%, or other alternating level of porosity based on the target application, process, and engineering choices. Each layer may include a varying porosity thru its thickness, or a number of sublayers of varying porosity.

The number of alternating layers included in multilayer structure 122 could be made as high as the number of layers needed for the 3D memory (for example, greater than 20, greater than 40, greater than 60, or greater than 100) or for the transferring of a subset of multilayers structures one on top of the other to form the desired final structure. The porosity modulation could be achieved by alternating the anodizing current or changing the lighting of the silicon structure while in the anodizing process or by first alternating the doping as the layer 120 is being grown through epitaxial process. Layer 144 could be the portion of layer 120 which is left un-processed.

For example, U.S. Pat. No. 7,772,096, incorporated herein by reference, teaches the formation of a multilayer structure by the following steps:

i—Epitaxially grow alternating layers of p+ 134,138, 142, with dopant concentrations in the range of $1 \times 10^{19}$ cm$^{-3}$ to $2 \times 10^2$ cm$^{-3}$, respectively over layers p 132,136, 140, with dopant concentrations in the range of $1 \times 10^{14}$ cm$^{-3}$ to $5 \times 10^{18}$ cm$^{-3}$. Layers 132, 134, 136, 138, 140, 142 could have thickness of 3 nm to 20 nm, or even thicker such as 20 nm to 100 nm.

ii—Perform an anodization process in a hydrofluoric acid (HF) containing electrolyte solution to convert the doped layers to porous layers. The p+ 134,138, 142 layers would convert to a high porosity layer with coarse porous structures while the p 132,136, 140 layers will convert to a fine porous structure.

iii—Perform an oxidization process to convert the p+ 134,138, 142 layers to oxide.

iv—Perform a high temperature annealing, for example, such as at 1,000° C. for a few hours, to convert the p 132,136, 140 layers into high quality monocrystalline layers.

Alternatively, the above steps ii-iv can be carried out after holes 151 are formed by masking and etch processes as shown in FIG. 2, where holes 151 may be filled by, for example, contact metal or gate stacks in subsequent processing. Holes 151 may include regions. Thus a second desired multilayer structure 124 may be formed.

The above processing may result with the desired multilayer structure 122 or second desired multilayer structure 124 for the formation of 3D memories.

For example, U.S. patent application Ser. No. 12/436,249, incorporated herein by reference, teaches an alternative method for the formation of the multilayer structure 122 with alternating doping. The method starts by multiple depositions of amorphous silicon with alternating doping, then after performing a solid phase recrystallization to convert the stack into a stack of p-type doped single crystalline Si-containing layers using a high temperature a recrystallization, with recrystallization temperatures from 550° C. to 700° C. After recrystallization, the single crystalline Si-containing layers could then be subjected to anodization and so forth as presented in ii-iv above. U.S. patent application Ser. No. 12/436,249 teaches a few alternatives for the formation of the alternating doping layer structure which could be employed herein for the 3D memory multilayer structure formation.

The epitaxial layer 120 could include alternating n doped and n+ doped layers. The porous formation of the n doped layers may be assisted by light to form the holes for the anodizing process to effectively work as had been presented in S. Frohnhoff et. al., Thin Solid Films, in press (1994), U.S. patent application Ser. Nos. 10/674,648, 11/038,500, 12/436,249 and U.S. Pat. No. 7,772,096, all of these incorporated herein by reference. Following the anodizing step the structure could be oxidized and then annealed as presented in steps iii and iv above.

A method to form alternating layers of coarse and fine porous layers is by alternating the anodizing current similar to the description in "Porous silicon multilayer structures: A photonic band gap analysis" by J. E. Lugo et al J. Appl. Phys. 91, 4966 (2002), U.S. Pat. No. 7,560,018, U.S. patent application Ser. No. 10/344,153, European patent EP0979994, and "Photonic band gaps analysis of Thue-Morse multilayers made of porous silicon" by L. Moretti at el, 26 Jun. 2006/Vol. 14, No. 13 OPTICS EXPRESS, all of these incorporated herein by reference. Following the anodizing step the structure could be oxidized and then annealed as presented in steps iii and iv above.

The anodizing step could be done as a single wafer process or by using a batch mode as illustrated in U.S. Pat. No. 8,906,218, incorporated herein by reference and other similar patents assigned to a company called Solexel.

Another alternative is to form the multilayer structure 122 by first forming multilayer structure of alternating n type over p type. Such a method is illustrated in U.S. Pat. No. 8,470,689 and in "Silicon millefeuille": From a silicon wafer to multiple thin crystalline films in a single step" by D. Hernandez et al., Applied Physics Letters 102, 172102 (2013); incorporated herein by reference. These methods leverage the fact that n type silicon would not become porous without light while p type silicon would only need current for the anodizing process to take place. For these methods the multilayer of n over p could be first etched to form the multilayer pattern such as is illustrated in FIG. 31E or FIG. 37E of U.S. Pat. No. 8,114,757 followed by an anodizing process to convert the p type silicon to porous while leaving the n type solid and un-etched. Then the step of oxidation iii. could be used to convert the porous layer to an isolation layer. The annealing step iv. could be made short or skipped as the n layers might be very lightly etched or not be etched at all.

Another alternative of multilayer structure could be achieved by successive epitaxial growths of n type silicon over p+ type silicon multiple times for which the n silicon could be at much higher rate than the p+ silicon. In a paper titled: "Fabrication of conducting GeSi/Si micro and nanotubes and helical microcoils" by S V Golod, V Ya Prinz, V I Mashanov and A K Gutakovsky, Semicond. Sci. Technol. 16 (2001) 181-185, incorporated herein by reference, it present that p+ silicon would be etch at much lower rate than n silicon, quoting: "As a selective etchant, an ammonium hydroxide-water solution can be used. It was shown in [8] that the 3.7 wt. % NH4OH solution has a pp+ selectivity of approximately 8000:1 at 75° C. and boron concentration p+=$10^2$ cm$^{-3}$.

An additional alternative may be to utilize the Bosch process. In a paper titled "Fabrication and Characterization of Vertically Stacked Gate-All-Around Si Nanowire FET Arrays" by Davide Sacchetto et. al. at IEEE SDDR09, incorporated herein by reference, a technique used for deep hole etch has been applied to form structures of crystalline lines one on top of the other each with oxide all around. Similar techniques could be used to form the base structure for 3D memory.

Another alternative is to form multilayers of silicon over $Si_{1-x} Ge_x$ as illustrated in "New class of Si-based superlattices: Alternating layers of crystalline Si and porous amorphous $Si_{1-x} Ge_x$ alloys" by R. W. Fathauer et al., Appl. Phys. Lett. 61 (19), 9 Nov. 1992, incorporated herein by reference.

In such a multilayer structure there is high degree of selectivity in etching $Si_{1-x} Ge_x$ layers over Si layers. This may be followed by oxidation such as step iii. and anneal iv. could provide multilayers of silicon over oxide. In a paper titled: "Novel Three Dimensional (3D) NAND Flash Memory Array Having Tied Bit-line and Ground Select Transistor (TiGer)" by Se Hwan Park et al, IEICE Transactions on Electronics. May 2012, incorporated herein by reference, it presents the use of multilayers of silicon over $Si_{1-x} Ge_x$ for forming a 3D NAND device. While many of the 3D memories presented in the following are 3D RAM and 3D ReRAM the multilayer structure presented herein are useful for 3D NAND type memory as was presented in this paper and in many of process flow presented in the incorporated here in patents such as in U.S. Pat. No. 8,581,349 as related to FIG. 37A-37G, incorporated herein by reference.

Another alternative for forming the multilayer structure is direct epitaxial of silicon special oxide and silicon again. The special oxide is a rare-earth oxide which if deposited properly would keep the crystal structure of the silicon to allow crystalline silicon on top of it as presented in U.S. patent application US 2014/0291752 incorporated herein by reference.

An interesting aspect of the multilayer structure that are epitaxial based rather than the layer transfer approach is that the whole structure in most cases would resemble one monolithic crystal, in which the crystal repeating element which could be a silicon atom or other molecules are very well aligned across layers. No molecular level alignment would happen in layer transfer process. So in an epitaxial process of multilayer formation the molecules forming the multilayer structure are all aligned forming lines that are parallel at better than 0.01 of degree while in layer transfer base multilayer structure between layers the molecules line would have in most case a misalignment greater than 0.1 degree. As well, in an epitaxial process of multilayer formation the molecules forming the multilayer structure from one layer to the next are aligned less than within half an atomic or molecule distance.

An alternative of using oxidized porous silicon for isolating the silicon layers for the 3D memory structure is the ability to easily etch portions of these oxidized porous layers to allow the gate formation to have a larger coverage of the transistor channel to have even better control on the memory transistor such as with gate all around or a 'mostly' gate all around transistor structure. In a similar way in the other forms of multilayer structure the area on top and under the channel could be etched so in the following processing step of oxide and gate formation it would form a larger coverage of the channel which could be even gate all around for better control.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate. Similarly, donor wafers herein may be substantially comprised of a crystalline material and may include, for example, mono-crystalline silicon or germanium, or may be an engineered substrate/wafer such as, for example, an SOI (Silicon on Insulator) wafer or GeOI (Germanium on Insulator) substrate, depending on design and process flow choices.

In general the described memory structure would be arranged as a process flow forming a type of a 3D memory structure. These flows could be considered as a Lego part which could be mixed in different ways forming other variations, thus forming many types of devices. Some of these variations will be presented but as with Lego there too many variations to describe all of them. It is appreciated that artisan in the art could use these elements of process and architecture to construct other variations utilizing the teaching provided herein.

Many of these memory structures are constructed starting with multilayer of mono-crystals as illustrated in FIG. 1B. The mono-crystal could be doped and could have either an isolative layer in-between or sacrificial layer which could be replaced at some point in the process with isolative layer. The multilayer structure could be fully ready or partially ready where the etching of vertical holes or trenches shaped, as required for the memory structure to follow, allows the completion of the multilayer structure by selective etching of the sacrificial layers in-between.

A volatile 3D memory using floating body charge is described in U.S. Pat. No. 8,114,757, incorporated herein by reference, as related to at least FIGS. 30A-30M and FIGS. 31A-31K. The following is additional alternative for forming a 3D DRAM volatile memory.

3D Memory may be multi-layers of 2D memory in which memory cells are placed as a matrix with rows and columns. These memory cells are controlled by memory control lines such as bit-lines, source-lines, and word-lines, usually in a perpendicular arrangement, so that by selecting a specific bit-line and specific word-line one may select a specific memory cell to write to or read from. In a 3D memory matrix, having three dimensions, selecting a specific memory cell requires the selecting of the specific layer which could be done by additional memory control lines such as select-lines. As been presented herein, some of the select lines could be integrated in the semiconductor layer in which the memory devices are built into. Other select lines could be deposited or formed thru epitaxial growth. These memory control lines could therefore be comprising semiconductor materials such as silicon or conductive metal layers such as tungsten aluminum or copper.

Figure 3A:
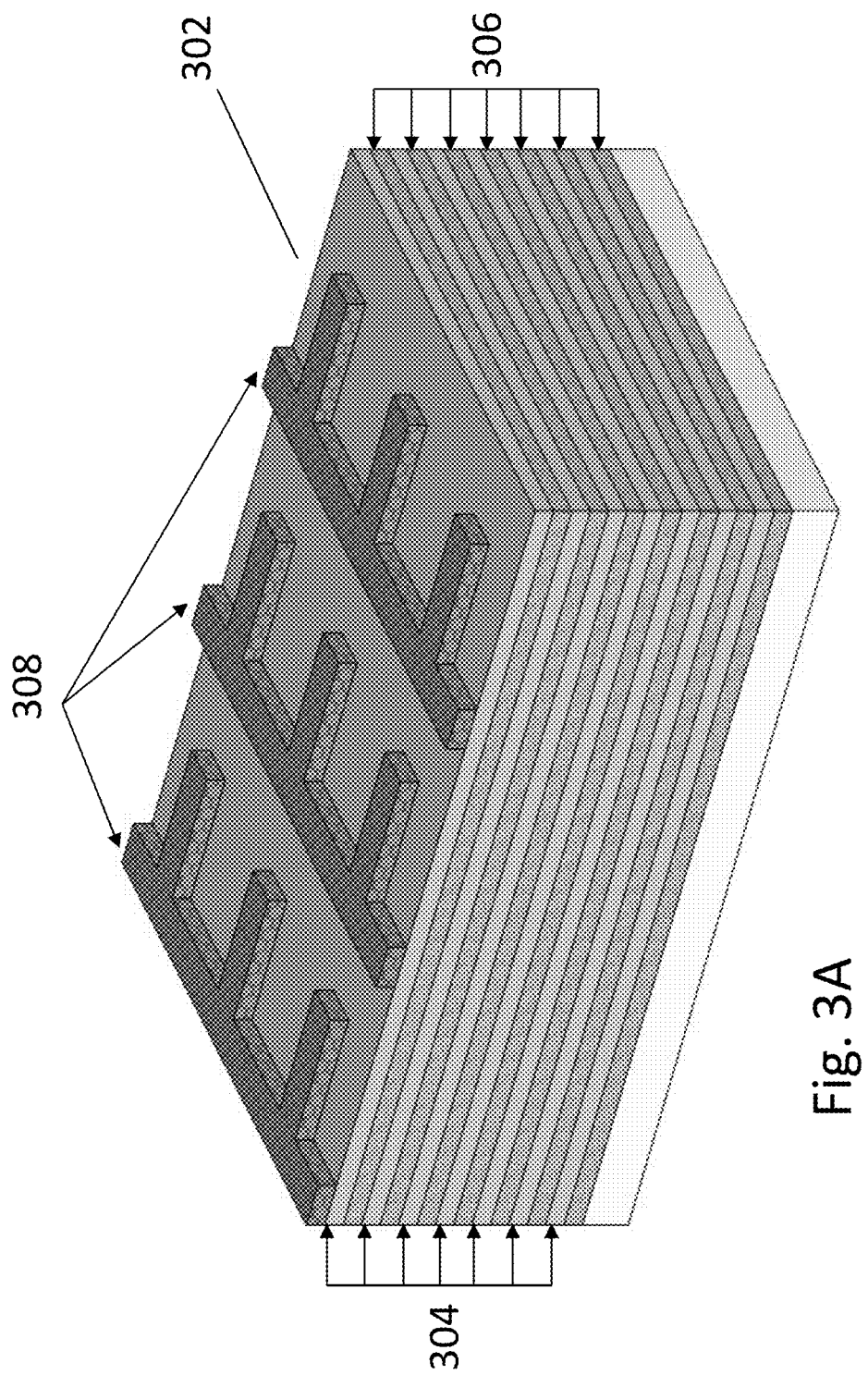
FIGS. 3A-3P are example illustrations of the formation and structure of a floating body 3D DRAM memory.

FIG. 3A illustrates a starting multilayer structure 302, comprising p-type or n-type silicon 304 and isolation or sacrificial layer in-between 306 formed by many of the processes presented herein. A hard mask 308 such as silicon nitride may be patterned on top for the following etch step. As been presented herein an important advantage of these 3D memories flow is the use of one lithography step to be affecting multiple layers. Many of the memory flows will utilize this concept.

Figure 3B:
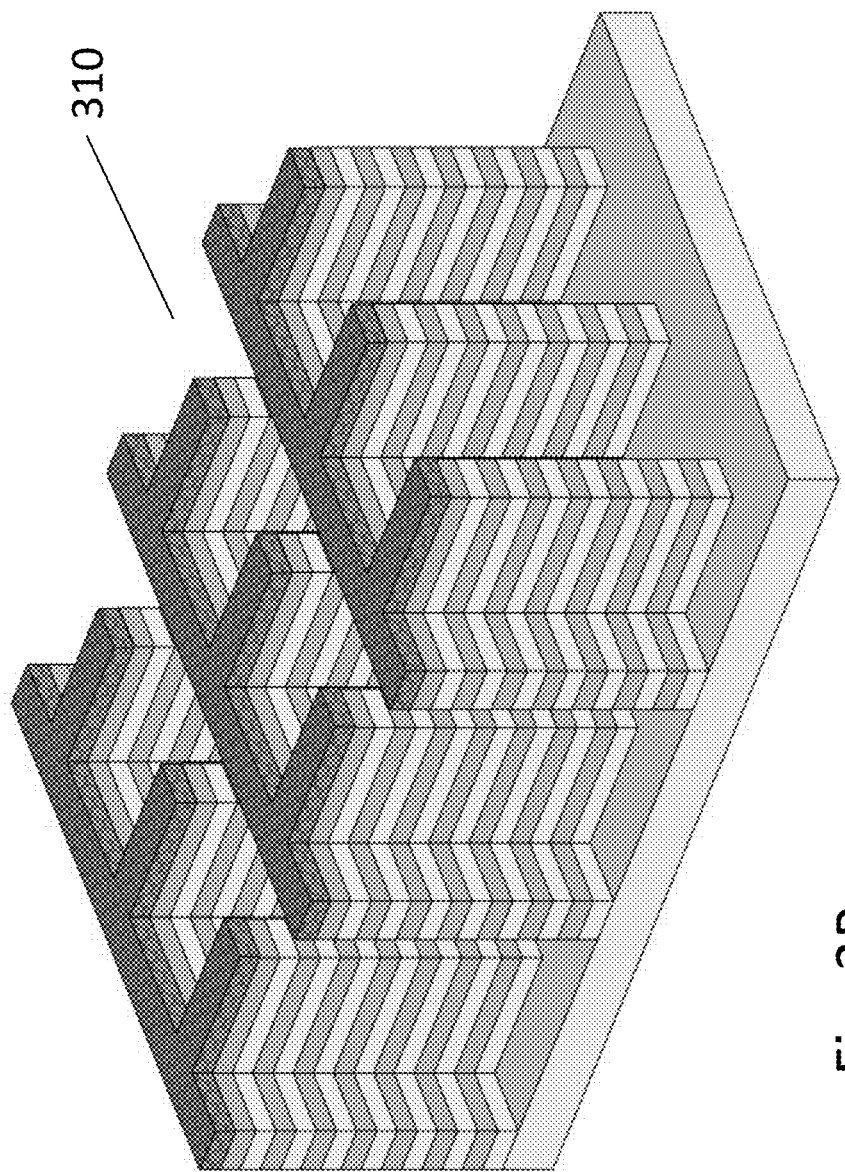

FIG. 3B illustrates the multilayer structure 310 after an etch step.

Figure 3C:
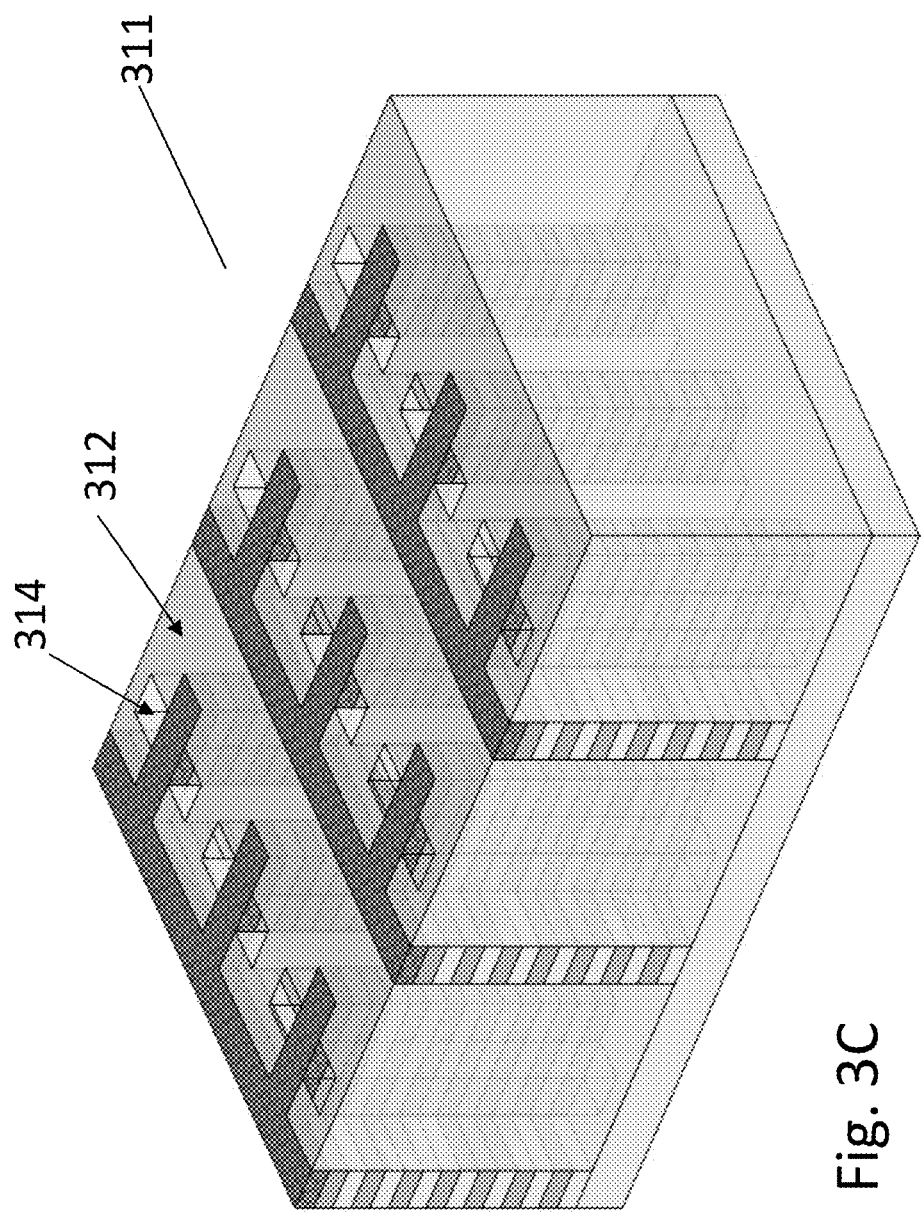

FIG. 3C illustrates the structure 311 after deposition of isolative material 312, such as $SiO_2$, and etching holes 314 for the following step of gate stack.

Figure 3D:
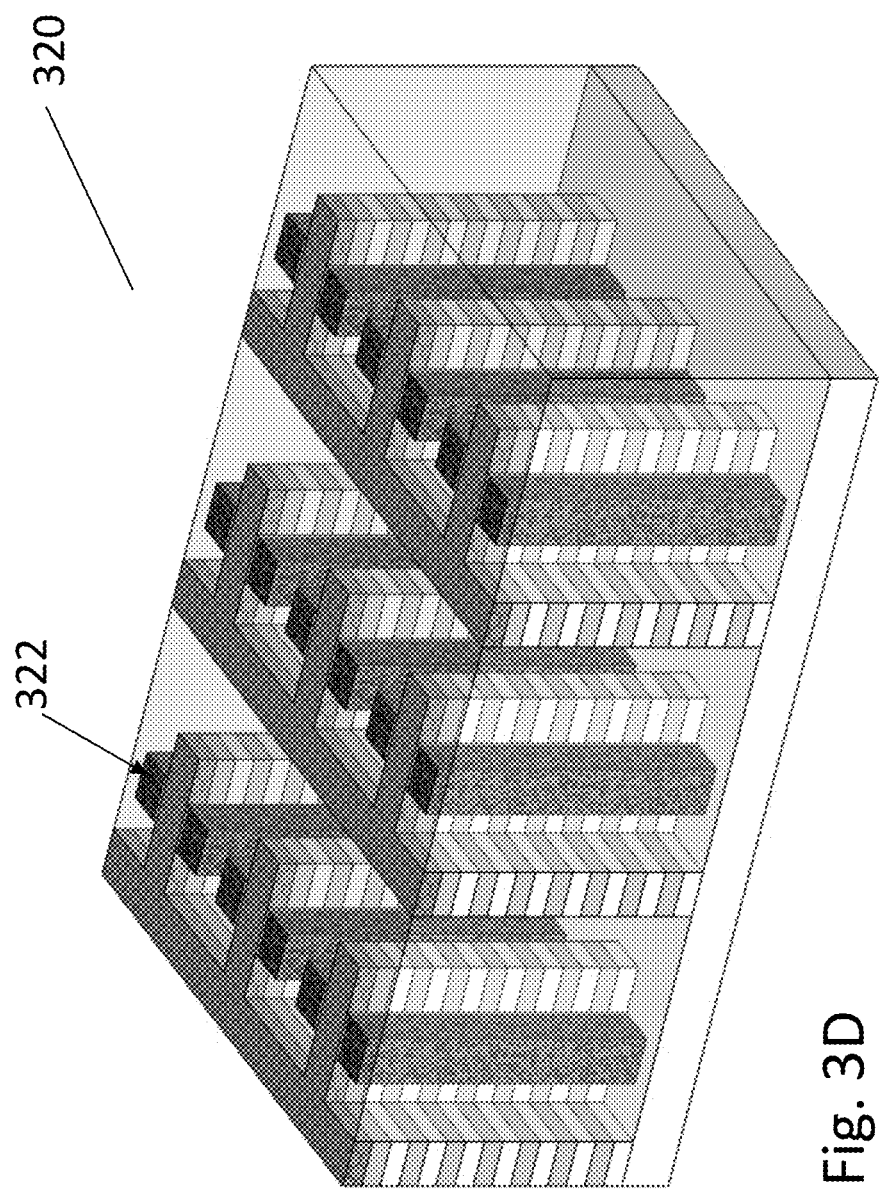

FIG. 3D illustrates the structure 320 after forming the gate stack 322. The gate stack could be formed by CVD or ALD of first a gate oxide and then gate material which could be metal or in-situ doped polysilicon. The gate formation could be two independent side gate column as illustrated or tied double gate or even gate all around. For the gate all around, it may require that the step of etching the gate holes 314 will include a non-directional isotropic etch step to etch the in-between layer to allow the following gate all around formation.

Figure 3E:
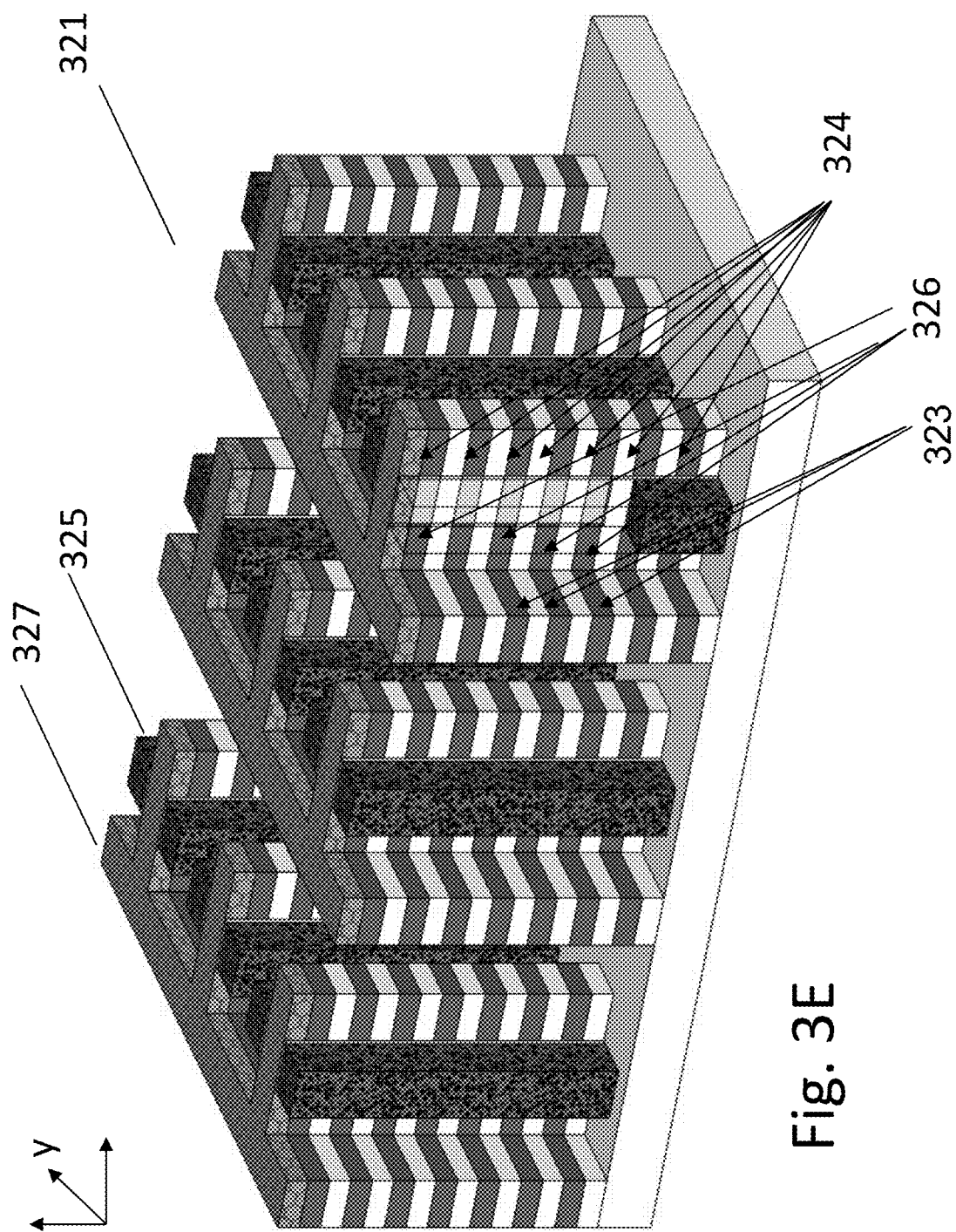

FIG. 3E illustrates the structure 321 after stripping off the dielectric 312, and then a step of diffusion doping to form the source 324 regions and the drain regions 326. The source regions 324 would be connected to the source line ("SL") and the strip of the drain regions 323 would become later part of the bit-lines ("BL"). Alternatively, the SL and the BL can be used interchangeably depending on the array arrangement. These diffusion doping will convert all the exposed silicon areas that are not protected by the gates structures 322 from p type to n+ type or n type to p+ type. This will form transistors in the small pin structures 325, while the common strips 327 would serve as simple conductor acting as the bit-lines or the source-lines for the memories that could be formed by the pins transistors 325.

Figure 3F:
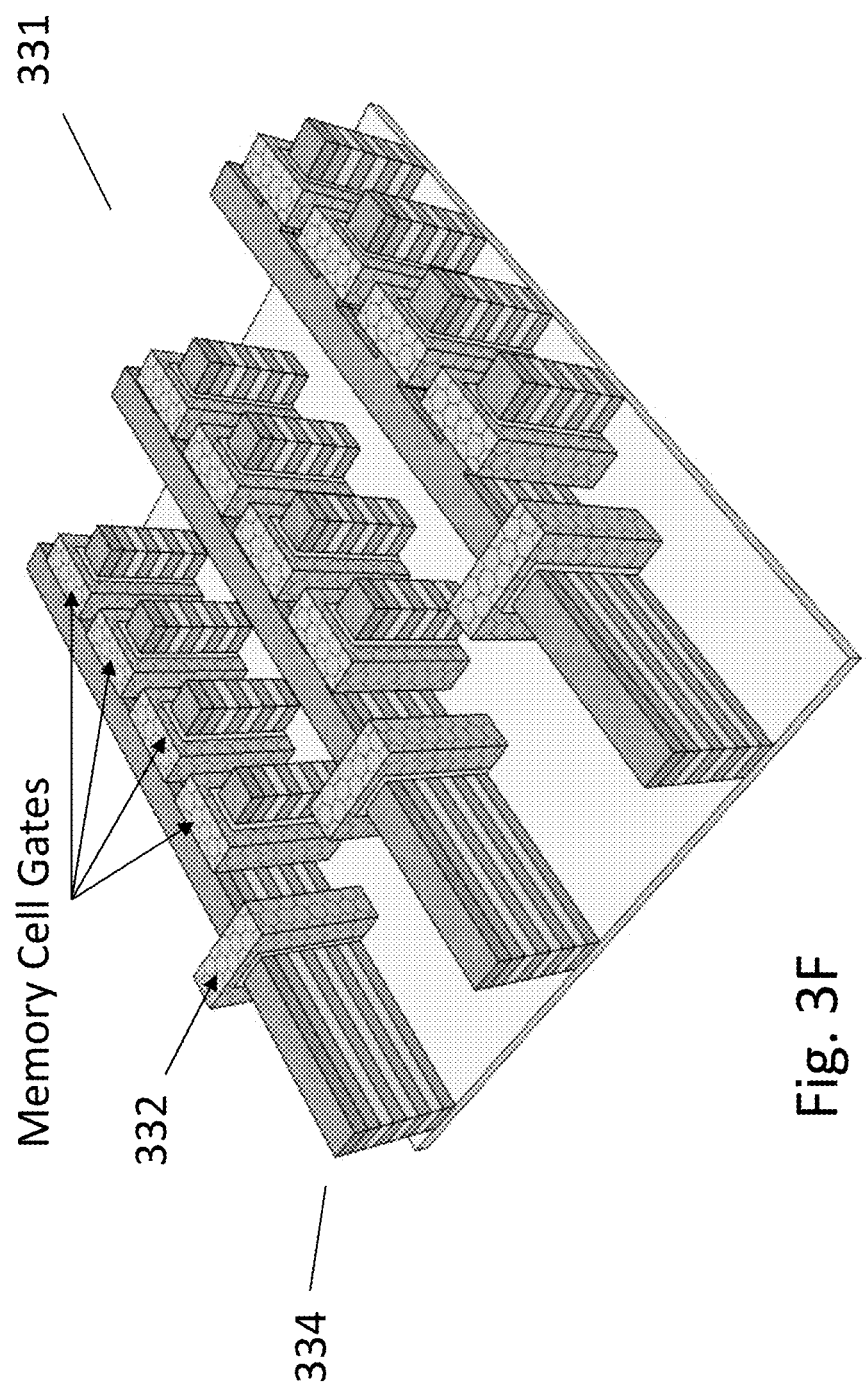

FIG. 3F illustrates the structure 331 with extension of the bit lines 334 which could be used for a stair-case per layer access. An optional select gate 332 could be used to select memory branch.

Figure 3G:
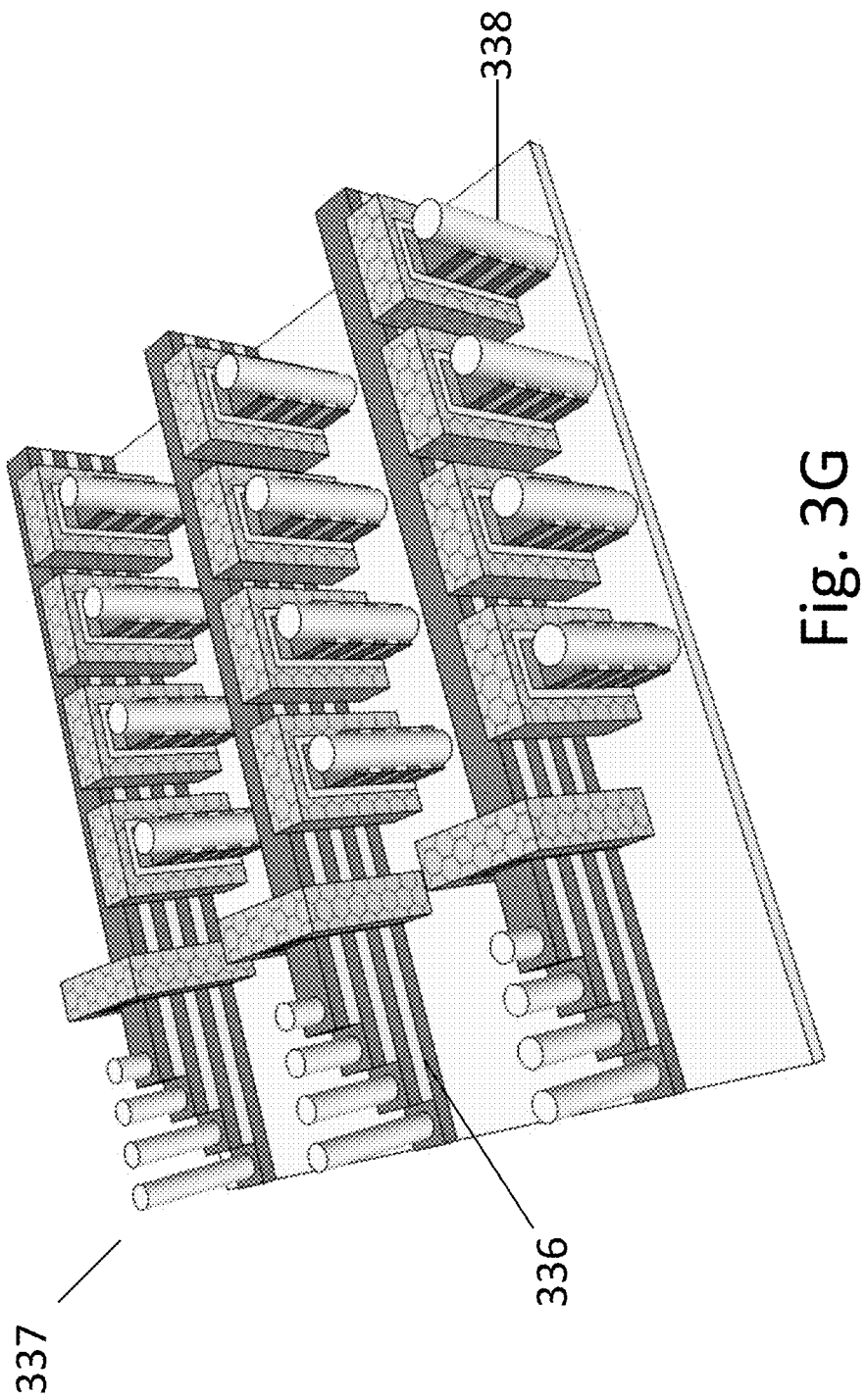

FIG. 3G illustrates the structure 331 after forming staircase 336 of the bit line extension 334 and after forming the vertical connections to the bit-lines 337 and to the transistor sources 338.

Figure 3H:
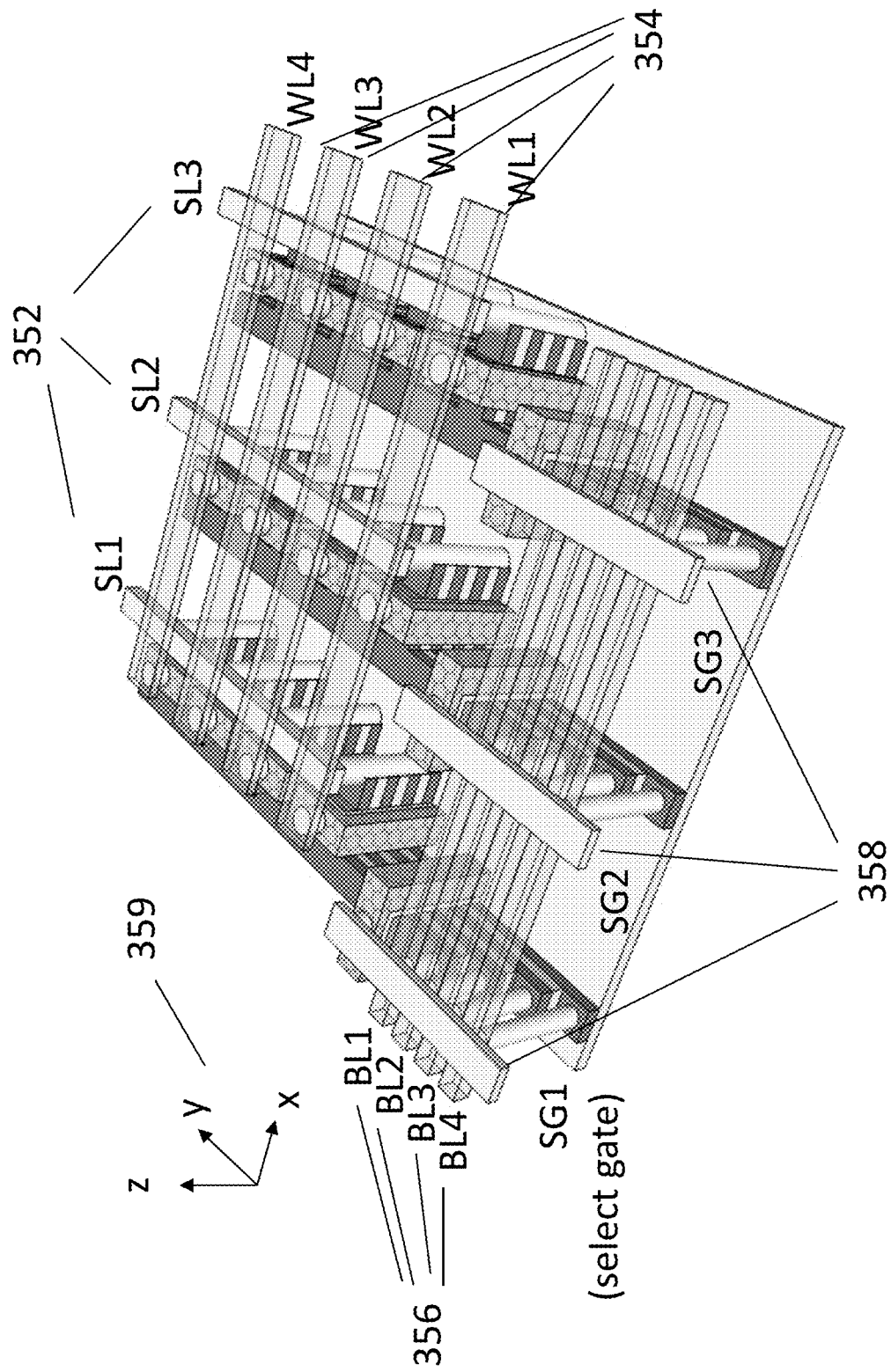

FIG. 3H illustrates the structure after adding the grid of connections. The illustration is one option for structuring bit-lines 356, select-gate lines 358, source-lines 352 and word-lines 354. We can call the direction x, y, z as illustrated by the corner direction 359. These connectivity structure allow selecting a specific cell such that select gate lines 358 allow the selecting the 'x' location by selecting the 'x' branches, the word-lines 354 select the 'y' location by selecting the gates in 'y' direction, and the bit-lines 356 select the 'z' location by selecting the drain in 'z' direction. The optional select-gate lines 358 allow selecting of the bank of transistors in the bank along 'x' direction.

Figure 3I:
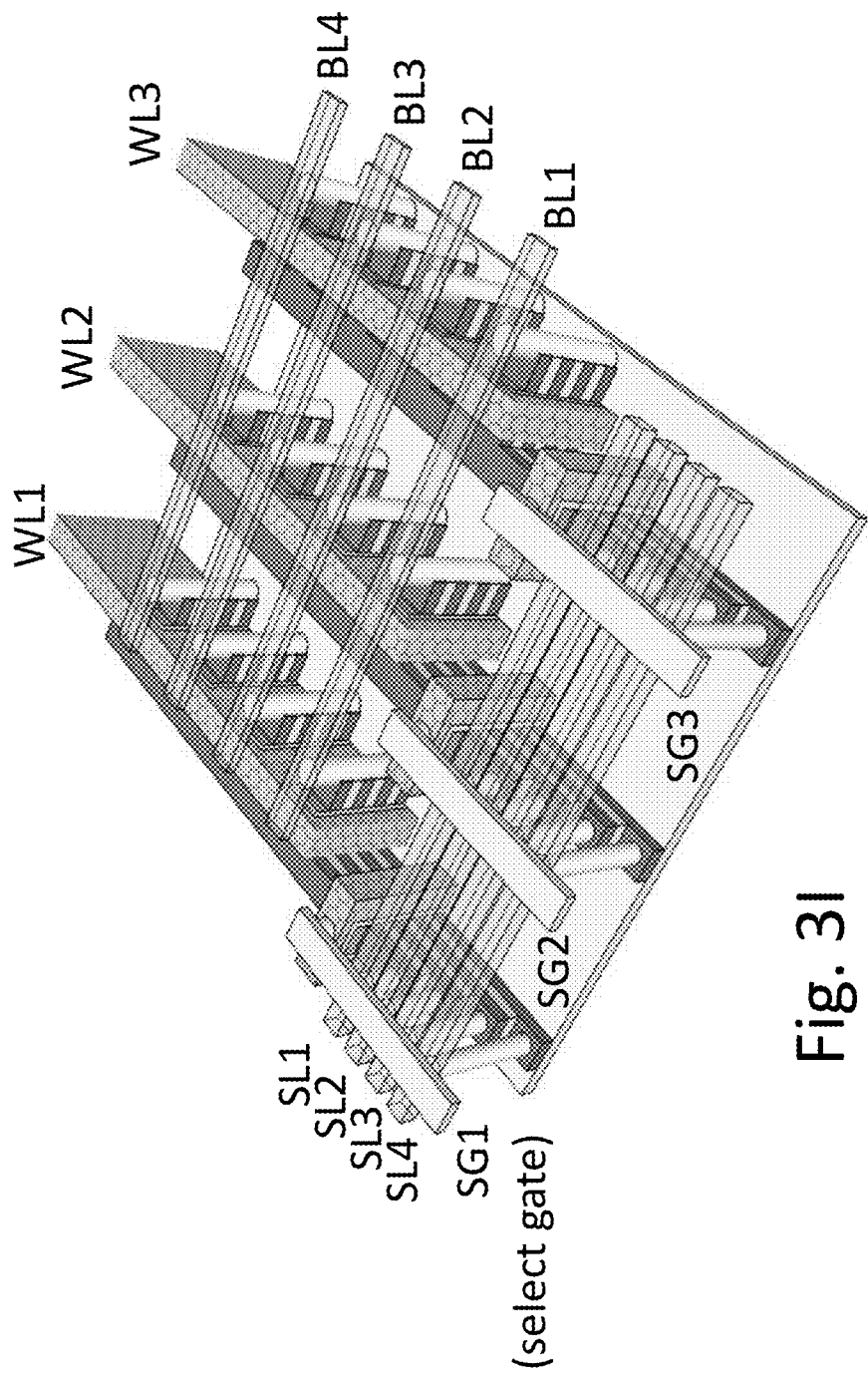

FIG. 3I illustrates the structure after adding the grid of connections with an alternative structure of word-lines and bit-lines. The gate material is common along the multiple pins, which would serve as simple conductor acting as the word-lines.

Figure 3K:
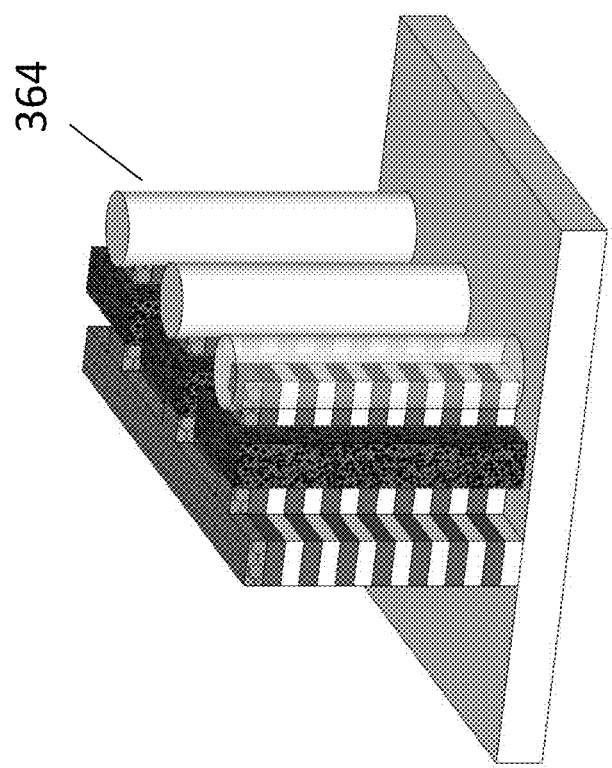
Figure 3J:
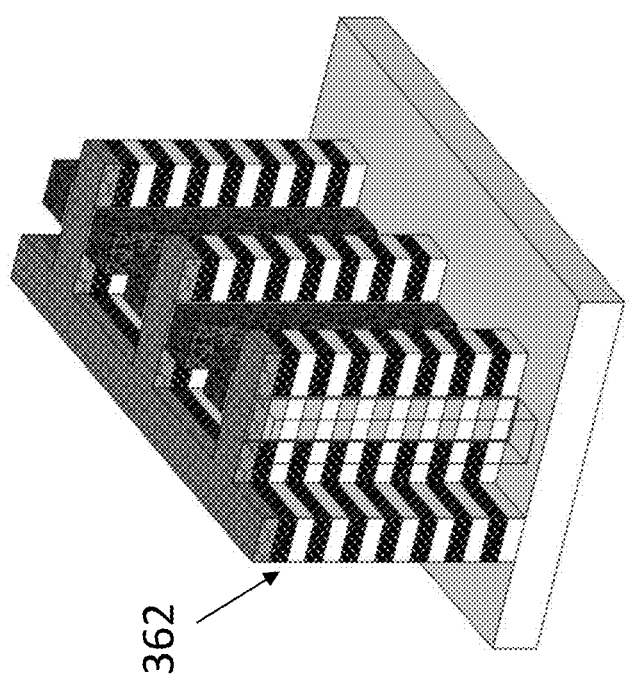

FIG. 3J illustrates optional silicidation of the bit lines 327 to reduce their resistance. First only the areas designated for silicidation 362 are being exposed while all other areas are being protected by photoresist or isolation oxide. Then a metal such as Ni, Ti, Co, or other known in the art material, is deposited making contact with the bit lines 327 side walls 362. Then thermal reaction is achieved by the use of Rapid Thermal Anneal (RTA) or laser anneal. Then the unreacted metal is etched away.

FIG. 3K illustrates a 3D memory of 3 column structure. The transistors source forming the memory cell are connected by vertical line 338 of FIG. 3G connecting with the transistors source side wall. It is enlarged view at FIG. 3K. As alternative to deposition this conductive vertical column 364 a selective epitaxy process could be used to form this vertical connection.

Figure 3L:
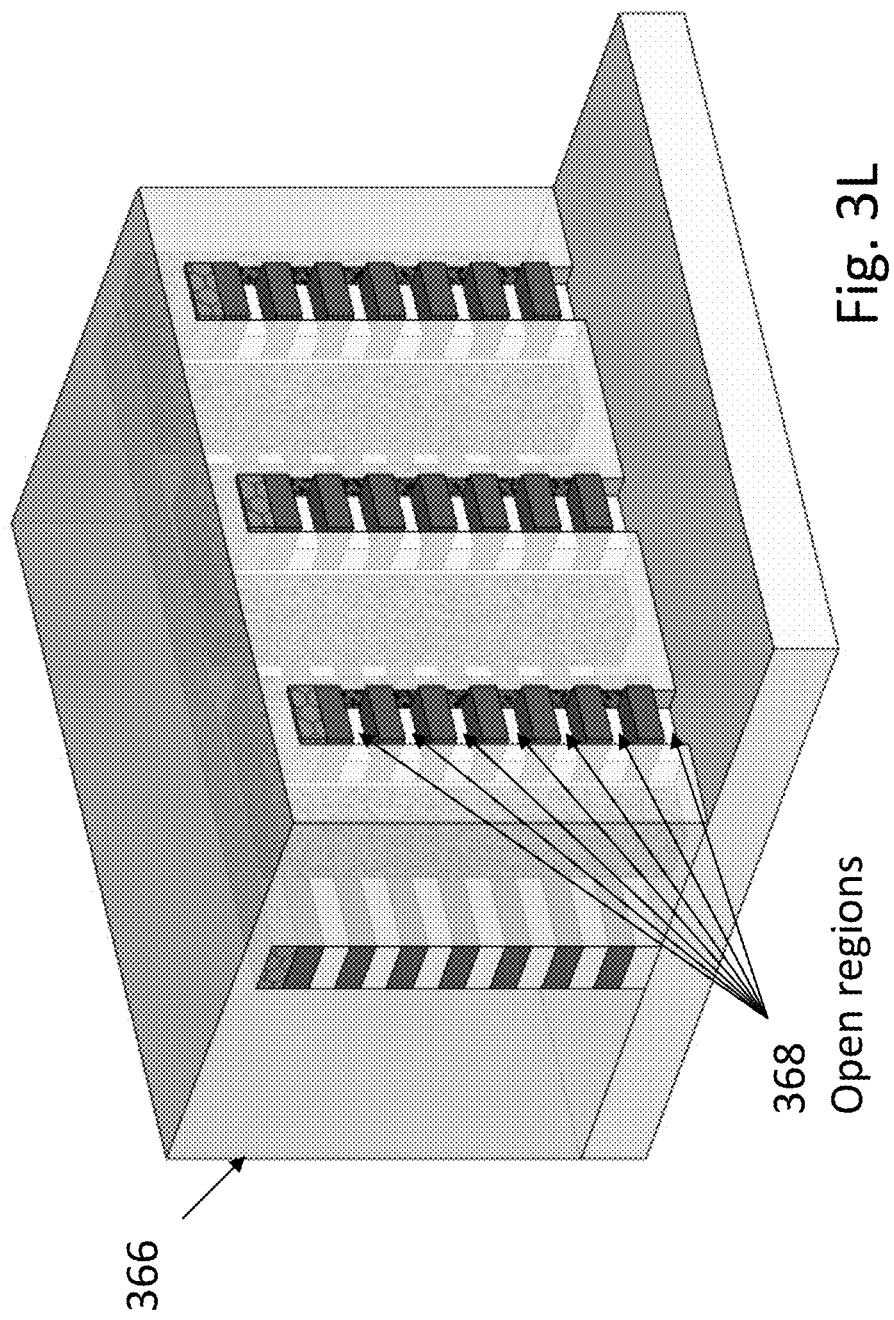

FIG. 3L illustrates the structure with protective cover of oxide or other protective material 366 and trench opening the side walls of the memory transistors source 368. The opening of the trenches 366 could include a step for selective removal of part of the vertical isolation between the sources of the stack transistors.

Figure 3M:
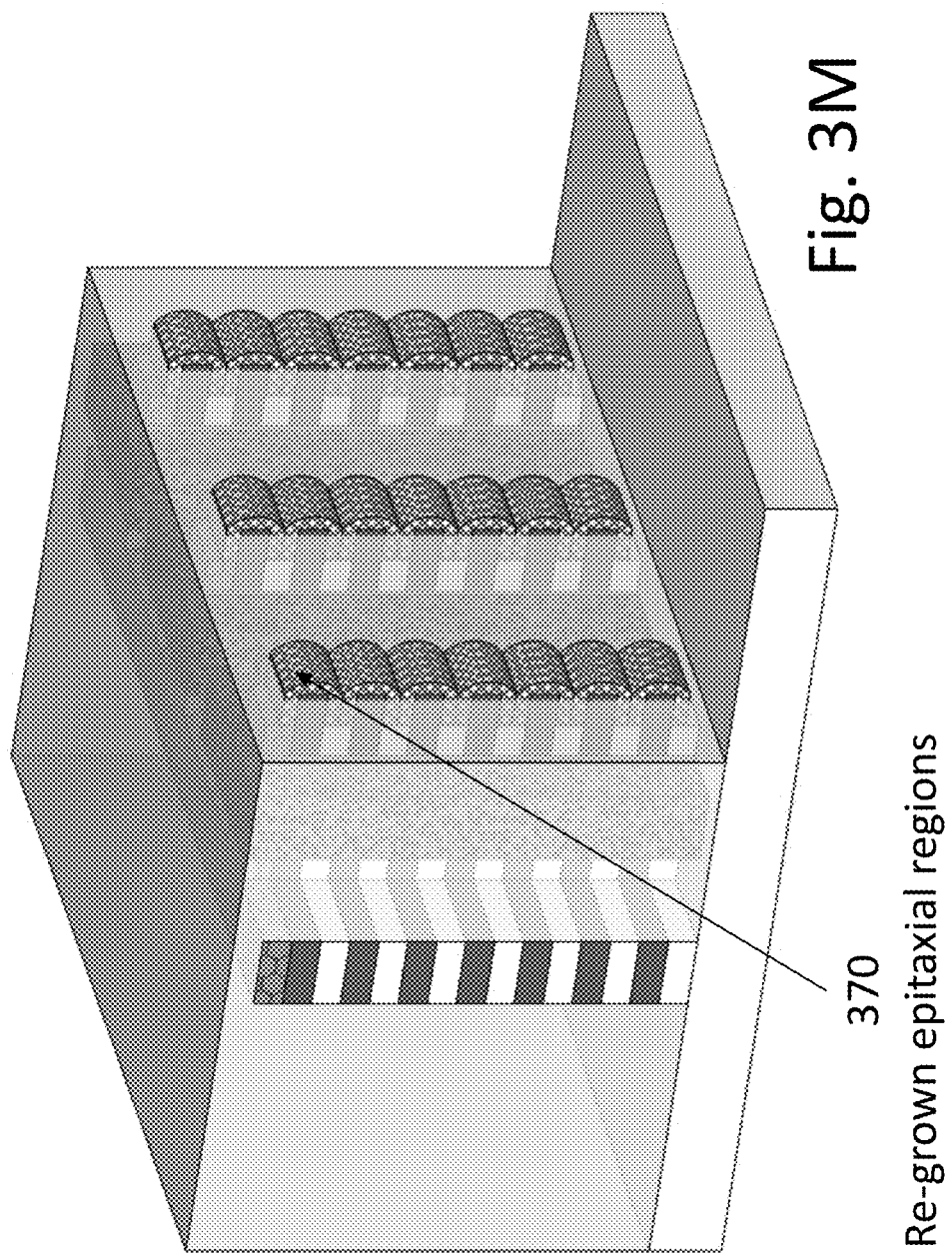

FIG. 3M illustrates the structure after a step of epitaxial growth for forming a vertical column connecting all the sources in a stack 370. These columns could be silicide to further improve their connectivity.

Figure 3N:
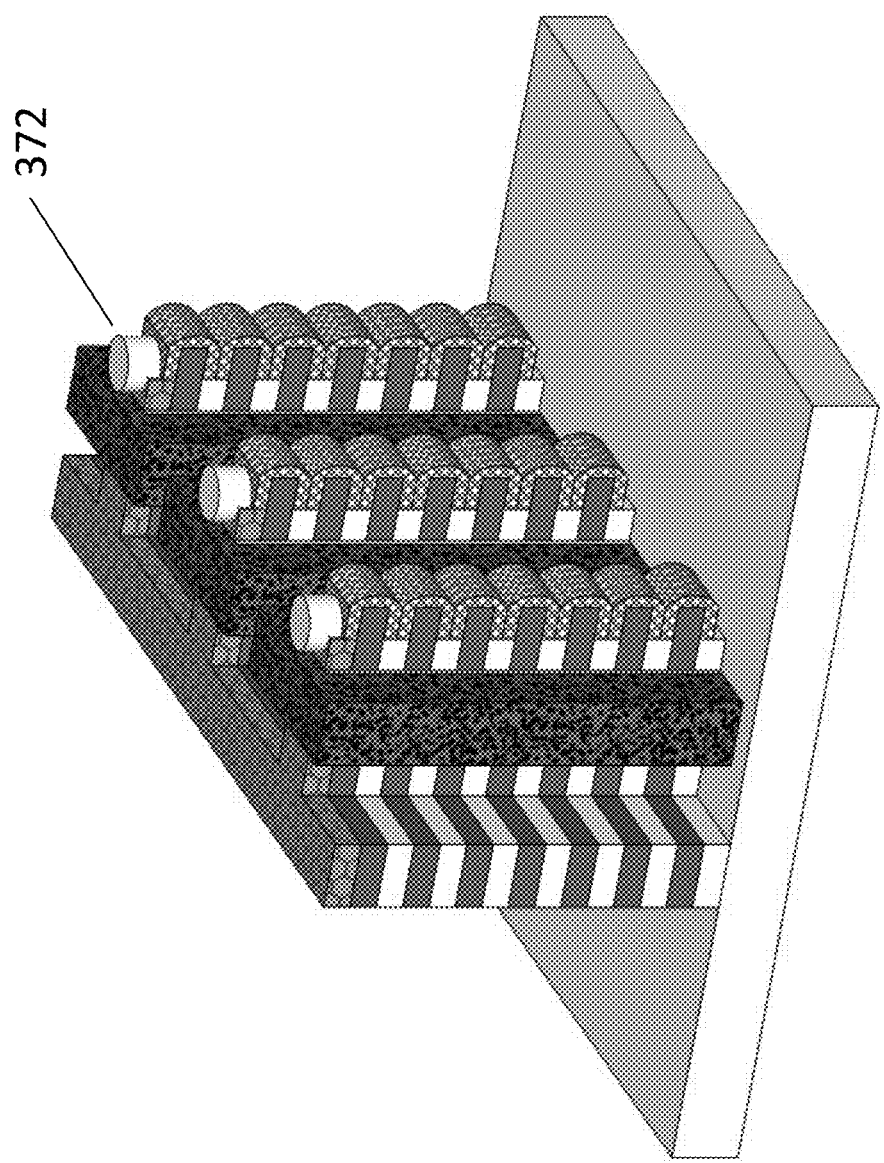

FIG. 3N illustrates the structure after adding contacts 372 from the top.

The illustrations in FIGS. 3A-3N were made for ease of drawings and understanding. Persons in the art would understand that techniques common in memory design could be used to increase memory bit density. Such as mirroring the transistors along the bit lines sharing the bit lines for right side transistor and left side transistors and mirroring across source side sharing the vertical source lines. Such structure is been illustrated in U.S. Pat. No. 8,114,757, as related to FIGS. 30A-30M and FIGS. 31A-31K.

FIG. 3O illustrates another alternative where the vertical line connecting the source side of the stack transistors are shared 376 but the horizontal in silicon bit-lines are not shared 374 and 375. One advantage of not sharing the bit-lines 374 and 375 is the option to add silicidation as was described in respect to FIG. 3J.

Figure 3P:
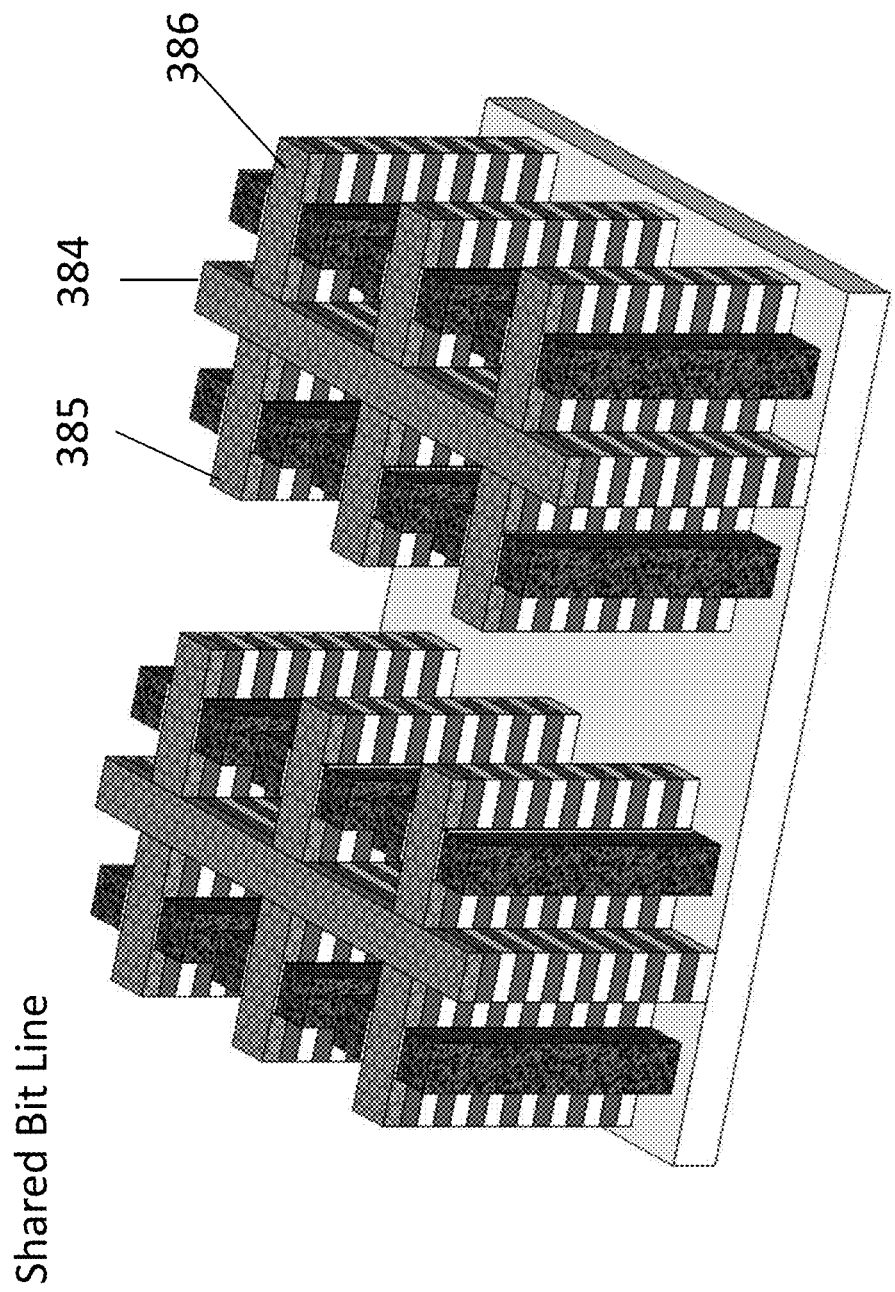

FIG. 3P illustrates another alternative where the horizontal bit lines of the stack transistors are shared 384 but the vertical line connecting the source side of the stack transistors are not shared 375 and 386.

One disadvantage of floating body memory such as the one presented in respect to illustrations FIG. 3A-3P herein is the need to refresh the charge stored at the transistor floating body. This disadvantage exists in all DRAMs and it is even more with floating body due to the relatively lower capacity of the floating body. A 3D memory using stable two states one transistor memory structure by the used of buried well also called back-bias has been presented before in at least U.S. Pat. Nos. 8,379,458 and 8,902,663 and in provisional application 62/007,280, incorporated herein by reference.

Figure 7A:
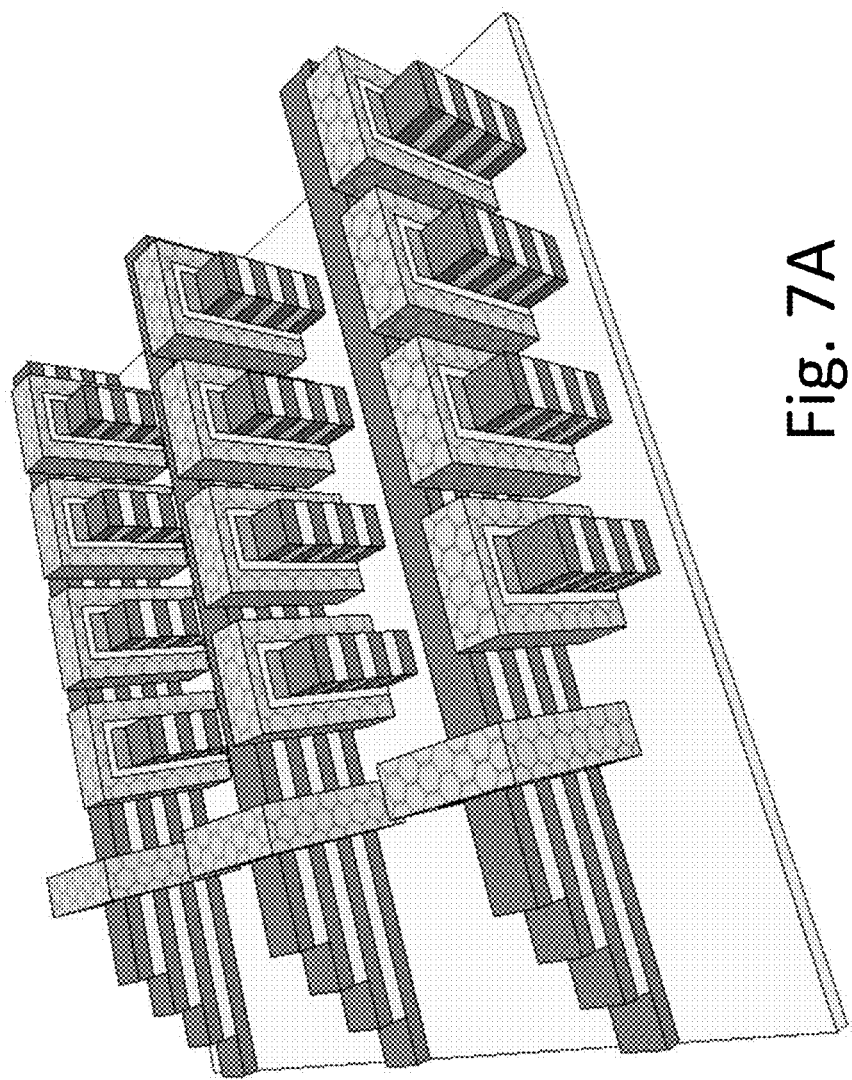
FIGS. 7A-7E are example illustrations alternative staircase structures that may be used in 3D structures.
Figure 7B:
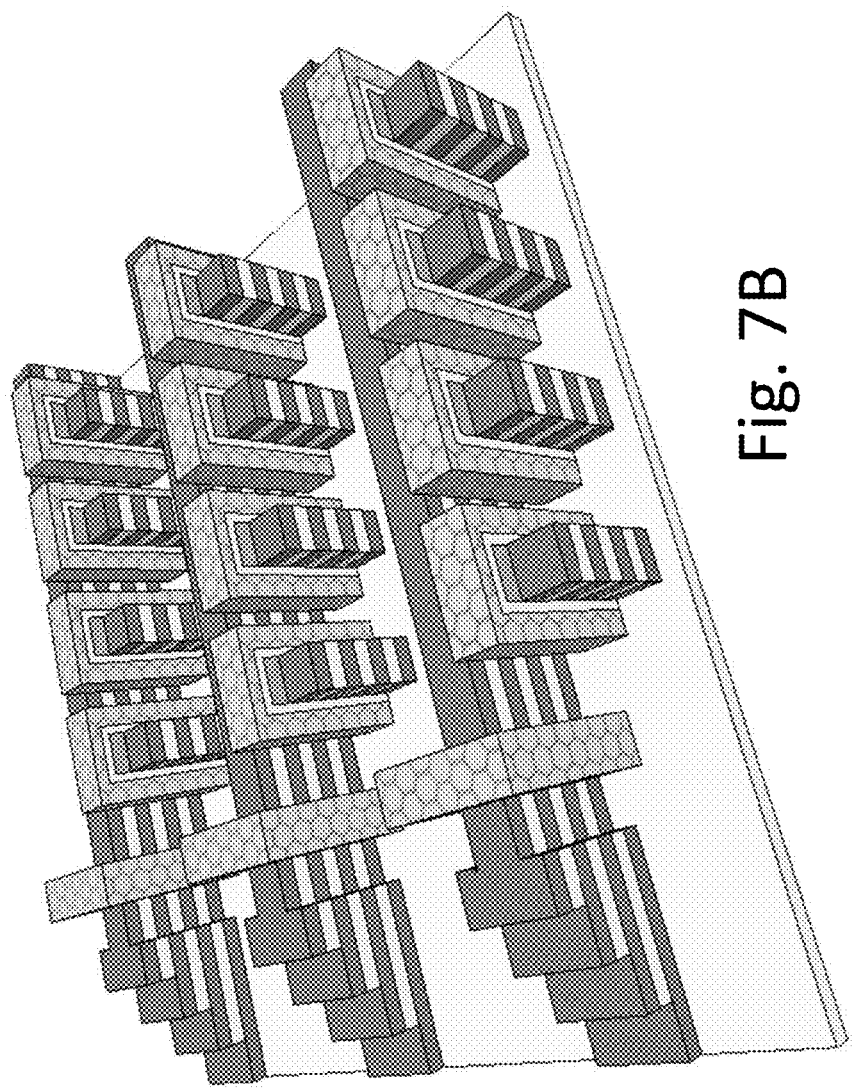
Figure 7C:
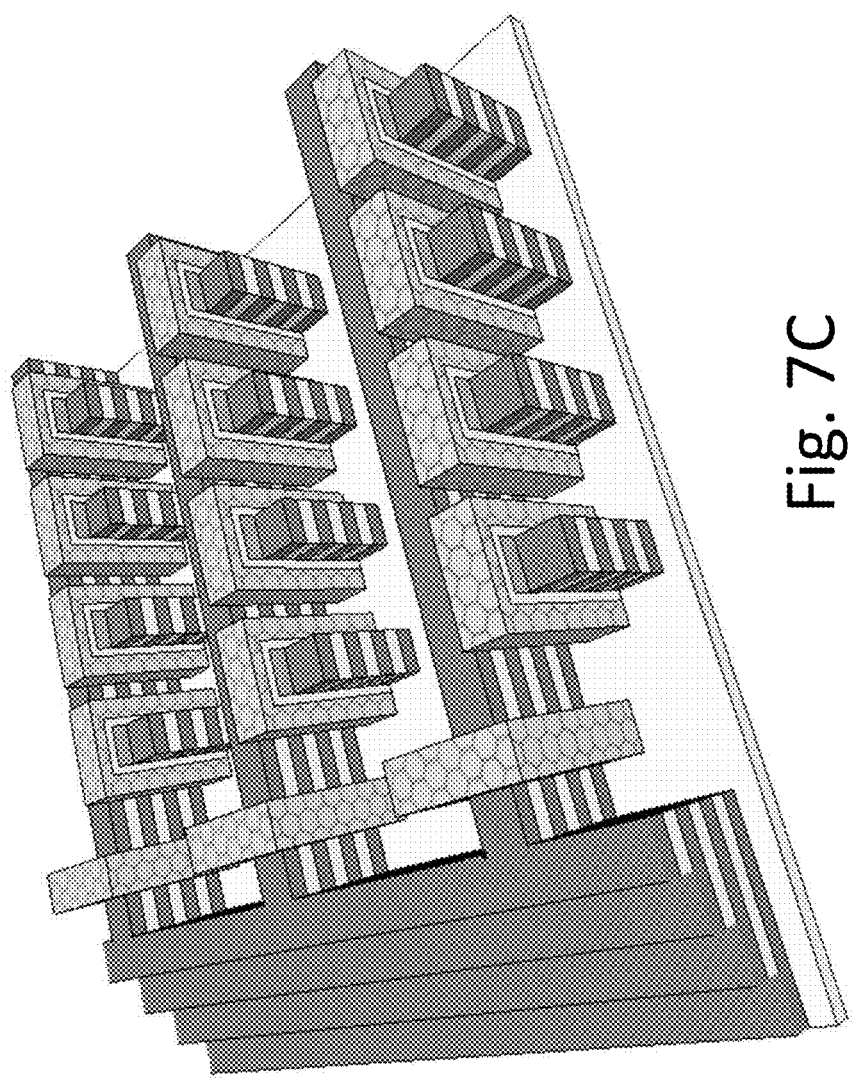
Figure 7D:
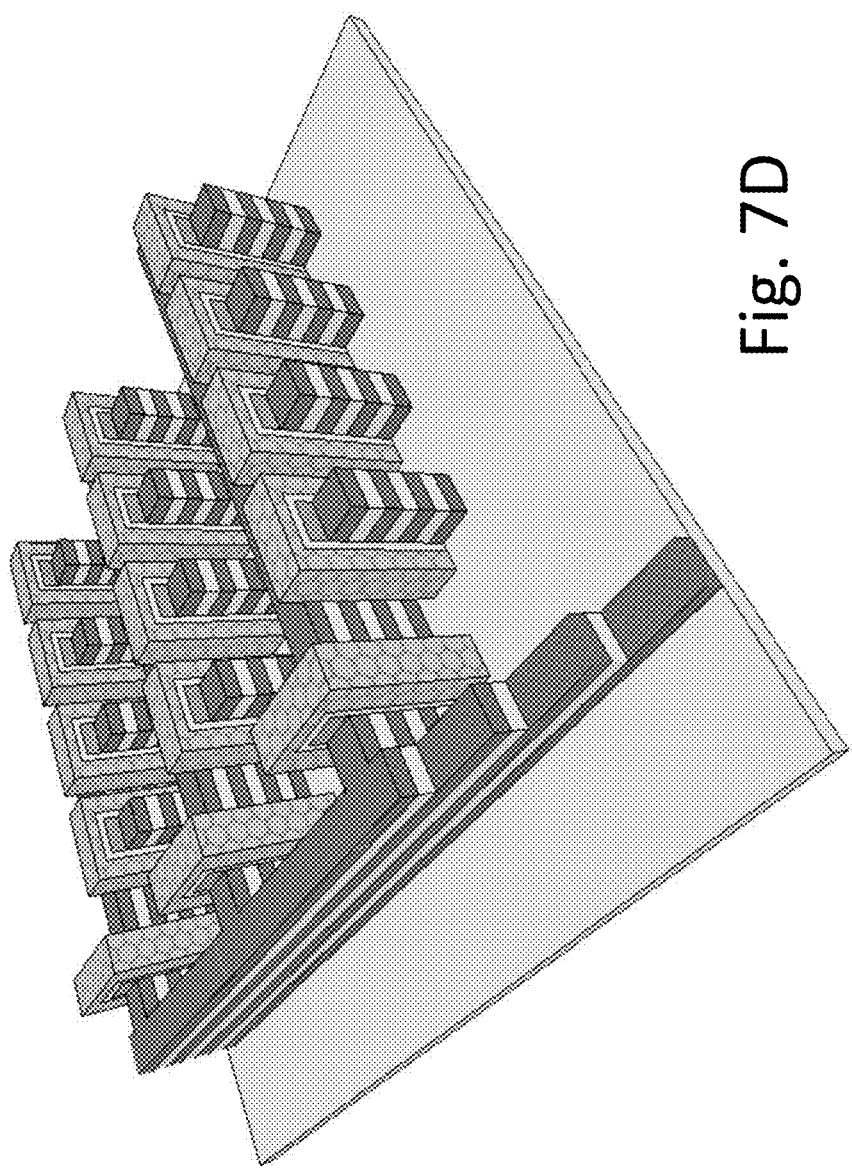
Figure 7E:
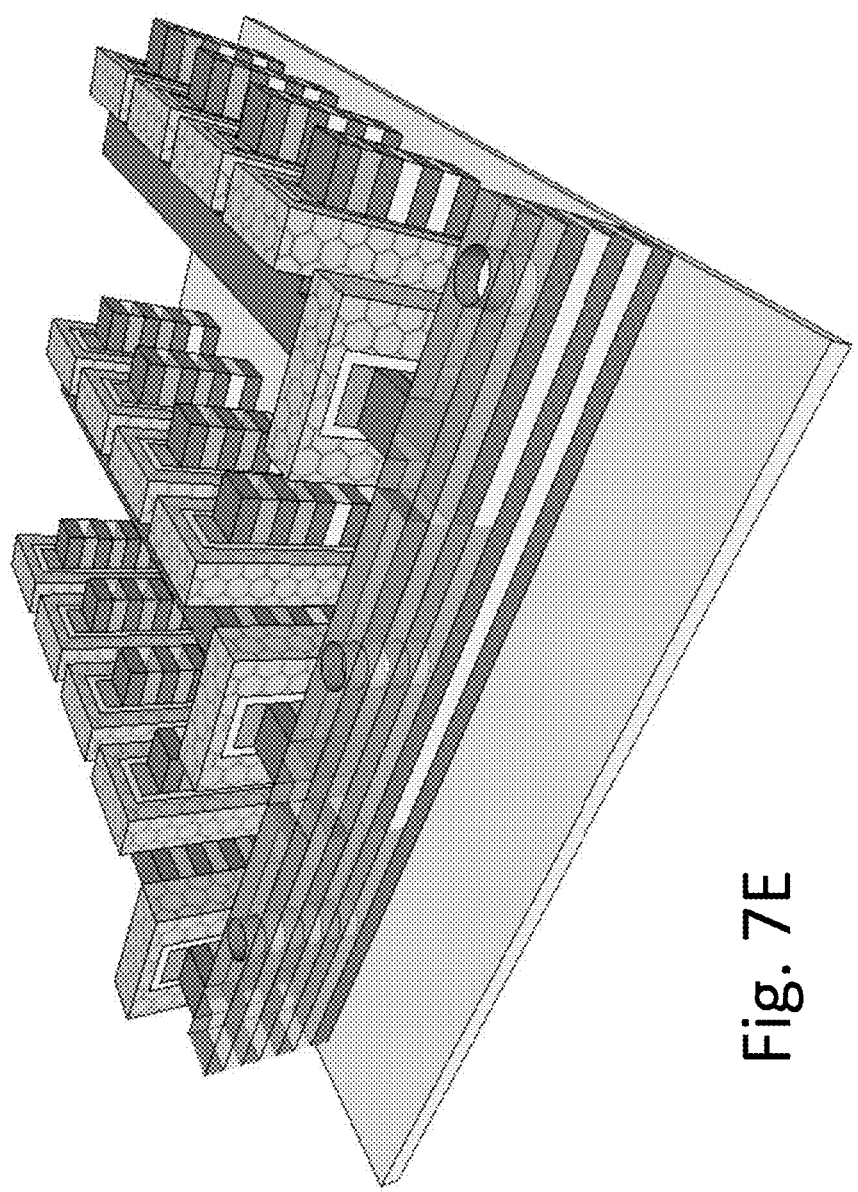

In the following an alternative volatile 3D memory flow to the one presented in U.S. Pat. No. 8,902,663 in respect to illustrations FIGS. 7A-7N, as been presented.

Figure 4A:
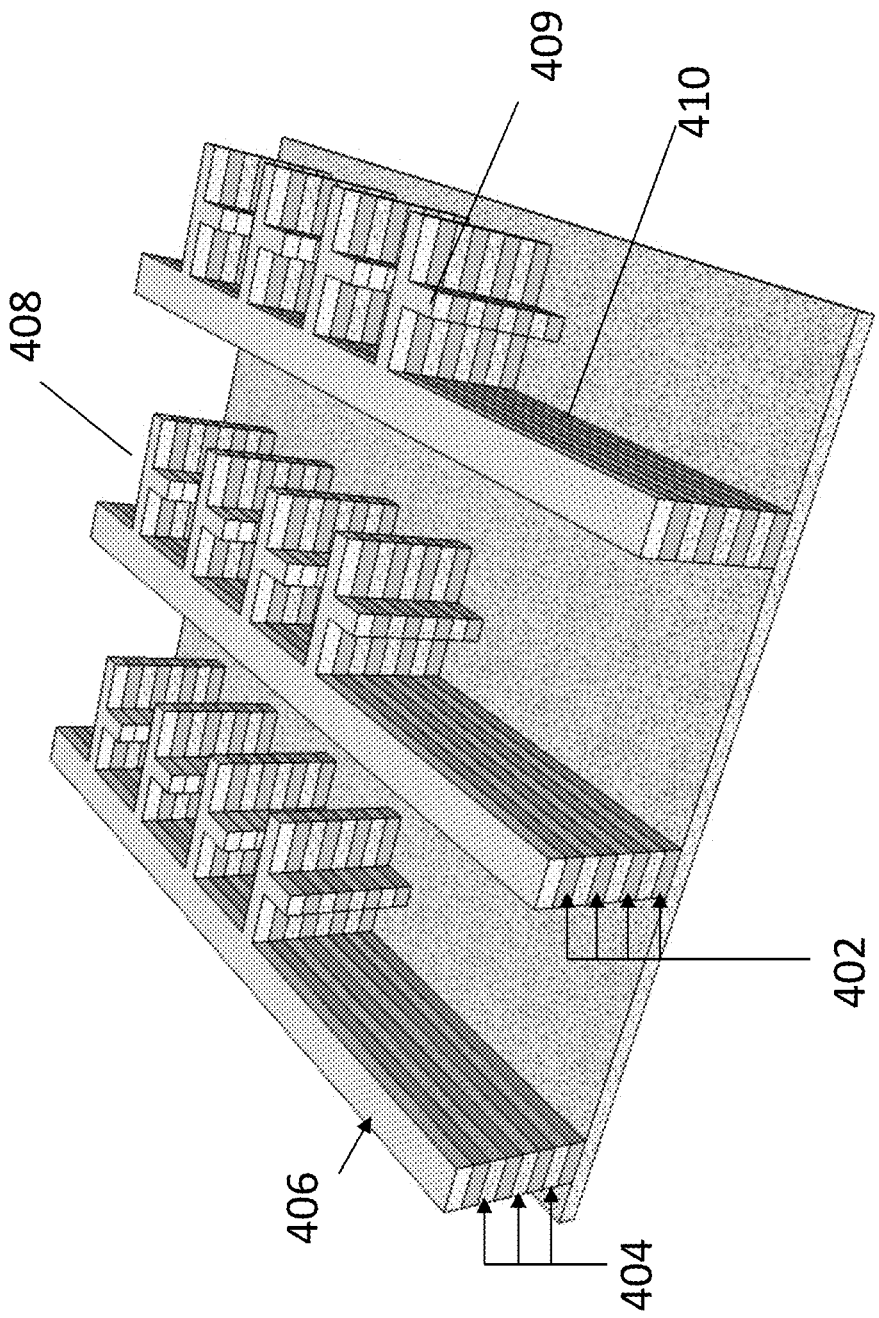
FIGS. 4A-4F are example illustrations of the formation and structure of a stable two states one transistor memory structure 3D DRAM memory.

FIG. 4A illustrates a starting multilayer structure processed in similar way to the one illustrated in FIG. 3A-B, having multilayer of undoped or p type-doped silicon 402 with sacrificial or isolating layers in-between 404 patterned using hard mask such as silicon nitride 406 providing stack of future transistors 408 sharing common silicon bit-lines 410. The transistors have middle extensions 409 for the future back-bias or charge injector.

Figure 4B:
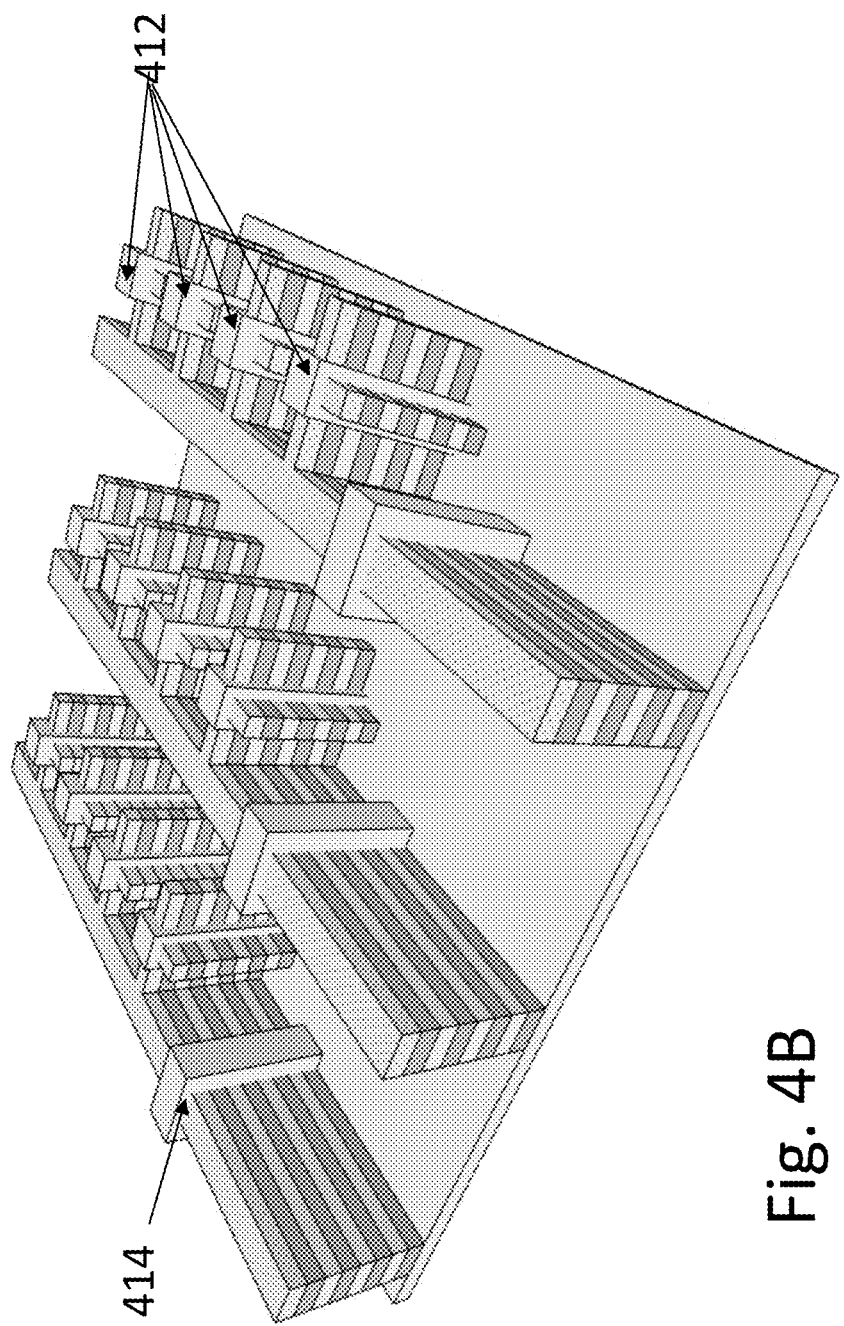

FIG. 4B illustrates the structure after patterning gates. These include the memory cell gates 412 and the bit-lines select gates 414.

Figure 4C:
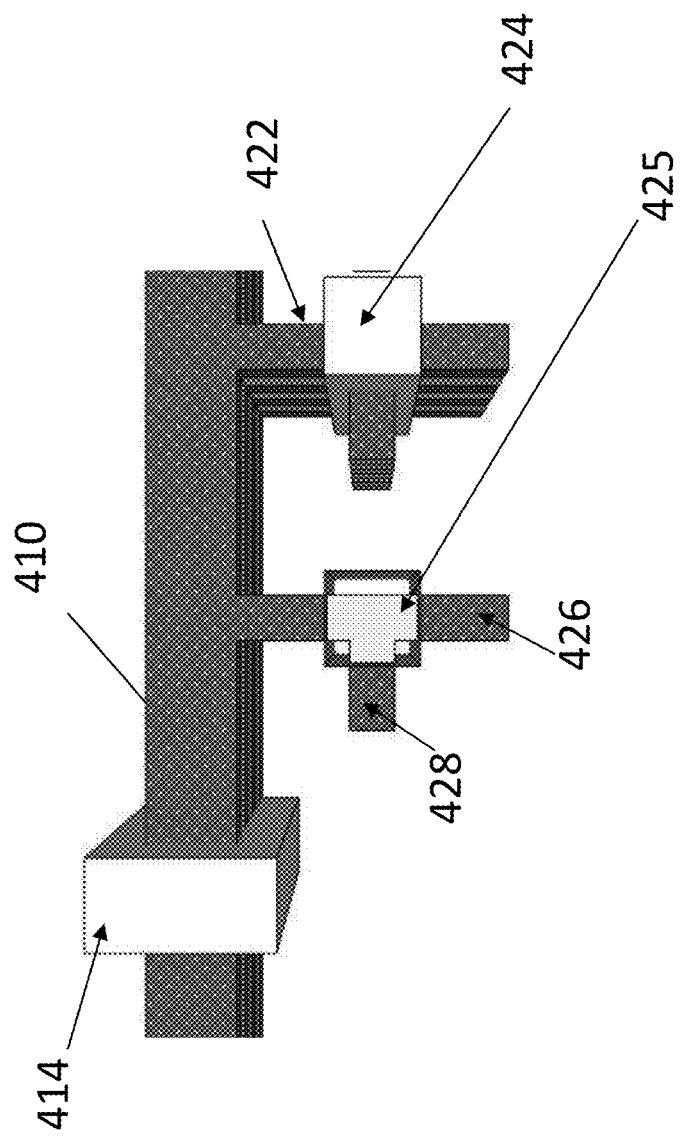

FIG. 4C illustrates the top-viewed transistors structure with more details. The bit-lines 410 have select gates 414 and are common to multiple stack of memory cell 424 transistors drains 422. The transistors other side is the source 426 and the transistor channel has like a T shape extension 428 to be used later to provides the back-bias which is the equivalent of the buried N-well or n-type charge injector for the 2D memory. The channel is well covered by the gate oxide and gate material 424 this help to prevent risk of direct short between n-type regions of the source 426, the drain 422, and the back-bias 428 regions and could help to direct the step of dopant diffusion to the target n regions.

FIG. 4C illustration is showing the gate also as transparent 425 to farther help understanding of the structure. The gate material is also used for self-aligned doping by diffusion converting the p type silicon to n+ silicon in all location not covered by the gate material.

Figure 4D:
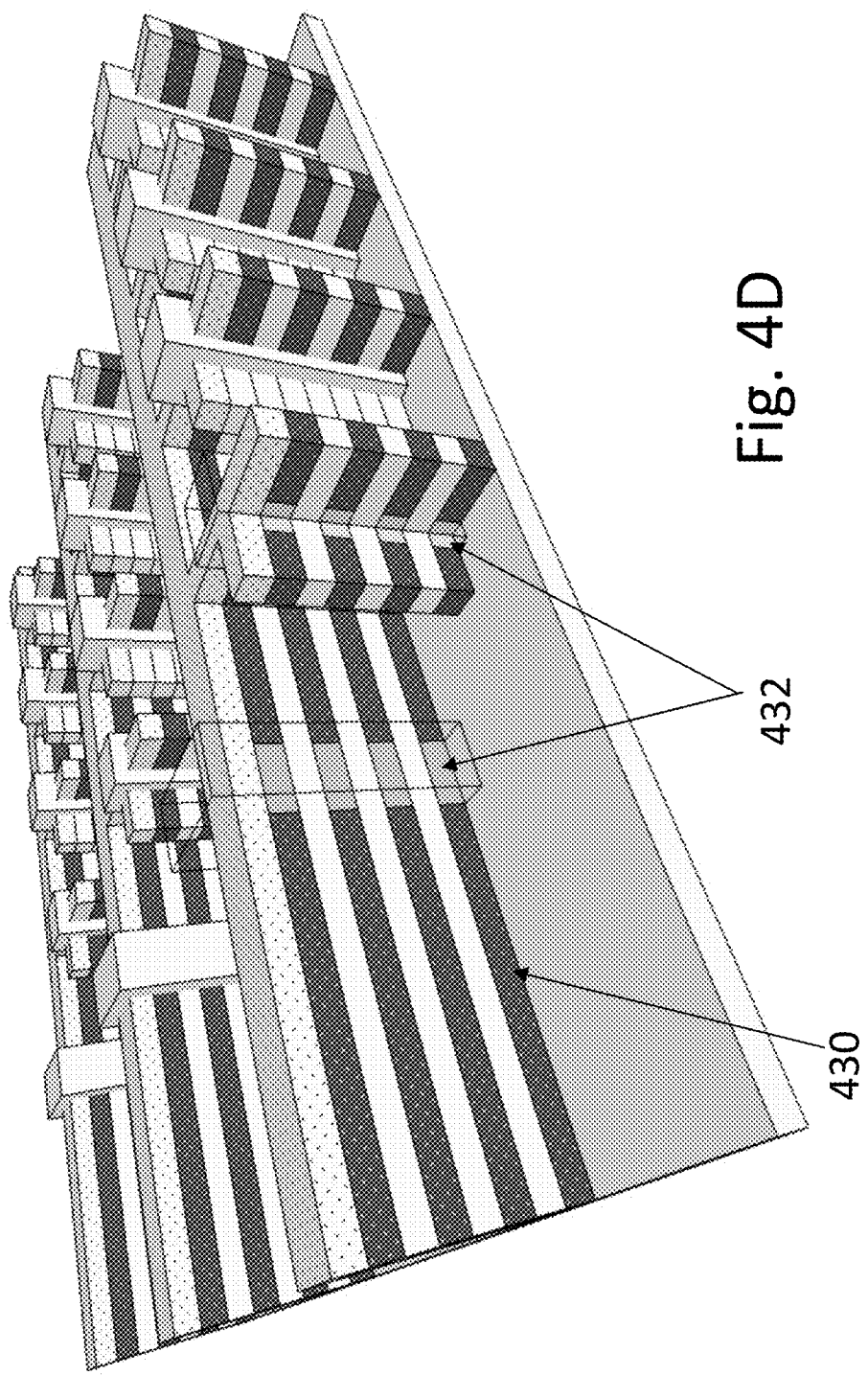

FIG. 4D illustrates the areas being doped 430 to become n+ and the area been protected and left undoped 432 p-type silicon.

Figure 4E:
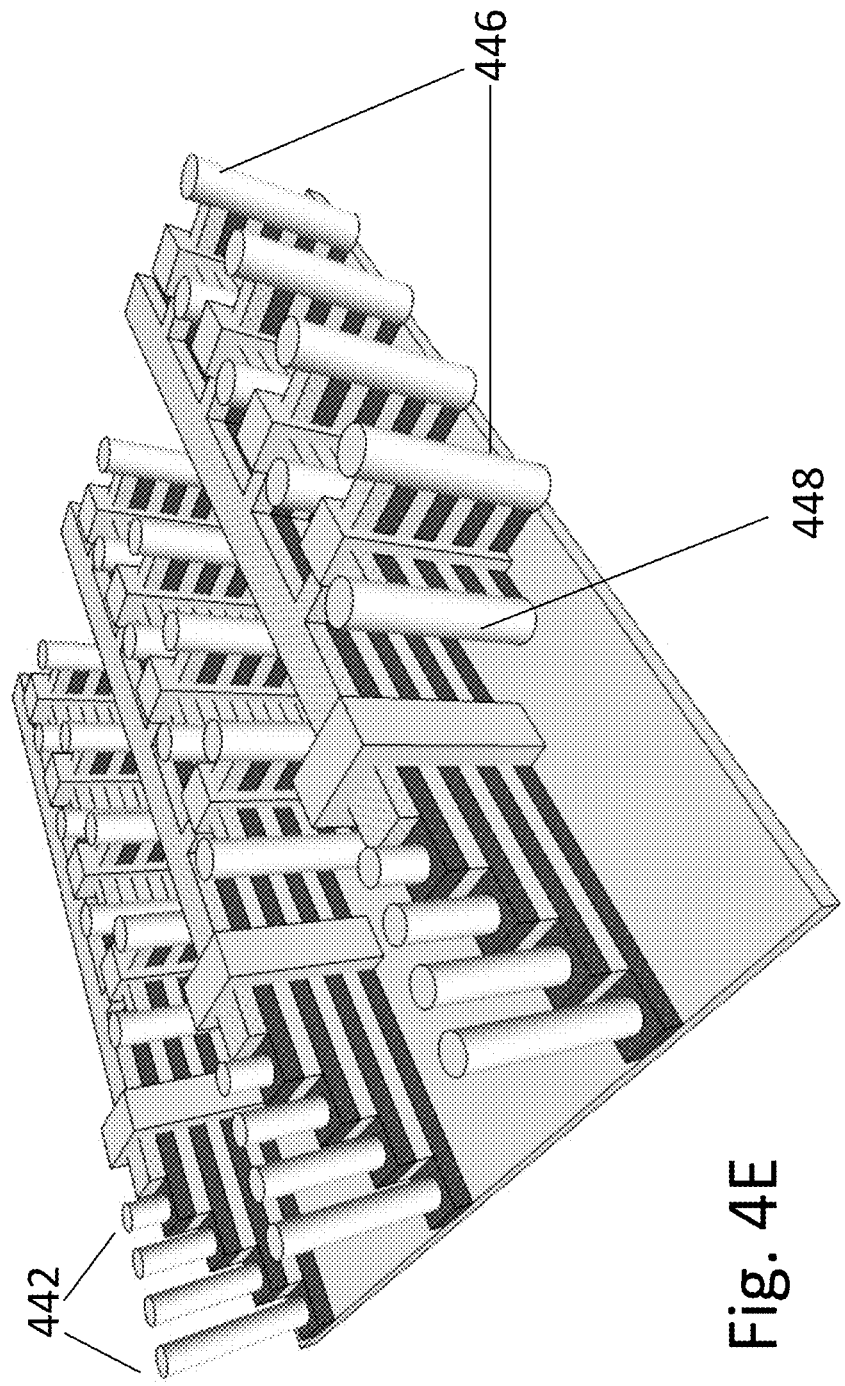

FIG. 4E illustrates the structure after adding the vertical connections. The bit-lines are connected with individual connection per layer using the stair-case technique 442, the source lines are connected with one vertical connection per transistor stack 446 and the back-bias or the charge injector are connected with their own vertical connections 448.

Figure 4F:
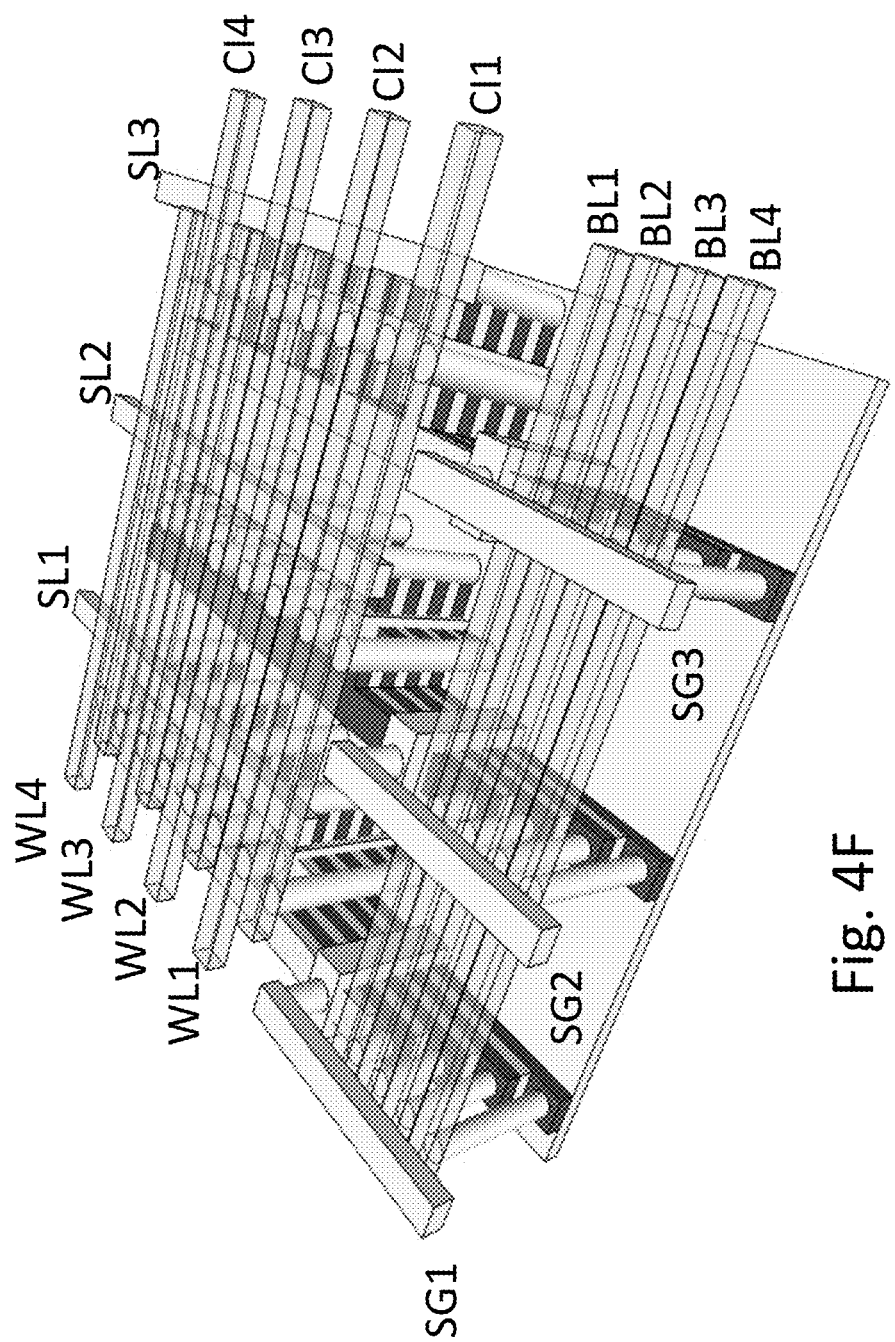

FIG. 4F illustrates after adding the grid of connections. The bit-lines are connected indicated by BL1, BL2, BL3,
BL4, with optional select gates SG1, SG2, SG3, and having the transistors sources connected with source lines SL1, SL2, SL3 and the gates connected with word lines WL1, WL2, WL3, WL4 and the back-bias having their own charge injector lines C11, C12, C13, C14. Other option exist for the formation of such memory control lines grid, allowing selecting an individual transistor-memory cell by selecting its source, gate and drain defining a specific x,y,z location.

The process flow suggested in respect to FIG. 3K to 3N of forming the vertical connection of the source side by selective epitaxial could be apply to the source 446 of these structure as well. Also the back-bias vertical connection 448 could be done by similar flow. And by having such epitaxial done with n+ doping the vertical connection could act as back-bias allowing to reduce the size of the T shape extension 428.

The process for bit-lines silicidation as presented in respect to FIG. 3J could also be applied to the bit-lines 410 of these memory structures The illustrations in FIG. 4A-F were made for ease of drawings and understanding. Person in the art would understand that techniques common in memory design could be used to increase memory bit density. Such as mirroring the transistors along the bit lines sharing the bit lines for right side transistor and left side transistors and mirroring across source side sharing the vertical source lines, and sharing the back-bias between adjacent cells and other density improvement techniques such structure is been illustrated in U.S. Pat. No. 8,902,663, as related to FIG. 7A-N. Many of the other alternatives presented in U.S. Pat. No. 8,902,663 could be applied for these structures as well. This may include having the memory peripheral circuits on top or underneath or on the side of the memory cell or any combination of those. The memory structure could be processed on top of a wafer which has a pre-build cut layer 113 to support a transfer of the structure to another wafer or carrier. This could allow forming peripheral circuits and other circuits both on top or underneath the memory structure as detailed in many other places in the incorporated by reference patents and patent applications.

Another alternative that would not require changes in the device structure is to use what could be called 'self refresh'. In a common DRAM refresh a refresh cycle means that each cell is being read and re-written individually. In 'self refresh' many or even all cells could be refreshed together by driving a specific current (may be a current range or minimum current) through them. The cell holding 'zero' will keep its zero state and the cell holding 'one' will get recharged to recover their lost of floating body charge due to leakage. This techniques had been detailed in a paper by Takashi Ohsawa et. al. in paper titled: "Autonomous Refresh of Floating Body Cell (FBC)" published in IEDM 2008, and in follow up paper titled: "Autonomous Refresh of Floating-Body Cell due to Current Anomaly of Impact Ionization" published by IEEE TRANSACTIONS ON ELECTRON DEVICES, VOL. 56, NO. 10, October 2009, incorporated herein by reference.

Another type of memory is resistive-memory ("ReRAM") which is a non-volatile memory type. A 3D ReRAM has been described in U.S. Pat. No. 9,117,749, incorporated herein by reference. In general, ReRAM perform the memory function by having the resistivity change which could be achieved by driving current through the ReRAM variable resistivity medium and could be sense by measuring current or voltage through that medium. There are many types of materials that could be used for ReRAM and some of those are oxides with additional materials which could be driven into the oxide to change it resistivity. U.S. Pat. No. 8,390,326 incorporated herein by reference present the use of silicon oxide for such use. A subclass of the ReRAM are structure that allow only one time programing ("OTP") of these mediums such as presented in U.S. Pat. No. 8,330,189 incorporated herein by reference.

In general for memory application in many memory implementations each element of resistive memory in the matrix of memory cell has a dedicated select device to allow writing one element in the matrix without accidently writing other element in the matrix.

Figure 5A:
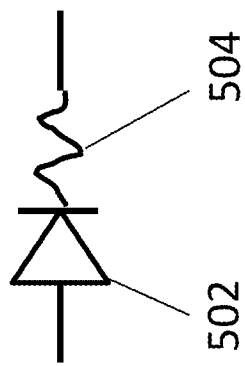

FIG. 5A illustrates a select device 502 which is a diode and a resistive memory element 504. In the following a 3D ReRAM structures are presented in which the matrix of the ReRAM are constructed by doped silicon as conductors and oxides as the element. The oxide as the resistivity switching element is sandwiched by two silicon regions. The doped silicon could be single crystal silicon or polysilicon. The diode 502 is achieved by having the silicon doped with n type to one electrode and p type to the other. The doping could be set so one electrode is highly doped to provide good conductivity while the other is medium doped to show rectifying diode current-voltage characteristic.

Figure 5B:
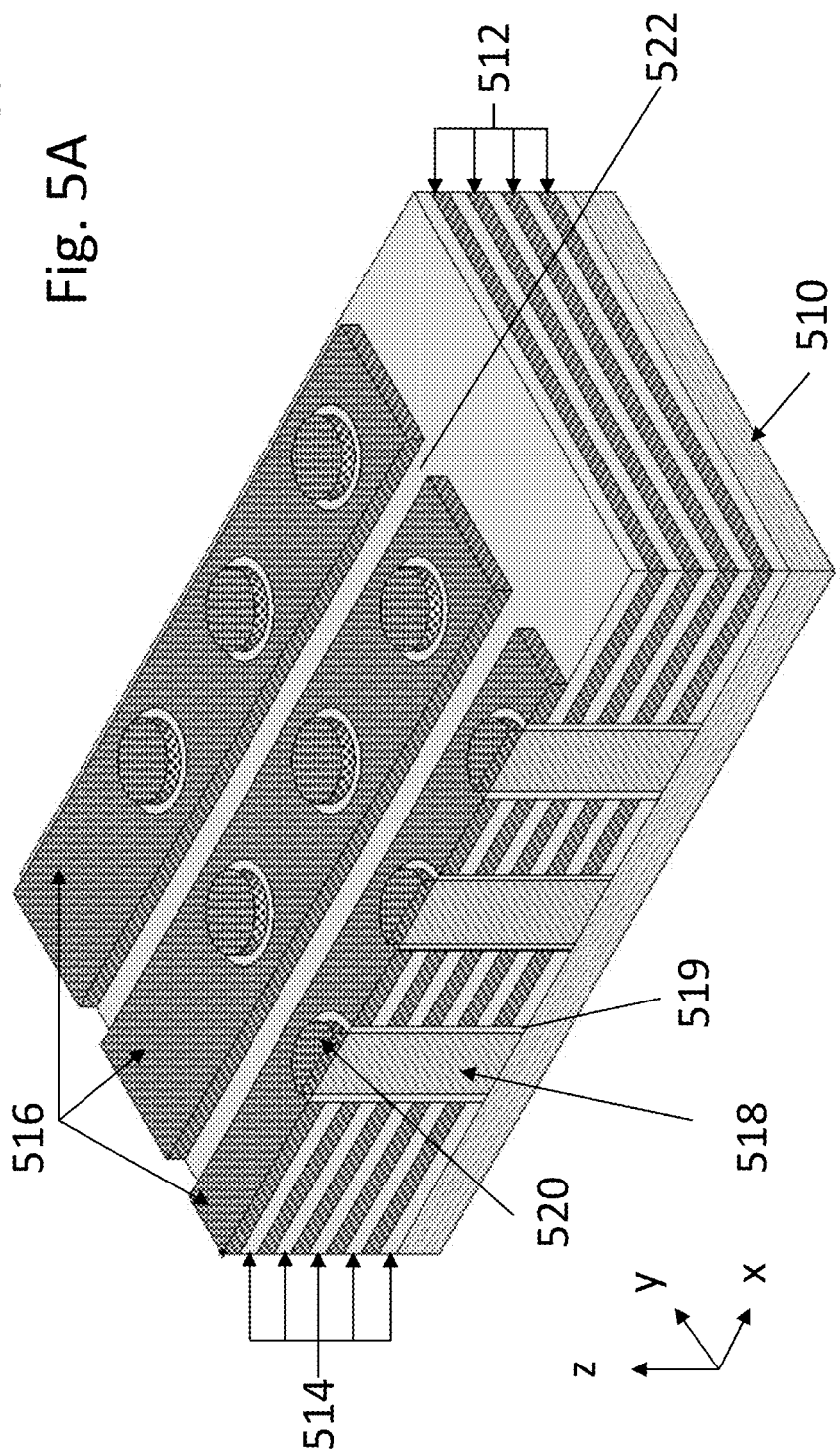

FIG. 5B illustrates structure for 3D Memory useful for OTP or other subclass of ReRAM. It start with a multilayer structure such as the one in FIG. 1B. A base substrate 510 and multilayers of silicon 512 and insulting layer 514. The silicon could also be polysilicon and accordingly allowing the formation of the multilayer structure by cycle of deposition of polysilicon followed by deposition of insulting layer such as silicon oxide. The silicon 512 could be highly doped. Then, a matrix of holes are formed into the multilayer structure. These holes are than filled first with the ReRAM material such as thin oxide 519 and then with Low~moderately doped polysilicon 518. The top region 520 of the polysilicon pillar 518 is highly doped for Ohmic contact. If the layers 512 hap n type doping than pillar filing the holes 518 would have p type doping or the reverse. The layers 510 serve as one electrode while the pillar 518 serve as the other electrode and every intersection between them form a memory site as the electrodes also form the select diode while the oxide in between is the element which change its resistivity other once for OTP or multiple times base on the type of materials and operation mode and other materials forming the 519 barrier layer. The very top silicon layer 516 could be highly doped and act as select gate. By etching 522 the top silicon layer 516 it is formed as strip along 'x' direction. Then, the select gate 516 could be used to select the pillar.

FIG. 5C illustrates the structure after adding stair-case connection per layer 526 for word-lines and contact for the select gate top strips 528 and the contact to the pillars 529.

FIG. 5D illustrates the structure with the connection grid. Word-lines WL1, WL2, WL3 and WL4, bit-lines BL1, BL2 and BL3 and Select Gates lines SG1, SG2 and SG3. These three set of memory control lines enable the selection of individual memory cell by choosing specific x, y, z location.

FIGS. 5E and 5F illustrate another alternative where the select gates are placed adjacent to stair-case word-lines 532, and having the forming strips etch done through all layers 530.

FIG. 6A illustrates a foundation structure for another alternative ReRAM non-volatile memory. Starting again with multilayer structure and etching it to form stack of multilayer rims 602 going in the x direction.

FIG. 6B illustrates the structure after patterning going in the y direction cover of ReRAM material such as silicon oxide 604 covered with highly doped polysilicon electrodes 606. Again the rim electrode 602 going in x direction could have p type doping while the polysilicon electrodes going in y direction 606 could have n type doping or the other way around. And again the rim electrode 602 going in x direction could have moderate level doping to show rectifying diode behavior to reduce risk of sneak current path through adjacent cells. The patterned y direction electrodes could before by deposition through patterned photo resist or by first blanket deposition and then etching step.

FIG. 6C illustrates the structure after forming stair-case 610 for per layer future connections. The electrode adjacent to the stair-case 607 could be used as a select gate for the rim.

FIG. 6D illustrates the structure with the connection grid. Word-lines WL1, WL2, WL3 and WL4, bit-lines BL1, BL2, BL3 and BL4 and Select Gates lines SG1, SG2, SG3, SG4 and SG5. These three set of memory control lines enable the selection of individual memory cell by choosing specific x, y, z location.

FIG. 7A to 7E illustrates alternative staircase structures that could be used in some of the structures previously presented.

Other types of two terminal memories are known in the art. These use active layers such as NPN, PNP, NPNP and PNPN. The PNPN are also known as Shockley diode or Silicon-Controlled Rectifier ("SCR"), the PNP, NPN are less known and are also called Biristors these memories are volatile memories. Unlike the conventional definition, the NPN, PNP, NPNP, and PNPN devices have two terminals such as anode and cathodes on these two ends terminal, and their gate are left floating. So, NPNP or PNPN structures can be referred as gate-less or open-gate SCT. The NPN or PNP structures can be referred as open-base bipolar transistor, In these structure the diode select device could be achieve from the device internal structure provide broader materials options of the memory electrodes—bit-lines and word-lines.

Figure 8B:
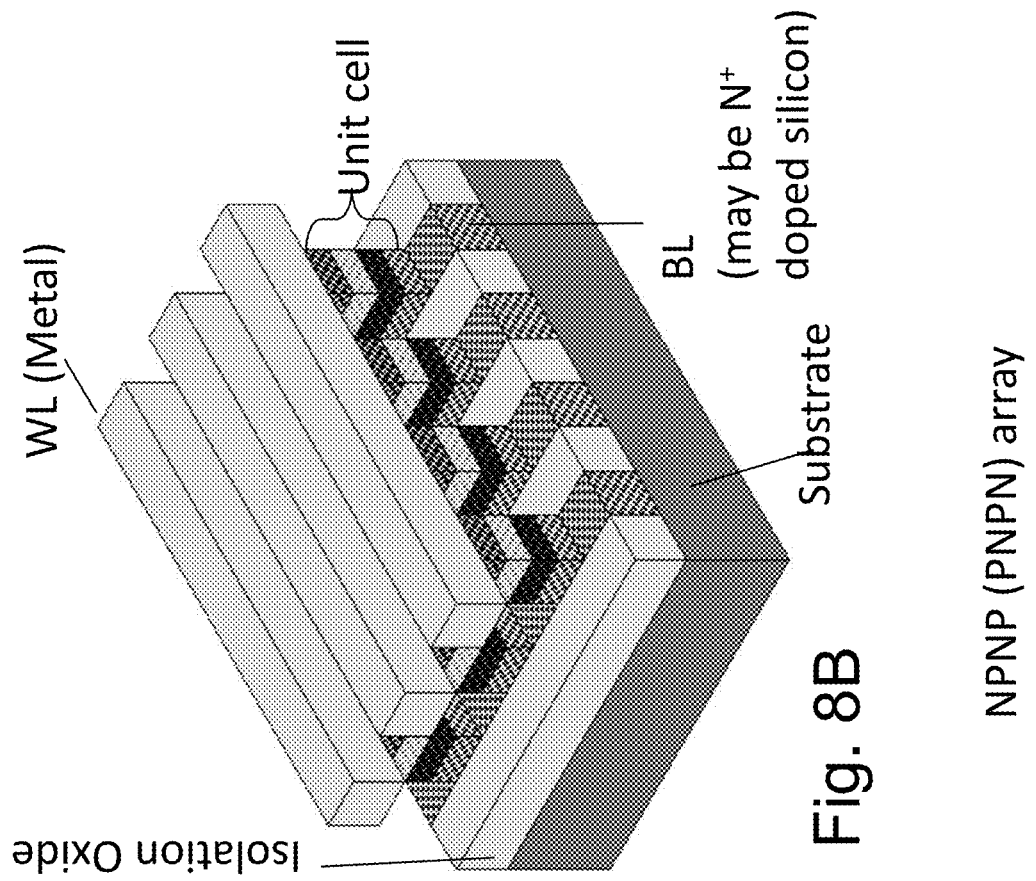
FIGS. 8A-8B are example illustrations of the formation and structure of vertical memory cell of a two terminal memory using SCR technology for a 3D memory.
Figure 8A:
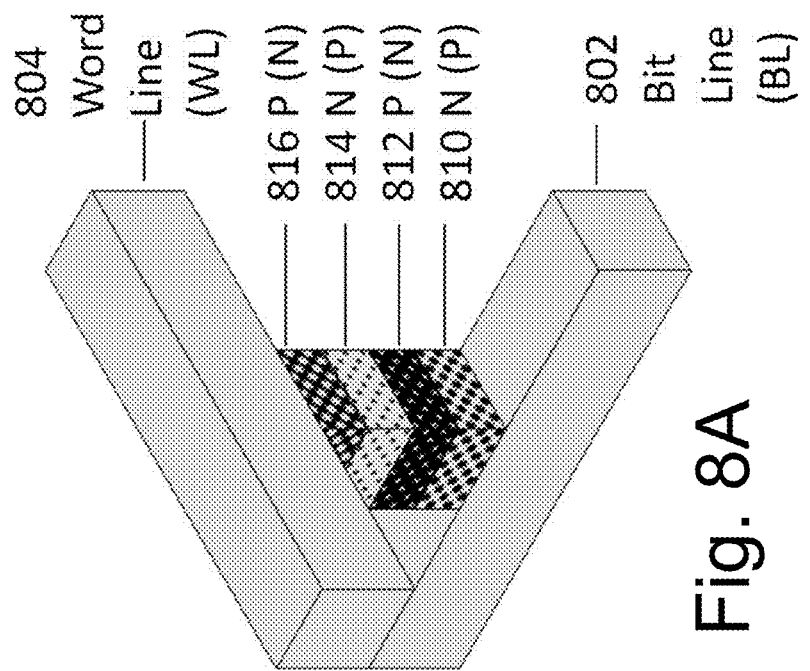

FIG. 8A illustrates a vertical memory cell of a two terminal memory using SCR technology. The bottom terminal—the bit line 802, could be metal conductor or highly doped silicon. On top of it the first active layer of n doped silicon 810. In some cases these layers (802, 810) could be combined. On top of it a layer of p doped silicon 812. On top of it the second n doped layer 814 and then the top most p doped 816 layer. Than the word line 804 vertical oriented in respect to the bit-line 802. The word-lines in most cases would be made from metal or alternative conducting material. Other than pure silicon materials such as polycrystalline silicon could also be used. Also the memory cell could be flipped having p type at the bottom and n type at the top.

FIG. 8B illustrates 2D memory structure using vertical SCR. More details for such memory structure are presented in a paper titled "Design of two-terminal PNPN diode for high-density and high-speed memory applications" by Tong Xiaodong et. al. published in Vol. 35, No. 1 Journal of Semiconductors January 2014, and U.S. Pat. No. 9,013,918 incorporated herein by reference.

FIG. 9A illustrates a vertical memory cell of a two terminal memory using Biristor technology. The bottom terminal—the bit line 902, could be metal conductor or highly doped silicon. On top of it the first active layer of n doped silicon 910. In some cases these layers (902, 910) could be combined. On top of it a layer of p doped silicon 912. On top of it the final n doped layer 914. Than the word line 904 vertical oriented in respect to the bit-line 902. The word-lines in most cases would be made from metal or alternative conducting material such as n doped silicon which in some cases could be combined with the top n+ layer 914. Other than pure silicon materials such as polycrystalline silicon could also be used. Alternative structure of PNP could also be used as an alternative.

FIG. 9B illustrates 2D memory structure using vertical Biristor. More details for such memory structure are presented in a papers titled Biristor-Bistable Resistor Based on a Silicon Nanowire at IEEE ELECTRON DEVICE LETTERS, VOL. 31, NO. 8, August 2010, and Bistable Resistor (Biristor)—Gateless Silicon Nanowire Memory at VLSI 2010 both by Jin-Woo Han at. al., incorporated herein by reference.

Figure 10A:
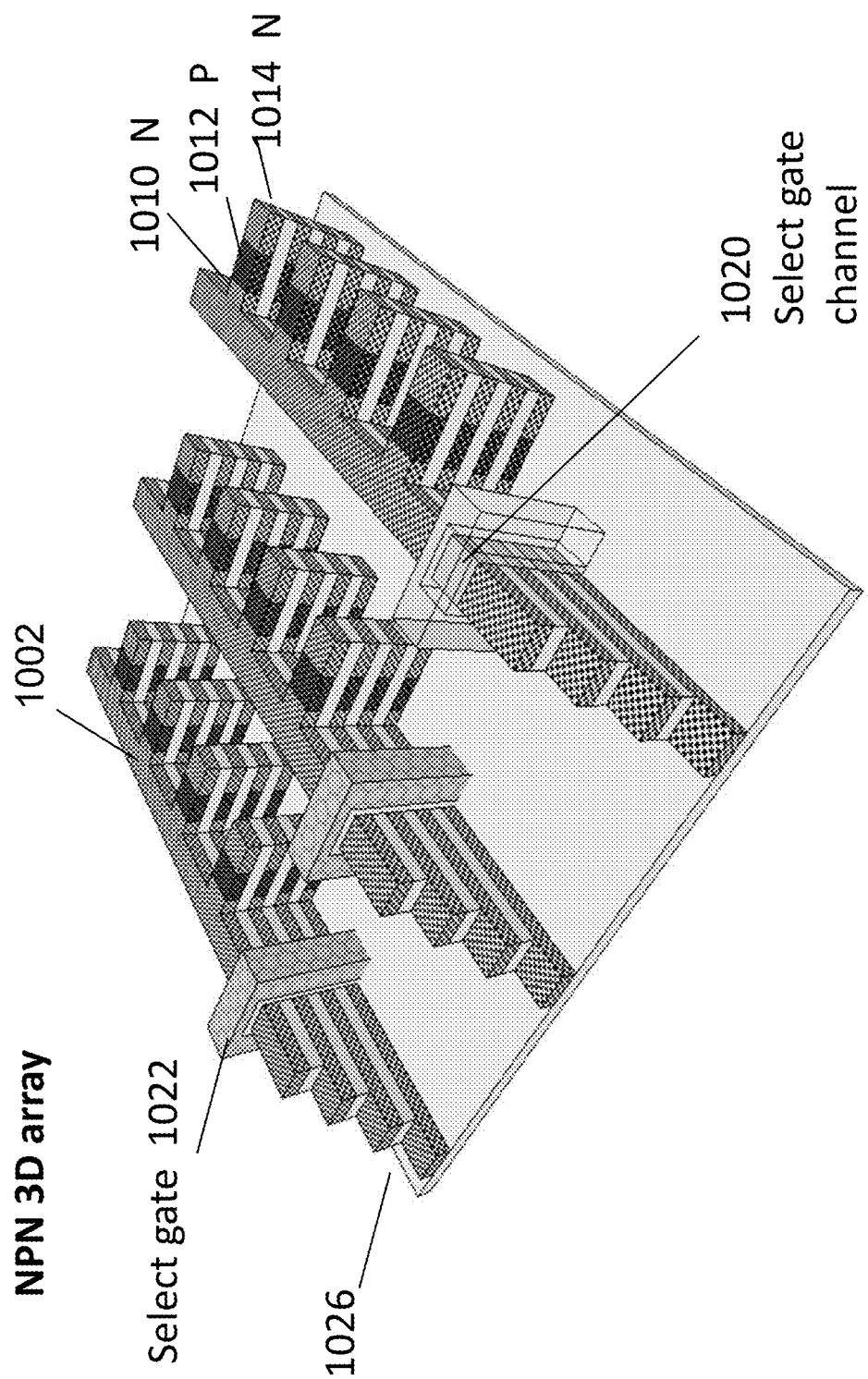
FIGS. 10A-10D are example illustrations of the formation and structure of horizontal bi-ristor and SCR technology 3D memory.

FIG. 10A illustrates a 3D horizontal Biristor memory structure. This structure resemble the structure of FIG. 3A-P without the gate 322. The fabrication flow could be similar and so the various option for sharing to compact the memory size. For Biristor it might be desired to have different doping level for the n silicon bit-lines 1002, the first n region 1010 and the second n region 1014. These could be achieved by masking all other region and diffuse doping only to the desired regions repeating the step for each region, or doping multiple regions with base doping and then add more doping to some of the regions by extra step of masking and diffusion doping. Alternatively, the P region 1012 has spatially gradient doping level between the first n region 1010 and the second n region 1014. In the Biristor memory the p regions 1012 are not covered by oxide and gate materials. Alternatively, the gate can be constructed for diffusion doping masking layer, but do not connect to the any terminal and left floating. The second n regions 1014 are later vertically connected by pillars similar to 338 or alternatively using selective epitaxial similar to 370. In the case of selective epitaxial the pillars could be doped during the epitaxial process to function as the second n regions 1014. FIG. 10A also illustrates the stair-case connections 1026 of the bit-lines 1002 and the select gates 1022 and the select oxide 1020.

Figure 10B:
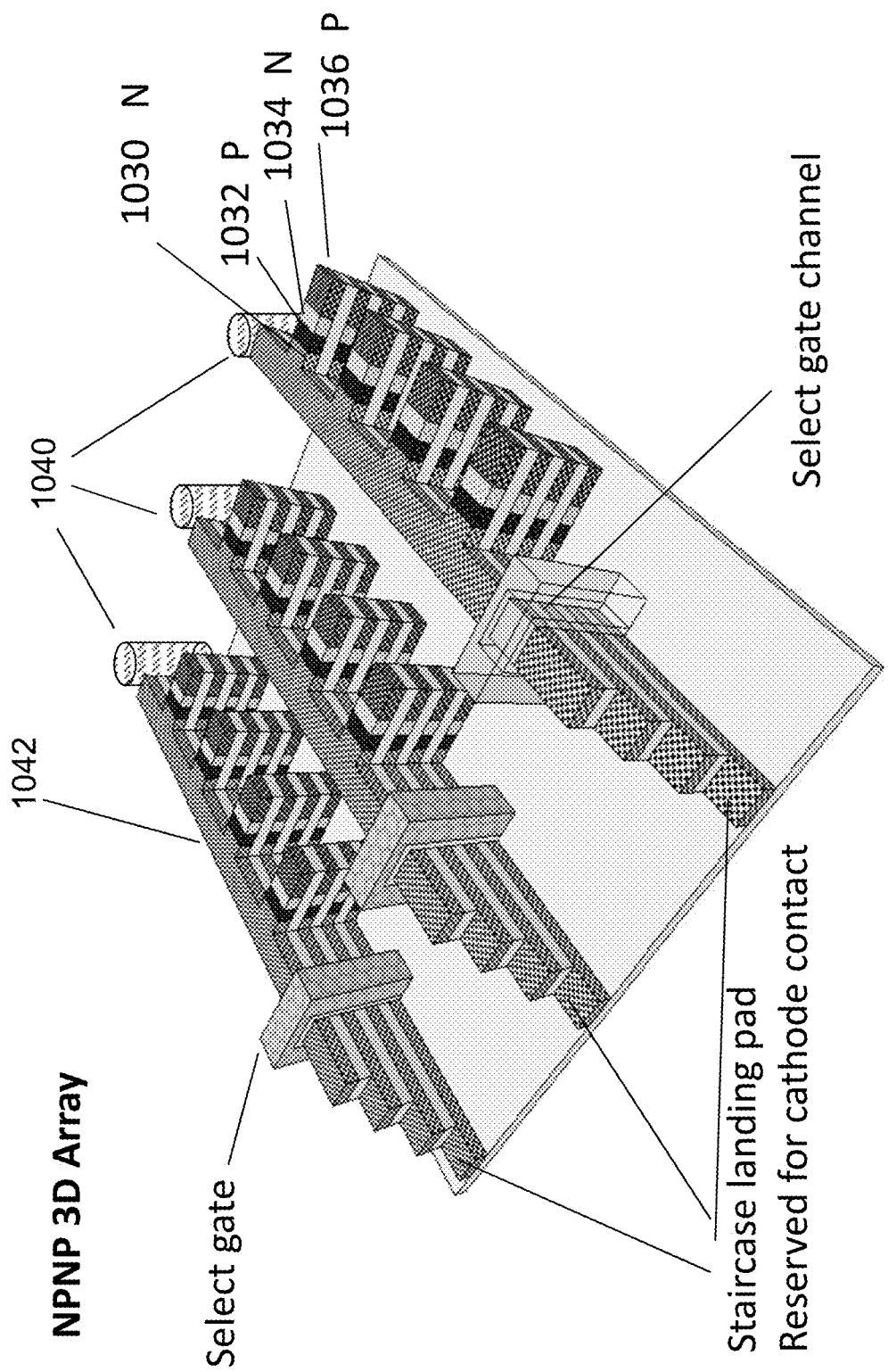

FIG. 10B illustrates a 3D horizontal SCR memory structure which is very similar to the structure of FIG. 10A. In FIG. 10B in addition to the first n region 1030 and the bit-lines 1042 which could be combined, the p regions 1032 and the second n region 1034, there are also second p regions 1036 forming the horizontal SCR—npnp device. For these devices it also might be desired to form different doping to the different functional regions n—1030, 1034, and the different functional regions p 1032, 1036.

Figure 10C:
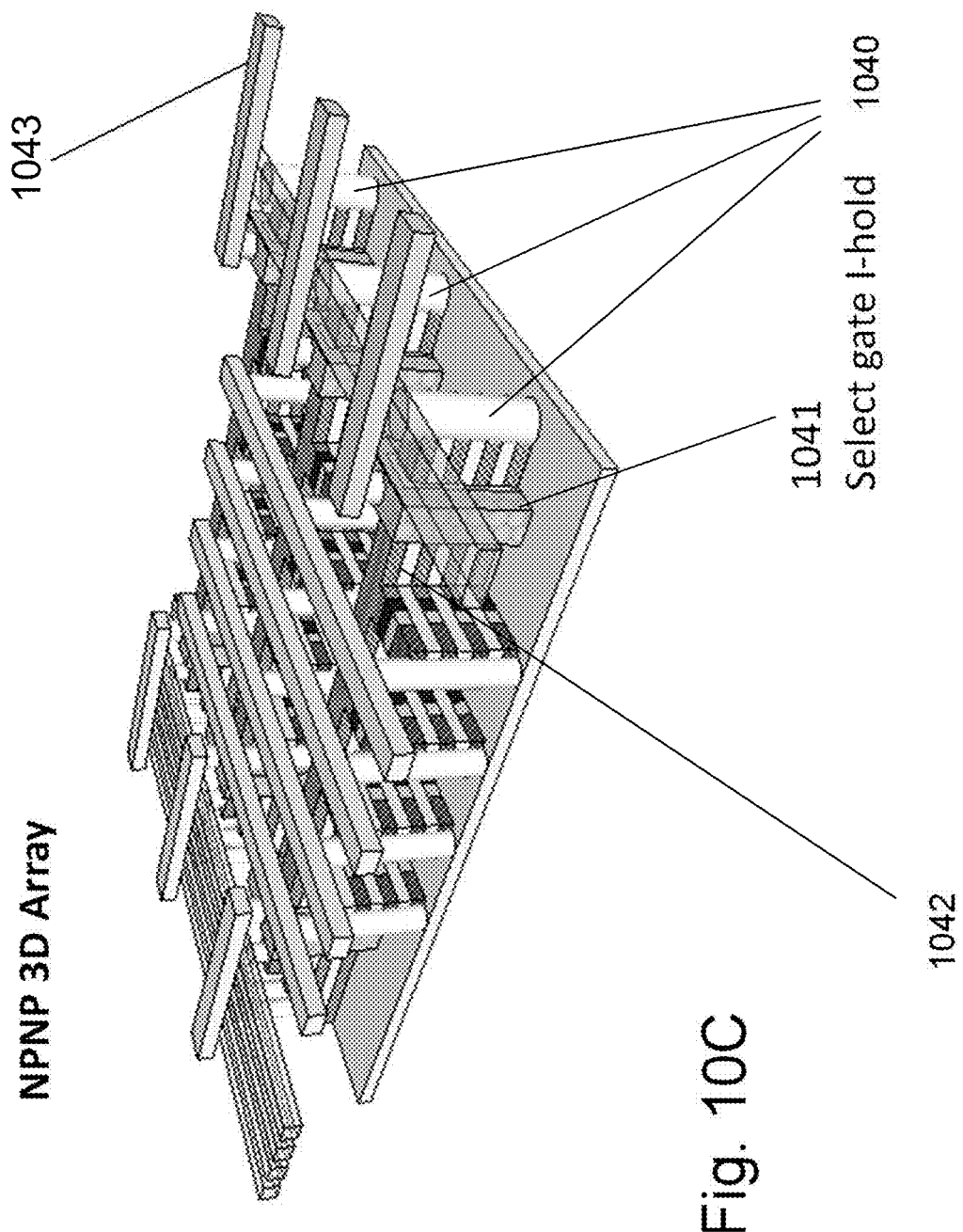
Figure 10D:
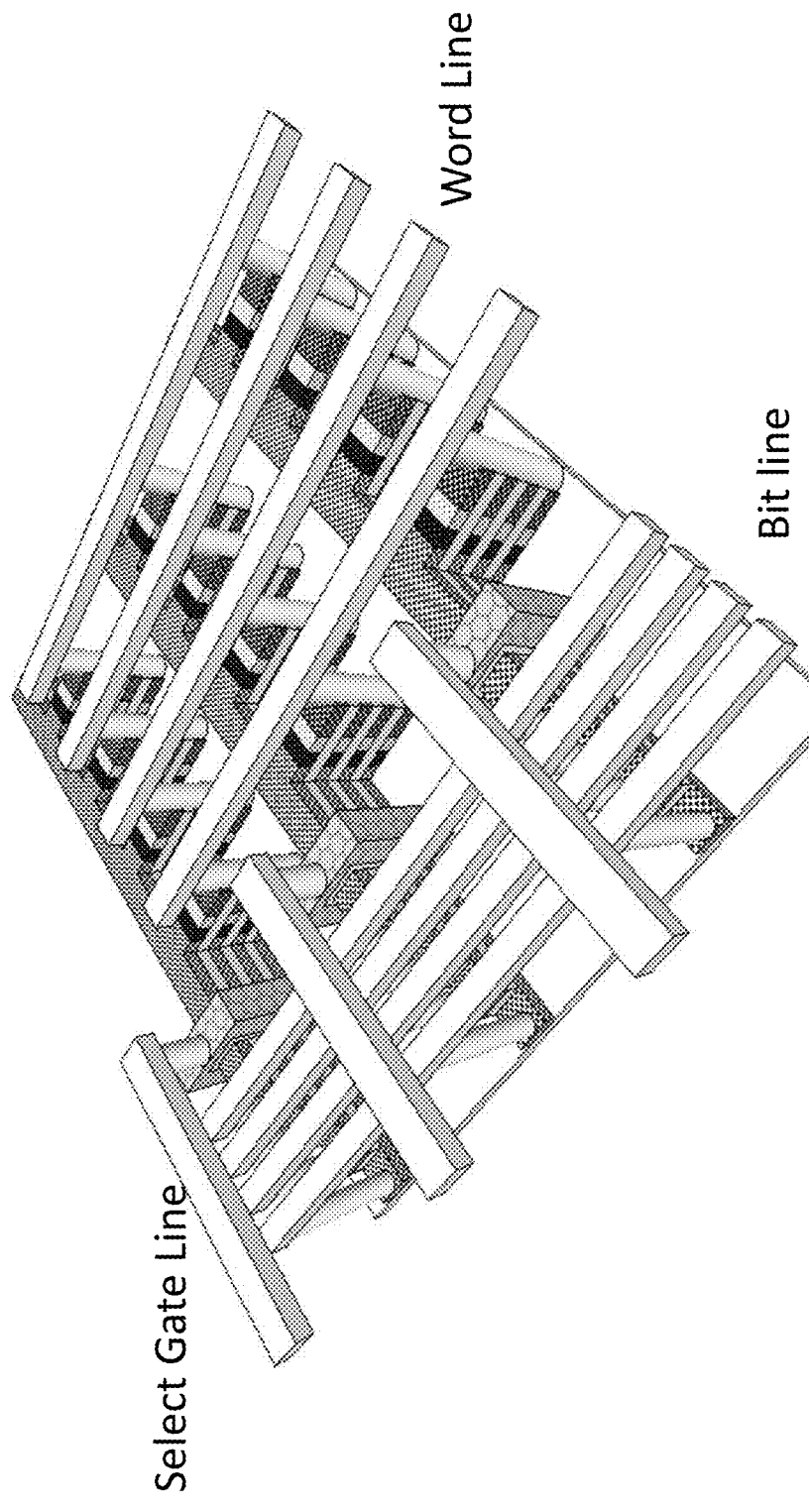

FIG. 10D illustrates the structure with the connection grid. Word-lines, bit-lines and Select Gates lines. These three set of memory control lines enable the selection of individual memory cell by choosing specific x, y, z location. The bit-lines 1042 on the other side than the select gates could have a high resistivity pillar connection 1040 to provide the minimal holding current to keep the state '1' of the SCR memory cells.

FIG. 10C illustrates the structure of FIG. 10B after rotation and addition of top layer control lines. It illustrates optional gates 1041 to allow control of the delivery of the holding current from the pillars 1040 to the bit-lines 1042. The control signal could be delivered by top metal lines 1043. Controlling the holding current could allow reduction of overall device power and could help in providing the write signal to the proper/desired memory cell without causing disturb to the un-selected memory cells.

As been described in the above incorporated paper titled "Design of two-terminal PNPN diode for high-density and high-speed memory applications", for the memory to operate properly the peripherals circuits need to support the following:

A. All cell need to have through them at least minimal holding current to retain the high '1' memory state. This holding current could be interrupted to brief time as there is some charge in the channel which would need to leak out for state '1' to be lost.

B. Wiring '1' to a cell need to have the voltage across him to be higher than Vlu. In the decoding circuit there are three states memory could be in:
 a. Non selected neither by word-line nor by bit-line
 b. Half-selected by one of word-line or bit-line
 c. Selected by both word-line and bit-line.

The peripheral circuits could be set so only the cell selected by both line get written to '1' or written to '0'. This could be achieved by moving the voltage in the word-line and in the bit-lines half way each toward the overall threshold of Vlh to achieve writing '1' or down toward Vld to achieve writing '0'. According only one cell will get written to '1' or '0'—the cell that both its word-line and its bit-line were selected. Attention need to be taken that no other cell would have across it a voltage lower than Vld or higher than Vlu, this need to account all lines and to account for the minimal holding current provided to all cells to retain their memory status. This design requirement are the type of requirement that detailed memory design need to account for including variation of temperatures supply voltage and variation in the manufacturing line.

There is added complexity with 3D memory as illustrated in FIG. 10B as in the bit-lines we could have three type of bit lines:
 a. Selected by bit-line and select gate. This is the one that would write data into the selected memory cell.
 b. Selected by select-line but not by bit-line, the voltage across the cell need to be between the two threshold Vld and Vlu, so minimum accidental write could happen
 c. Not selected by select-line. This need to still keep the holding current going through the cell to retain its stored state. This could be provide by high resistivity pillar connection 1040.

While multiple memory plans processing following one lithography step is attractive in respect for cost another alternative is forming 3D memory by successive step of memory plan following another memory plan. In such memory the 3D structure provides ability to share between planes memory control line such as bit-lines and word-lines, and ability to pack more memory bits in a smaller area with benefit in performance (line RC), power and even cost.

Figure 11A:
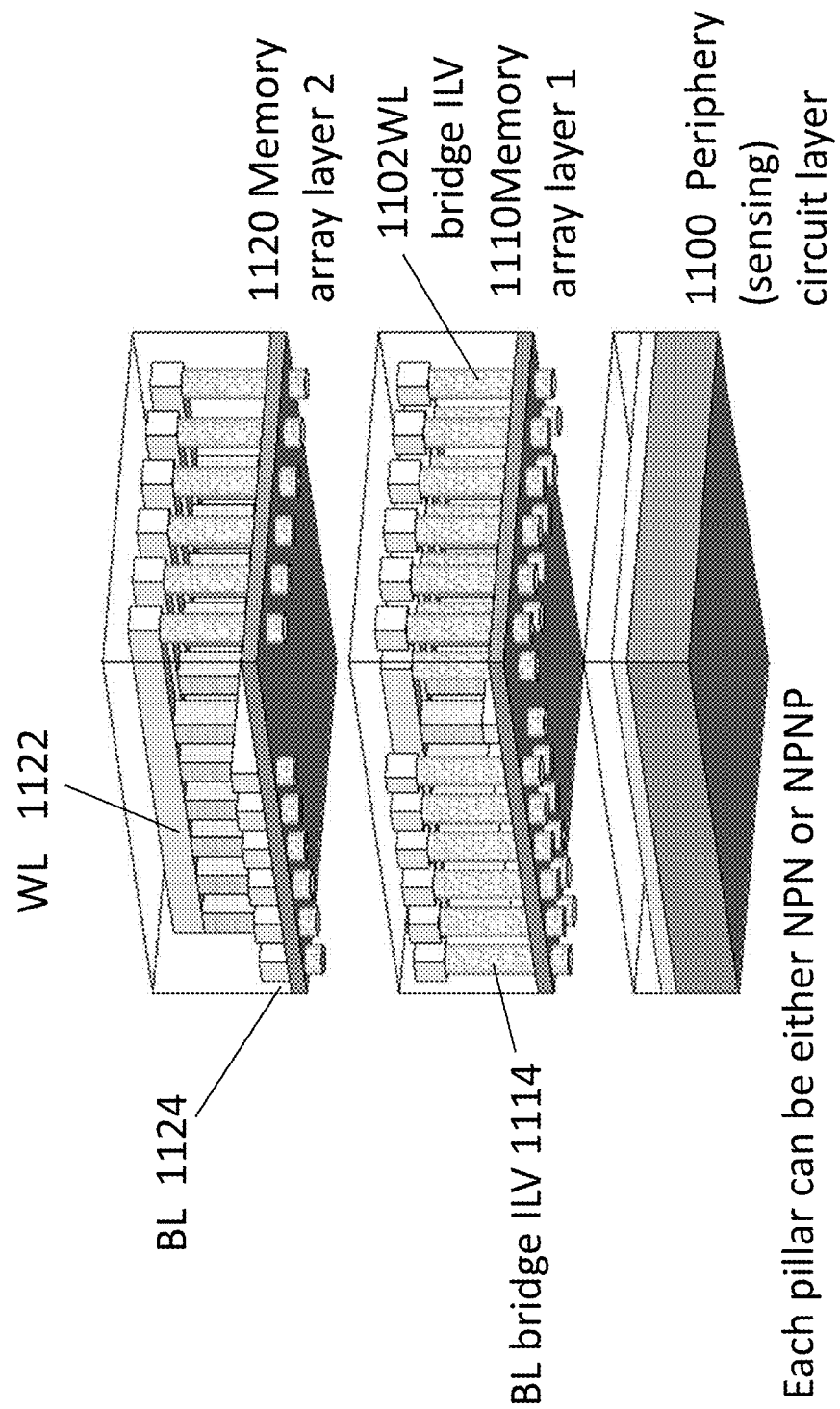

FIG. 11A illustrates the type of 2D memory structure, presented in FIG. 8B and FIG. 9B process 2D memory plane on top of another 2D memory plane forming a 3D memory structure. FIG. 11A spread the structure planes for ease of understanding. In the base plane the memory periphery circuits could be build 1100, on top of it a first memory plane 1110 including its word-line via bridge 1102 and its bit-lines interlayer via bridges 1114. Then a second memory plane 1120 could be processed with its word-lines 1122 and bit lines 1124.

Figure 11B:
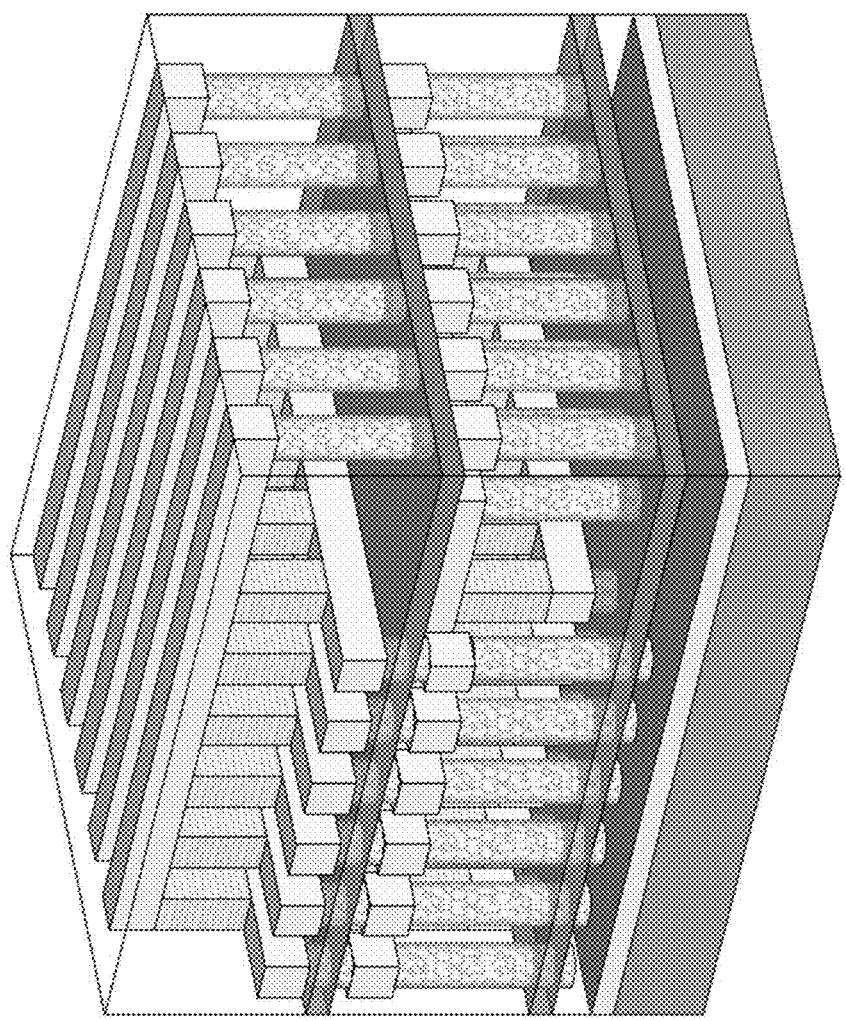
Figure 11C:
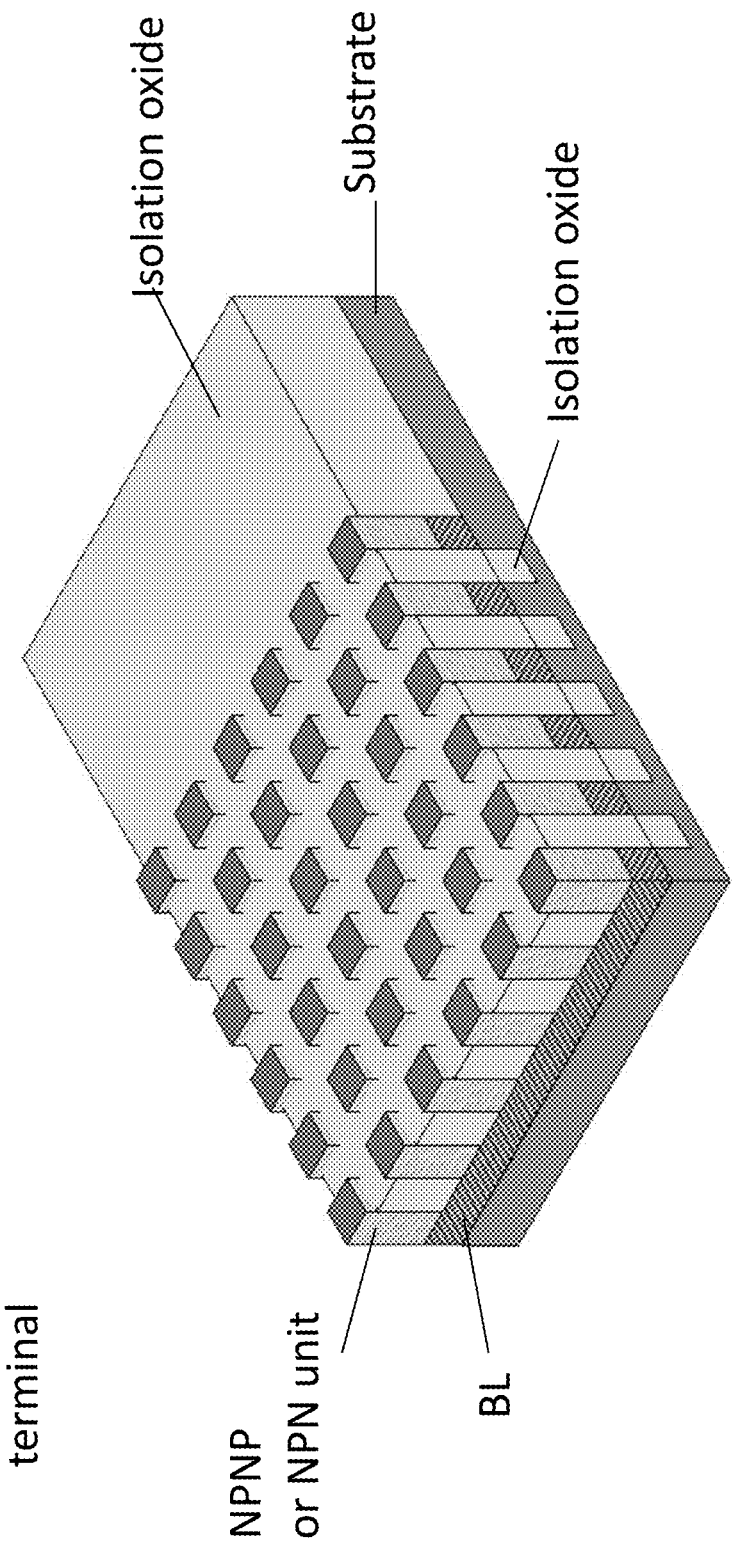
Figure 11E:
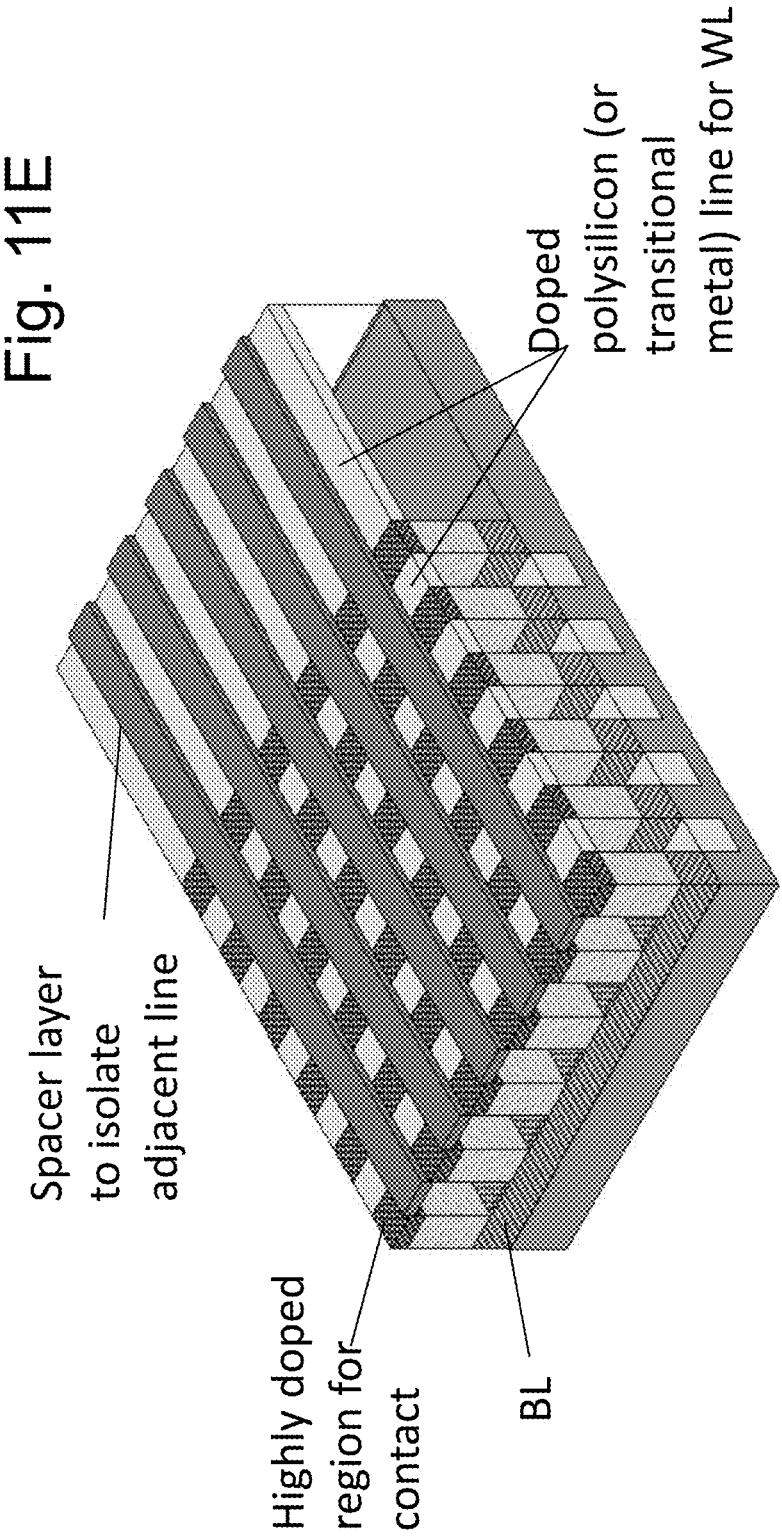
Figure 11F:
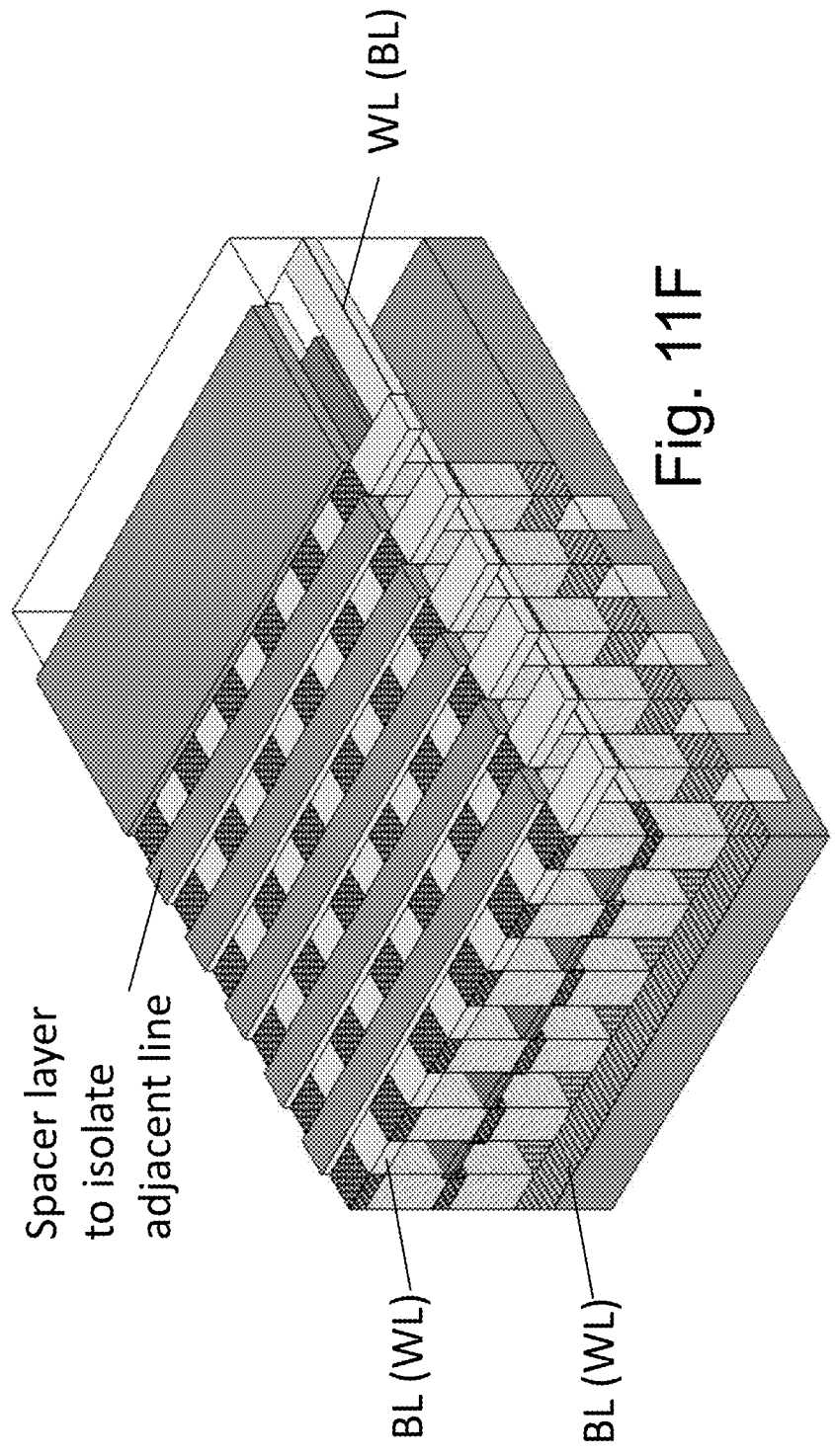

FIG. 11B illustrates the structure of FIG. 11A with the planes not in exploded view.

FIG. 11C to FIG. 11F illustrates some of the steps of forming such 3D memory.

Figure 11G:
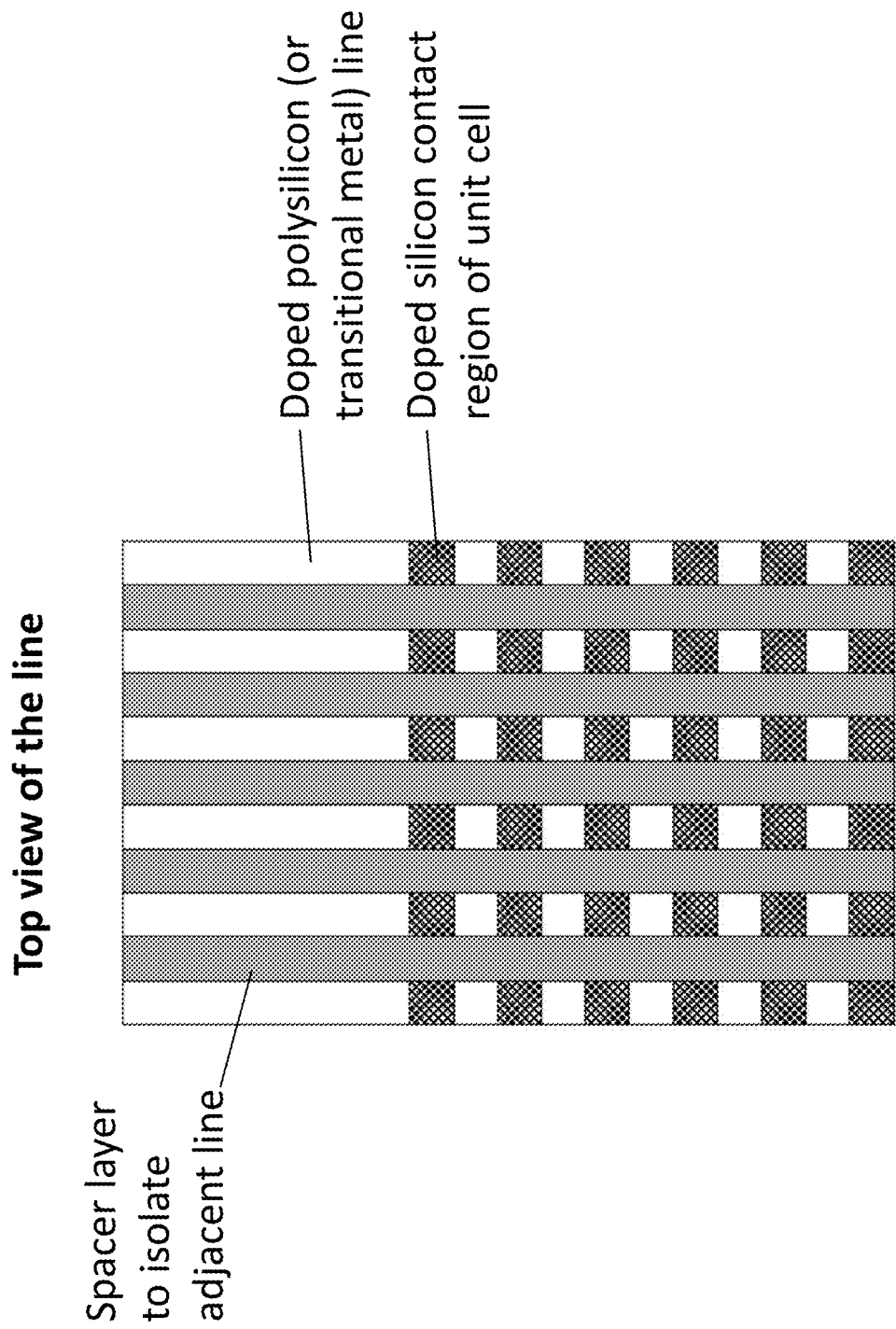
Figure 11H:
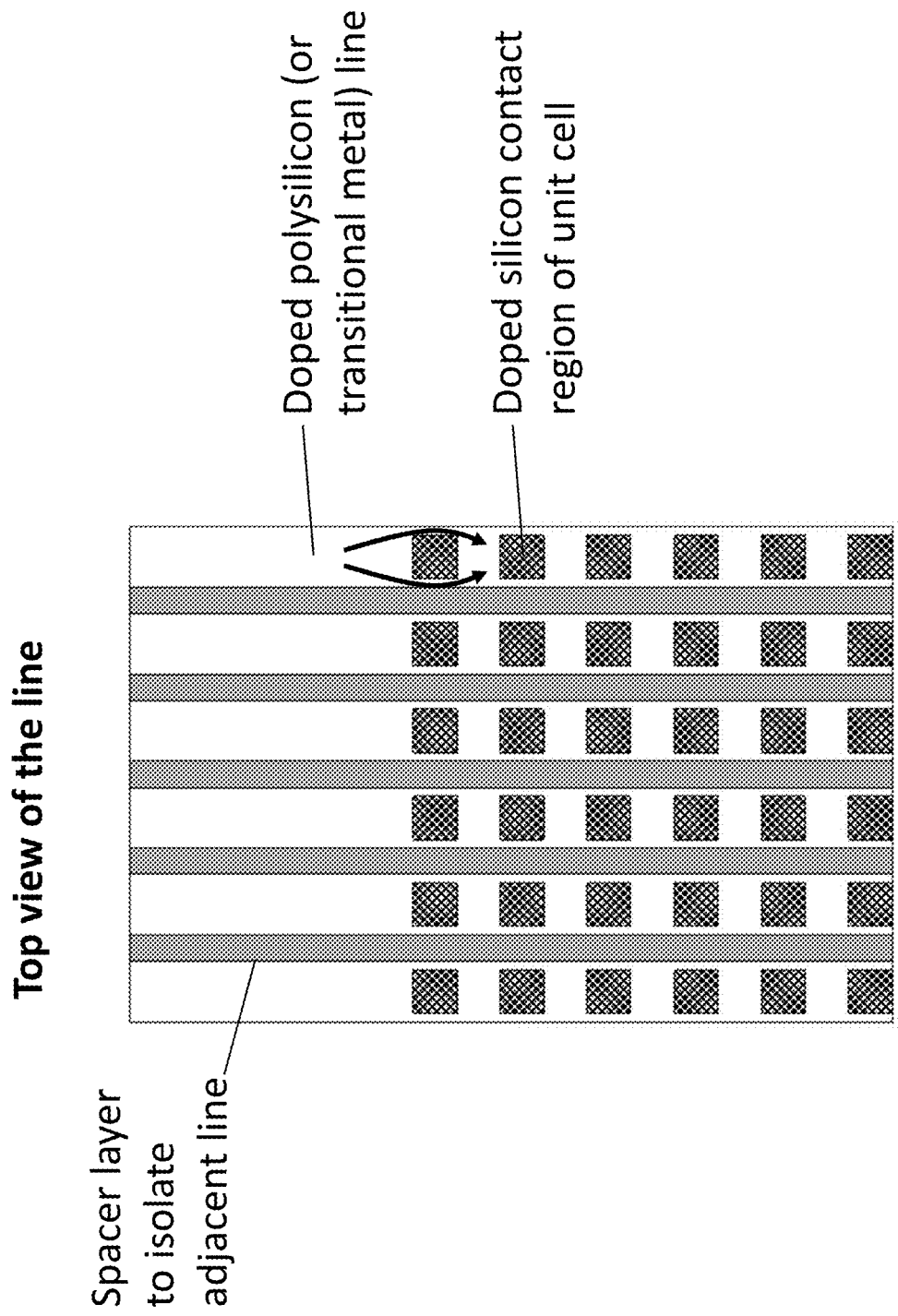

FIG. 11G and FIG. 11H illustrates two options for forming the bit-lines or word-lines and having them connected to the p silicon or the n silicon regions.

In respect to the modified ELTRAN process to support layer transfer there are alternatives to the step of epitaxial of the silicon layer 120 over what used to be porous layer 113. In one alternative the substrate is prepared for a specific use in which the silicon area to be used for transistors could be designated.

Figure 12A:
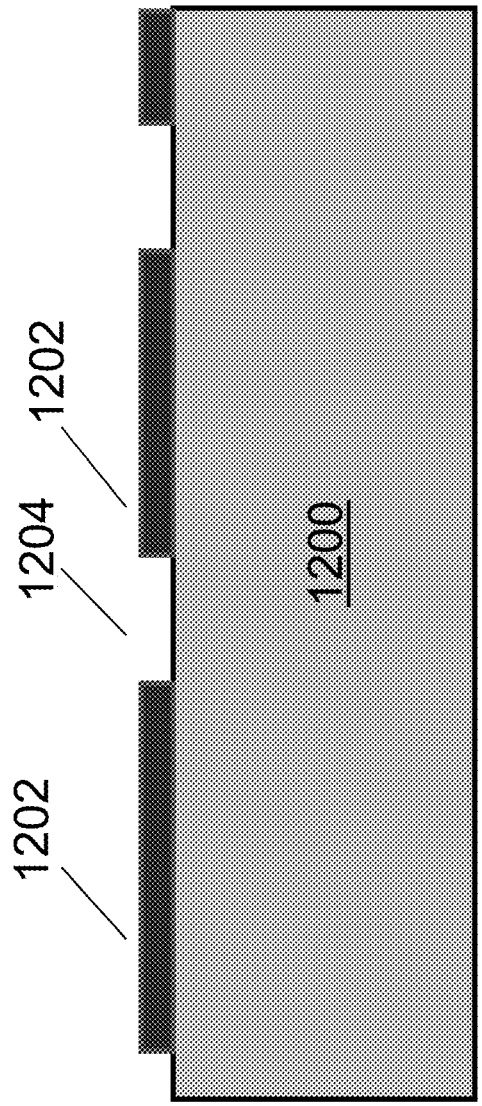
FIGS. 12A-12B are example illustrations of the formation and structure using a substrate with protection areas or transistors designated regions in and ELTRAN type process.

FIG. 12A illustrates specific substrate with protection areas or transistors designated regions. Accordingly the top layer of the silicon substrate 1200 is patterned exposing future transistors area 1202 and covering non-transistor regions 1204 such as shallow trench isolation ("STI") regions. The exposed area 1202 could be doped by n type doping or covered by protective hard mask such as silicon nitride. The substrate is then put into an anodizing process forming porous in the unprotected are and expending underneath the protected areas.

Figure 12B:
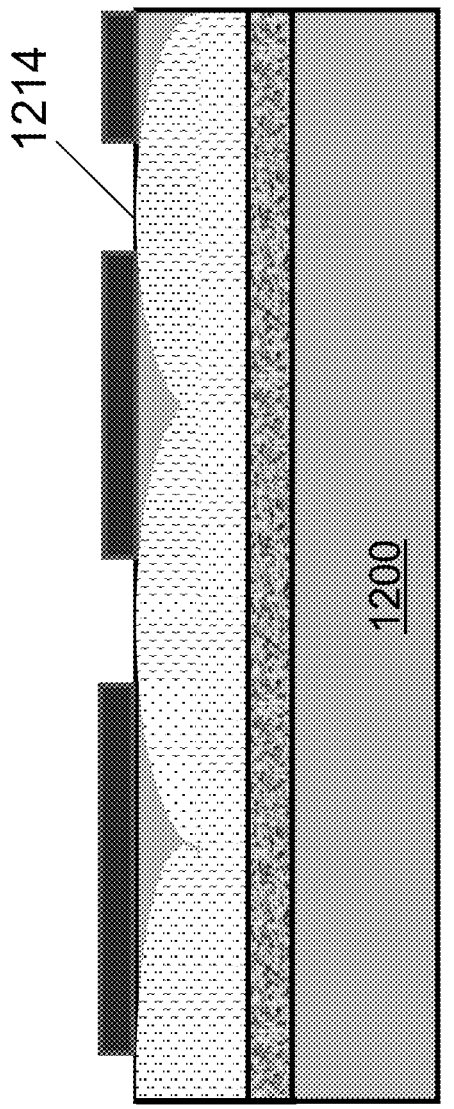

FIG. 12B illustrates the substrates following an anodizing step. The closer to the surface area 1214 could be anodized to have relatively lower porosity and underneath it the second porous layer 1216 could have high porosity. Then as before the wafer could be cleaned the porous layer could be harden by some oxidation the top surface could be sealed and flattened by high temperature $H_2$ annealing and epitaxial step could be done to further improve the substrate top surface.

In U.S. Pat. No. 8,114,757, incorporated here-in by reference, in respect to FIGS. 50A-E and 51A-F, a 3D memory is presented which utilizes a multilayer structure of interleaving poly-silicon and isolation layers. It is expected that such structure would be lower cost to fabricate than an interleaving structure with crystalline silicon. Such a structure could be used for the 3D ReRAM described in respect to FIGS. 5B-E, FIGS. 6A-D herein and could be used for the NPNP or PNPN type memory described in respect to FIGS. 10A-C and FIG. 11A-G herein. The poly-silicon layer could be annealed, for example, such as by laser annealing to improve its electrical and physical characteristics, such as carrier mobility and so on. During the formation of the poly-silicon some baseline doping could be done. For these memories the peripheral circuits could also use poly-silicon transistors and for better performance crystalline silicon could be used. These peripheral circuits could be place on the memory sides but also, using techniques presented here and before, underneath and or on top. These types of 3D integration of peripheral circuits could enable shorter memory control lines, thereby reducing circuit delays and power.

Figure 13A:
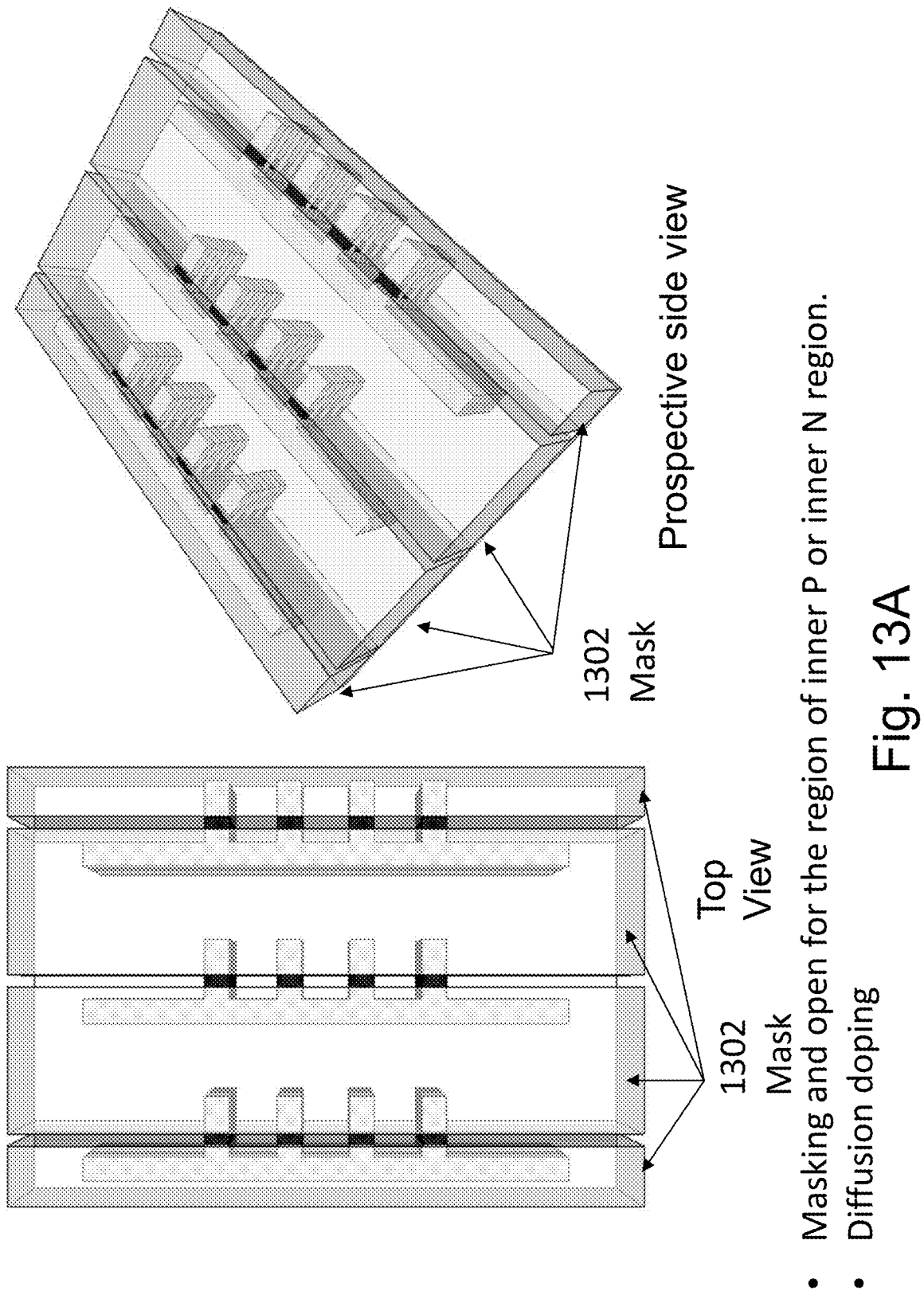

FIG. 13A illustrates a 3D memory structure similar to structures presented herein with a top view and a perspective side view, masked 1302 to open regions for diffusion doping of the inner P or N regions of the memory cells.

Figure 13B:
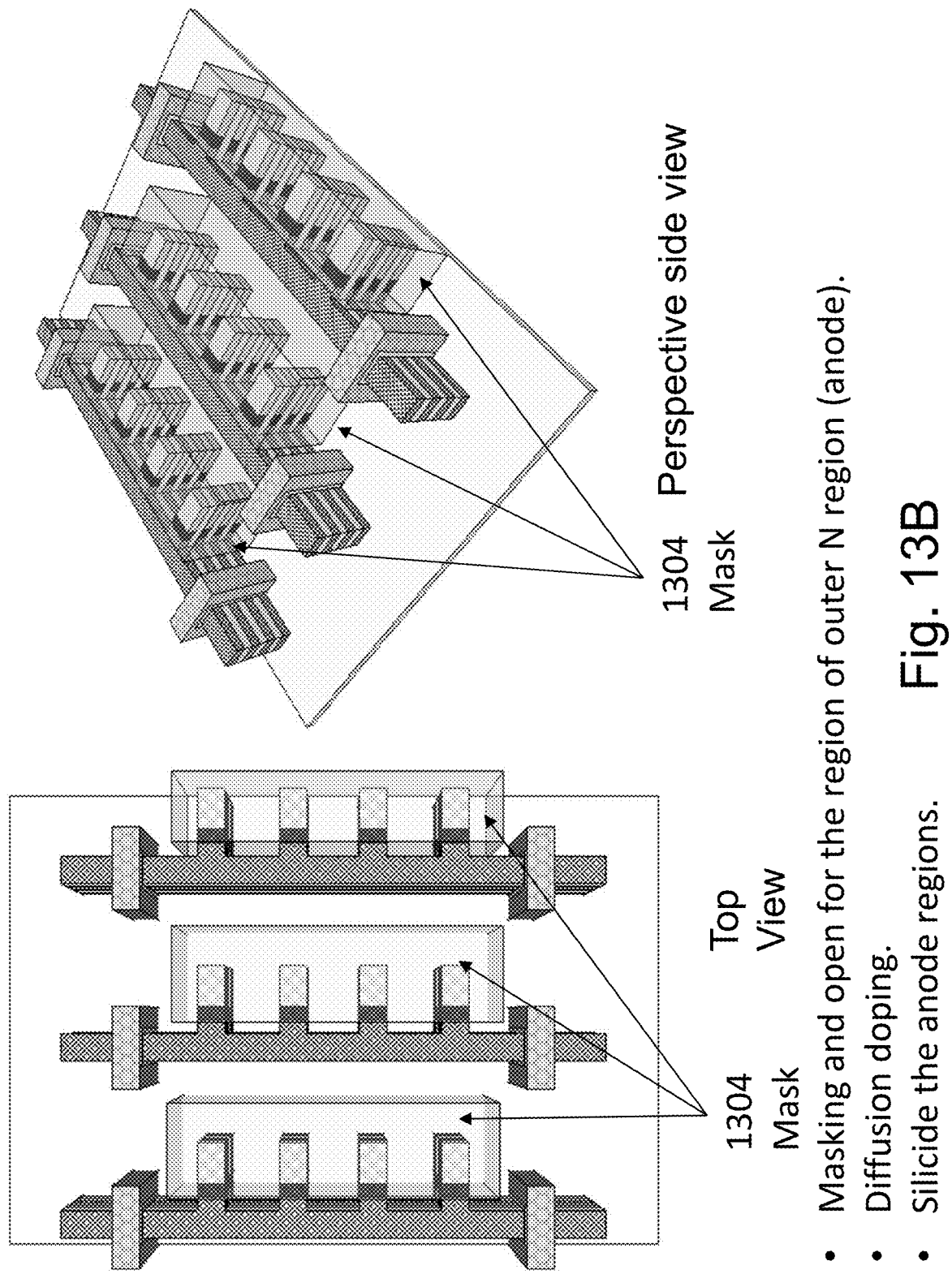

FIG. 13B illustrates a 3D memory structure similar to structures presented herein with top view and perspective side view, masked 1304 to open regions for diffusion doping of the outer N regions (anode) of the memory cells and the in silicon bit-lines. These bit-lines could further be silicided for better conductivity as has been described herein before.

FIG. 13C illustrates a 3D memory structure similar to structures presented herein with top view and perspective side view, masked 1306 to open regions for diffusion doping of the outer P regions (cathode) of the memory cells. These outer P regions could further be silicided.

The memory cell could be constructed for the in silicon control line to be made P type which could be part of the cathode and the outer N region could be later on connected with pillars as has been described herein, and accordingly changes the type of doping the mask pattern illustrated in respect to FIG. 13A-C herein.

The two terminals SCR type memory could be modified to include a gate and is known in the art as Thyristor device or Thyristor Random Access Memory—T-RAM, or Thin Capacitively-Coupled Thyristor (TCCT) memory. Some of the work on such memory was published in U.S. Pat. Nos. 6,104,045, 6,773,968, 7,078,739, 7,630,245 and application 20010024841, all incorporated herein by reference. And scientific papers such as "A Novel High Density, Low Voltage SRA Cell with a Vertical NDR Device" by Farid Nemati et al in VLSIT98, "Fully Planar 0.562 pm2 T-RAM Cell in a 130 nm SO1 CMOS Logic Technology for High-Density High-Performance SRAMs" by Farid Nemati et al in IEDM04, "A novel capacitor-less DRAM cell using Thin Capacitively-Coupled Thyristor (TCCT)" by Hyun-Jin Cho et al in IEEE 2005, "Working Principles of a DRAM Cell Based on Gated-Thyristor Bistability" by Halid Mulaosmanovic et al, in IEEE ED Letter September 2014, and "Investigation of the Turn-ON of T-RAM Cells Under Transient Conditions" by Halid Mulaosmanovic et al, in IEEE Transactions on ED April 2015, all incorporated herein by reference. The extra control signal—the gate—provides additional control flexibility and could help achieve higher write operation to the memory cell.

FIG. 14A and FIG. 14B illustrate the building blocks—example memory cells for T-RAM memories and for 3D T-RAM memories. In FIG. 14A, going thru the TRAM structure, the anode 1408 is outer P type region, then an inner N type region 1406 then inner P type region 1404 with gate 1409 on the sides (or may be all around P-type region 1404) isolated by gate oxide 1407, and then the cathode 1402 outer N type region which could be extended to form the in-silicon embedded source line.

The outer N region 1402, inner P region 1404, inner N region 1406, outer P region 1408 can be made of amorphous silicon or alternatively polycrystalline silicon. The grain size of the polysilicon may be designed to minimize the cell-to-cell variation. For example, the grain size of polycrystalline silicon may be 5 nm~100 nm so that the impact of grain size fluctuation reflects uniformly to the memory performance across a number of different cells. Alternatively, the grain size of the polycrystalline silicon may be greater than the size of each inner P region 1404 and inner N region 1406, which may be obtained thru, for example, annealing processes so that the grain boundary does not exist in inner P region 1404 and inner N region 1406. The height of the unit cell silicon may be 5 nm~ 200 nm and the width of the unit cell silicon may be 5 nm~ 200 nm. The length of the inner P region 1404 and inner N region 1406 may be 5 nm~ 200 nm. The doping concentration of inner P region 1404 and inner N region 1406 may be greater $10^{15}$ $cm^{-3}$ but may not exceed $5 \times 10^{19}$ $cm^{-3}$. The doping concentration of outer N region 1402 and outer P region 1408 may be greater than $5 \times 10^{19}$ $cm^{-3}$, for example, such as $5 \times 10^{19}$ $cm^{-3}$ or $1 \times 10^{2}$ $cm^{-3}$. Additional information on poly-silicon or amorphous silicon T-RAM may also be found in U.S. Pat. Nos. 5,477, 065, 6,812,504, 6,882,010 and 7,042,027, and International PCT application PCT/IB2013/061383, the entirety of the foregoing are incorporated herein by reference.

A high doping concentration could be achieved by in-situ deposition techniques. Such could be applied for the formation of the pillars achieving multiple objectives—low connection resistance and doping and it could allow some cell size reduction.

Figure 14C:
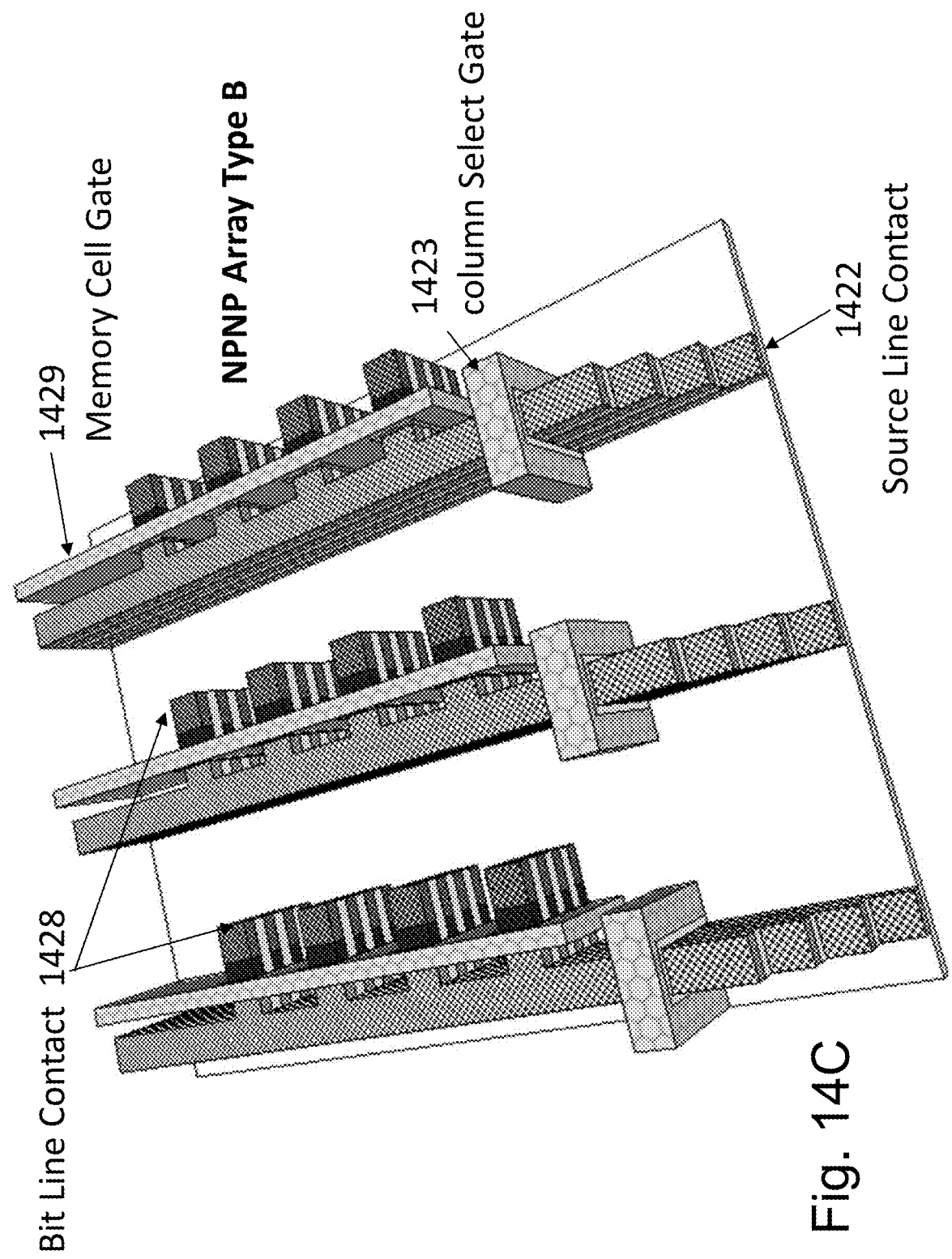
Figure 14D:
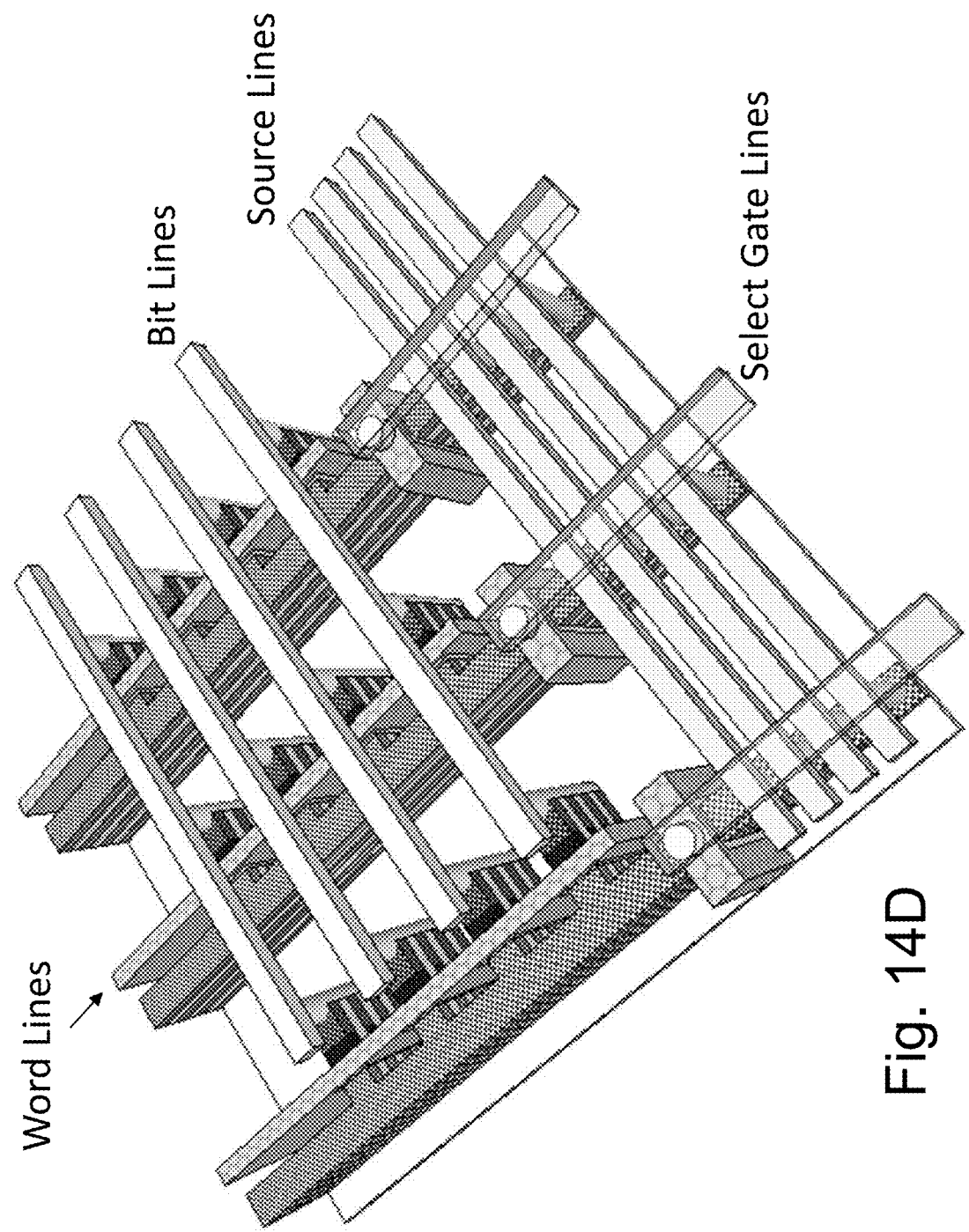
Figure 14E:
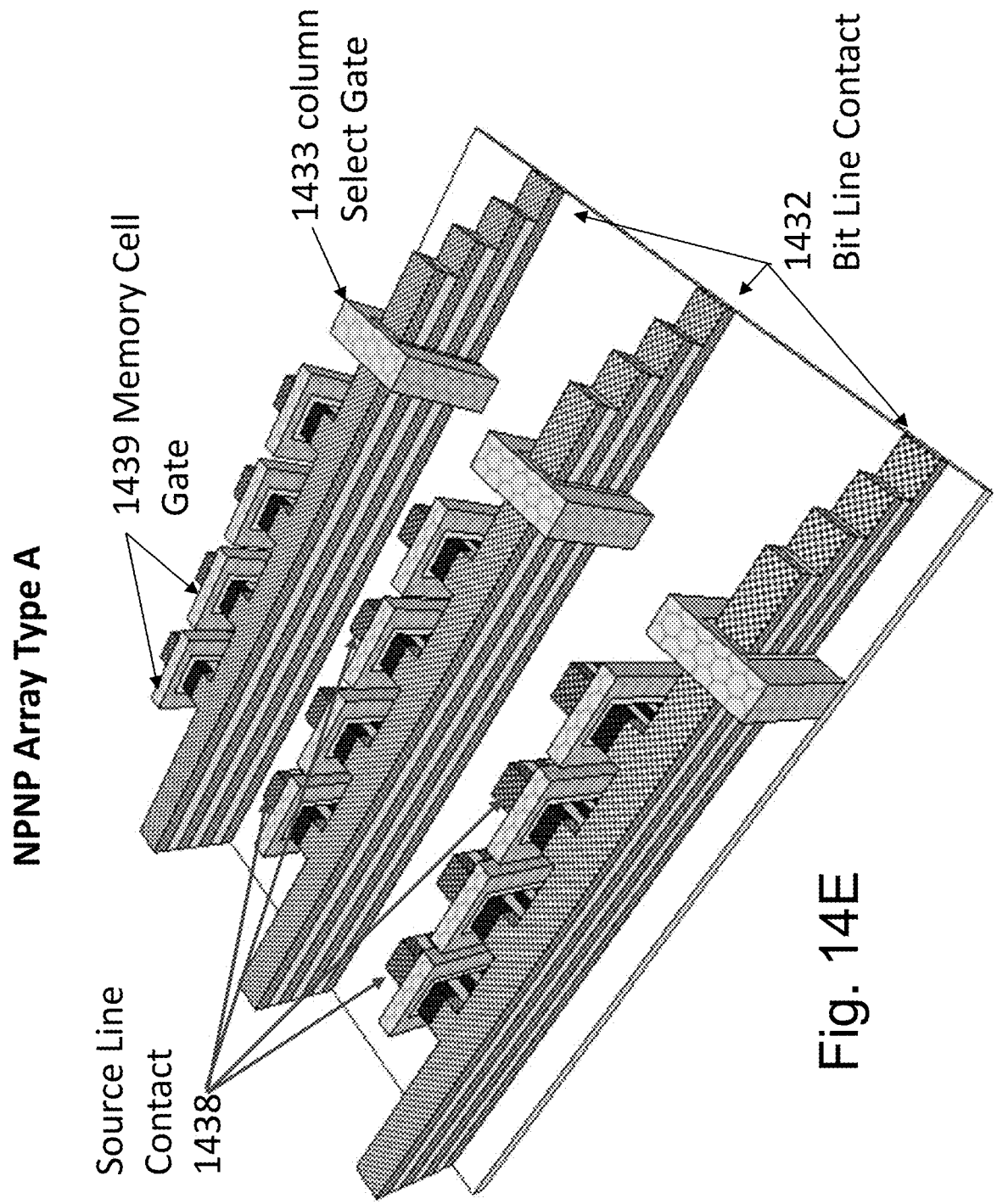
Figure 14F:
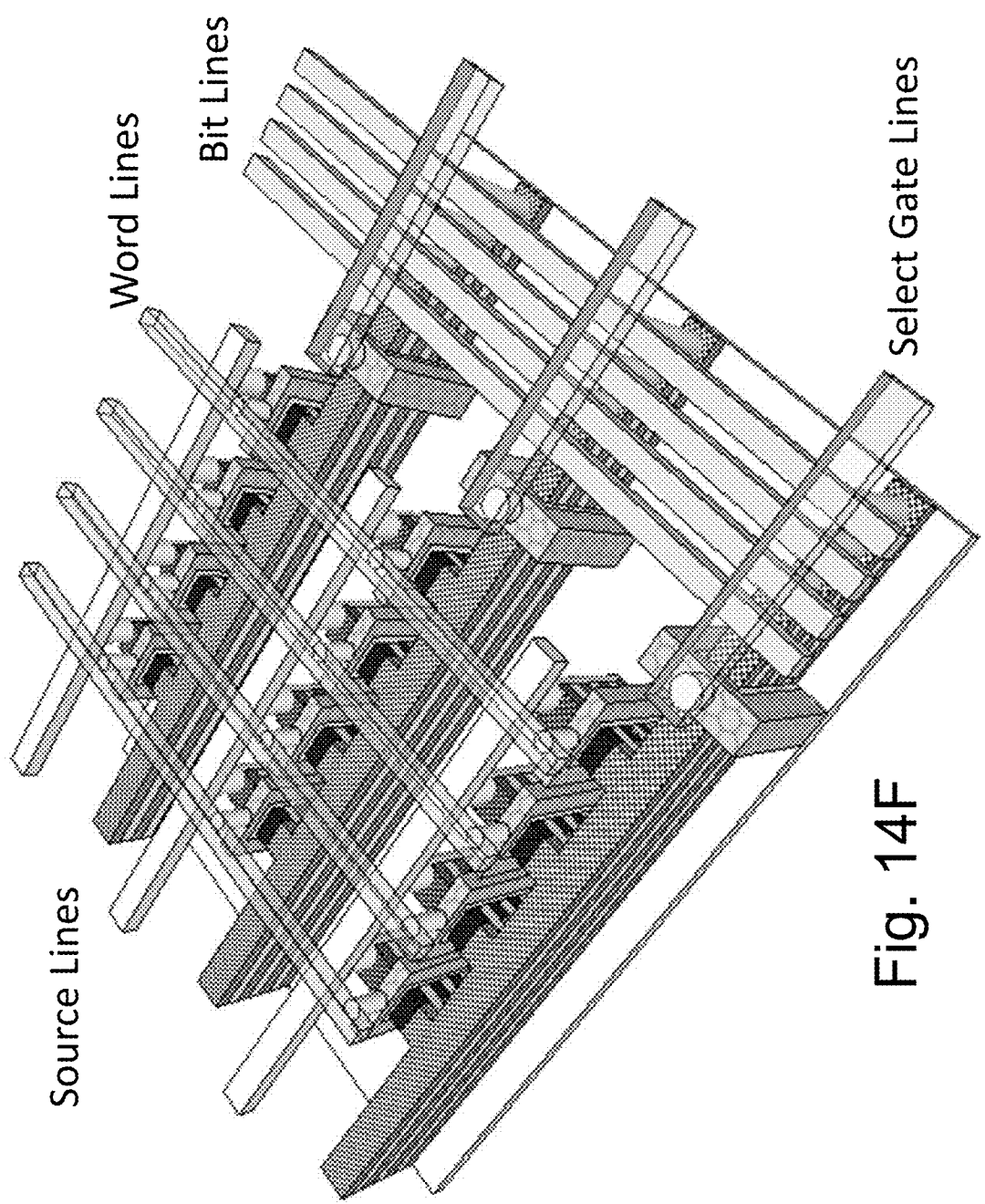
Figure 14G:
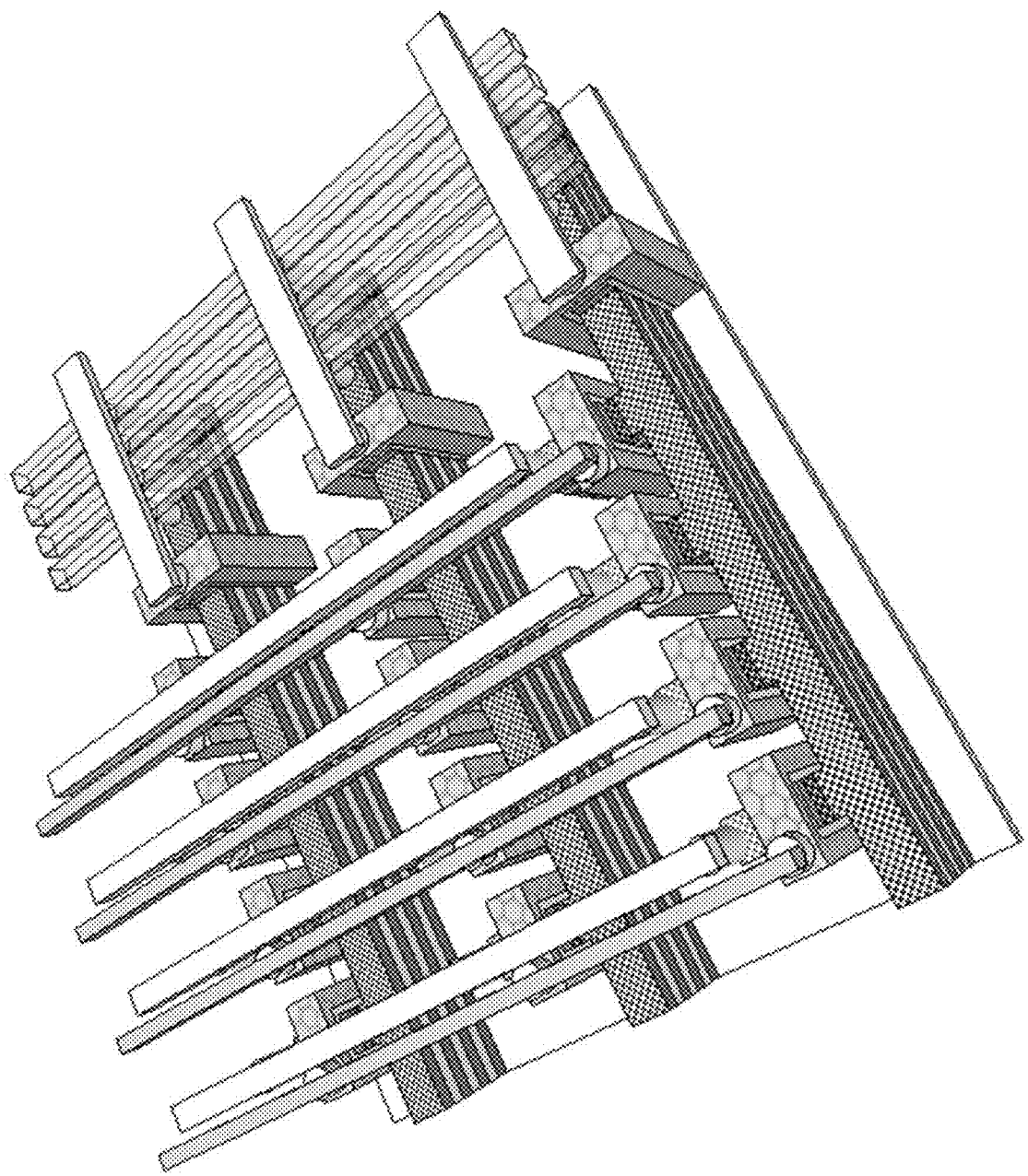

FIG. 14J illustrates a similar structure to the one in FIG. 14G. The outer N regions are connected by pillars 1450.

Figure 14H:
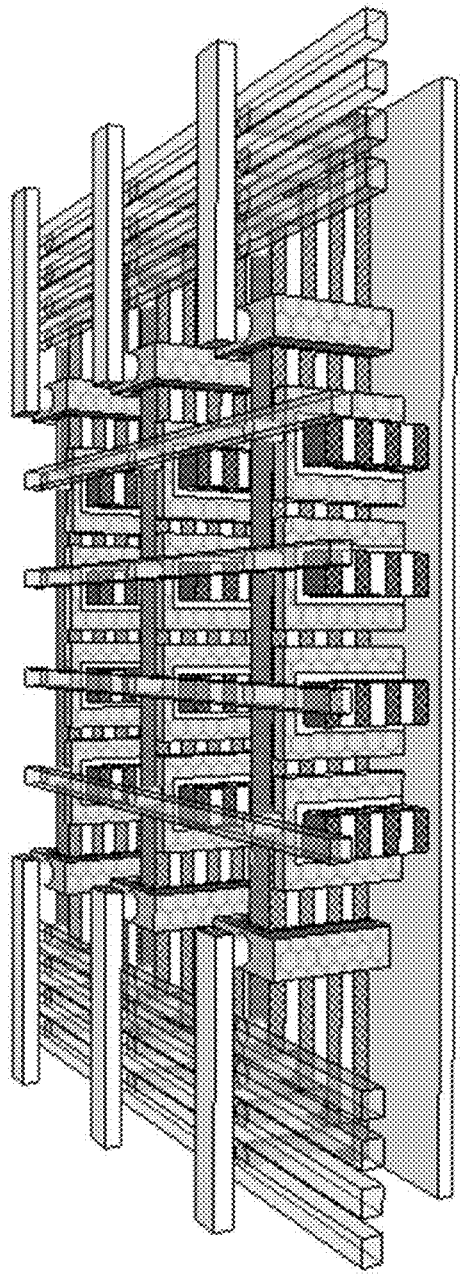
Figure 14I:
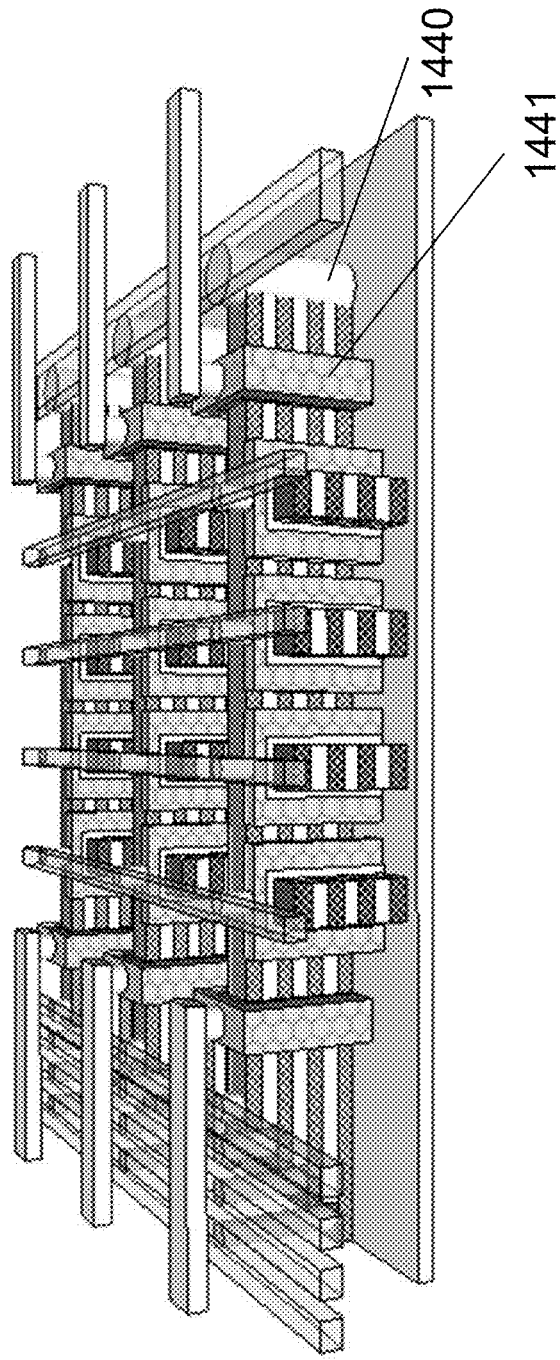
Figure 14K:
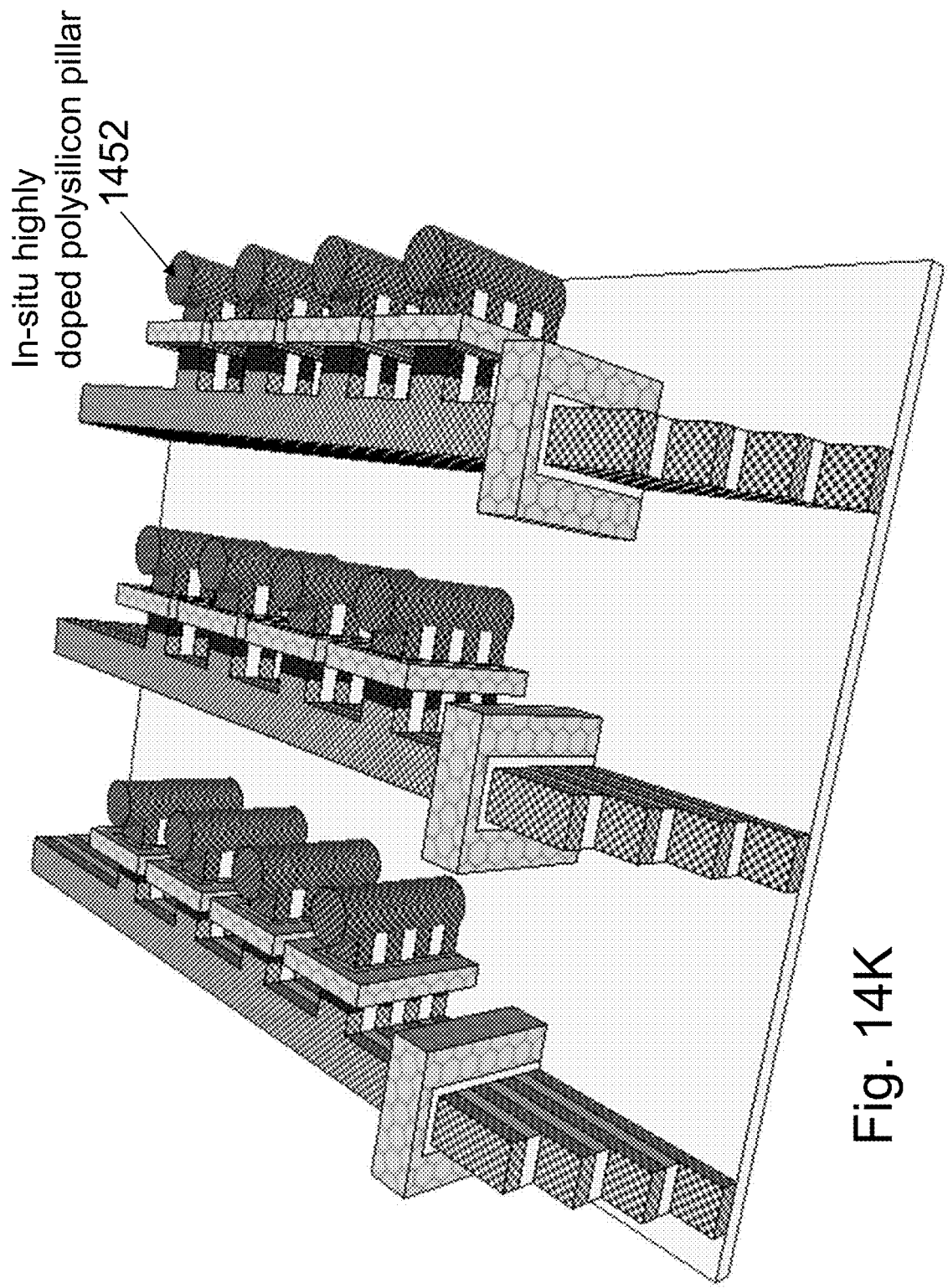

FIG. 14K illustrates the structure with in-situ highly doped N type polysilicon pillars 1452.

Figure 14L:
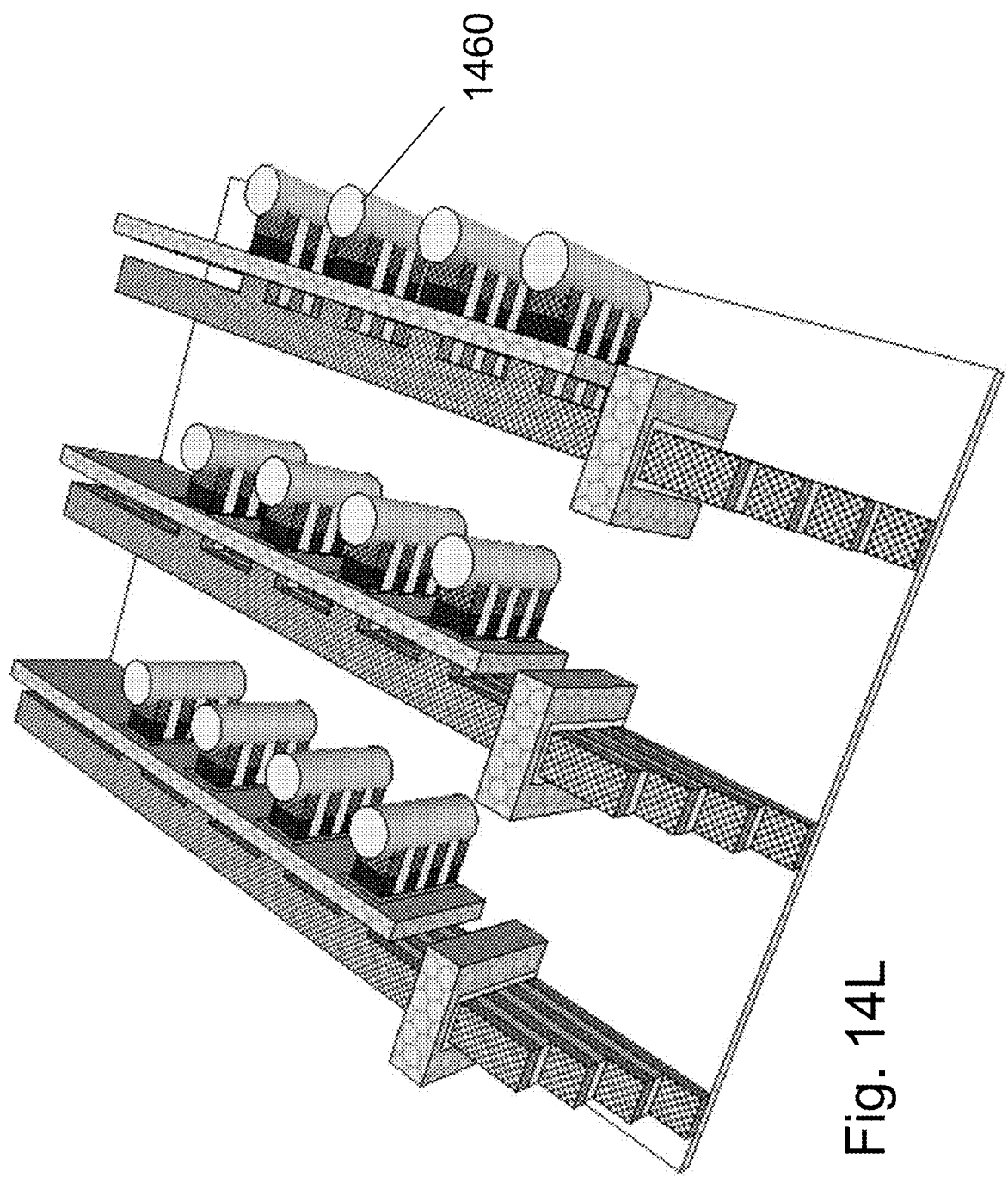

FIG. 14L illustrates a similar structure to the one in FIG. 14D. The outer P regions are connected by pillars 1460.

Figure 14M:
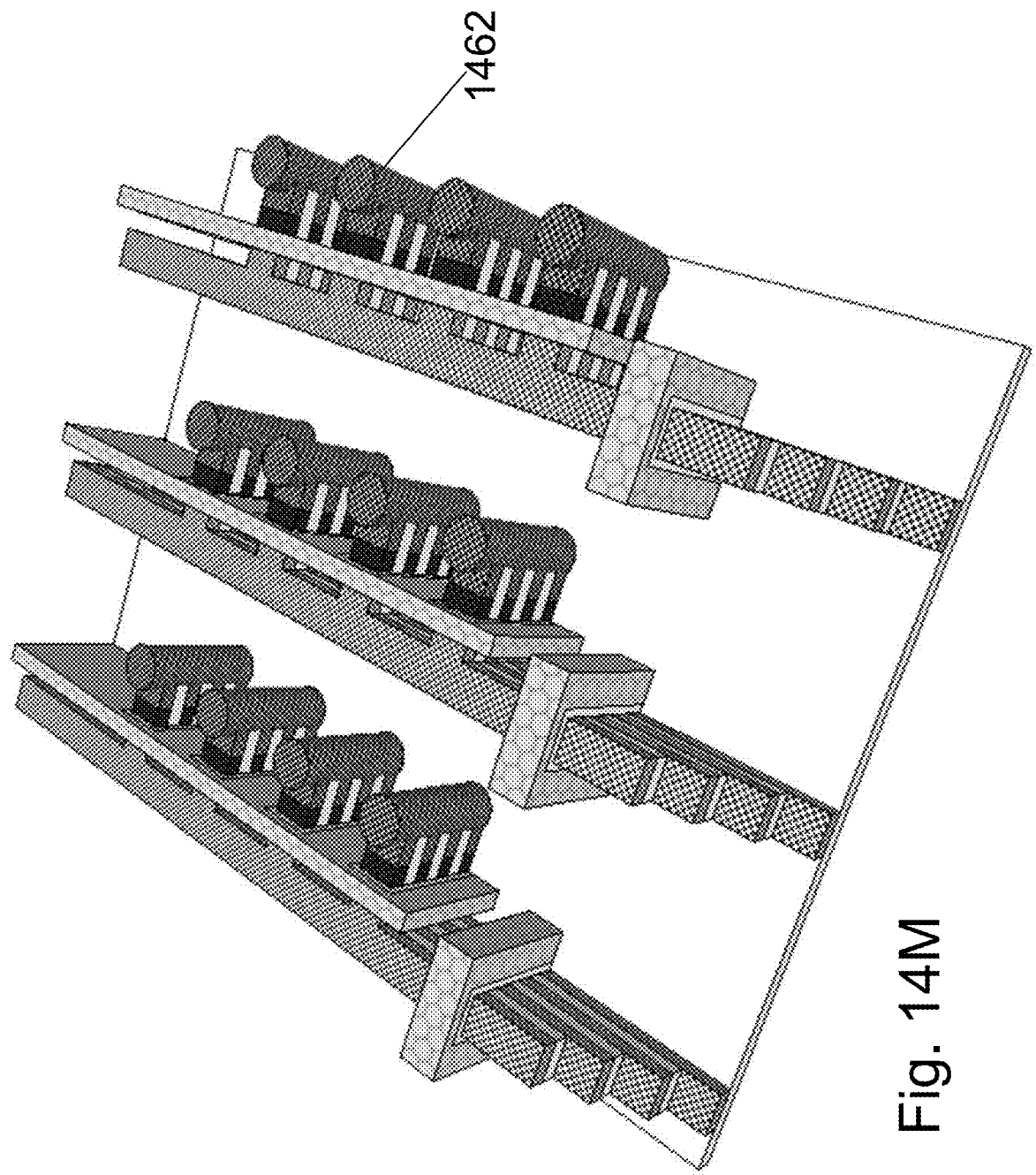

FIG. 14M illustrates the structure with in-situ highly doped P type polysilicon pillars 1462.

The structure could also built in reverse order as illustrated in FIG. 14B the anode 1412 is P type which could be extended to form the in-silicon embedded bit-line, then an N type region 1414 then P type region 1416 with gate 1419 on the sides (or may be all around P type region 1416) isolated by gate oxide and then the cathode 1418 N type region.

FIG. 14C illustrates an example 3D T-RAM structure utilizing the bit-cell of FIG. 14A. The anode contact 1428 could be formed by pillars or selective epitaxy similar to what has been presented before herein, the memory cell gates 1429 of a row could be shared forming gate lines, and the cathode forming the source lines 1422 could be etch to form the staircase (or other type access structures) for a per layer connection. A branch select gate 1423 could be formed to control the source lines of an entire row. The other side of the source lines could include a gated hold current structure similar to 1041, 1040 of FIG. 10C herein. The gated hold current structure 1041, 1040 allow reducing the memory power consumption as the holding current could act as refresh rather than constant as discussed in the IEDMO4 paper by Nemati.

FIG. 14D illustrates an example of the structure of FIG. 14C with the connection grid—word-lines, bit-lines, source-lines and select gates-lines drawn. These three sets of memory control lines enable the selection of individual memory cell by choosing specific x, y, z locations.

FIG. 14E illustrates an example 3D T-RAM structure utilizing the bit-cell of FIG. 14B. The anode contact 1438 could be formed by pillars or selective epitaxial similar to what has been presented before, the gates 1439 of a row could are not shared, and the cathode forming the bit-lines 1432 could be etched to form the staircase (or other structures) for a per layer connection. A branch select gate 1433 could be formed to control the source lines of an entire row.

FIG. 14F illustrates the structure of FIG. 14E with the connection grid—word-lines, bit-lines, source-lines and select gates-lines. These three set of memory control lines enable the selection of individual memory cells by choosing specific x, y, z locations. This structure is a bit more challenging as the select lines and the bit line are parallel which implies that multiple T-RAM cells may have their anodes sharing the same source lines while their cathodes share the same bit-lines and only their gate is unique. The read operation from an individual cell in such structure is a more challenging.

FIG. 14G illustrates an alternative to the illustrated FIG. 14F arrangement wherein the source lines are vertical to the bit lines and are in parallel to the gate lines. Reading an individual cell is now conventional; for example, by selecting a bit line and a source line a single T-RAM cell may be selected, which is the common approach for T-RAM memory array.

FIG. 14H illustrates the structure with an alternative dual staircase with dual select control for the in-layer embedded control line. This could be used for the refresh function and or for multi-port options.

FIG. 14I illustrates the structure with an alternative controlled refresh holding current on the other side of the in-layer embedded control line with pillars 1440 providing the holding current controlled by gates 1441 similar to 1041, 1040 of FIG. 10C herein.

Another alternative is to use a shared gate such as 1429 shown in FIG. 14C herein in the structure illustrated in FIG. 14E or alternatively to use isolated gates such as 1439 shown in FIG. 14E herein for the structure of FIG. 14C. In general, shared gates are easier to process and could allow tighter memory cell pitches than isolated gates. On the other hand, shared gates are oriented in parallel to the per layer in-silicon control line as illustrated in FIG. 14C in which memory cells on a layer who share the source-line 1422 will also share the gate line 1429. In such structure the selection of the specific cell in 'x', 'y', 'z' location would require activating the specific bit-line pillar 1428. For the alternative structure for FIG. 14C in which the gates are not shared their anodes could be held at constant reference voltage while the specific gate and per layer shared cathode could select the individual memory cell for write and read.

The most common control for 2D T-RAM memory cell is by holding the anode at constant reference voltage and use perpendicular control lines for the gate and the cathode. Yet, the T-RAM cell could be controlled by perpendicular control lines for the gate and the anode as the key for writing '1' is to have differential voltage between the anode and cathode, while writing '0' is achieved by removing or reversing the voltage between the anode and cathode. The key for reading is sensing the current through the T-RAM while having a differential voltage between the anode and cathode. The key for refreshing the T-RAM cell is to periodically have current through it by having a differential voltage between the anode and cathode. Accordingly, an artisan in the art could properly design the peripheral circuit to allow proper operation of each of the memory structure presented herein.

An alternative form of T-RAM cell has been described in a paper by Ahmad Z. Badwan et. al. titled "SOI Field-Effect Diode DRAM Cell: Design and Operation" published in IEEE Electron Device Letters, Vol. 34, No. 8 Aug. 2013, incorporated herein by reference. The T-RAM structured presented here and the process to process them could be adapted to build FED (Field-Effect Diode) structure and to form a 3D-FED RAM device.

Figure 15A:
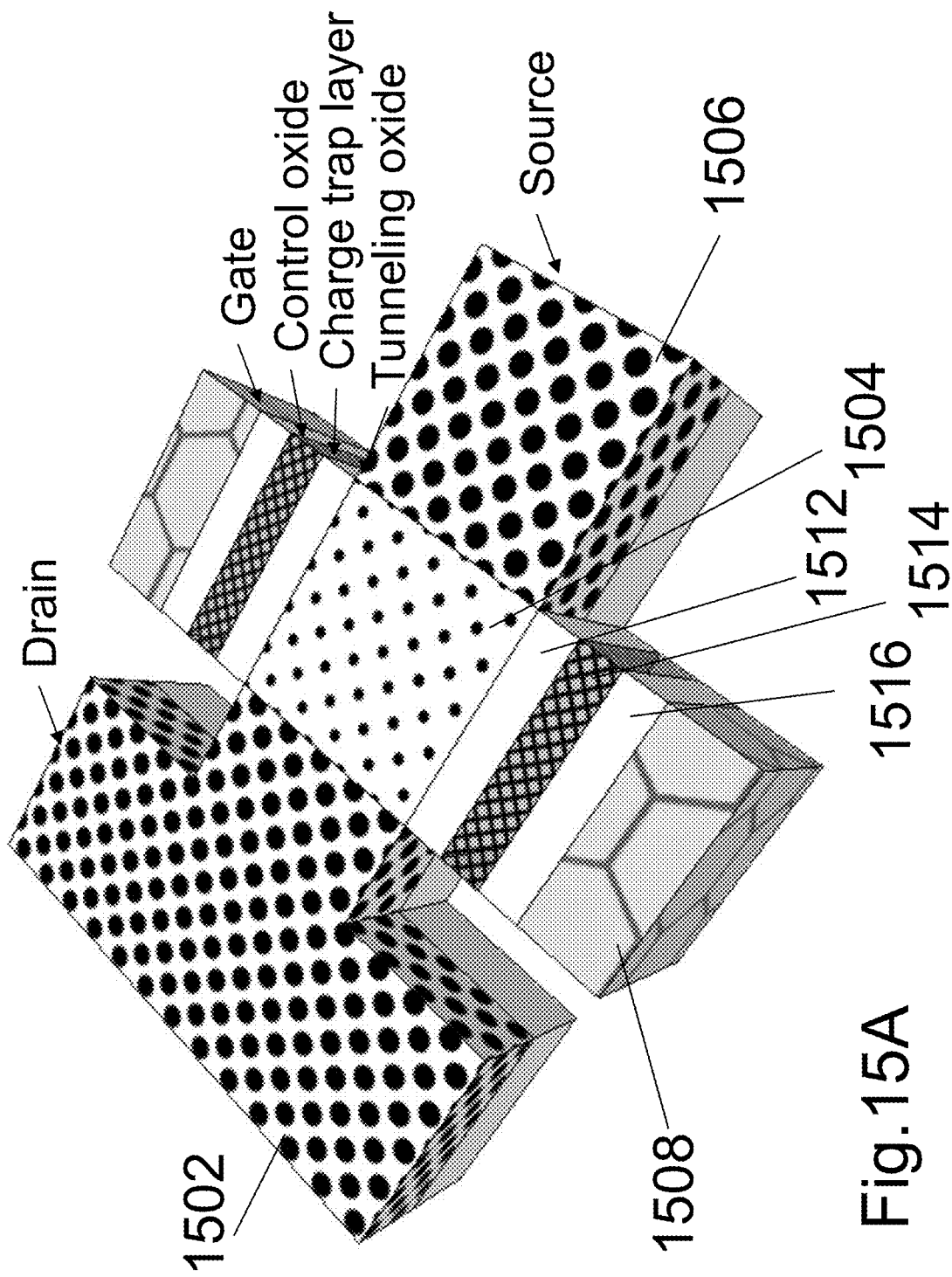
FIG. 15A is an example illustration of a non-volatile floating body cell.

FIG. 15A illustrates the floating-body memory cell, of the type utilized for 3D RAM such as illustrated in respect to FIG. 3A-P and FIG. 10A herein, enhanced to support a non volatile option by adding between the gate 1508 and the channel 1504, charge trap layer 1514 isolated with tunneling oxide 1512 and isolating control oxide 1516. The memory cell has n type drain 1502, p type channel 1504 and n type source 1506. The process forming the tunneling oxide 1512, charge trap layer 1514, control oxide 1514 and gate 1516 could be utilizing successive steps of ALD (Atomic Layer Deposition) or other type of deposition process, in place of single gate layer deposition described before. Such memory is sometimes referred to as universal memory. Each memory cell could function as high speed volatile RAM and also as low power non volatile floating gate or charge trap memory. For some applications the combination of high speed RAM with low power non-volatile built in back-up could be attractive.

Figure 15B:
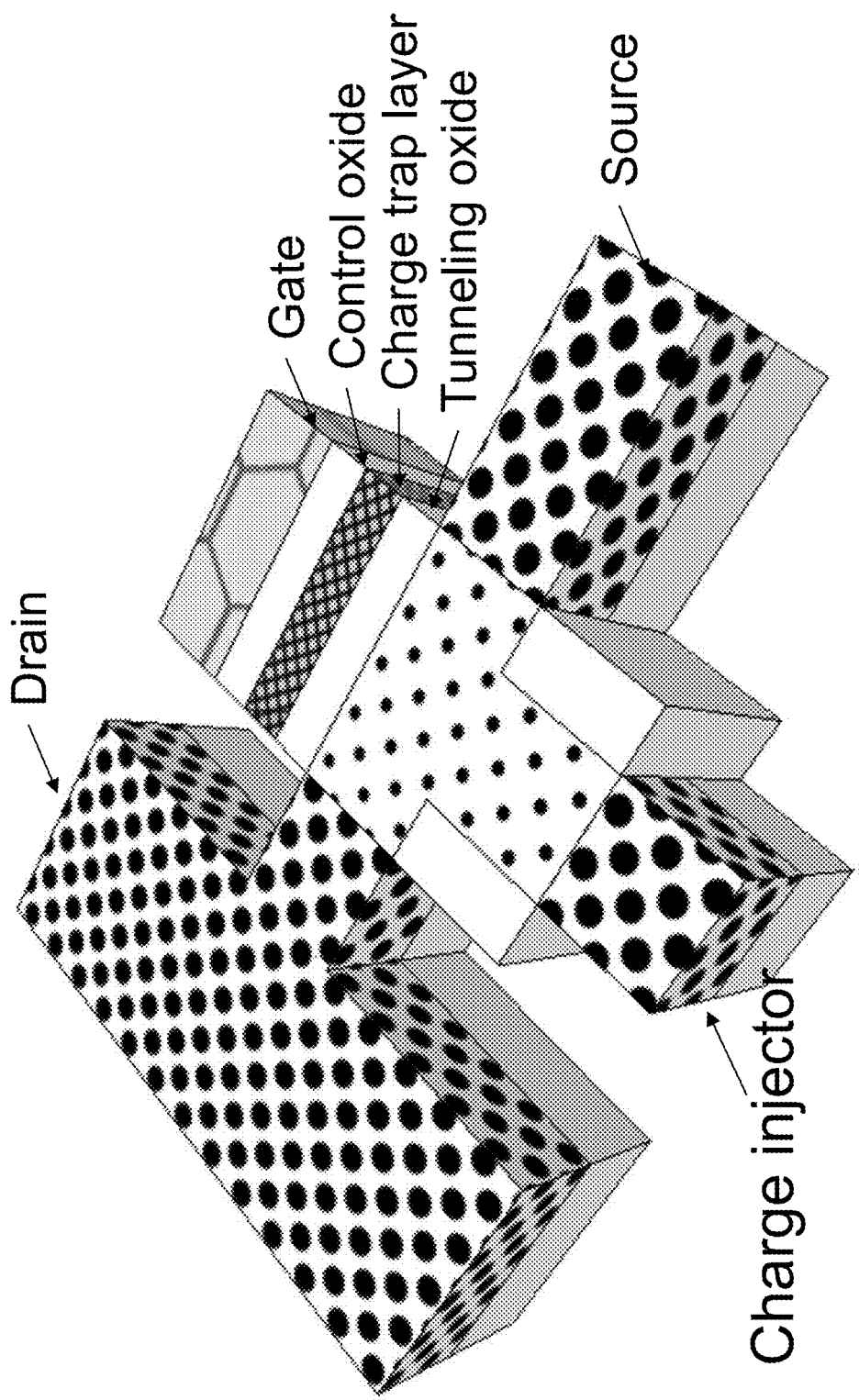
FIG. 15B is an example illustration of a stable two states one transistor memory structure 3D DRAM memory cell.

FIG. 15B illustrates enhancing to support the non-volatile memory option concept of FIG. 15A to the 3D memory illustrated as related to FIG. 4A-4D.

Figure 15C:
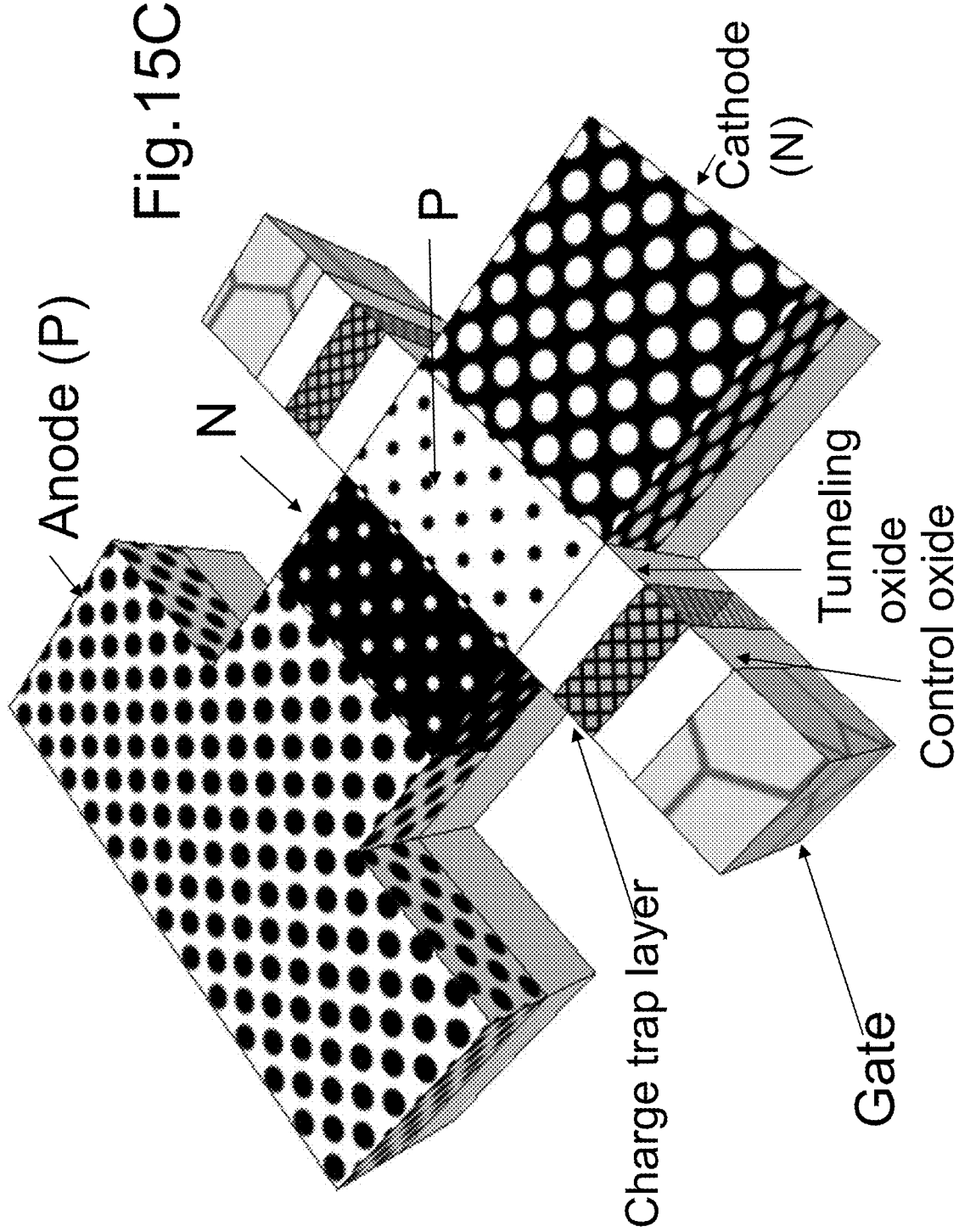
FIG. 15C is an example illustration of a non-volatile 3D TRAM memory.

FIG. 15C illustrates enhancing to support the non-volatile memory option concept of FIG. 15A to the 3D memory illustrated as related to FIG. 14A-14H.

In U.S. Pat. No. 8,902,663, incorporated herein by reference, a select transistor is presented at the upper layer of a 3D memory cell column as presented in respect to FIG. 8 and the related description there. Such per column select transistor could be effective for many of the memory structures presented herein. In many of these structures this top layer select transistor could be processed together with the transistor forming the memory cell underneath by sharing the same lithography process and other processes, thus the top select transistor ends up being at least partially self-aligned with the memory cell underneath it. Having these select transistors could give additional control flexibility and could provide a buffer to the memory cell to improve overall memory access speed and assist the read or write operations. In the following a detailed description is provided for the process to add such select transistors to one of the 3D T-RAM structure presented herein. It would be obvious for a semiconductor memory artisan to apply the concept to many of the other memory structure presented herein.

Figure 16A:
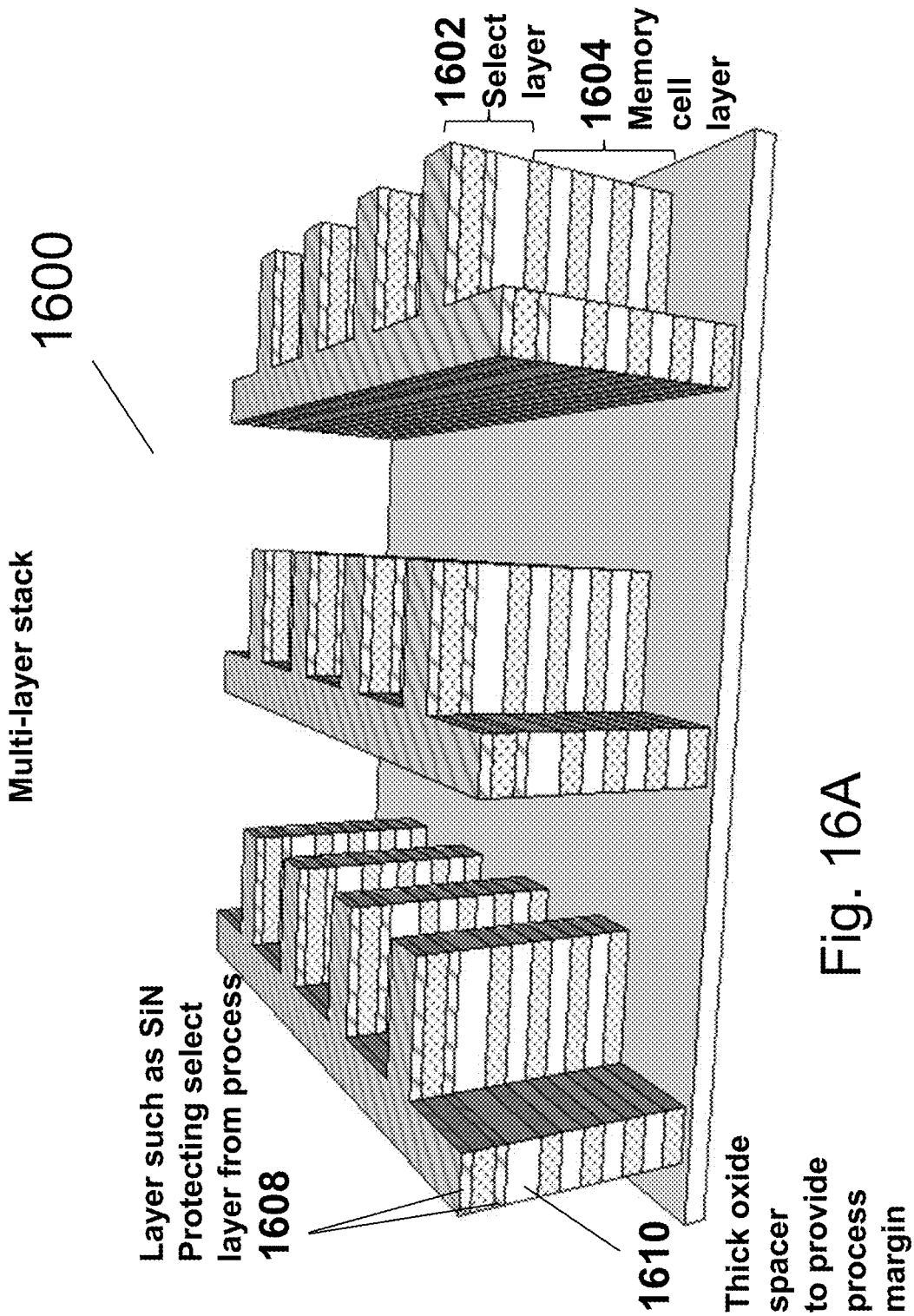

FIG. 16A illustrates a multi-layer stack 1600 patterned for the formation of 3D T-RAM similar to the structure of FIG. 14E. The top layer 1602 could be used for the construction of the column 1604 select transistor. The underlying layers would be used for the formation of the 3D matrix of T-RAM cells. The isolation 1610 between the top layer 1602 and the underlying stack 1604. The thicker isolation layer 1610 could provide larger process margin. Additional optional protection layer 1608 could be made from silicon nitride SiN and could be used to protect the column select transistors for the following processes. Forming silicon nitride between the top layer and the thick isolation layer 1610 is far easier for memory stack in which the top layer is either been deposit afterward or transferred in using layer transfer technique.

Figure 16B:
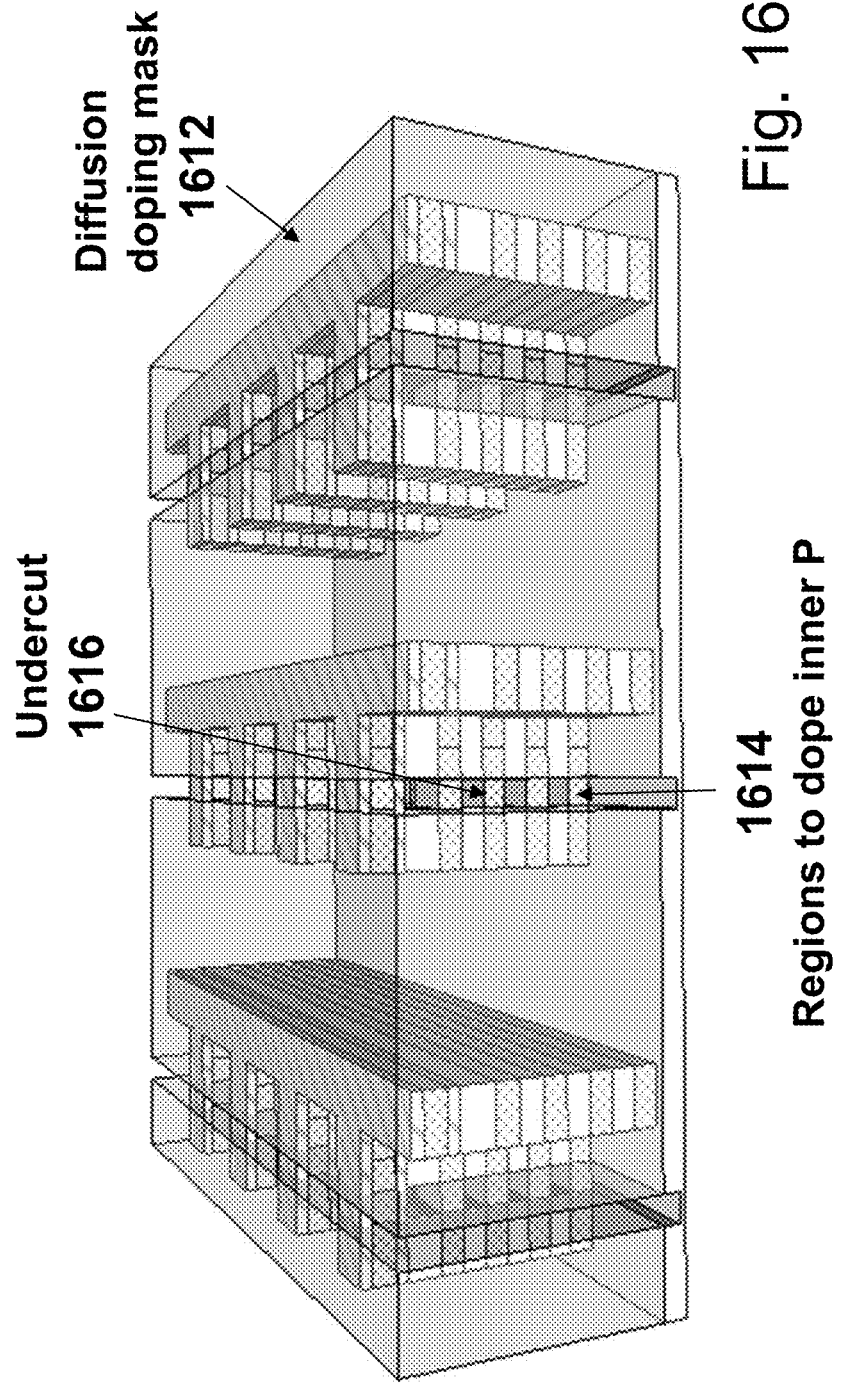

FIG. 16B illustrates the structure 1600 in different orientation after filling it with isolation layer such as silicon oxide masking it with diffusion mask 1612 and opening windows 1614 for the inter p regions of the T-RAM cells. The process could include a step of isotropic etch to open the interlayer oxide 1616 so the following step of get forming could fill the gate all around the P regions.

Figure 16C:
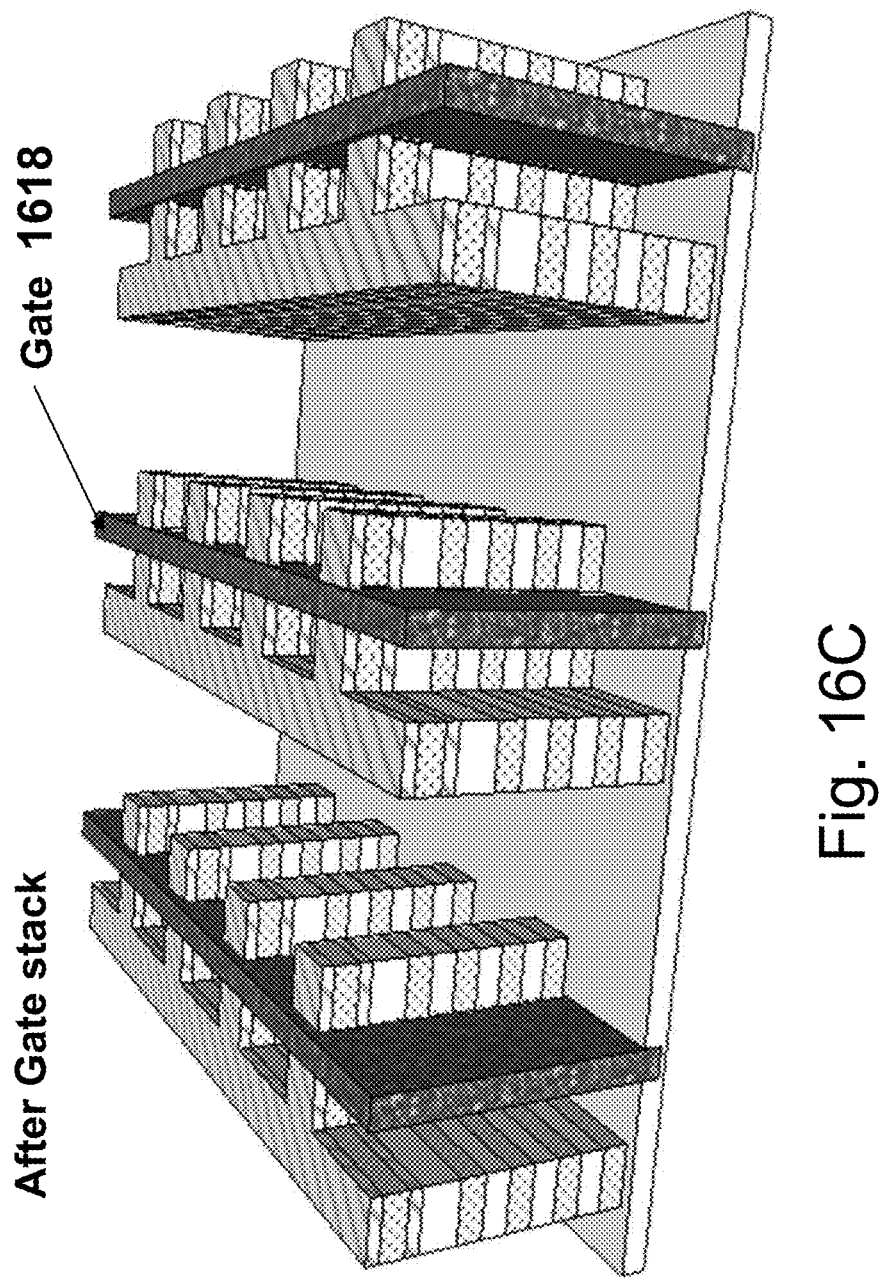

FIG. 16C illustrates the structure having the formed gate stack 1618 including a gate dielectric and gate material.

FIG. 16D illustrates the structure having the formed gate stack 1622 and a patterned silicon nitride 1620 masking the inner N regions so the outer regions could be silicided. Before the silicide masking layer 1620 is formed, the exposed silicon regions masked by the gate stack 1622 are doped by diffusion doping or other doping method to achieve the inner N region concentration.

Figure 16E:
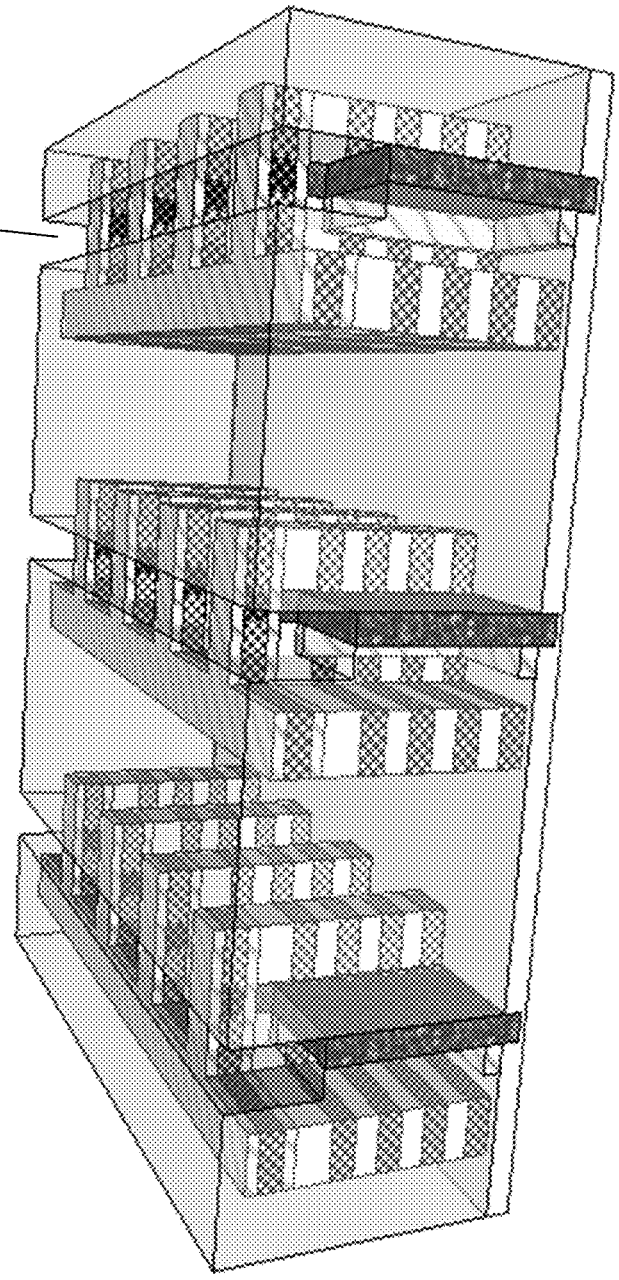

FIG. 16E illustrates the structure after etching back the gate and the blocking layer to expose 1630 only the top layer for the formation of the column select transistor.

Figure 16F:
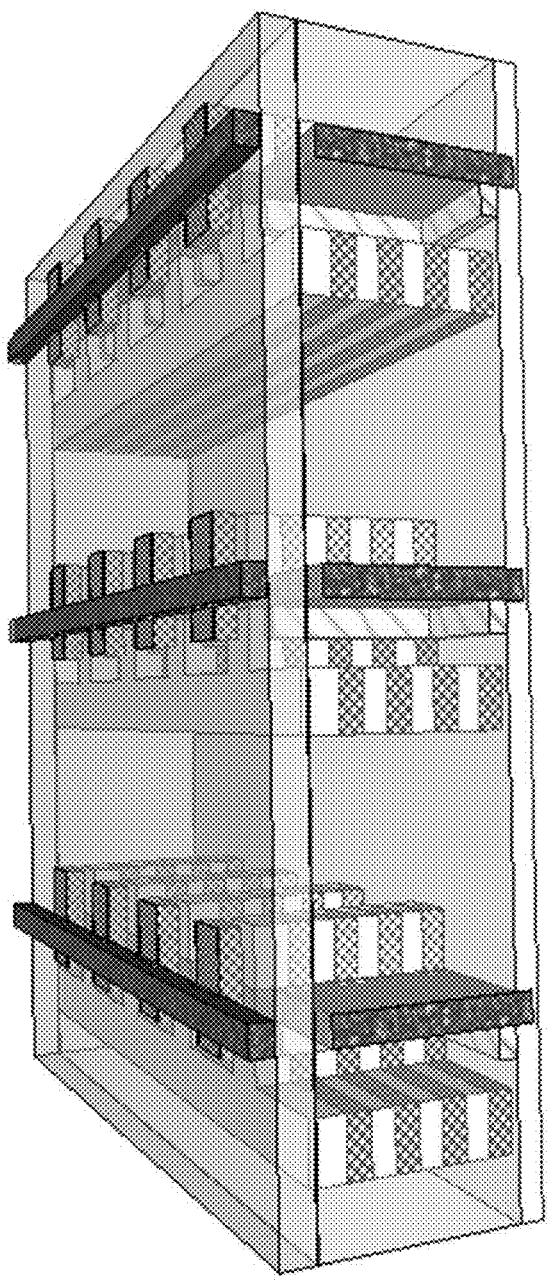

FIG. 16F illustrates the structure after performing an etch of the branch region backbone to separate each select transistor, forming isolation layer, forming column select transistor gate stack, and forming column select transistor source and drain (S/D).

Figure 16G:
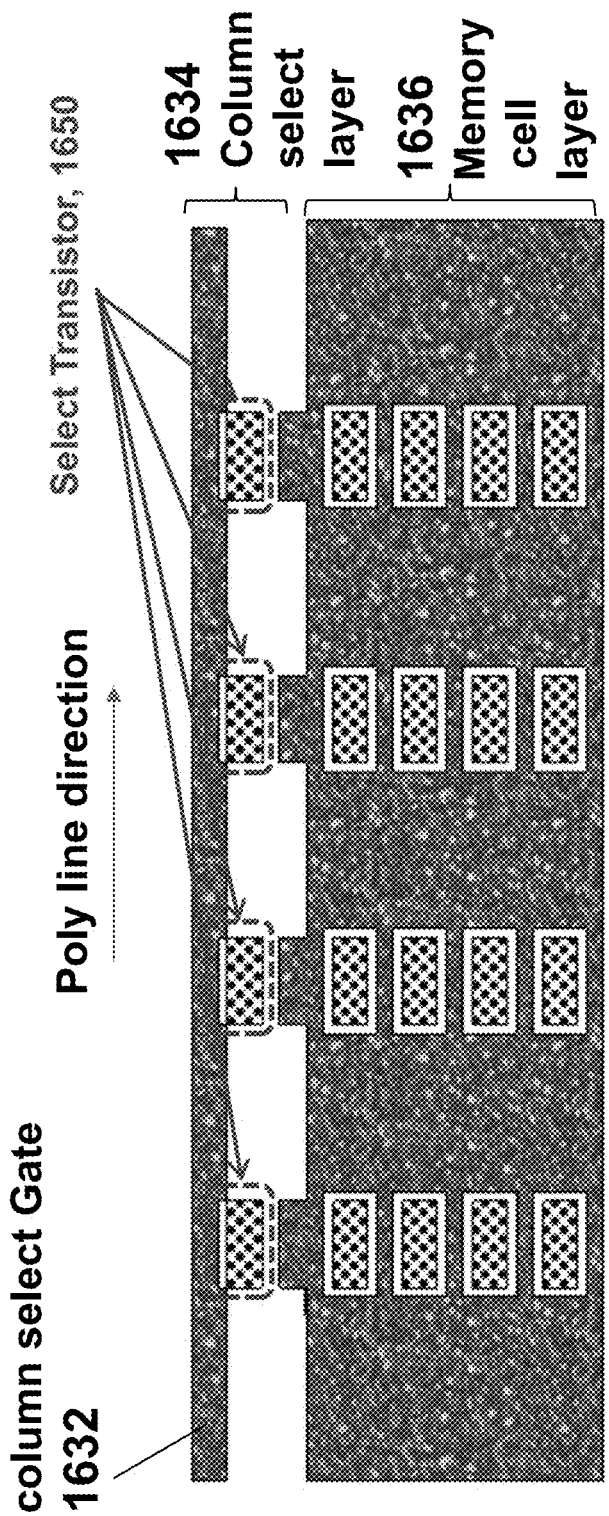

FIG. 16G illustrates the structure from a side view cut along the column select gate. Illustrating the common column select gate 1632 of the column select layer 1634 overlying the memory cells layers 1636 and the select transistors 1650. The gate in memory cell layer 1636 continues across the multiple columns through the gate material filled in the interlayer region.

Figure 16H:
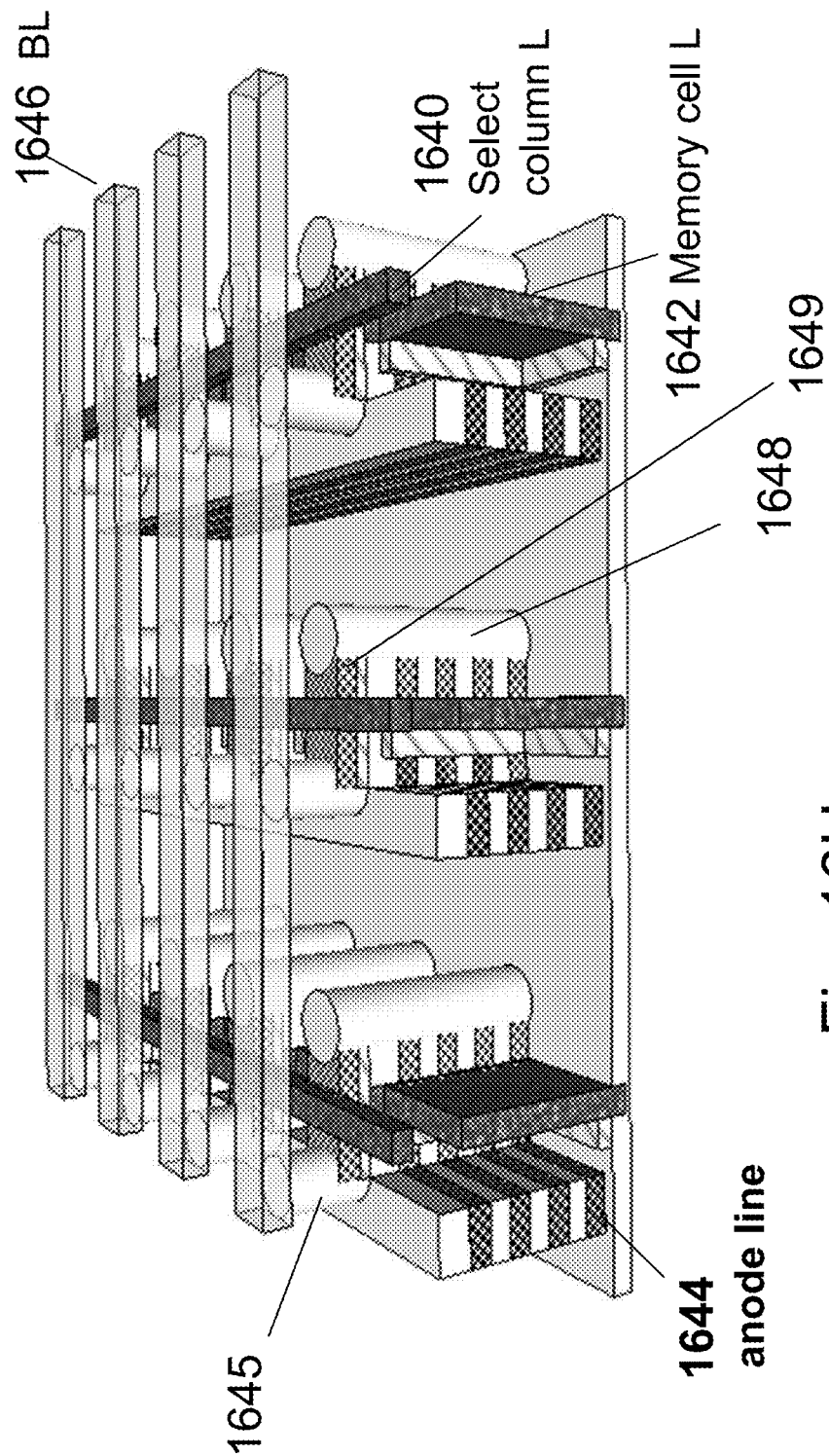

FIG. 16H illustrates the structure after adding the conducting pillars 1648 for cathodes connecting them to the source of column select transistor 1649. The contacts 1645 from the bit-lines 1646 to the drain of the column select transistor 1649. The drawing also illustrates the anode in silicon embedded per layer word-lines 1644 (p type silicon), the T-RAM memory cell gate lines 1642 and the column gate line 1640.

Figure 16I:
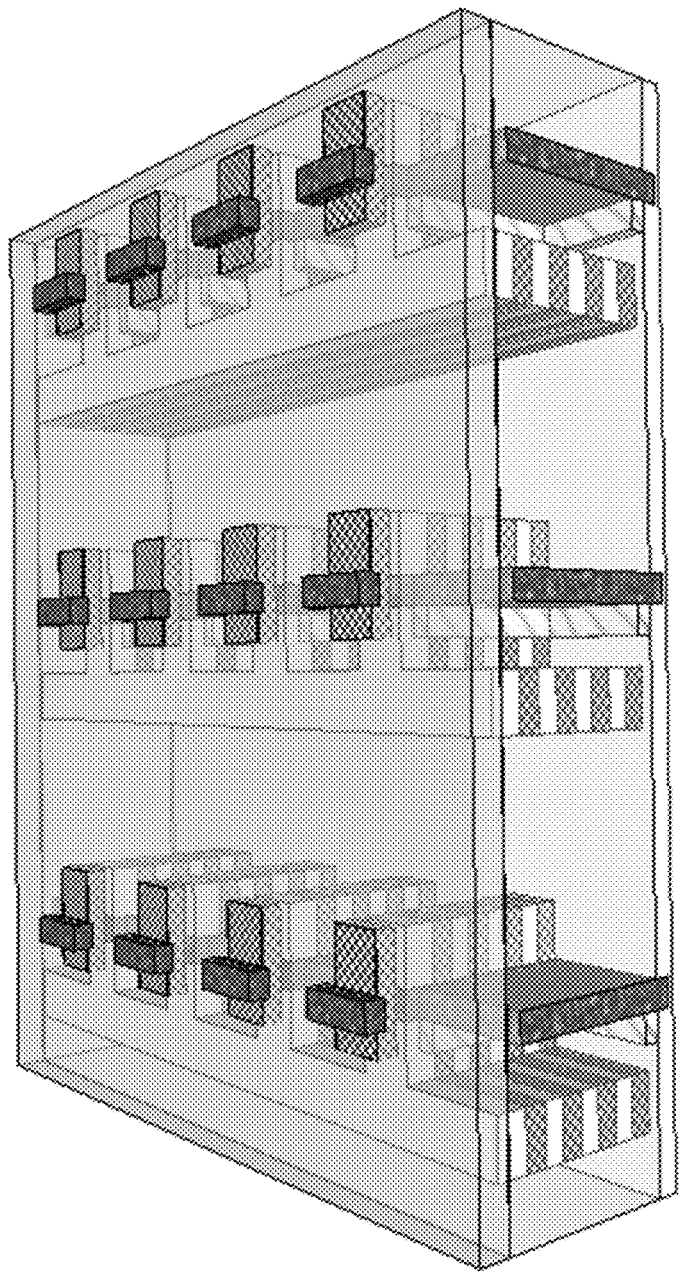
Figure 16J:
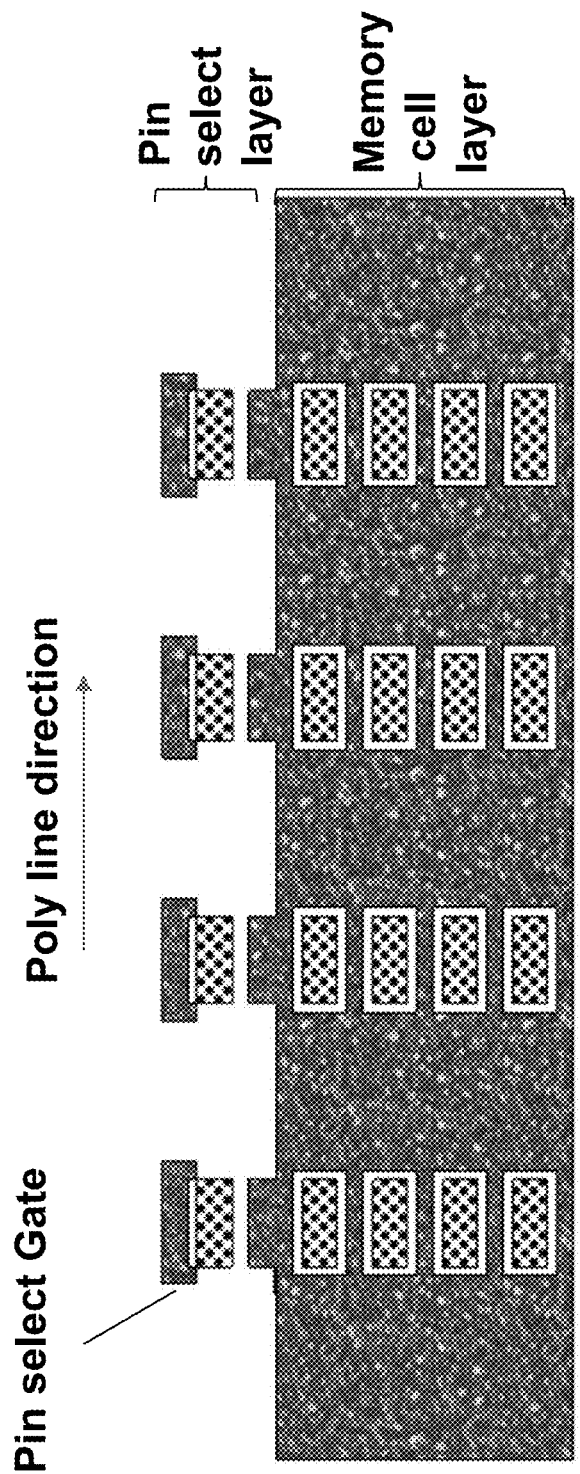
Figure 16K:
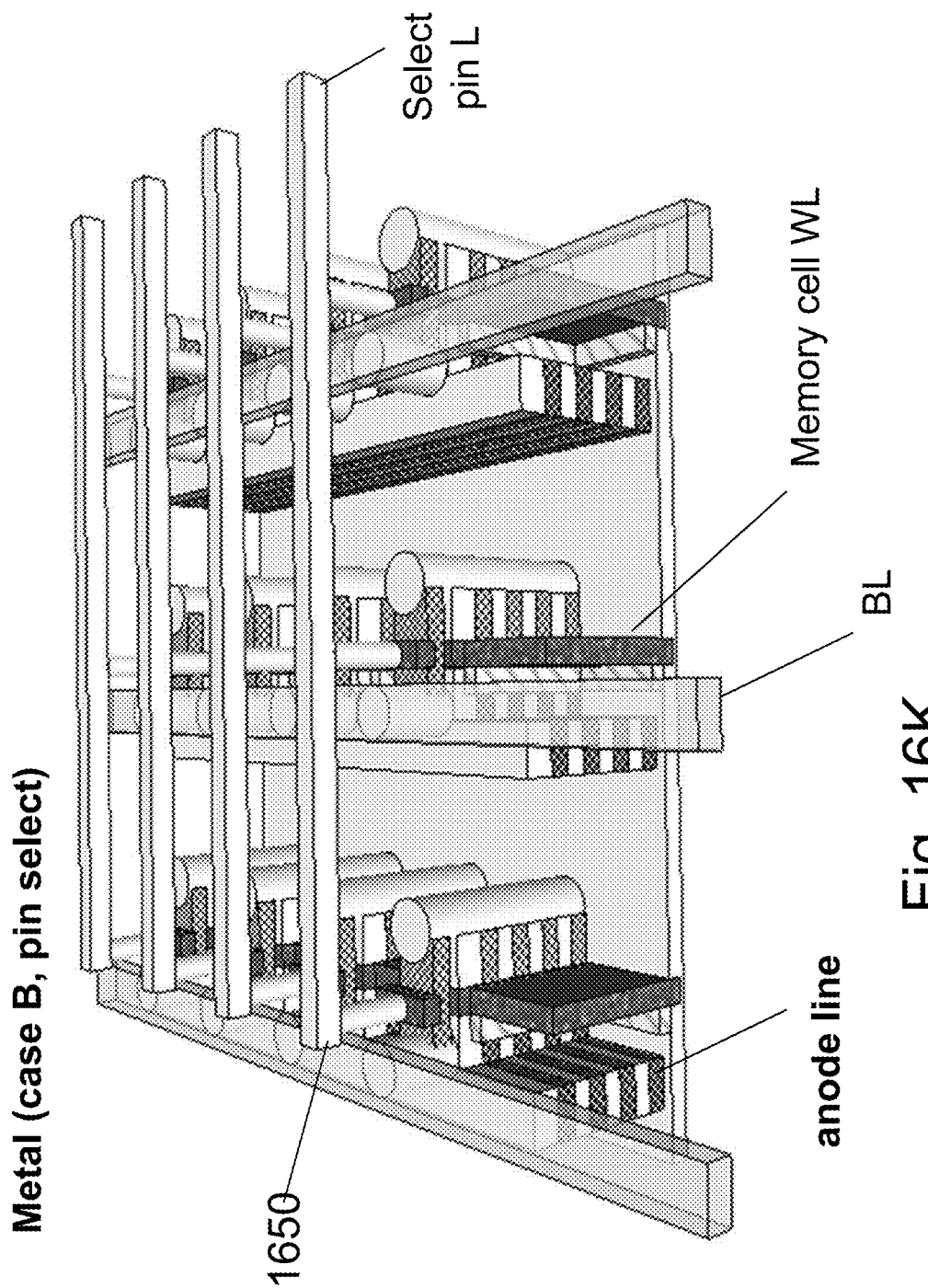

FIG. 16I to FIG. 16K illustrates an alternative in which the column select gate may be made individually and connecting along the direction of the T-RAM cell vertical to the anode line while the select transistors drain are made common in parallel to the anode-lines. Both configurations enable selection of individual T-RAM cell. In the first configuration it could be done by selecting a bit-line 1646—the column select transistor drain, while in the second configuration it could be done by selecting the select pin line 1650—the column select transistor.

Figure 16L:
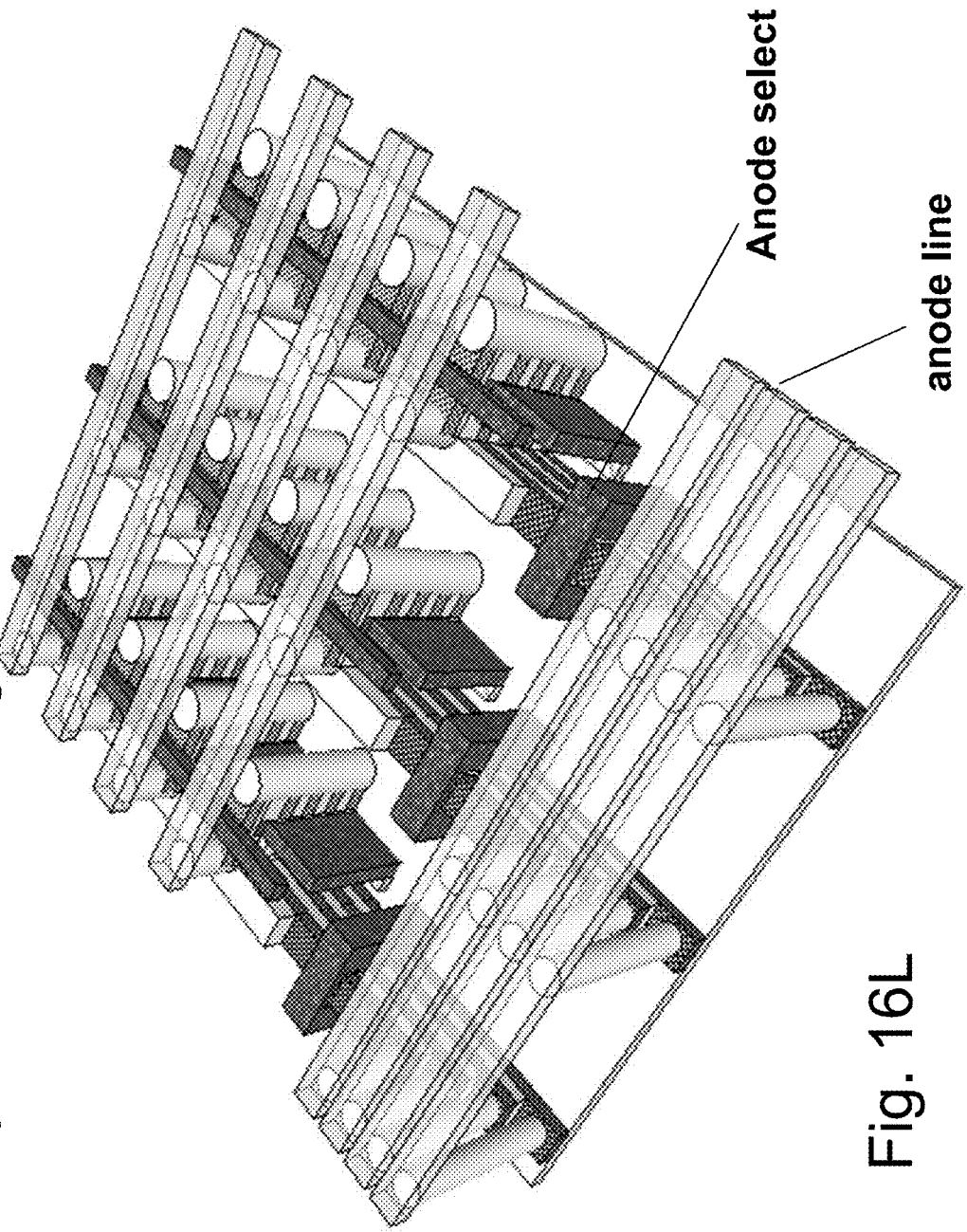

FIG. 16L illustrates the structure after adding the staircase for the per-layer in silicon embedded anode lines and the optional anode select transistors.

The flow for formation of top layer per column select transistors could be adapted to the other memory described herein such as those related to at least FIG. 3B, FIG. 4A, FIG. 7A, FIG. 10A, FIG. 10B and FIG. 14C.

As discussed before a technique for memory design is to share control lines between adjacent memory rows and column to increase overall memory matrix density. This could be applied for many of the memory structures presented herein such as those related to FIG. 3B, FIG. 4A, FIG. 7A, FIG. 10A, FIG. 10B, FIG. 14C and FIG. 14E, which were shown without such sharing for ease of illustration and description, Sharing the pillars such as pillars 338 is been illustrated in FIG. 3L—376, and could applied and similar fashion to the other memory structure here in. Sharing the in silicon per layer control line such as 384 of FIG. 3M could be in some cases more challenging.

Figure 17A:
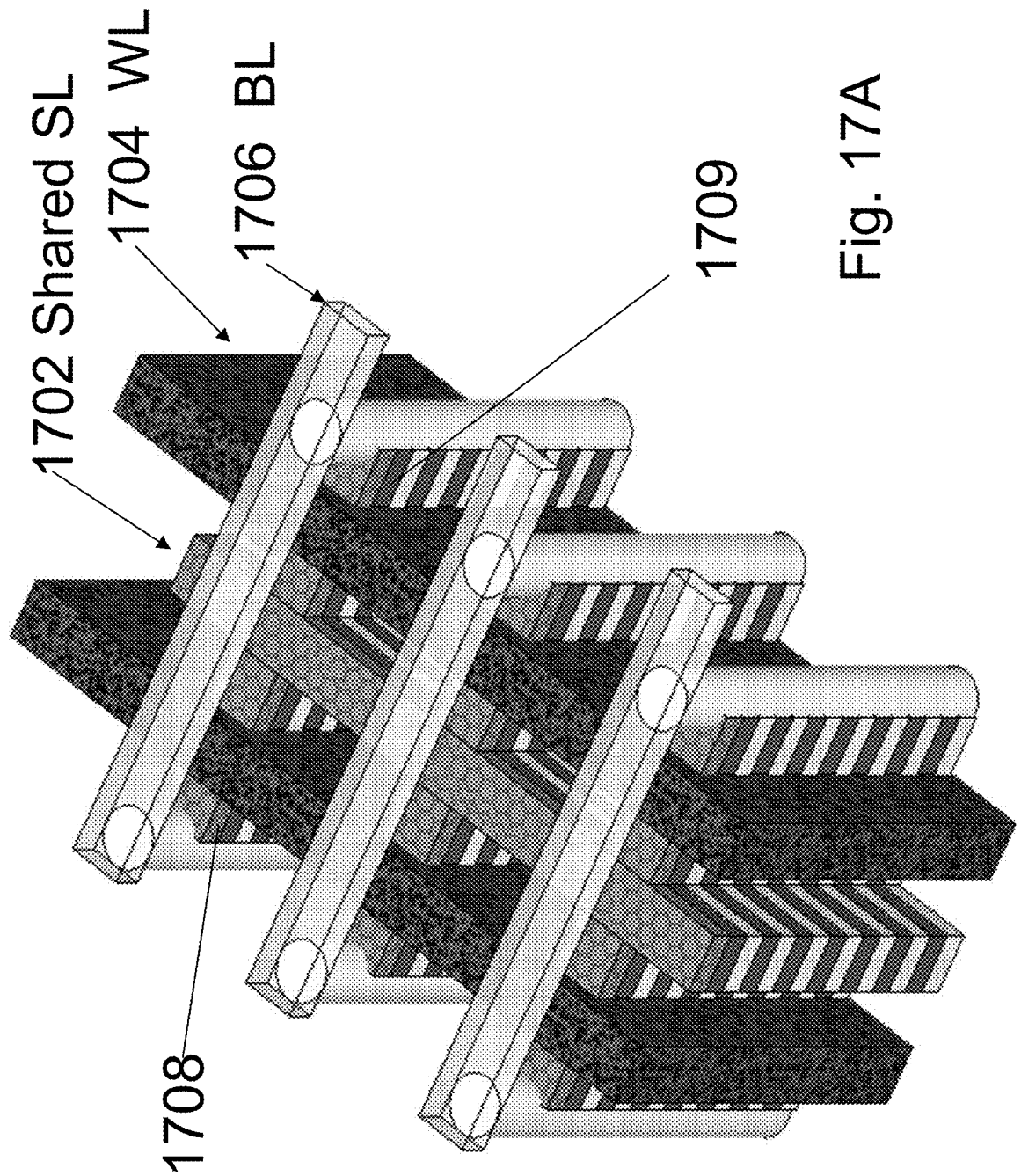
FIGS. 17A-17B are example illustrations of sharing of the per layer in silicon control lines.

FIG. 17A illustrates such challenge as the sharing of the per layer in silicon control lines 1702 while having the gate-line shared in parallel Word-Lines 1704 and in vertical orientation their bit-lines 1706. In some memory type it will be harder to distinguish between the adjacent memory cells 1708 and 1709. The two cells share two of their control lines 1702 and 1706 and would be addressed individually by selecting the proper gate-lines (word-lines) 1704. Yet in many T-RAM cases in the read operation the gate-line is not active and accordingly it will not help to distinguish between the adjacent memory cells 1708 and 1709. Similar challenge would exist for memory like the one presented in FIG. 10C which use a two terminal cell and do not have gate-lines.

Figure 17B:
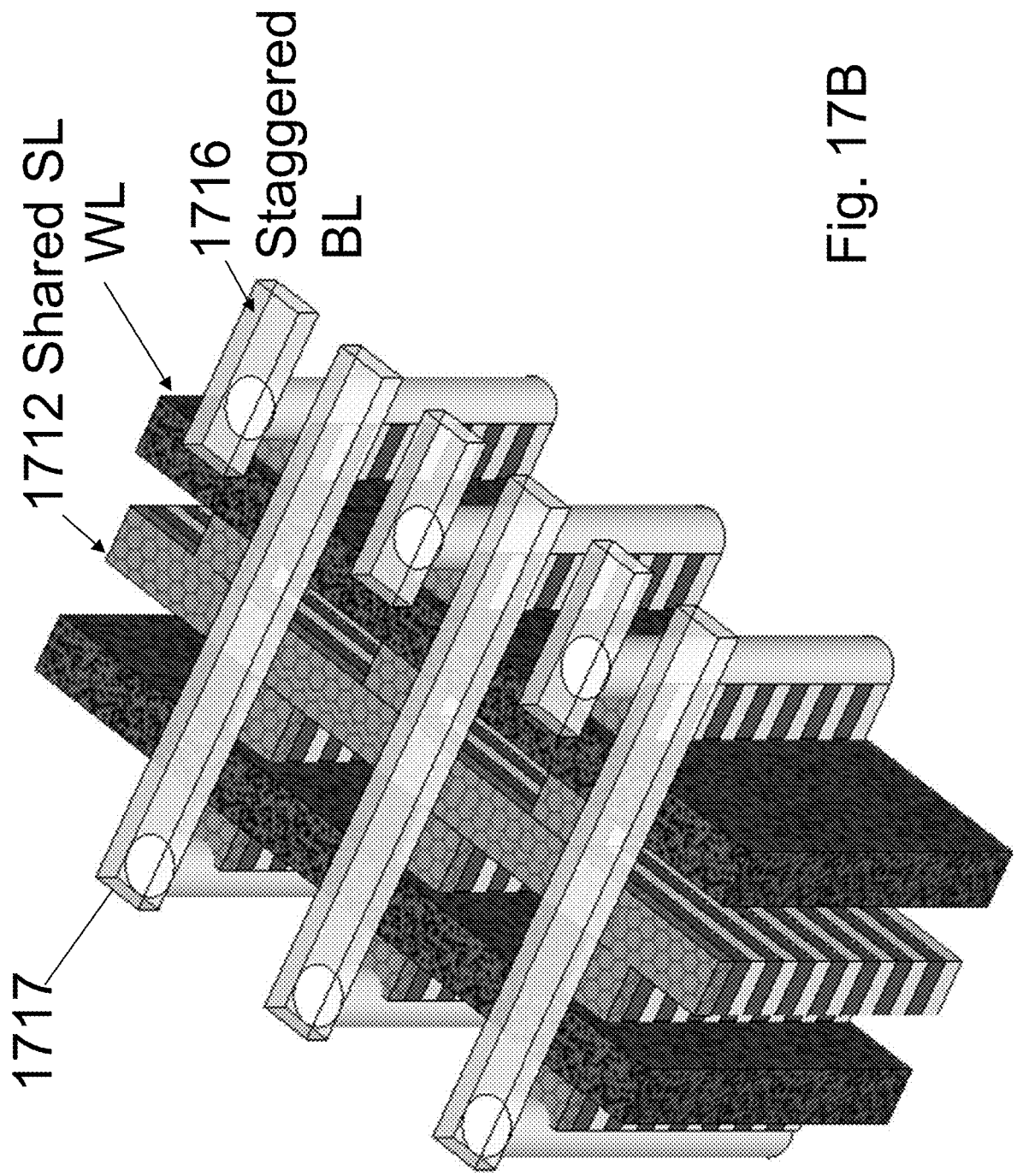

FIG. 17B illustrates one optional solution by staggering the cells along the two sides of the in silicon embedded control line, the shared select line 1712. Accordingly the adjacent cells would have different bit lines 1716 and 1717. Alternative solution could be applied by having some control lines going at the bottom of these memory structures and not just at the top as has been illustrated herein.

Figure 18A:
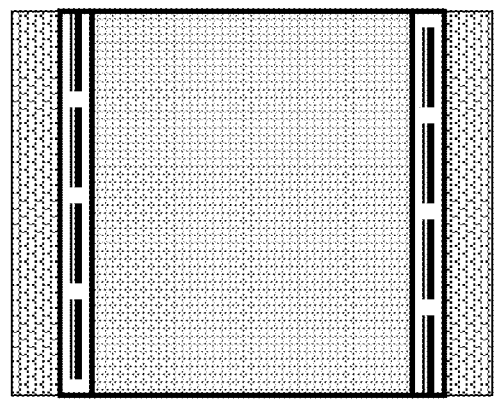
FIGS. 18A-18D are example illustrations of 3D memory arrangements.

FIG. 18A illustrates prior art 2D memory device. The memory cells 2D matrix 1802 is surrounded with the memory control circuits 1804 such as decoders, sense amplifiers and interface with external devices. Having these circuits are called accordingly memory peripherals. The memory control lines 1806 are going through the memory cells columns and rows all the way across the memory matrix to the peripherals circuits.

Figure 18B:
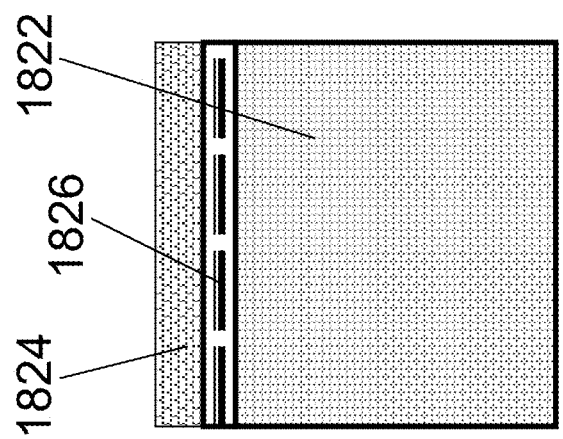

FIG. 18B illustrates prior art 3D memory device. Recently 3D memory also known as 3D-NAND has been released to the market. In such 3D NAND the memory cells 3D matrix 1812 is still surrounded with the memory control circuits 1814 such as decoders, sense amplifiers and interface with external devices. These memory peripherals circuits are being process in very similar way the 2D memory circuits on the silicon wafer substrate. In these 3D memories the control lines 1816 are going through the memory cells columns and rows all the way across the memory matrix, some of these control lines are build at the top of the 3D matrix and some of those going through in the body of the memory matrix but than they are brought down to the 2D peripherals circuits.

Figure 18C:
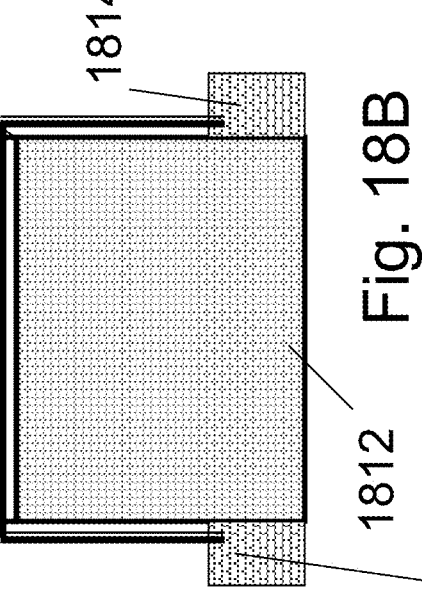

FIG. 18C illustrates 3D memories formed using the techniques presented herein. The 3D memory matrix 1822 of layers of columns and rows having the control circuits which could still be called peripherals circuits 1824 and they could be formed on top of the memory matrix and the control lines 1826 in-between FIG. 18D illustrates an alternative 3D memories formed using the techniques presented herein in which the control lines and the control circuits are also underneath the memory cell matrix.

Figure 18D:
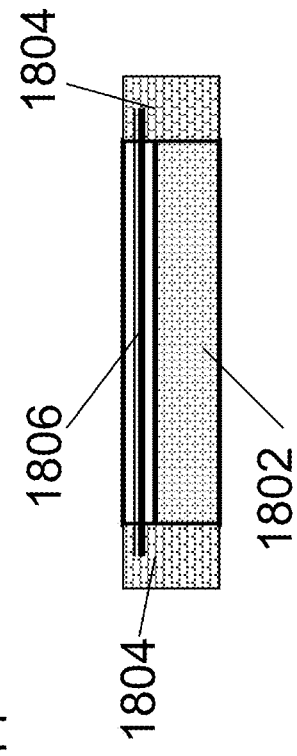

This new type of 3D memories could be constructed to achieve significant benefits from the 3D architecture as illustrated in FIGS. 18C and 18D, as the control lines 1826 could be broken to smaller chunks and having the control circuits repeated for each chunk. Shorter control lines could allow reduction of memory access read and write and refresh and could allow faster memory access time. The stair-case per layer access could impact device cost if it is broken too often. Proper architecture and overall memory control strategy could use very long per layer control lines to save overhead area for stair-case and accordingly design to use memory at the same layer for as long as possible so having the other control lines relatively short while the per layer control lines still long, could allow these benefit of low power and fast access maintained for most of the time.

As was discussed in respect to FIG. 15A, FIG. 15B, and FIG. 15C these 3D memory could be enhanced to include dual functionality—a high speed volatile memory and a low power low speed non volatile memory. These figures illustrates non-volatile utilize charge trap or floating gate technology. Alternatively other form on non volatile technologies could be implemented such as Re-RAM, M-RAM, Phase-Change, etc. For some of these other non volatile techniques it might be preferred to split the gates on the side of the memory cell channel so one side will control the volatile function and the other side could control the non-volatile function. Alternatively splitting the gate could be used to increase the non-volatile memory capacity for cells that the channel is wide enough to allow 2-bit per cell.

In most cases the volatile operation could interfere with the non-volatile operation of the memory cells. So it is common to avoid using them together, and to have the unused portion reset to reduce interference with the used portion.

There are many use mode such enhanced memory could be used including, splitting the memory bank for volatile and non-volatile portions, power own with saving the volatile information into the non volatile portion, and sleep power reductions by moving the volatile information into the nonvolatile portion. For some of these use modes the 3D structures presented in here with control circuits on top and/or on the bottom—FIG. 18B and FIG. 18C—could be construct for very enhanced effectiveness. For these modes the time and the power required to move the data from volatile portion into the non volatile portion, could be reduced by order of magnitude.

Figure 19A:
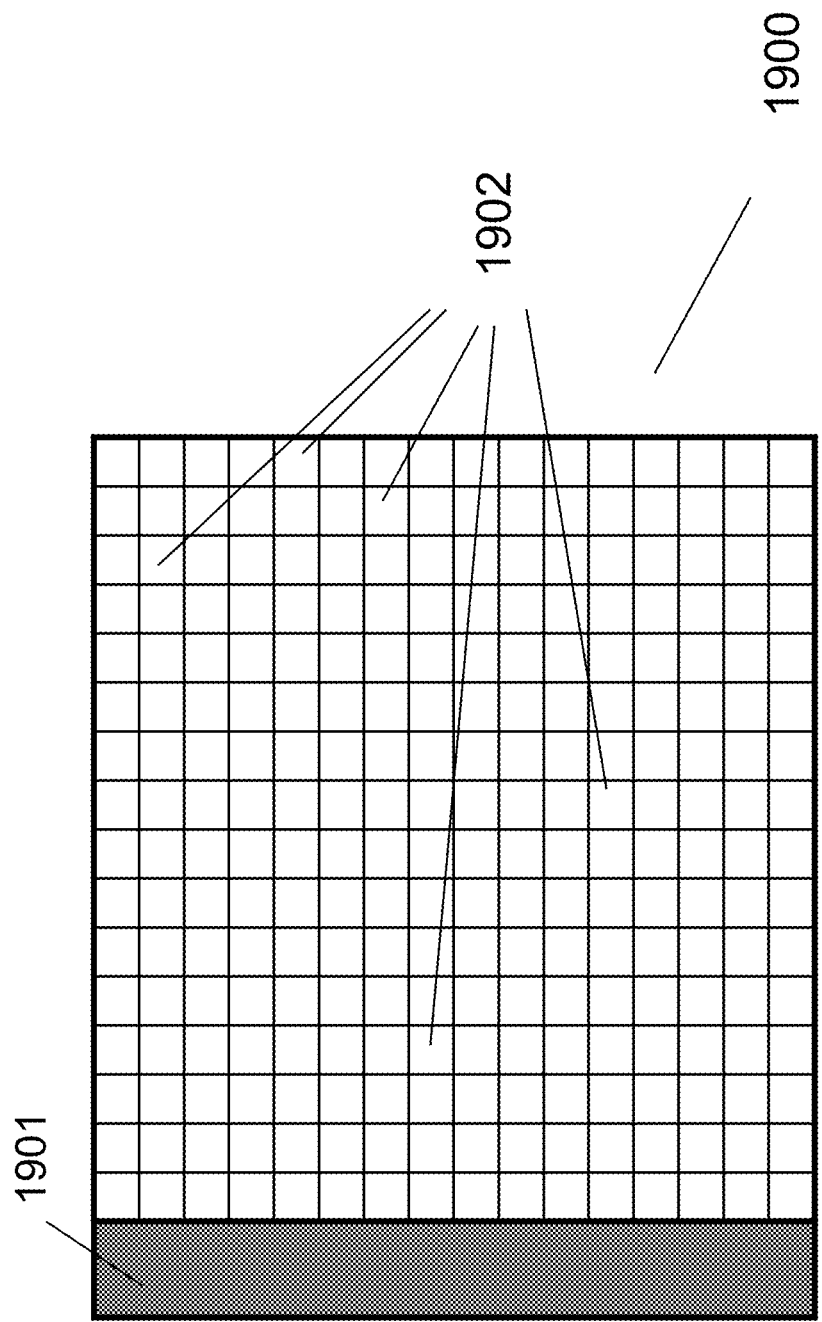
FIGS. 19A-19B are example illustrations of the formation and structure of 3D Memory with dual functionality.

FIG. 19A illustrates the top level construction of 3D memory 1900 for such enhanced operation. The side memory control circuits 1901 control the interface to external devices both for instruction, and data in and out. This circuits 1901 could include the per layer decoders and control to support all internal memory blocks so the stair-case area overhead could be reduced. The 3D memory is than partitioned to many blocks 1902 each is a sub-memory structure with its own top peripherals circuits to control most of its control lines. In such construction the operation each instruction to move data from one portion to the other could be done in parallel in all the units reducing the time and power by orders of magnitude. The side memory control circuits 1901 could synchronize these operations so it will be done one layer at a time.

Figure 19B:
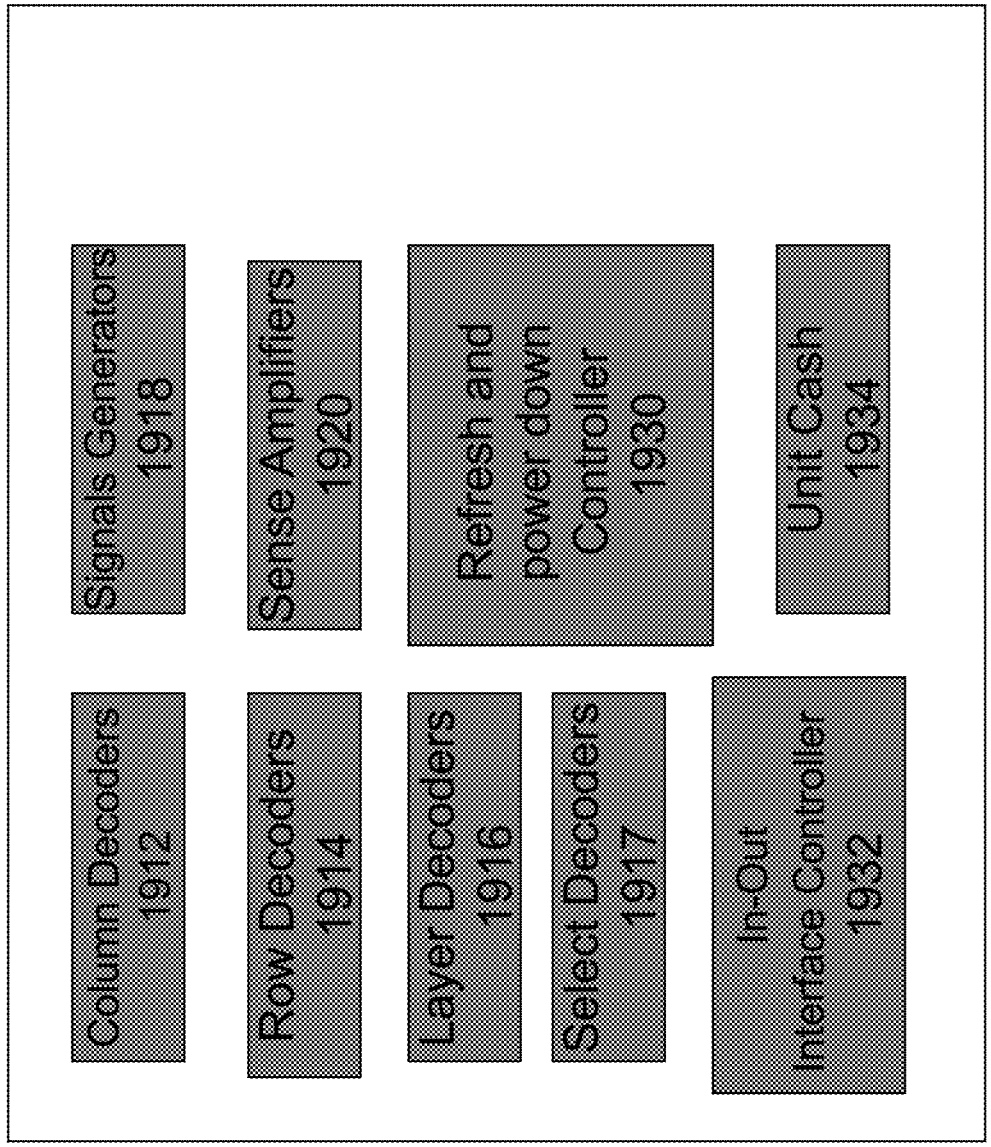

FIG. 19B illustrates the block diagram of peripherals circuit of a block 1902. The block diagram 1904 of such unit block control circuits could include:

Central controller 1930 commanding and control these operation for sleep mode recovery mode etc.

In-Out interface controller to interface with data and control with the device controller 1901

Sense Amplifiers 1920 to sense the data of a memory cell according to the mode of operation and to convert side memory control circuits 1901 side memory control circuits 1901 side memory control circuits 1901 it to a digital bit which could be temporarily stored in the unit memory cash 1934.

Signal generators 1918 to generate the required voltages and current for the proper read write of the memory cells. Some of these circuitry, such as charge pumps could be shared by all units and be placed in side memory control circuits 1901

Than blocks 1912, 1914, 1916, 1917 for the various control lines such as bit-lines, word-lines, gate-lines, select lines etc. The layer decoders 1916 might be removed out from the unit 1904 into the general per layer circuits at side memory control circuits 1901

Additional advantage for such memory architecture is the potential ability to move in and out very large blocks of data as many blocks 1902 could be access in parallel. If only a single per layer stair case is used for maximum array efficiency than the parallel action would be limited to single layer at a time. For many application these could be manage by proper system data structure and control.

Such 3D Memory could include redundancy circuit to allow repair of control function and not just for memory bits. The architecture of FIG. 18C could be used to allow access to many of the memory control lines from both side—top and bottom and to have duplication of the device control circuit 1824 at the bottom. Such redundancy could be broken to the memory block control units 1902. So if one unit block control circuits is faulty than it is replaced by his compatible one on the other side. Alternatively each unit block control circuits could be built with two stratum one being a back for the other as was detailed here before.

The memory control redundancy could be applied to any of the 3D memories herein.

Another alternative for 3D memory could be built utilizing a mono crystalline transistor wherein their channel is vertically oriented so the current through the device is going vertically across the device layers rather than horizontally along the device layers. Yet, this structure are designed to be low cost by sharing lithography, etch and deposition of multiple layers together forming vertical oriented transistor, one self aligned to the one on top of it.

Figure 20A:
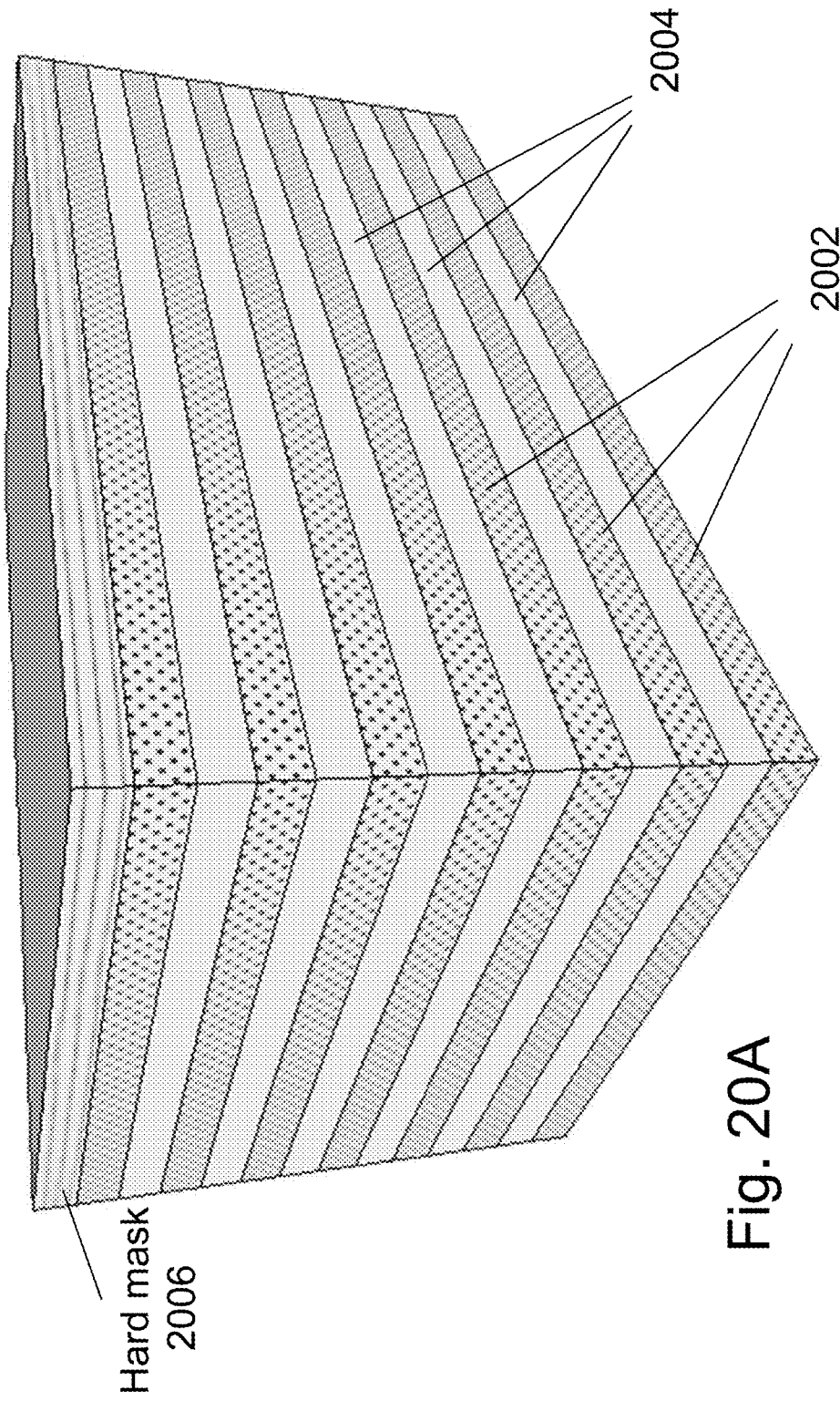

FIG. 20A illustrates a starting material for these vertically oriented 3D memories. It has interchanging layers of designated source drain (S/D) material 2002 over designated channel material 2004. These layers could be process by epitaxial steps with in-situ alternating doping from N/N+ type to P/P+ type and/or between Silicon to SiGe etc. The design of these layer composition could be done together with a choice of an high selectivity etch process to enable etching the designated channel layers 2004 at far higher rate than the (S/D) layers 2002. The thickness of these layers could be thin as few nm to hundreds of nm.

For example the (S/D) layers 2002 could be N+ silicon while the channel layers 2004 could be P type silicon and the selective etch later would utilize anodic etching as detailed in U.S. Pat. No. 8,470,689 and other as was described herein.

An alternative is to use P++ silicon for the (S/D) layers 2002 and N silicon for channel layers 2004 and the selective etch later would utilize the chemistry—"As a selective etchant, an ammonium hydroxide-water solution can be used. It was shown in [8] that the 3.7 wt. % NH4OH solution has a pp+ selectivity of approximately 8000:1 at 75° C. and boron concentration p+=$10^{20}$ cm$^{-3}$" as was described herein.

An alternative is to use N+ silicon for the (S/D) layers 2002 and P type SiGE for channel layers 2004 and the selective etch later would utilize the process used for 3D horizontal NAND memory described by Se Hwan Park et al in a piper titled "Novel Three Dimensional (3D) NAND Flash Memory Array Having Tied Bit-line and Ground Select Transistor (TiGer)" published in TECHNICAL REPORT OF IEICE in 2011 (APWF_PSH), a paper by FL W. Fathauer et al titled "New class of Si-based superlattices: Alternating layers of crystalline Si and porous amorphous Si, —, Ge, alloys" published by Appl. Phys. Lett. 61 (19), 9 Nov. 1992, a paper by Jang-GnYun titled "Single-Crystalline Si Stacked Array (STAR) NAND Flash Memory" published at IEEE TRANSACTIONS ON ELECTRON DEVICES, VOL. 58, NO. 4, April 2011 and U.S. Pat. No. 8,501,609 all incorporated herein by reference.

For simplicity we will detailed the flow for vertical channel 3D memory structure having (S/D) layers 2002 as N+ silicon and P type silicon for channel layers 2004. A memory device artisan would be able to modify the flow for other alternatives.

On top of the multilayer of alternating 2002/2004 a hard mask material 2006 is deposit.

Figure 20B:
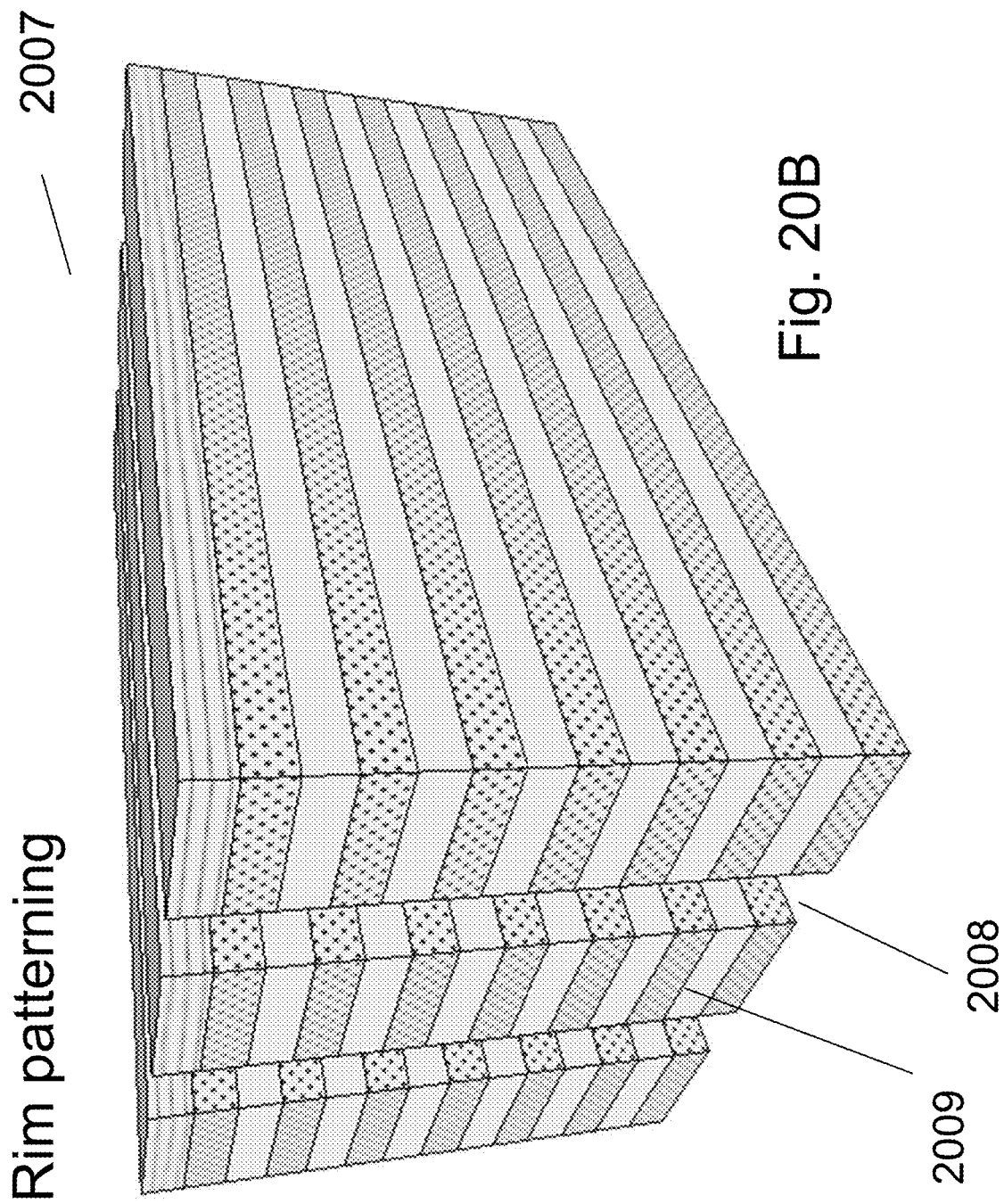

FIG. 20B illustrates etching the structure to form multi-layer rims 2009 and valleys 2008 in between resulted in repeating rims structure 2007. The width of the rims and the valleys could be from 10 nm or even lower to few hundreds of nm. At current state of technology about 50 nm could be good choice. The width of the rims and the valleys could be set in consideration of the thickness of layers 2002/2004, the type of memory build and other consideration. Similar width and thickness could be appropriate.

FIG. 20C illustrates the structure after a step of selective isotropic etches of the channel layers 2004, forming horizontal notches 2009 while keeping the S/D layers 2010 mostly untouched.

Figure 20D:
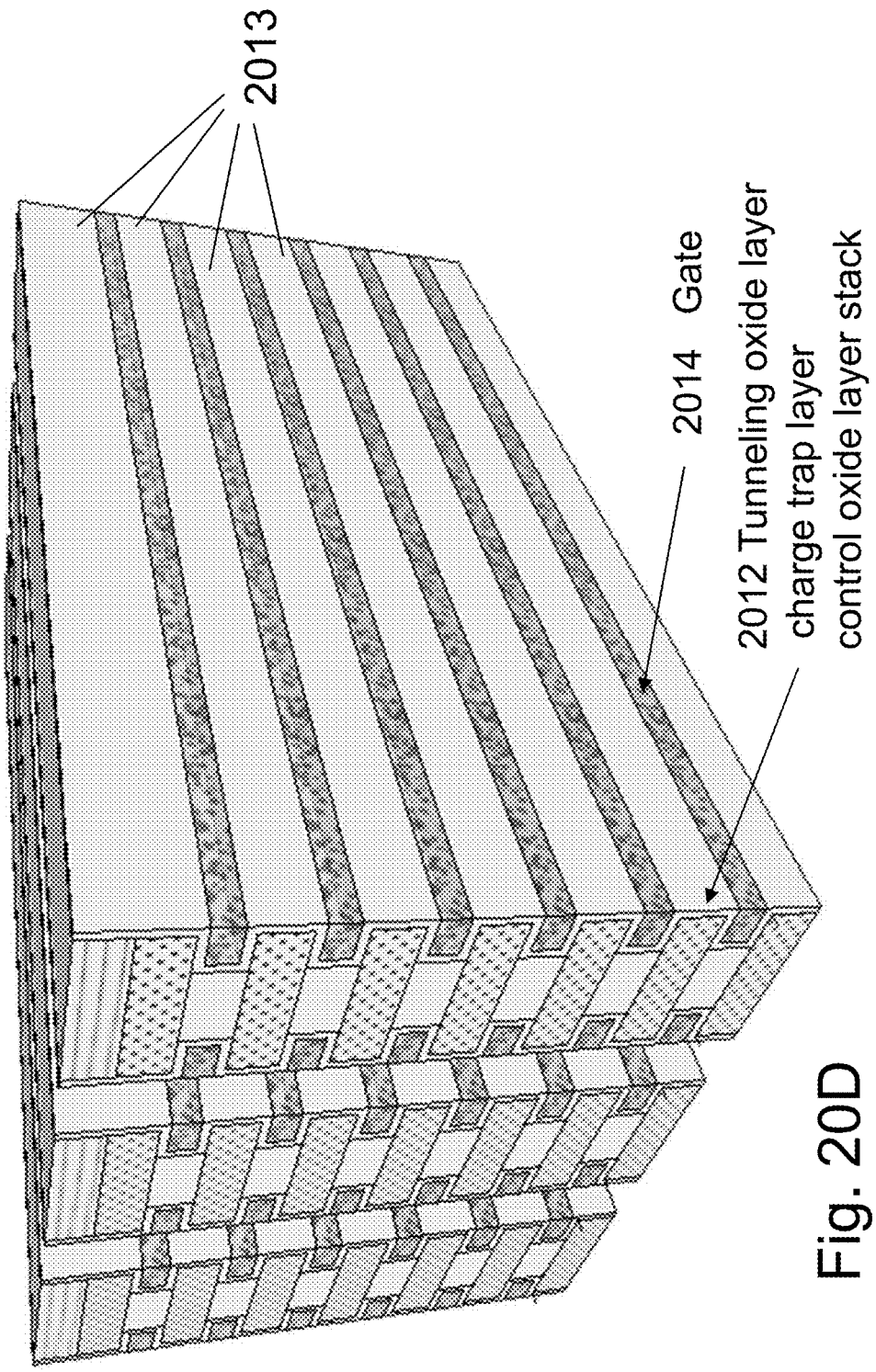

FIG. 20D illustrates the structure after a steps of depositing a stack of tunneling oxide layer/charge trap layer/control oxide layer 2012 such as oxide/nitride/oxide and gate conductive material 2014. The step could be done by Atomic Layer Deposition (ALD) or alternative processes used for semiconductor device fabrications. A directional anisotropic etch step could be used to remove all gate material from the side walls of the S/D layers 2013.

Figure 20E:
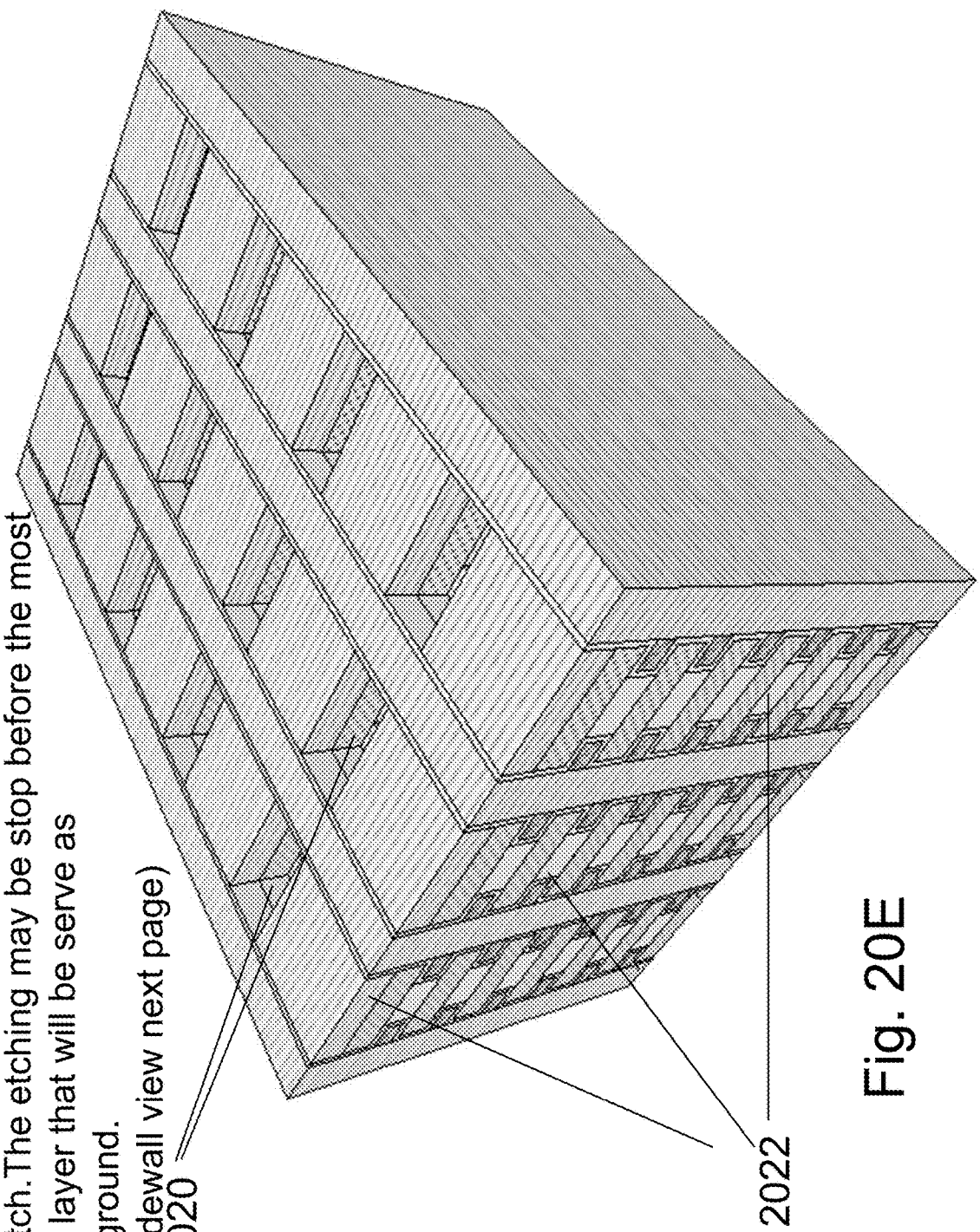
Figures 20F, 20G:
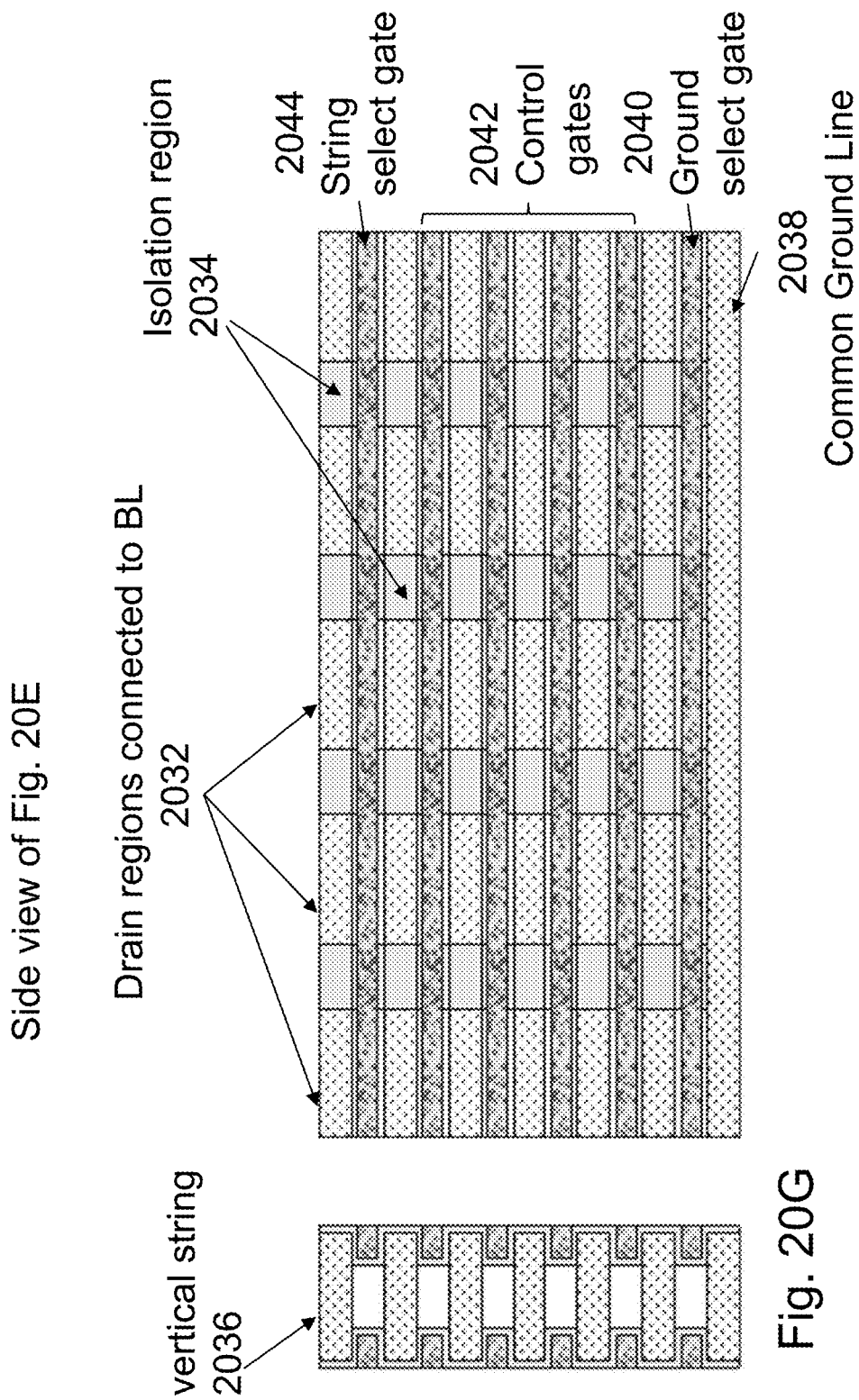

FIG. 20E illustrates the structure after an etch step 2020 of the rims to form vertical strings 2022. The etch step could be done in two steps. First anisotropic etch the stack of multilayer of alternating 2002/2004 to form the vertical individual strings 2022, and then isotropic selective etch to remove the source/drain 2002 in-between the gate stack 2012, while leaving the horizontal going gate and oxide lines. The etching may be stop before the most bottom N+ layer that will be serve as common ground FIG. 20F illustrates side view along word line direction of the structure of FIG. 20E. The empty space left from the removal of the in-between channel material 2034 serve as memory cell isolation. The left bottom material 2038 could serve as a common ground line. The lower gate line 2040 could serve as ground select gate. The top of the vertical strings 2032 would serve as the string drain region and could be connect later to the bit-lines (BL). The inside of the structure is the matrix of memory cell formed as vertical non-volatile NAND strings with horizontal going across control gates 2042 controlling the channels between the source/drain in the vertical NAND strings FIG. 20G illustrates side view along a string direction of one vertical NAND string 2036.

Figure 20H:
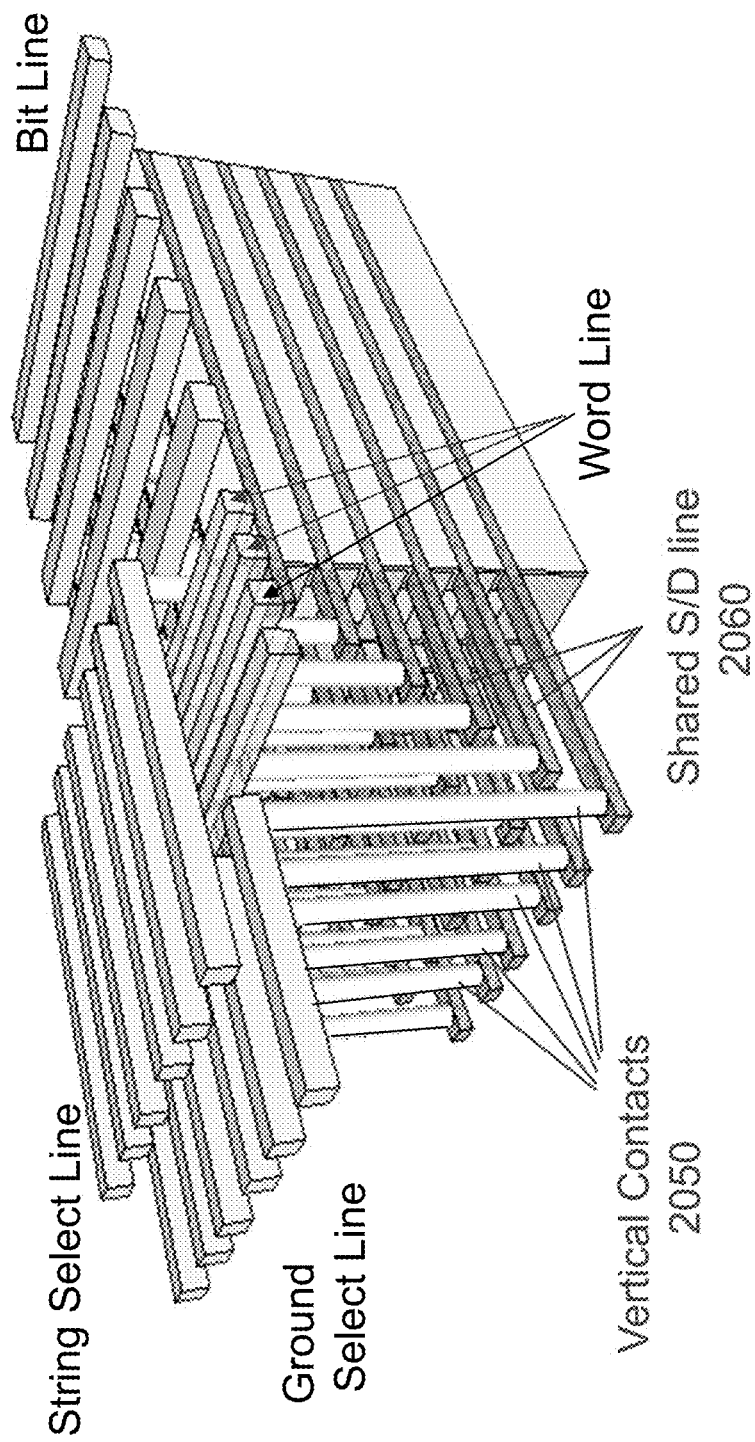

FIG. 20H illustrates the 3D NAND memory structure after adding the memory control lines: word-lines, bit-lines, string select-lines, vertical contacts 2050, shared S/D line 2060, and ground select-lines.

In this 3D memory structure, and also for most other memory structure herein, the horizontal per layer line in through the matrix could be the limit for power performance in respect to how long it could be made. On the other hand the area required for the stair-case mean that a shorter line will result in lower array efficiency and higher cost per bit. An alternative could be to place such stair-case on both side of the line which as an added benefit could help reduce cell to cell variation in addition to improving power and delay. If the device is constructed with multiple block across with multiple stair cases than the overhead for this is limited as the between block stair-case could be shared with both the right and the left sides of it.

Figure 21A:
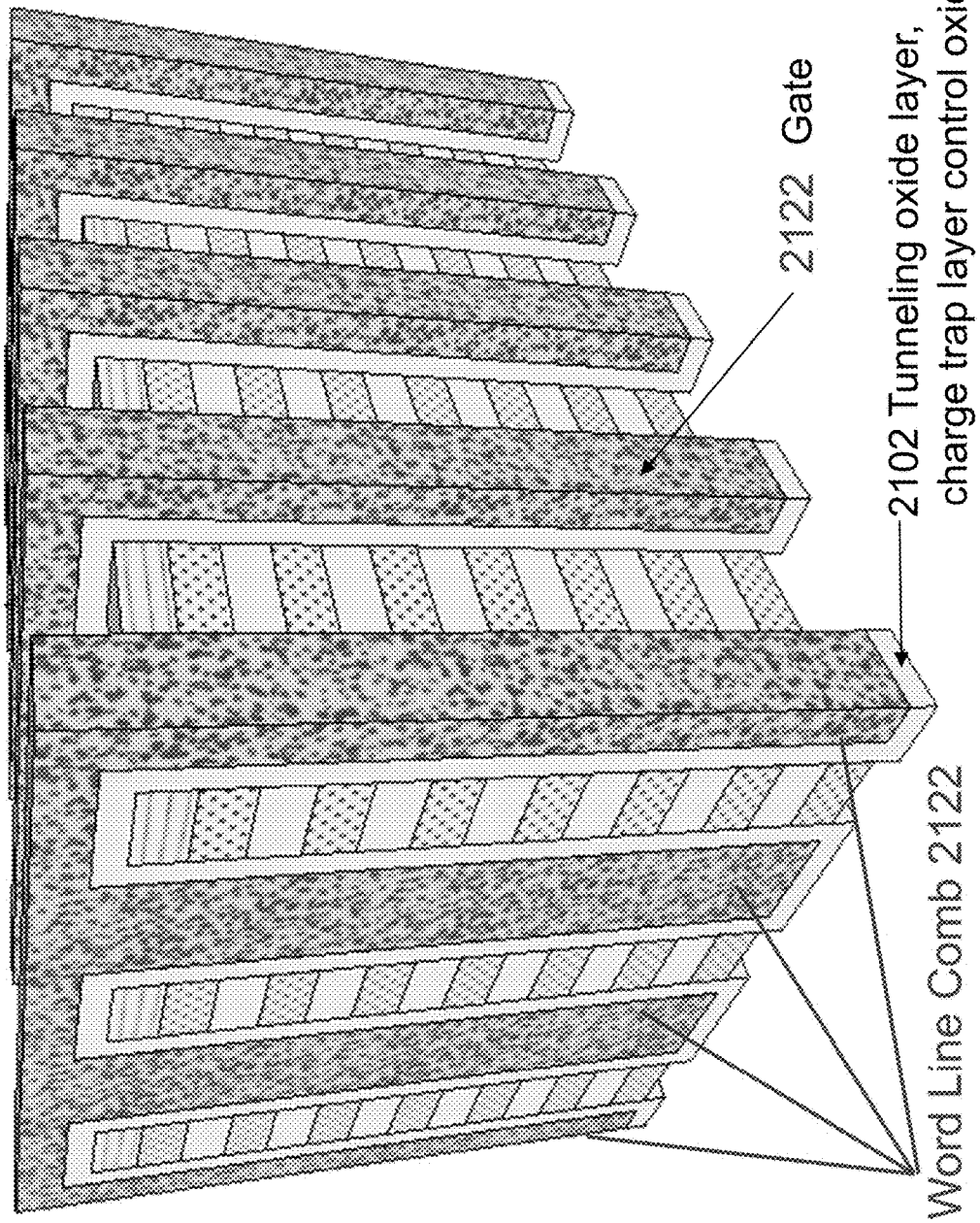

FIG. 21A illustrates a structure for the formation of a NOR type 3D memory. It starts from the structure 2007 illustrated in FIG. 20B. Using masking forming strips in vertical direction to the rims, in which first a tunneling oxide layer, charge trap layer and control oxide layer are formed resulting with the NV stack 2102. On top of it a gate 2122 [2104] such as tungsten (W) or polysilicon or other form of memory matrix gate is being formed, for example, in Word Line Comb 2122. This step could use ALD techniques.

FIG. 21B illustrates the structure after selective isotropic etching the channel in all place not covered by the gate stack. Leaving voids 2112 in between the horizontal bridges of the un-etched S/D material 2110. Under the gate 2122 stack the channels 2114 are not etched being protected by the gate 2122 stack, in the shape of a Word Line Comb 2122.

FIG. 21C illustrates a cross section of the structure of FIG. 21B. The gates 2122 would control the conductivity between the source and the drain S/D [2120] 2110 through the channel [2121]2114, with isolation region 2134 between, above, and below each transistor. In this structure the S/D material act as source drain under the gates 2122 and as conductive lines 2123 being the memory control line connecting the S/D along the layer for each rim. When the S/D material is selected to be N+ silicon and the channel; material is selected to be P type silicon, than each memory cell would NPN transistor with two side gate stack to form a non volatile memory cell. As the memory is structure so the S/D lines are going across the rim all the way to the edge of the block than proper design would enable selecting adjacent S/D pair to power all the cell of a specific layer within a rim. The vertical gate stack could then be selected to read write to a specific memory cell on that rim.

Figure 21D:
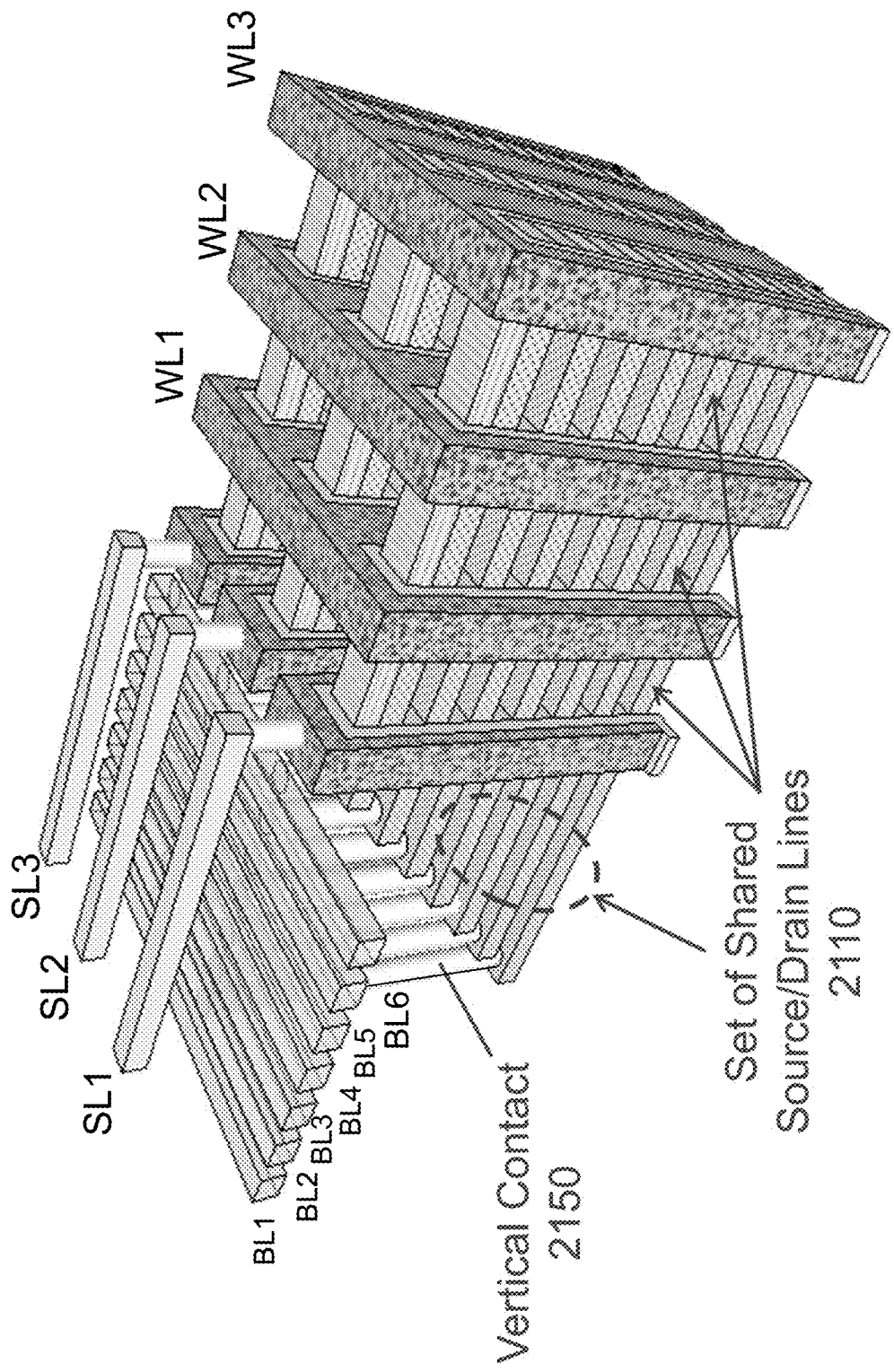

FIG. 21D illustrates the 3D NOR structure after adding control lines. The shared gate go vertical to the rim control by word-lines WL1, WL2, WL3. The stair case is used for the per layer control lines, which may be utilized to connect sets of shared source/drain lines 2110 to the array bit lines (BL1 . . . BL6 for example) thru vertical contacts 2150. The bit-line BL1 control the S/D of the first layer of all the rims in the memory block, BL2 control the second layers and so forth. The select-lines are controlling the access of the bit line to the S/D of the rims. SL1 control the access to the first rim, SL2 to the second rim and so forth.

The rim control is constructed by first removing the channel at the region designated for rim control. Than the S/D line at these regions are made to function as junction less transistor or as gate all around nano-wires. In some cases it might be desired to thin the S/D lines in the region designated as junction less transistor or nano-wire to achieve better gate control. Such thinning would narrow these regions to about 20 nm thickness.

Figure 21E:
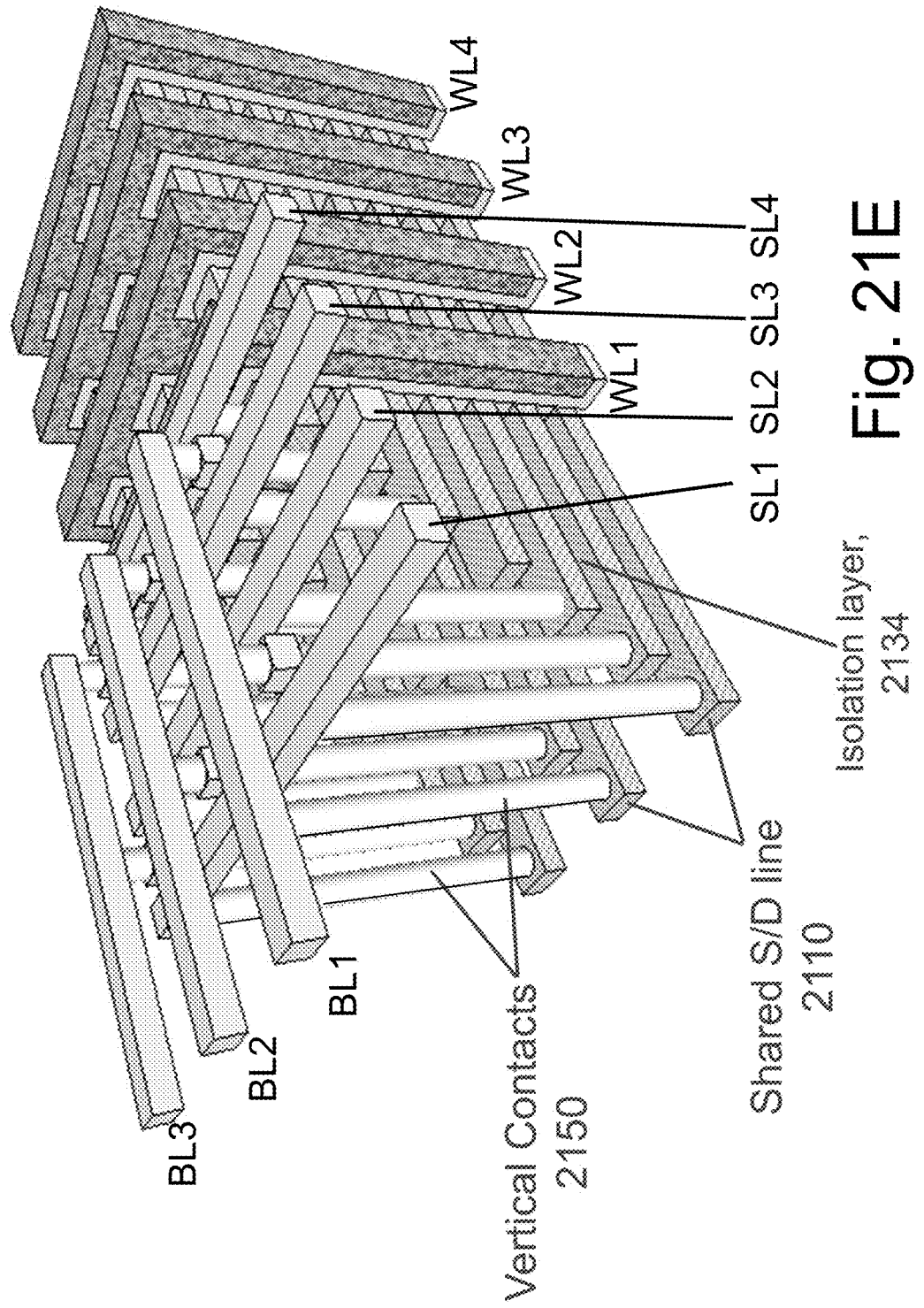

FIG. 21E illustrates an alternative 3D NOR structure alternative control for the per layer control lines. The shared S/D lines 2110 are split to odd layers jointly connected by select-lines (SL1-SL4 for example) in parallel to the word-lines. According SL1 connects the S/D lines of layer 1, SL2 connects the S/D lines of layer 3 and so forth. These connections may be made from shared S/D lines 2110 variously to select lines (SL1 . . . SL4 for example) and bit lines (BL1 . . . BL3 for example) thru vertical contacts 2150. And the even layers are connected per rim along the rim direction by bit-lines in vertical orientation to the word lines. Accordingly BL1 connects the S/D of all even layers of the first rim, BL2 connects the S/D of all even layers of the second rim and so forth. By selecting one bit-line and one select-line a specific layer within a specific rim would have both S/D of its memory cell active all other cells in the matrix may have one or non of their S/D active. Selecting a specific word-line will activate one memory cell of those cells that have both of their S/D active. Accordingly a specific memory cell with specific x, y, z location could be selected.

This 3D NOR structure could be enhance using the universal memory concept of FIG. 15A. The cell channel becomes the floating body and the gate stack would be enhance to support such dual functionality. The use of the enhance 3D NOR and the various use mode and system architecture could be similar to those discussed herein.

Figure 22A:
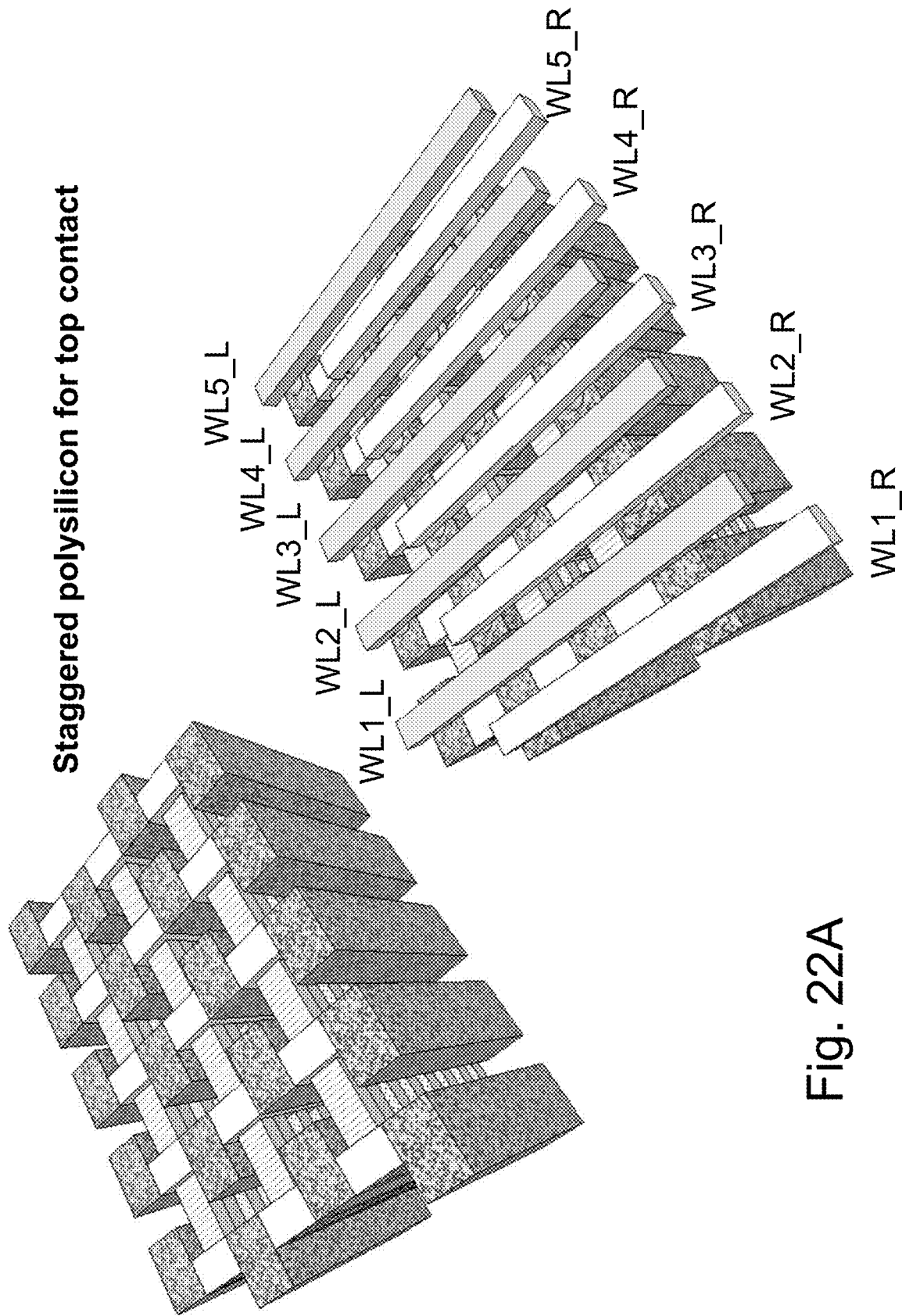
Figure 22B:
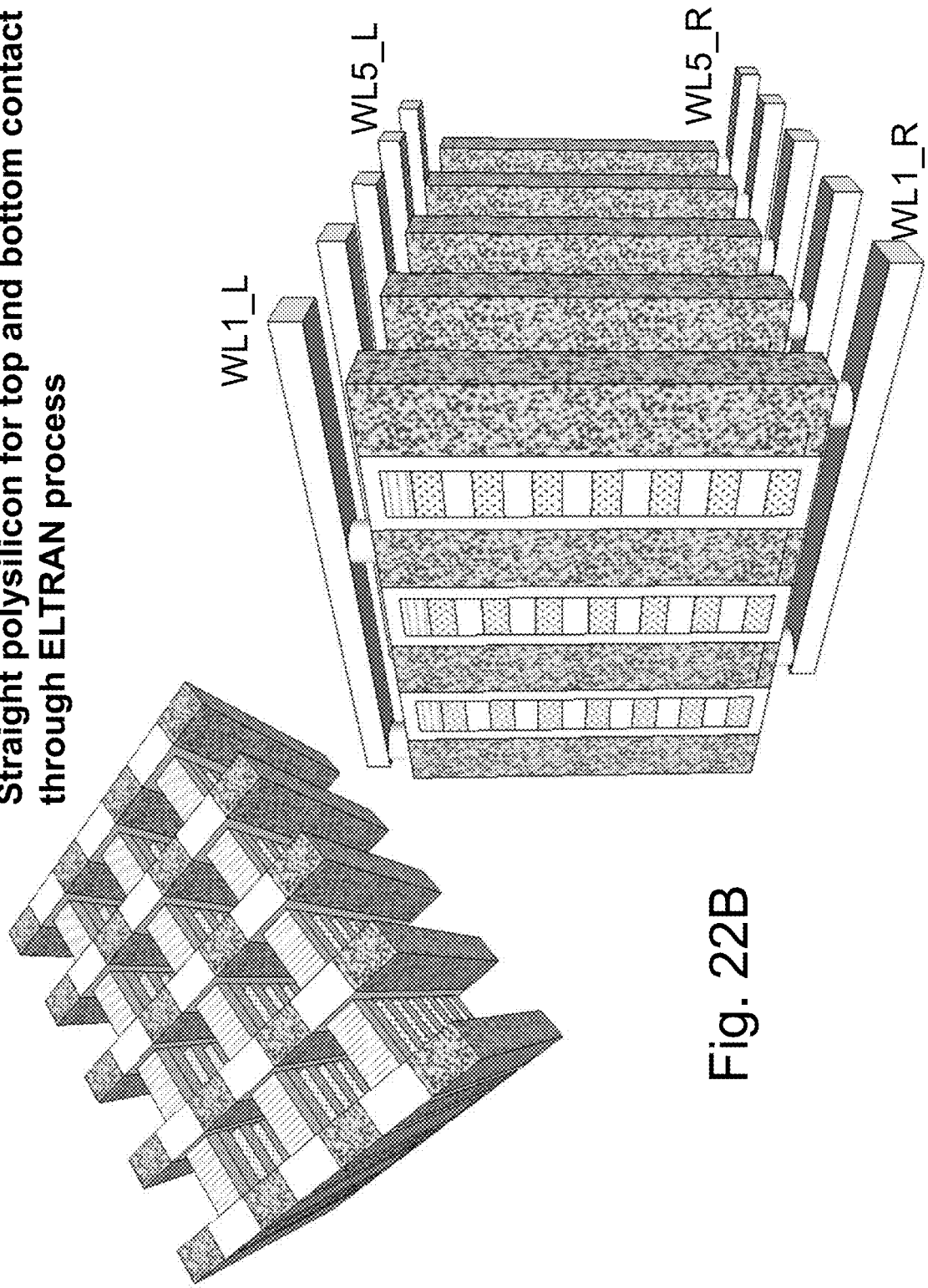

Additional enhancement to such 3D NOR is to break the gate control to two independent side gate—left gate and right gates. So for example control line WLR1 will control all the right side gates and WLL1 would control all the left side gates. Such split could allow doubling the store capacity, The channel size need to support such 'two bit' per cell option. A channel width of 50 nm or higher had been used for such 'two bit' per cell functionality These two gate control line can be place on the top connection layer side by side as is illustrated in FIG. 22A, or alternatively one on the top and one on the bottom as illustrated in FIG. 22B.

Additional enhancement to such 3D NOR is to implement MirrorBit® technology is was made commercial by Spansion for NOR products.

Figure 22C:
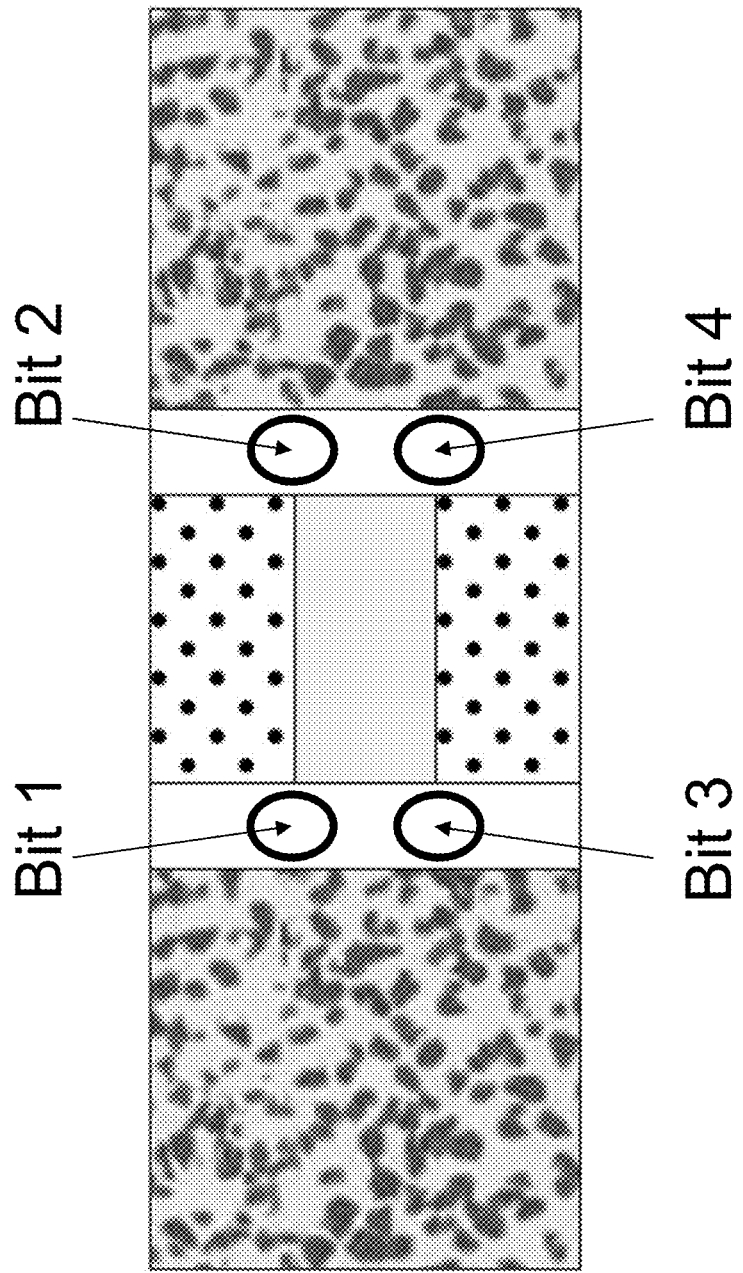

These two enhancements could be combined to allow '4 bit per cell' as is illustrated n FIG. 22C. Such technology is detailed in U.S. Pat. No. 7,091,551 incorporated herein by reference.

Additional enhancement to such 3D NOR is to enhance the MirrorBit to allow 8 bit per cell by forming a stair-case per layer for both sides of the S/D lines allowing multiple current path through the cell to position charge trap bit for each corner of the memory cell as illustrated in FIG. 22D and FIG. 22E. These figures are a zoom view of one memory cell within the 3D NOR structure. The cell channel is between two S/D lines 2200 and 2202. The right side of the cell charge trap layer could store in each corner a charge—bit1, bit2, bit3, bit4. Those would be control by the right side gate 2204. The choice which of this bit is activated would be made by activating the right side gate and controlling the current path from one of the two sides of the S/D line 2200 and to or from one of the two side of S/D line 2202. FIG. 22E shows the same cell from a different view point illustrating the left side gate 2206 and the charge trap location for bit5, bit6, bit7 and bit8.

Figure 22F:
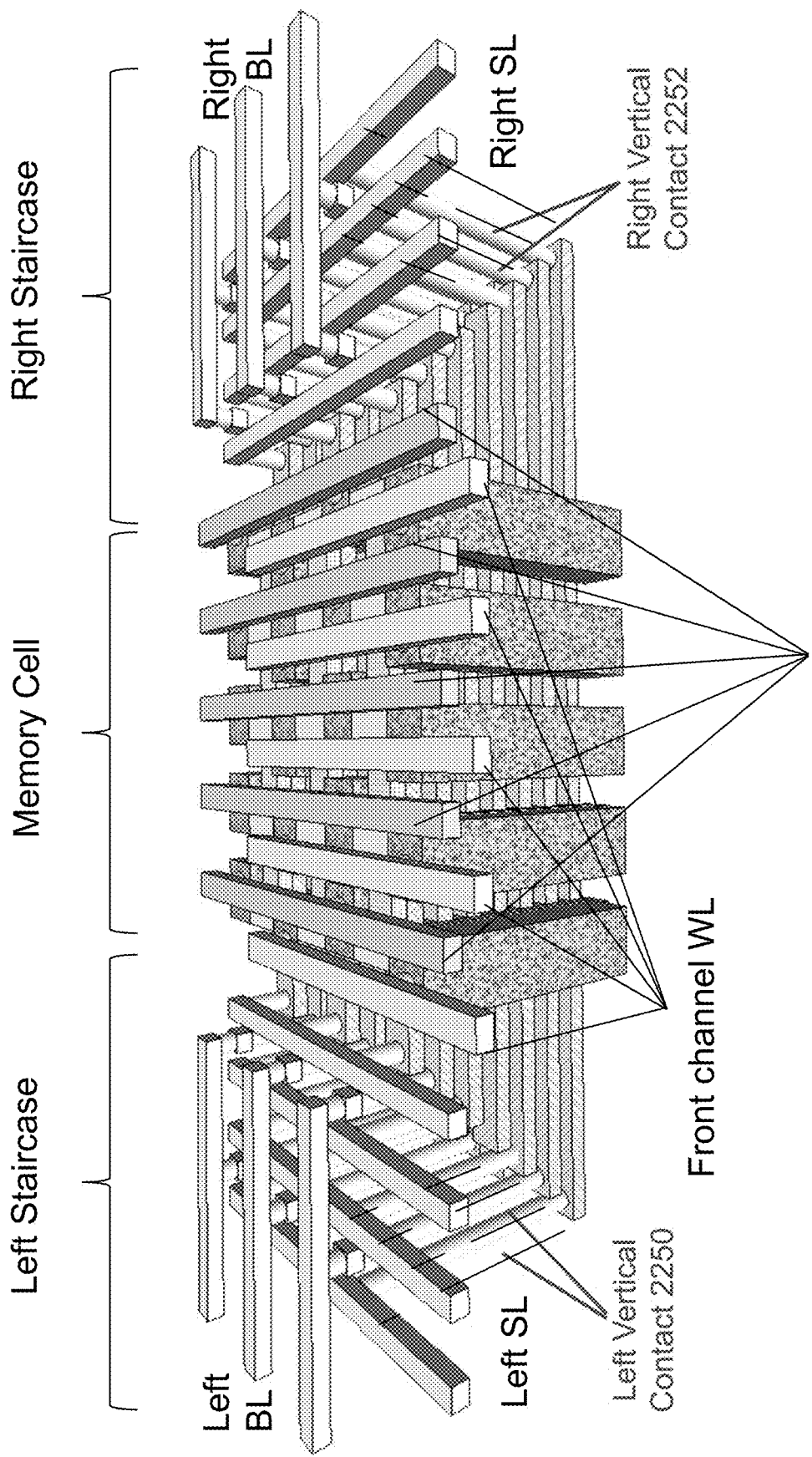

FIG. 22F illustrates a memory block with its control line designed to control 8 bit store in one cell, including left vertical contacts 2250 and right vertical contacts 2252.

The general approach to access and distinguish could be as follows:
 Front side bit & Back side bit 4 Front size WL and Back side channel
 Upper bit & Lower bit 4 Source Line & Bit Line Swapping
 Left side bit & right side bit 4 Left staircase access & right staircase access Another known enhancement technique is to control the amount of charge being trapped in a cell to allow coding of more than 1 bit base on the amount of charge. These different enhancement techniques could be combined to achieve even higher number of bits per cell. Accordingly if each corner is designed to hold 4 level than the cell could store 16 bits. If more levels are managed at each corner than the storage capacity of a cell could be even higher The structure of this 3D NOR could be modified by changing the gate stack to construct a 3D-DRAM using the floating body technique.

The Floating body of the 3D-DRAM or of the 3D-NOR Universal memory could be refreshed using the self-refresh described herein.

As a general note we described here-in 3D money memory structure and variations. There are many ways to form other variations of these structures that would be obvious to artisan in the semiconductor memory domain to form by the presented elements described herein. These may include exchanging n type with p type and vice versa, increase density by sharing control lines, silicidation of some in silicon control lines, providing stair case on both sides of memory blocks to improve speed and reduce variation including sharing staircase in between two blocks and other presented variations herein. Many of these options had been presented in some memory options in more details and it would be obvious to artisan in the semiconductor memory domain to apply to the other memory structures.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus the invention is to be limited only by appended claims (if any).

We claim:

1. A 3D memory device, the device comprising:
a first level comprising first memory cells, each of said first memory cells comprising a first transistor;
a second level comprising second memory cells, each of said second memory cells comprising a second transistor,
  wherein said second level is disposed above said first level,
  wherein a plurality of said first memory cells comprise a shared first source line and a shared first drain line,
  wherein a plurality of said second memory cells comprise a shared second source line and a shared second drain line, and
  wherein at least one of said first memory cells is self-aligned to at least one of said second memory cells; and
a third level comprising memory control circuits,
  wherein said third level is bonded above said second level,
  wherein said plurality of said second memory cells comprise channel regions disposed in-between said shared second source line and said shared second drain line,
  wherein said channel regions are controlled by right side gate lines and left side gate lines,
  wherein said device further comprises:
a plurality of horizontal word lines above said second layer,
  wherein said horizontal word lines comprise odd word lines and even word lines, and
  wherein said odd word lines are connected to said right side gate lines, and
  wherein said even word lines are connected to said left side gate lines.

2. A 3D memory device, the device comprising:
a first memory layer comprising a plurality of first vertical memory cells,
a second memory layer comprising a plurality of second vertical memory cells,
  wherein said second memory layer is disposed above said first memory layer,
  wherein said plurality of first vertical memory cells comprise a horizontal shared first source line and a horizontal shared first drain line,
  wherein said plurality of second vertical memory cells comprise a horizontal shared second source line and a horizontal shared second drain line,
  wherein at least one of said first vertical memory cells is self-aligned to at least one of said second vertical memory cells, being processed following a same lithography step;
a staircase structure with contacts to said horizontal shared first source line,
  wherein said horizontal shared first source line comprises said contacts on both ends of said horizontal shared source first line; and
a vertically-oriented, interdigitated word-line comb wrapped around said first and second vertical memory cells.

3. The device according to claim 2,
wherein said plurality of first memory cells comprise etched isolation regions disposed in-between said shared first source line and said shared first drain line.

4. The device according to claim 2,
wherein each first memory cell comprises a first memory bit site and a second memory bit site, and
wherein said first memory bit site is located closer to said shared first source line, and
wherein said second memory bit site is located closer to said shared first drain line.

5. The device according to claim 2,
wherein each memory cell comprises a gate and a channel; and
wherein each memory cell further comprises: a charge trap layer, a tunneling oxide layer, and a control oxide layer disposed in-between the gate and the channel.

6. The device according to claim 2, further comprising:
a memory control layer comprising a plurality of memory control circuits;
  wherein said memory control layer is bonded above said second memory layer.

7. The device according to claim 2, further comprising:
a memory control layer comprising a plurality of memory control circuits,
  wherein said memory control circuits comprise at least one select transistor.

* * * * *